(12) United States Patent
Ueno et al.

(10) Patent No.: US 6,946,950 B1
(45) Date of Patent: Sep. 20, 2005

(54) MOBILE BODY DISCRIMINATION APPARATUS FOR RAPIDLY ACQUIRING RESPECTIVE DATA SETS TRANSMITTED THROUGH MODULATION OF REFLECTED RADIO WAVES BY TRANSPONDERS WHICH ARE WITHIN A COMMUNICATION REGION OF AN INTERROGATOR APPARATUS

(75) Inventors: Shinichiro Ueno, Machida (JP); Suguru Fujita, Tokyo (JP); Shinkichi Ikeda, Komae (JP); Kenichi Maeda, Tokyo (JP); Ushio Sangawa, Sagamihara (JP)

(73) Assignee: Matsushita Electric Industrial Co., Ltd. (JP)

( * ) Notice: Subject to any disclaimer, the term of this patent is extended or adjusted under 35 U.S.C. 154(b) by 819 days.

(21) Appl. No.: 09/615,045

(22) Filed: Jul. 12, 2000

(30) Foreign Application Priority Data

| Jul. 12, 1999 | (JP) | ............................................ | 11-197060 |
| Jul. 12, 1999 | (JP) | ............................................ | 11-197062 |
| Jul. 12, 1999 | (JP) | ............................................ | 11-197063 |
| Sep. 27, 1999 | (JP) | ............................................ | 11-272405 |

(51) Int. Cl.⁷ ............................................... H04Q 5/22
(52) U.S. Cl. ................ 340/10.1; 340/10.34; 340/572.1; 340/10.2; 340/10.4; 340/5.65; 340/825.58; 455/107
(58) Field of Search .............................. 340/10.1, 10.34, 340/572.1, 10.2, 10.4, 5.65, 825.58; 455/107, 106, 101

(56) References Cited

U.S. PATENT DOCUMENTS

| 5,099,227 | A | * | 3/1992 | Geiszler et al. | .......... | 340/572.5 |
| 5,537,105 | A | * | 7/1996 | Marsh et al. | ............ | 340/10.32 |
| 5,559,507 | A | * | 9/1996 | Beigel | ..................... | 340/10.34 |
| 5,940,006 | A | * | 8/1999 | MacLellan et al. | ........ | 340/10.1 |
| 5,963,144 | A | * | 10/1999 | Kruest | ........................ | 340/10.1 |
| 6,140,924 | A | * | 10/2000 | Chia et al. | ............... | 340/572.5 |

FOREIGN PATENT DOCUMENTS

| EP | 0 467 036 A2 | 1/1992 |
| EP | 0 689 151 A2 | 12/1995 |
| JP | 63-5287 | 1/1988 |
| JP | 63-54023 | 3/1988 |
| JP | 5-297131 | 11/1993 |
| JP | 6-71224 | 9/1994 |
| JP | 8-123919 | 5/1996 |
| JP | 8-252995 | 10/1996 |
| JP | 2705076 | 10/1997 |

\* cited by examiner

*Primary Examiner*—Michael Horabik
*Assistant Examiner*—Vernal Brown
(74) *Attorney, Agent, or Firm*—Parkhurst & Wendel, L.L.P.

(57) ABSTRACT

In a mobile body discrimination apparatus having an interrogator apparatus and a plurality of transponders each capable of transmitting information to the interrogator apparatus by modulation of radio waves that are reflected from a transponder antenna, which can be attached to respective articles, store data concerning the articles, and transmit the data to the interrogator apparatus in response to a command signal transmitted while the transponder traverses a communication region of an antenna of the interrogator apparatus, each transponder is configured to begin sending such response data after a randomly determined time interval following reception of the command signal, thereby reducing the probability of data conflict when plural transponders are within the communication region. In addition, radio waves from a second antenna of the interrogator apparatus are directed into that communication region in the intervals between transmissions of the command signal, thereby increasing the power level of radio waves that are reflected by a transponder antenna or used by a rectifier circuit to supply power for operating the transponder circuits.

69 Claims, 68 Drawing Sheets

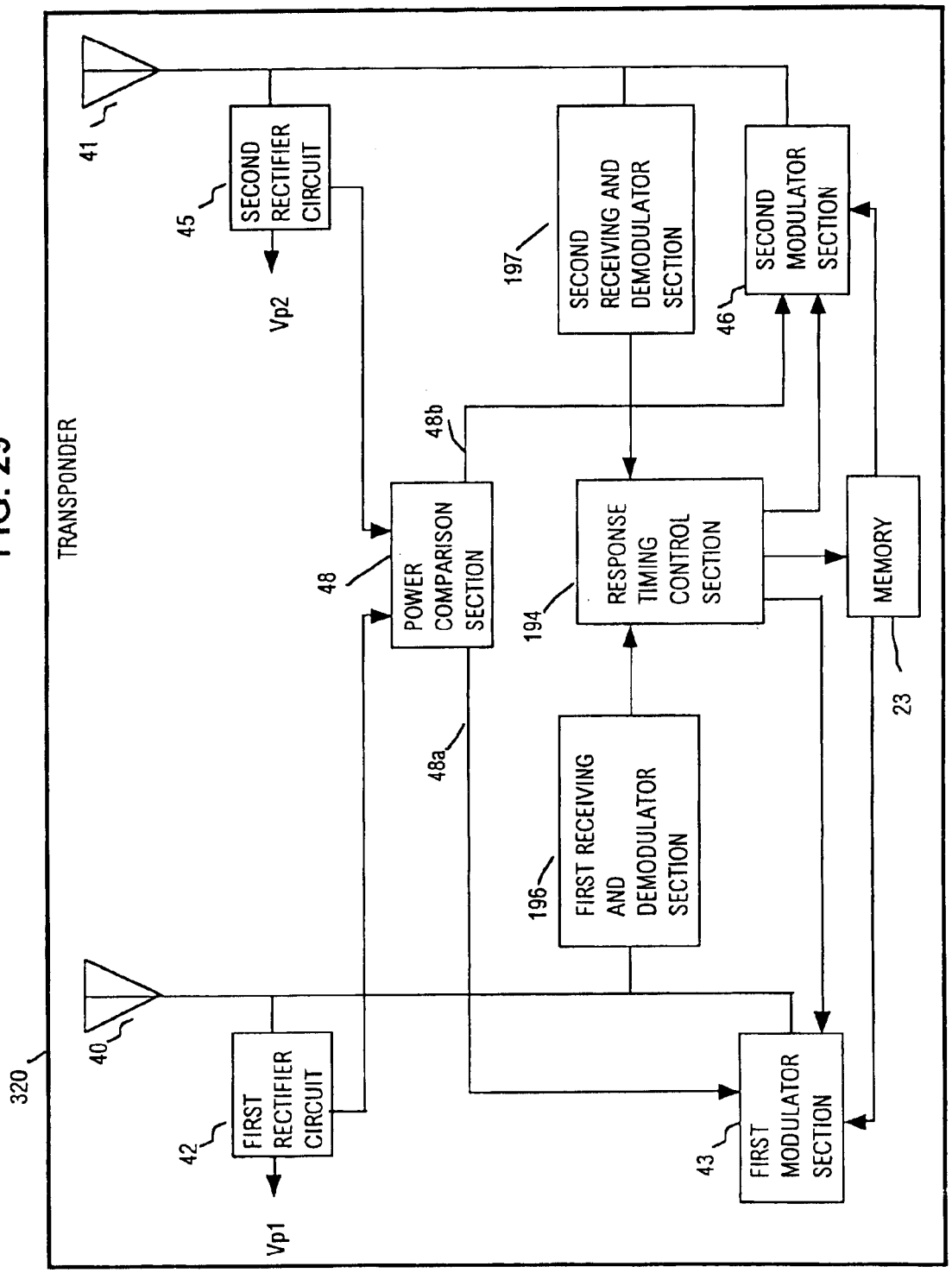

(LEFT-HANDED POLARIZED)

(TRANSMIT/RECEIVE ENABLED ONLY VIA ANTENNA 40)

(TRANSMIT/RECEIVE ENABLED ONLY VIA ANTENNA 41)

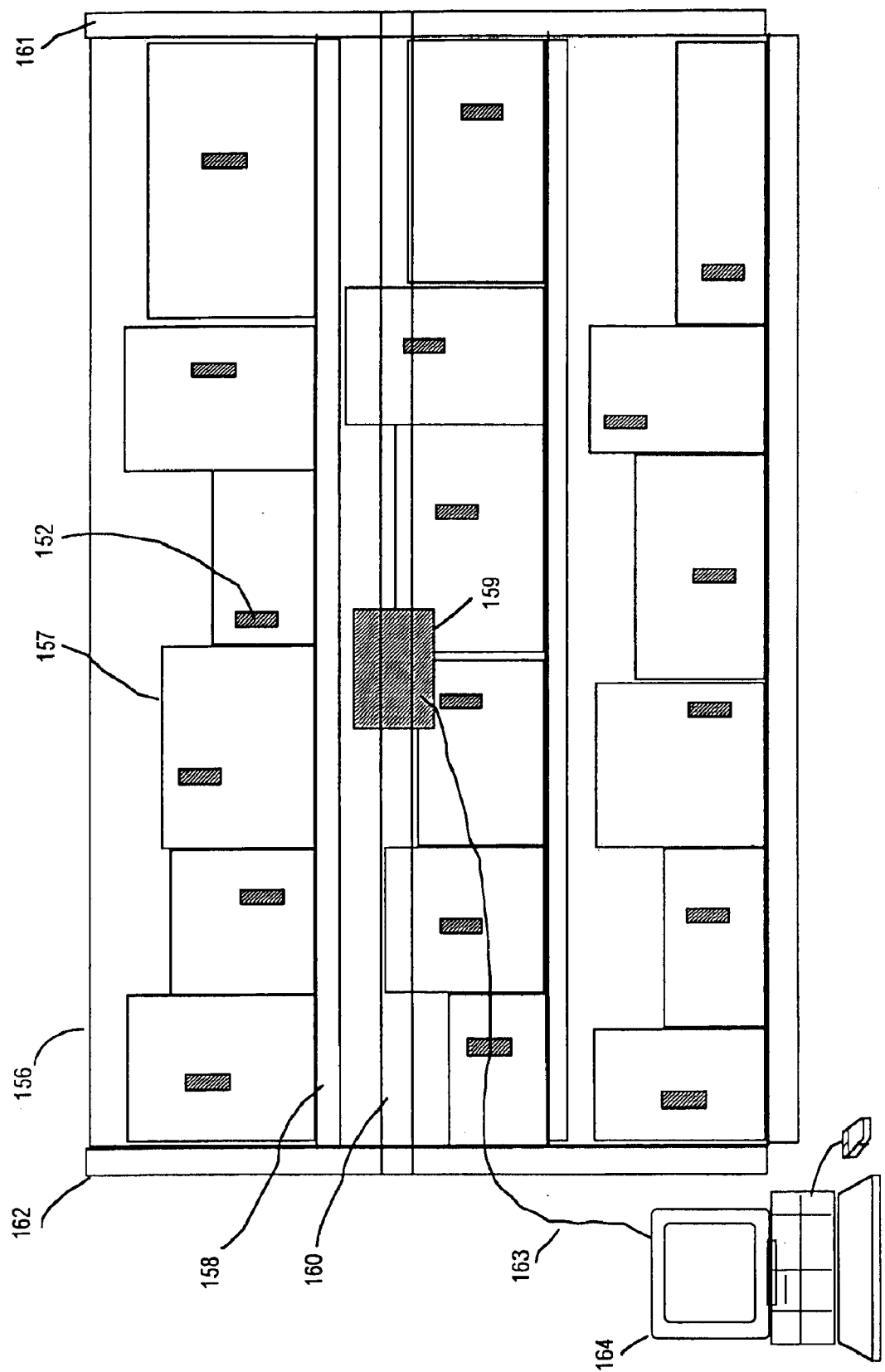

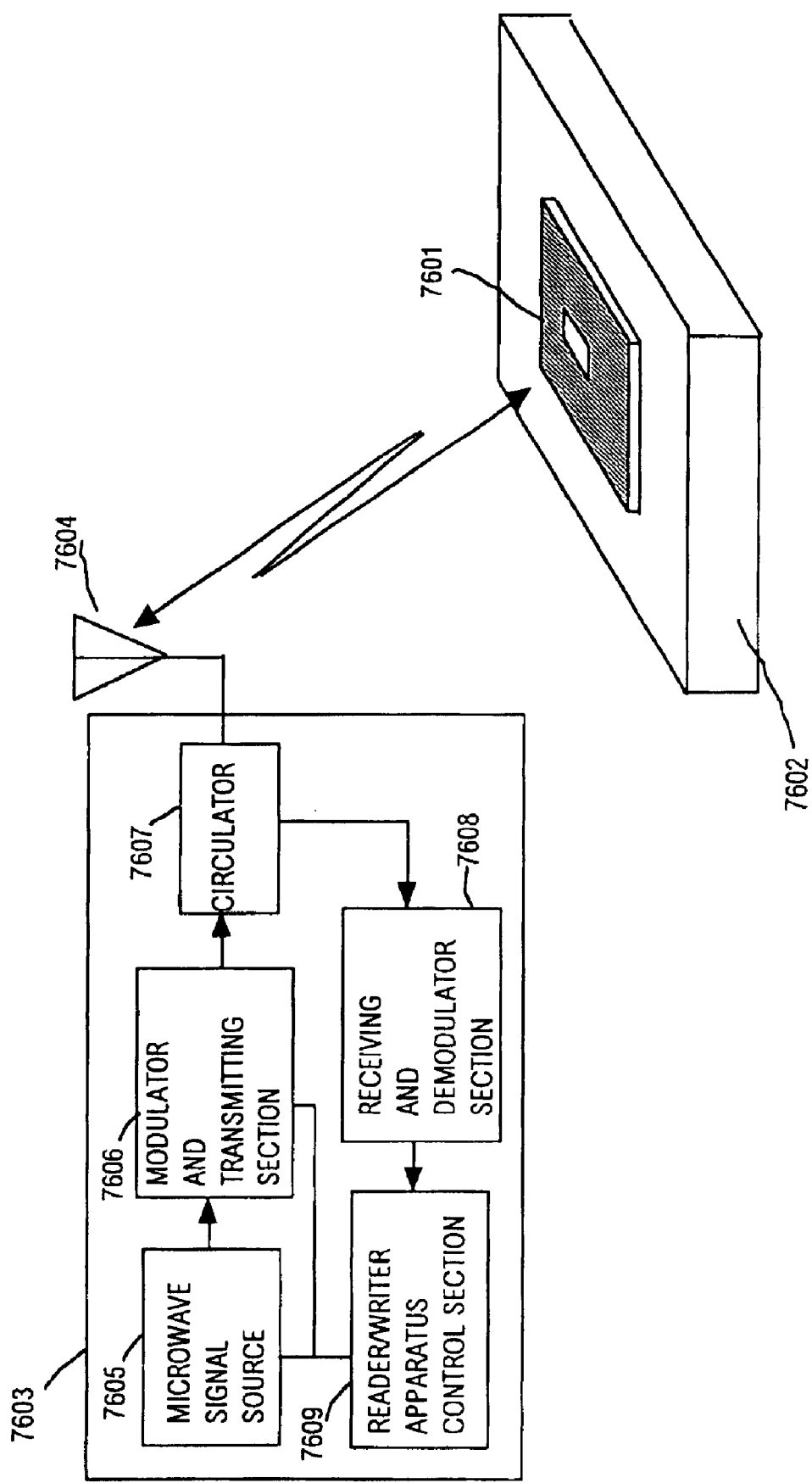

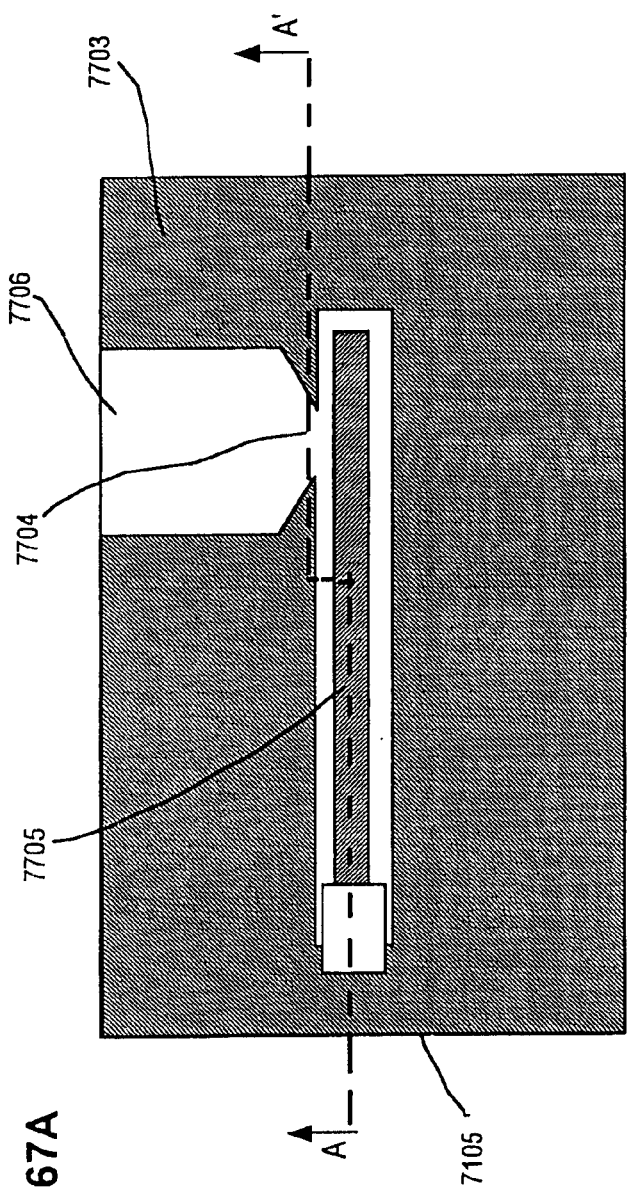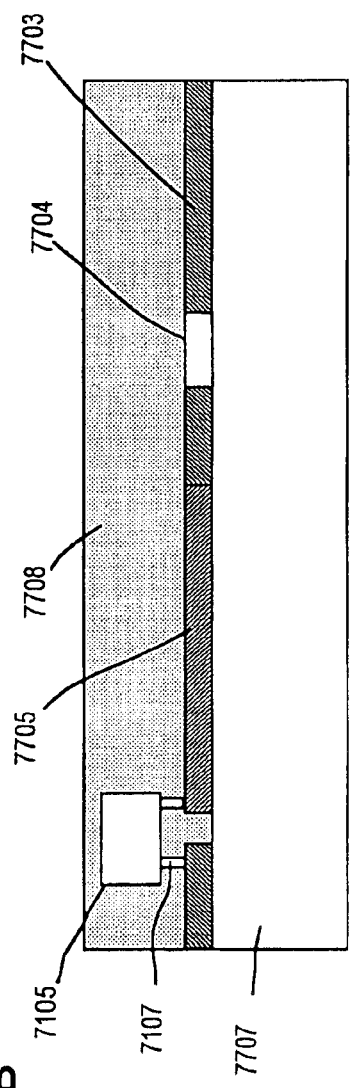
FIG. 67A
FIG. 67B

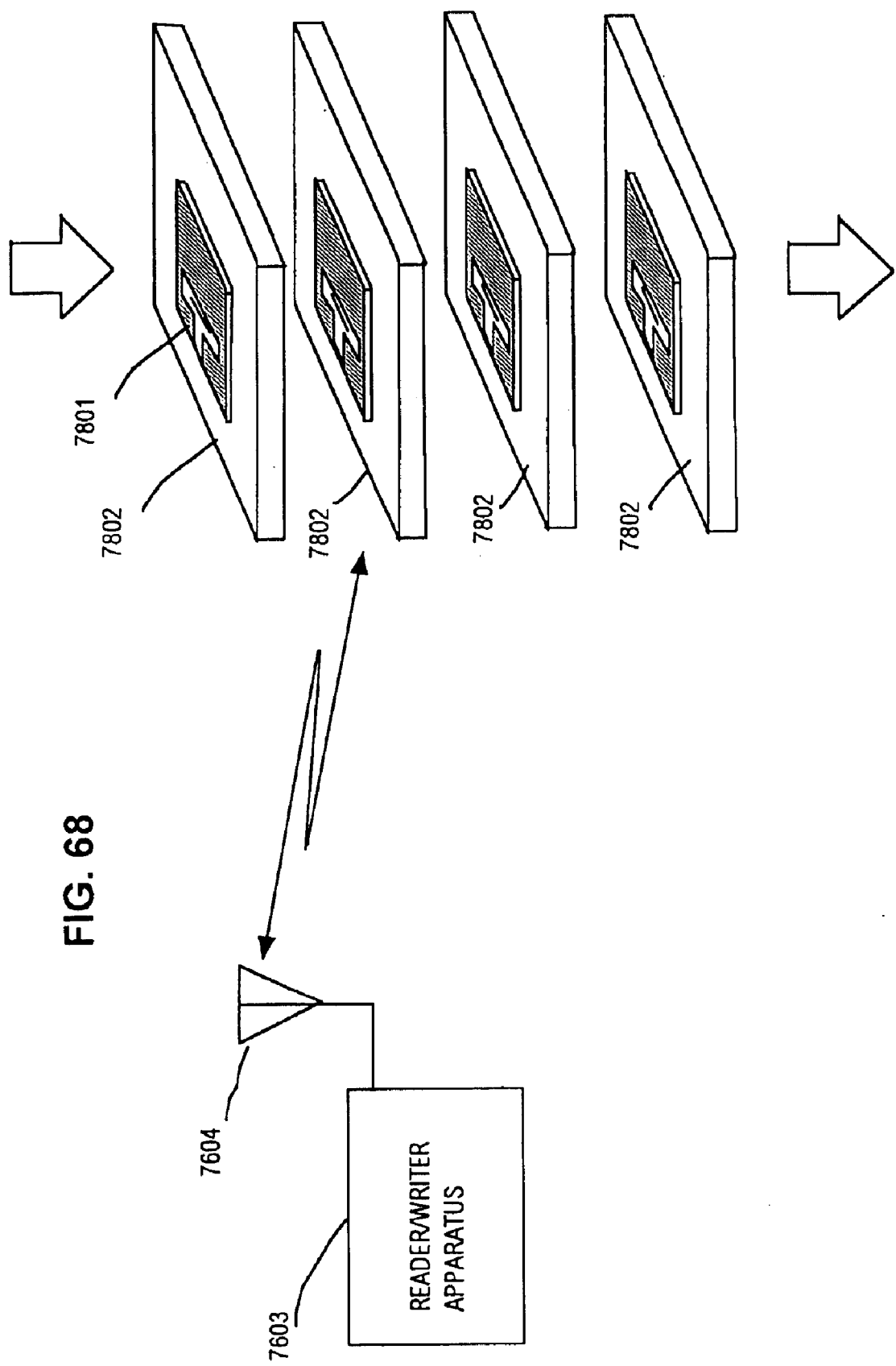

MOBILE BODY DISCRIMINATION APPARATUS FOR RAPIDLY ACQUIRING RESPECTIVE DATA SETS TRANSMITTED THROUGH MODULATION OF REFLECTED RADIO WAVES BY TRANSPONDERS WHICH ARE WITHIN A COMMUNICATION REGION OF AN INTERROGATOR APPARATUS

BACKGROUND OF THE INVENTION

1. Field of the Invention

The invention relates to a mobile body discrimination apparatus in which an interrogator apparatus acquires data by non-contact communication from respective transponders, and in particular whereby such data are transmitted by modulated reflected radio waves

2. Description of Prior Art

Types of mobile body discrimination apparatus are known in the prior art, whereby continuous-wave (abbreviated in the following to CW) radio waves, at frequencies which are typically in the microwave or UHF (ultra-high frequency) range, are produced from an interrogator apparatus and are reflected by an antenna of a transponder back to the interrogator apparatus, with the reflection characteristics of the transponder antenna being modulated in accordance with information such as transponder identification information, so that the reflected radio waves convey that information to the interrogator apparatus. An example of such a system is described in Japanese patent HEI 1-182782. Other systems are known in the prior art whereby the DC supply power for operating the circuits of such a transponder is obtained by rectifying the radio waves received from the interrogator apparatus. Such an apparatus is for example described in Japanese patent SHO 63-5287.

Other types of systems are known whereby the interrogator apparatus is equipped with a directional antenna, which functions both to acquire data from transponders and to determine the size of a communication region (i.e., a region which transponders may enter and within which communication between a transponder and the interrogator apparatus is possible) in accordance with the level of transmission power of the interrogator apparatus. Such a system is described for example in Japanese patent HEI 6-71224. With another prior art system, spread-spectrum radio waves are transmitted by the interrogator apparatus to perform communication with transponders, as described in Japanese patent HEI 5-297131.

In the following, the prior art method described in Japanese patent HEI 1-182782 will be described, referring to the drawings. FIG. 70 shows the configuration of a transponder 80 of that patent, forming part of a non-contact type of discrimination apparatus utilizing radio waves. In FIG. 70, 81 is an antenna, 82 is an oscillator, 83 is an address counter, 84 is a PROM (programmable read-only memory), and 85 is a FET (field effect transistor). The operation of this prior art mobile body discrimination apparatus will be briefly described in the following. Unmodulated radio waves, generated from an interrogator apparatus which is not shown in the drawing, are radiated to reach the transponder 80. Electrical power is continuously supplied to the internal circuits of the transponder 80, by means such as a battery, etc. The oscillator 82 generates a clock signal which is counted by the address counter 83, to thereby generate successive addresses of the PROM 84. When a predetermined address is output from the address counter 83, the PROM 84 generates a code that has been predetermined as specific to the transponder 80. This can for example be an ID (identification) code, which is one of respective ID codes that have been predetermined for various transponders. The FET 85 performs ON/OFF switching in accordance with the ID code, to produce corresponding variations in the impedance of the antenna 81. In that way the transponder 80, by altering the impedance of the antenna 81 in accordance with the ON/OFF switching operations of the FET 85, produces corresponding alterations in the reflection characteristics of the antenna 81, whereby radio waves that are modulated in accordance with the information that is stored in the PROM 84 are reflected back to the interrogator apparatus. The interrogator apparatus can then demodulate the resultant received radio signal, to obtain the information from the transponder 80.

With such a type of transponder, since it is not necessary to provide any form of amplifier in the signal path within the transponder, the power consumption of the circuits of the transponder can be made small. Hence, by rectifying the radio waves which are emitted from the interrogator apparatus, it becomes possible to obtain power for operating the electronic circuits of the transponder, so that the transponder can be implemented such as not to require a battery or other power source. Various forms of such small-scale transponders have been proposed in the prior art, however the range within which communication between such a transponder and an interrogator apparatus can be performed depends upon the amount of power required to operate the circuits of the transponder. Specifically, the amount of power that is available for operating such a transponder is determined by the transmission power level of the interrogator apparatus, the directional characteristics of the antenna of the interrogator apparatus, and the rectification efficiency of the transponder, i.e., its efficiency in converting received radio waves into a DC power supply. In order to increase the size of the region within which communication can be executed between an interrogator apparatus and a transponder, the directional characteristics of the antenna of the interrogator apparatus can be set such as to illuminate a wide region with the radio waves which are transmitted by the interrogator apparatus. However such a widening of the antenna beam of the interrogator apparatus will result in a lowering of the antenna gain factor, so that the strength of the radio waves which are received by a transponder from that interrogator apparatus will be reduced, and the amount of electrical power which can be derived by a transponder will be lowered accordingly. If on the other hand the level of transmission power of the interrogator apparatus is increased, this may result in interference with other systems. Furthermore if the size of the communication region, within which communication can be executed between the interrogator apparatus and transponders, is made large, then the problem arises that a plurality of transponders may be concurrently within that communication region. Conflict will thereby arise between respective received signals that are obtained simultaneously from a plurality of transponders by the interrogator apparatus, so that reliable acquisition of information from the transponders becomes difficult.

Another example of a prior art type of mobile body discrimination apparatus is described in Japanese patent HEI 9-123919, which is a non-contact IC card system.

FIG. 71 shows the communication method of this prior art IC card system. With this system, if a plurality of IC cards 8601a, 8601b, 8601c are within the communication area of an IC card reader/writer apparatus 8602, the apparatus 8602 can access each of those IC cards. The reader/writer apparatus 8602 specifies an initial condition 8603, and timings at which each of the IC cards 8601a, 8601b, 8601c is to transmit a response data block 8604 containing the ID code of the card. The reader/writer apparatus 8602 receives each response data block 604 transmitted by the IC cards 8601a, 8601b, 8601c, and notifies these if data conflict occurs. If conflict occurs, the condition is changed by sending a retransmit request 8605 which specifies an altered condition.

For example the card 8601a transmits the response block 8606 after a time TO has elapsed following reception of the retransmit request, while the other cards 8601b, 8601c retransmit the response block 8606 after a time interval TO+T (ID) has elapsed following reception of the retransmit request. The reader/writer apparatus 8602 processes the response block that has been successfully acquired from the card 8601a without data conflict. The reader/writer apparatus 8602 then again sends the retransmit request 8607, and the card 8601b transmits the response block 8606 after a time TO has elapsed following reception of the retransmit request, while the other card 8601c retransmits the response block 8606 after the time interval TO+T (ID) has elapsed following reception of the retransmit request. By repetitions of such operations, response blocks are received from each of the cards 8601 without data conflict, and communication with a plurality of cards which are all currently within the communication region of the reader/writer apparatus 8602 is thereby achieved.

However with such a method of overcoming the problem of data conflict between transmissions that are received by an interrogator apparatus (i.e., the IC card reader/writer apparatus) from a plurality of transponders, when these transmissions overlap along the time axis, it is difficult to rapidly acquire data from the transponders that are currently within the communication region of the interrogator apparatus since it is not possible to acquire data concurrently from two or more transponders. That is to say, if data conflict occurs, then at least one transponder must then subsequently wait to receive one or more "retransmit" requests from the interrogator apparatus, and respond one or more times to these "retransmit" requests. Thus, such a prior art form of mobile body discrimination apparatus has the disadvantage that respective sets of data cannot be rapidly acquired by the interrogator apparatus (IC card reader/writer) from a plurality of transponders which are all currently within the communication region of the interrogator apparatus.

Another disadvantage of the prior art is as follows. If the internal circuits of a transponder are powered by AC line power, or by an internal battery, then it is possible to perform complex signal processing and to generate an adequate level of transmission power. However such methods are not appropriate with regard to achieving small size and light weight of a transponder, with low manufacturing cost and long operating life. For that reason, a type of transponder has been devised, for example as described in Japanese patent No. HEI 63-54023, whereby the power for operating the circuits of the transponder is obtained from radio waves that are directed to the transponder from an interrogator apparatus.

FIG. 72 shows the general features of the transponder which is disclosed in that patent. Here, microstrip lines 902 each having a length that is one half of the wavelength of the response signal, and a flat patch type of microwave antenna 8903 are formed by metallizing on a substrate 8901. Microwave radio waves which are received by the antenna are rectified by the diode 8904a, while a response signal is applied to diodes 8904b to be transmitted.

However with such a prior art arrangement for obtaining DC supply power to operate the circuits of a transponder, in order to maximize the amount of energy that is converted to DC supply power by the rectifier element, it is necessary to provide some form of impedance matching circuit for matching the impedance of the antenna to that of the rectifier element. In the prior art, such a matching circuit has been implemented (e.g., as a fixed length of microstrip) on the assumption of using a rectifier element (such as the diode 904a in FIG. 71) which has predetermined standard characteristics. As a result, due to the manufacturing variations which actually occur in the characteristics of such diodes, it has not been possible to ensure that the energy of the received microwaves is efficiently converted to DC power.

Another disadvantage of the prior art technology is as follows. A prior art type of transponder which functions as a non-contact IC card, i.e., which can transmit and receive data to/from an interrogator apparatus (referred to as an IC card reader/writer apparatus) is described in Japanese patent No. HEI 8-252995. FIG. 73 shows the configuration of this prior art non-contact IC card. This has a substrate 7901 having a connecting lead pattern 7902 and an antenna 7903, for performing transmitting and receiving, formed as a patterned portion of a conductive layer on an upper face of the substrate, an insulating spacer 7904 having an aperture 7912 and a through-hole connector 7906 formed therein, and having a ground pattern layer 7905 (i.e., an electrically conductive layer which is connected to the ground potential of the circuits of the IC chip 7907) formed on an upper face 7904a of the spacer, an adhesive film 7911 formed with apertures corresponding to the aperture 7912 and through-hole connector 7906, for attaching the upper face 7901a of the substrate 7901 to the lower face 7904b of the spacer 7904, bumps 7908 (i.e., protrusions formed of a material such as solder, formed on a flip-chip IC to serve as connector elements to the internal circuits of the IC and for attaching the IC to a connecting lead pattern which is formed on a substrate) disposed in the aperture 7912 of the spacer 7904, an anisotropic electrically conducting adhesive material 7909 for attaching and electrically connecting the circuit pattern 7902 to the bumps 7908 of the IC chip 7907, and an epoxy type of molding material 7910 which fills the spaces between the aperture 7912 of the spacer 7904 and the IC chip 7907.

Such a non-contact IC card can be used as a transponder of a mobile body discrimination system, in which case the IC card will be attached by its front or rear face to some article, which might for example be formed of metal. In such a case the problem arises that while the reader/writer unit should be able to receive data from a card irrespective of the direction of orientation of the faces of the card, if the IC card has some object located close to the rear face of the card (i.e., the outer face of the substrate 7901), then the antenna 7903 may become substantially or completely shielded from incident radio waves. Thus, deterioration of the performance of the antenna 7903, and hence a deterioration or complete interruption of communication operation, can occur. Hence, such an IC card is not suitable for use as a transponder which may be attached to a surface of an article with the outer face of the substrate 7901 in proximity to that article.

In the following description and in the appended claims, the term "mobile body discrimination apparatus" will be used to signify a combination of an interrogator apparatus with a plurality of transponders which are designed to operate in conjunction with that interrogator apparatus, while the term "mobile body discrimination system" will be used to signify an overall system which includes such a mobile body discrimination apparatus in conjunction with means for effecting relative movement between a plurality of objects and an antenna (or plural antennas) of the interrogator apparatus, with each of the transponders being configured for transmitting data relating to the corresponding object to which it is attached. Also, in the following description and in the appended claims, the term "scanning" of a plurality of transponders by an interrogator apparatus is to be understood as having a significance which broadly covers the concept of effecting relative motion between the interrogator apparatus and the transponders such that a successive transponders are brought within the communication region of an antenna of the interrogator apparatus. This motion may be continuous or it may be intermittent, for example the relative motion between the interrogator apparatus and respective groups of one or more transponder might in some cases be temporarily halted. In addition, the relative motion may be effected by moving the transponders with the interrogator apparatus held fixed in position, or by moving the interrogator apparatus with the transponders left in a stationary condition.

Furthermore in the following description and in the appended claims, unless otherwise indicated, the term "spread-spectrum radio waves" is to be understood as signifying spread-spectrum radio waves which are not modulated to convey information.

In addition, the term "directivity" is used herein to signify the direction of an axis of maximum antenna gain, of a directional antenna.

SUMMARY OF THE INVENTION

It is an objective of the present invention to overcome the above problems of the prior art. According to a first aspect of the invention, it is an objective to enable rapid and reliable communication operation between an interrogator apparatus and transponders of a mobile body discrimination apparatus, by reducing the possibility of data conflict between respective sets of data that are transmitted by respective ones of a plurality of transponders which are all concurrently within the communication region of the interrogator apparatus.

That is achieved by arranging that the interrogator apparatus periodically transmits a specific code, referred to in the following as the "Response Start command code" to the transponders which are within that communication region, requesting commencement of transmission of respective data sets by these transponders, with the interrogator apparatus transmitting CW radio waves in the intervals between successive transmissions of that command code, and by configuring each of the transponders such as to transmit the corresponding data by modulation of reflected CW radio waves from the interrogator apparatus which are incident on the antenna of the transponder, after a specific delay time interval has elapsed following reception of that Response Start command code, with that delay time interval being separately determined as a randomly selected value (from within a fixed range of possible values)) by each of these transponders, and with a new random value being generated by each transponder each time that the Response Start command code is received.

In that way, the possibility of a plurality of transponders transmitting simultaneously, and thereby causing conflict between sets of data that are received by the interrogator apparatus, is substantially reduced.

As another aspect of the invention, each of the transponder is equipped with a power supply circuit which rectifies the received radio waves from the interrogator apparatus to derive power for operating the circuits of the transponder, and the interrogator apparatus of such a mobile body discrimination apparatus is provided with two antennas, which are spaced apart, so that the respective transmission beams of the antennas are incident on the transponders from two different directions, but with the communication regions of these antennas arranged to overlap to form a common communication region, through which the transponders successively move. A first one of these antennas of the interrogator apparatus transmits only CW radio waves, while the second antenna periodically transmits the aforementioned "response start" command code to the transponders which are within that common communication region and transmits CW radio waves in the intervals between successive transmissions of that command code. In addition, the interrogator apparatus is configured such that transmission of the CW radio waves by the first antenna is interrupted during each of respective time intervals in which the Response Start command code is transmitted by the other antenna. In that way, it is ensured that the internal power supply circuit of each transponder can generate a sufficiently high level of power for operating the circuits of the transponder, irrespective of the orientation of the transponder in relation to the interrogator apparatus, since CW radio waves are incident on the antenna of each transponder from two different directions during each of the time intervals between transmissions of the Response Start command code.

This further serves to enable reliable communication operation between an interrogator apparatus and a plurality of transponders which are concurrently within the communication region of that interrogator apparatus.

As an alternative arrangement, in the case of an application in which a stream of transponders moves continuously or intermittently along a fixed path in a fixed direction, the communication region of the first antenna can be positioned spaced apart from but partially overlapping the communication region of the other antenna, such that the transponders will successively move first through the communication region of the first antenna and thereby receive the CW radio waves from that antenna, then move through the communication region of the second antenna to then receive the CW radio waves and transmissions of the Response Start command code from the second antenna. This has the advantage that the stream of transponders can move more rapidly, since it can be ensured that the internal power supply circuit of each transponder which enters the communication region of the second antenna will already be providing a sufficiently high level of power to fully operate the circuits of the transponder. This is desirable, since with a practical type of power supply circuit for a transponder, in which smoothing of a generated DC supply voltage is applied, a certain amount of time will elapse between the point at which radio waves first become incident on the antenna of the transponder and the point at which the level of output power that is available will become sufficient. Hence, this aspect of the invention also serves to enable reliable communication operation between an interrogator apparatus and a plurality of transponders which are concurrently within the communication region of that interrogator apparatus.

According to another aspect of the invention, when a mobile body discrimination apparatus is applied in a mobile body discrimination system whereby a stream of items having respective transponders attached thereto are moved along a fixed path by means such as a conveyer belt, the antennas of the interrogator apparatus are supported and enclosed within a housing which is formed of a material suitable for shielding of radio waves and is shaped with a central aperture, to permit transfer of the items with the transponders attached thereto through the central aperture by the conveyer belt. If the mobile body discrimination apparatus has two antennas which are to be arranged such as to overlap to form a common communication region, then these antennas are attached within the housing, at respective positions located on the periphery of the central aperture, respectively oriented such as to form the common communication region (30) within the central aperture. Alternatively, the antennas can be positioned and oriented such as to form two partially overlapping communication regions through which the transponders successively pass.

According to another aspect, the invention achieves the objective of providing a mobile body discrimination apparatus capable of rapidly acquiring respective sets of data from a plurality of transponders which are currently within a communication region of an interrogator apparatus, by providing the interrogator apparatus with two antennas which are spaced apart and oriented such that respective communication regions of the antennas will substantially entirely overlap one another in a common communication region, with these antennas being driven by two different types of spread-spectrum radio waves in the intervals between successive transmissions of the Response Start command code. This has the advantage that there the occurrence of standing waves within that common communication region is substantially eliminated, thereby eliminating variations in the level of electric field strength of radio waves received by transponders which are moving through that communication region, i.e., variations caused by standing waves which can occur when both of the antennas transmit CW radio waves. Each of the antennas supplies a received signal to a corresponding receiving section, which can only demodulate a signal that is conveyed by modulated reflected spread-spectrum radio waves of the type which are transmitted by the corresponding antenna, and the interrogator apparatus is equipped with means for judging respective strengths of signals which are received via the two antennas. When a transponder transmits data by modulating the received radio waves which are of these two different types, then one of the resultant transmitted signals will be stronger than the other, as determined by the position of the transponder in relationship to the two antennas, and the data conveyed by the stronger one of these signals are selected by the interrogator apparatus to be stored in memory. In that way, greater reliability of acquiring data from a plurality of transponders within the communication region can be achieved.

More specifically, the interrogator apparatus of such a mobile body discrimination apparatus consists of first and second antennas, first transmitting means controlled by the control means to periodically drive the first antenna to transmit modulated radio waves conveying a transmission start command code and to drive the first antenna to transmit spread-spectrum radio waves which have been generated using a first pseudo-noise code sequence during intervals between transmitting the transmission start command code, and second transmitting means which are controlled by the control means to periodically drive the second antenna to transmit modulated radio waves conveying the transmission start command code, and to drive the second antenna to transmit spread-spectrum radio waves which have been generated using a second pseudo-noise code sequence which is different from the first pseudo-noise code sequence, during intervals between transmitting the transmission start command code. The interrogator apparatus further includes first receiving means which are coupled to the first antenna for obtaining respective data sets which are transmitted from the transponders, conveyed by modulated reflected spread-spectrum radio waves which have been transmitted by the first antenna, and second receiving means which are coupled to the second antenna for obtaining respective data sets from the transponders, conveyed by modulated reflected spread-spectrum radio waves which have been transmitted by the second antenna, and means for judging the respective strengths of two signals being concurrently received via respective ones of the two antennas and for storing data conveyed by the stronger of these signals in a memory of the interrogator apparatus.

With another form of such an apparatus in which the interrogator apparatus transmits two different types of spread-spectrum radio waves as described above, it is arranged that when the transponders of such a mobile body discrimination apparatus move as a stream along a fixed path, for example when attached to respective articles which are transported by a conveyer belt, then the two communication regions of the two antennas are positioned to the left and right sides respectively of the center of that path, so that approximately half of the transponders will reflect only one type of spread-spectrum radio waves and the majority of the remainder of the transponders will reflect only the other type. In that way, the interrogator apparatus can acquire respective sets of data from two transponders which are respectively situated in these two different communication regions and are transmitting data concurrently, so that the speed of acquiring data from the transponders can be increased.

Alternatively, the two communication regions can be arranged respectively at an upstream position and a downstream position with respect to the flow of transponders, so that each transponder will pass successively through both of the communication regions. In that case, the mobile body discrimination apparatus is preferably configured such that each transponder transmits (together with its data set) an ID code and that when the interrogator apparatus successfully receives the ID code and data from a transponder which is passing through the upstream communication region, the interrogator apparatus then transmits a Transmission Halt command code together with the ID code of that transponder, with the transponder being configured to be thereby inhibited from making any further transmissions while passing through the remainder of that upstream communication region and through the downstream communication region. In that way, the same effect is achieved as if the number of transponders which pass through the downstream communication region were to be substantially reduced, so that the overall permissible rate of flow of transponders can be increased.

Alternatively, with such an arrangement of the two antennas, such a mobile body discrimination apparatus can be configured with detector means located adjacent to the flow path of the transponders, at a position preceding (i.e., upstream from) the aforementioned upstream communication region, for detecting transfer of successive numbers of the transponders along the fixed path and for producing signals indicative of the numbers, and operation control means provided in the interrogator apparatus, responsive to the signals from the detector means for selectively enabling and inhibiting operation of at least a part the transmission circuits and receiving circuits corresponding to the upstream communication region (for example by switching off the supply of power to these circuits, to thereby reduce the energy requirements of the apparatus) in accordance with the detected rate of flow of the transponders.

According to another aspect of the invention, with a mobile body discrimination apparatus in which the interrogator apparatus transmits respectively different types of spread-spectrum radio waves via two antennas which define a common communication region, transmission via each of these antennas is alternately enabled and inhibited during successive time intervals, such that at any point in time, radio waves are transmitted from only one of the antennas. This serves to increase reliability of receiving data from the transponders, and enables the circuit configuration of the interrogator apparatus to be simplified, since data are only received via one antenna at a time.

According to another aspect of the invention, with a mobile body discrimination apparatus in which the interrogator apparatus transmits respectively different types of spread-spectrum radio waves via two antennas, these antennas are polarizing antennas having respectively different types of polarization, while in addition each of the transponders is provided with a polarizing antenna, and it is arranged that approximately half of the transponders have an antenna with the first type of polarization and the remainder have an antenna with the second type of polarization. As a result, even if two antennas which are within the same communication region of the interrogator apparatus should each randomly determine approximately the same time point to begin transmitting data, no conflict will occur in the data received by the interrogator apparatus, if these transponders have respectively different types of polarizing antennas. That is to say, the permissible number of transponders which can be currently located within a communication region can be substantially increased without increasing the frequency of occurrence of data conflict, so that the rate of scanning transponders can be effectively increased.

Alternatively, each of the transponders is provided with two polarizing antennas, of the first and second types of polarization respectively, and two separate sets of transmitting/receiving circuits coupled to these, each controlled to transmit respective sets of data at a randomly determined time point following reception of a transmission start command code from the interrogator apparatus. In that way, the interrogator apparatus can acquire two sets of data (e.g., an identification code and data concerning an object) concurrently from each transponder, i.e., transmitted in parallel by modulated reflected spread-spectrum radio waves that are respectively of the first and second polarization types and so are received via respective ones of the two polarizing antennas of the interrogator apparatus, so that the speed of acquiring all requisite information from each of the transponders within a communication region of the interrogator apparatus can be substantially increased.

As a further alternative configuration of such a mobile body discrimination apparatus in which the interrogator apparatus transmits spread-spectrum polarized radio waves of two different types of polarization via two antennas, each of the transponders can be provided with first and second polarizing antennas of the first and second types of polarization, with the first antenna being coupled to supply received signals to a receiving circuit and the second antenna being coupled to transmit signals which are generated by a transmitting circuit, i.e., as modulated reflected spread-spectrum polarized radio waves which convey a set of data. In that case, the interrogator apparatus can not only periodically transmit to each transponder the aforementioned Response Start command code, but can also at other times transmit to all of the transponders within a communication region (or to specific transponders, indicated by respective ID codes) arbitrary data, with these data being received via the first polarizing antenna of a transponder at the same time that the transponder is transmitting a response data set via the second polarizing antenna. In that way, for example, function such as updating the data held in a memory of a transponder can be performed without affecting the speed of acquiring data from each of the transponders that are within the communication region.

As a further alternative configuration of such a mobile body discrimination apparatus in which the interrogator apparatus transmits spread-spectrum polarized radio waves of two different types of polarization via two antennas, each of the transponders can be provided with first and second polarizing antennas of the first and second types of polarization, which are coupled to respectively separate transmission circuits and respectively separate receiving circuits, and also are coupled to respectively separate power supply circuits which rectify received radio waves to provide an internal power source for operating the circuits of the transponder, and with the transponder further including a power comparison section which compares the respective levels of supply power that are available from these two power supply circuits. The power comparison section judges which of the two antennas is currently receiving the higher level of incident radio waves, based on the available power supply levels, and applies control whereby the transmission and receiving circuits which are coupled to the antenna having that higher level of incident radio waves is set in the operating condition, while the transmission and receiving circuits which are coupled to the other one of the two antennas are set in inoperative condition. In practice, the power levels can simply be judged based on respective output DC voltage levels.

In that way, it is ensured that each transponder performs transmission and receiving operation by utilizing the polarized radio waves received from the one of the antennas of the interrogator apparatus that is optimally oriented with respect to that transponder, i.e., a form of polarization diversity operation is performed. Hence, greater speed and reliability of communication between the interrogator apparatus and the transponders which are currently within a communication region of the interrogator apparatus can be achieved.

More specifically, each transponder of such a mobile body discrimination apparatus can be formed of a first polarizing antenna having a first direction of polarization and a second polarizing antenna having a second direction of polarization, a first power supply circuit coupled to the first polarizing antenna, for converting a signal received by the antenna to a supply of electrical power for operating at least a part of all circuits of the transponder, and a second power supply circuit coupled to the second polarizing antenna, for converting a signal received by the antenna to a supply of electrical power for operating at least a part of all circuits of the transponder, first receiving means coupled to the first polarizing antenna, for obtaining the transmission start command code and supplying the transmission start command code to the response timing control means, second receiving means coupled to the second polarizing antenna, for obtaining the transmission start command code and supplying the transmission start command code to the response timing control means, first modulator means controllable for varying a reflection condition of the first polarizing antenna, and second modulator means controllable for varying a reflection condition of the second polarizing antenna, and a power comparison circuit for judging which of the first and second power supply circuits is currently providing a higher level of supply power, and for applying control to enable operation of the one of the first modulator means and second modulator means which corresponds to the antenna that provides the higher level of supply power while inhibiting operation of the other one of the first modulator means and second modulator means.

According to another aspect, the invention provides a mobile body discrimination apparatus in which each transponder performs the aforementioned modulation of radio waves that are reflected from its antenna by applying amplitude modulation, and in particular multi-level ASK (amplitude shift keying) modulation, with an arbitrarily determined depth of ASK modulation being applied by a transponder each time that the Response Start command code is received. The interrogator apparatus in this case is configured to be capable of discriminating and separately storing respective sets of data which are transmitted using different depths of ASK modulation, so that it becomes possible for respective sets of data which are transmitted concurrently by two transponders within the communication region to be correctly received by the interrogator apparatus, if the two data sets have been transmitted using respectively different depths of ASK modulation. Each transponder performs this modulation by selecting alternate ones of a pair of arbitrarily absorber elements to be connected and disconnected to the antenna of the transponder, to thereby vary the degree of absorption of incident radio waves.

More specifically, each transponder of such an apparatus includes comprises modulator means having a plurality of absorber elements for applying respectively different degrees of absorption of the radio waves reflected by the antenna of the transponder, response timing control means, selection control means for generating a selection control signal which specifies an arbitrarily determined pair of the absorber elements, and absorber element selector means controlled by the selection control signal to select a pair of the plurality of absorber elements each time that the Response Start command code is obtained by the receiving means, and for effecting variation of the reflection condition of the antenna by selectively connecting the selected pair of absorber elements to the antenna in accordance with a signal that is to be transmitted, to thereby perform amplitude modulation of the reflected radio waves with a modulation depth determined by the arbitrarily determined pair of absorber elements. In addition, the interrogator apparatus includes data processing means for operating on an output signal produced from the receiving means of the interrogator apparatus for extracting, from the output signal, respective sets of data which have been transmitted by the transponders by modulation utilizing the arbitrarily determined pairs of absorber elements.

Since such a mobile body discrimination apparatus enables data to be correctly acquired by the interrogator apparatus, without conflict, from two transponders which are within the communication region and are transmitting (using respectively different depths of ASK modulation) concurrently, the number of transponders which can be concurrently within that communication region can be increased, i.e., the rate of scanning transponders can be increased.

Alternatively, such a mobile body discrimination apparatus can be configured such that each transponder responds to reception of the Response Start command code from the interrogator apparatus (after the aforementioned randomly determined time interval) by first transmitting a header containing an identification code, using a relatively high depth of amplitude modulation of the reflected radio waves, then transmitting a set of data by using a relatively low depth of amplitude modulation. The header also contains information for use by the interrogator apparatus in correctly extracting the transmitted data set in the event that conflict occurs between reception of that data set and of data transmitted at the same time by some other transponder. In addition, the interrogator apparatus is configured such that when a complete identification code and data set are received from a transponder, a command is transmitted to that transponder which has the effect of terminating any further transmissions from that transponder so long as it remains within the communication region of the interrogator apparatus. In that way, data can be rapidly acquired in succession from the transponders which are currently within the communication region, without data conflict being produced as a result of any unnecessary transmissions from the transponders.

According to another aspect, the invention provides a mobile body discrimination apparatus in which each transponder performs the aforementioned modulation of radio waves that are reflected from its antenna by applying phase modulation, and in particular PSK (phase shift keying) modulation, by selecting a pair of phase shifters from a plurality of phase shifters and alternately connecting respective ones of the selected pair to the antenna of the transponder, in accordance with the data to be transmitted. Each transponder is configured such that when the transponder first enters a communication region of the interrogator apparatus, it responds to a first reception of the Response Start command code by transmitting an identification code and set of data through PSK modulation using a relatively small degree of phase shift, and responds to a second and any subsequent reception of the Response Start command code by transmitting an identification code and set of data through PSK modulation using a relatively large degree of phase shift. The interrogator apparatus is configured such that when the identification code and data are successfully received from a transponder, a command signal is transmitted which has the effect of terminating any further transmissions from that transponder so long as it remains within the communication region of the interrogator apparatus. As a result, priority is automatically assigned to reception by the interrogator apparatus of data sent from any transponder which has made a first attempt at transmitting and has failed in that attempt (e.g., due to an unfavorable orientation of the transponder). Hence, data can be rapidly acquired from successive transponders which enter the communication region of the interrogator apparatus, with reduced possibility that a transponder might traverse the communication region without communicating successfully with the interrogator apparatus.

Alternatively, with such a mobile body discrimination apparatus, each transponder applies a fixed degree of phase shift in performing PSK modulation, but is configured such that when the transponder first enters a communication region of the interrogator apparatus, it responds to a first reception of the Response Start command code by transmitting an identification code and set of data through PSK modulation using that fixed degree of phase shift, but with a specific amount of attenuation applied to the phase-modulated reflected radio waves, and responds to a second and any subsequent reception of the Response Start command code by transmitting the identification code and set of data through PSK modulation using the same degree of phase shift, but with the attenuation of the phase-modulated radio waves removed. In addition, as described above, the interrogator apparatus is configured such that when the identification code and data are successfully received from a transponder, a command signal is transmitted which has the effect of terminating any further transmissions from that transponder so long as it remains within the communication region of the interrogator apparatus.

Thus such an arrangement serves to ensure that the interrogator apparatus can assign priority to receiving data which are transmitted from a transponder which has failed in a first attempt at communication, since such data will be conveyed to the interrogator apparatus by radio waves at a higher amplitude than in the case of other transponders, enabling the interrogator apparatus to recognize and appropriately process a signal which is received from such a transponder that has failed in a first attempt at communication.

According to another aspect, the invention provides a rectifier circuit as a power supply circuit for deriving the operating power of a transponder from received radio waves, whereby optimum rectification efficiency can be achieved when such transponders are mass-manufactured, irrespective of manufacturing variations in the impedance characteristics of the rectifier elements (in general, diodes).

Specifically, such a rectifier circuit includes a rectifier element, impedance matching means (such as a microstrip transmission line of predetermined length) for transferring a signal received by the transponder antenna to an input terminal of the rectifier element, and a low-pass filter for smoothing a rectified output voltage produced at an output terminal of the rectifier element, with the rectifier circuit also including an impedance adjustment element which is coupled to the rectifier element and is adjusted to optimize a degree of rectification efficiency of the rectifier circuit means, by applying compensation for a deviation of an impedance parameter of the rectifier element from a nominal predetermined value of the parameter. In the case of a diode rectifier element, the impedance parameter for which adjustment is applied is the value of capacitance between the diode terminals.

In the case of a such a rectifier circuit in which the diode is connected in series with the antenna, adjustment to compensate for the manufacturing deviations of the diode characteristics can be performed by variation of a capacitor that is connected between the input terminal of the diode and the output terminal, i.e. the input of the low pass filter, while supplying a fixed-amplitude test signal in place of an antenna signal and monitoring the resultant available output power level from the rectifier circuit (e.g., as expressed by the on-load voltage) until that power level attains a predetermined minimum acceptable value. In the case of a rectifier circuit in which the diode is connected in parallel with the antenna, such an adjustment capacitor is connected between the input terminal of the diode and the circuit ground potential.

When the transponder is manufactured as an integrated circuit chip (containing a rectifier circuit and the other circuits of the transponder) which is mounted as a bare chip on a substrate in flip-chip configuration (i.e., with connector "bumps" of the integrated circuit chip directly attached to connecting leads formed on that substrate), the invention provides a simple arrangement whereby the aforementioned compensation capacitor adjustment can be readily performed under conditions of mass-production. This is achieved by configuring the adjustment capacitor as a first conductive layer portion that is formed on the substrate and a second conductive layer portion that is disposed such as to be moved towards the first conductive layer portion as the integrated circuit chip is moved towards the substrate, e.g., by forming that second conductive layer portion on the same side of the integrated circuit chip as the "bumps" with the first conductive layer portion directly below. In that case, since the bumps are generally formed of a relatively ductile metal, the aforementioned capacitance adjustment can be performed by applying force in a direction such as to gradually move the integrated circuit chip towards the substrate (i.e., by compressing the "bumps") to thereby successively increase the value of the compensation capacitance.

Alternatively, impedance adjustment to compensate for the manufacturing variations of the rectifier element can be implemented by connecting an adjustable inductor in parallel with the rectifier element (i.e., in series with a DC blocking capacitor). In the case of the above-mentioned flip-chip configuration, such an inductor can be formed on the substrate as a flat spiral inductor directly below the integrated circuit chip, with a number of downward-oriented electrically interconnected protrusions (e.g., formed of the same material as the "bumps") which are of respectively varying heights being formed on the integrated circuit chip. With that arrangement, variation of the inductor can be performed by applying force in a direction such as to gradually move the integrated circuit chip towards the substrate, to thereby successively decrease the value of the compensation inductance as successive adjacent portions of the spiral inductor become short-circuited by the protrusions.

As a further aspect, the invention provides a mobile body discrimination apparatus in which the radio waves transmitted by the interrogator apparatus are in the microwave frequency range, and each transponder is configured in the form of an IC card, (i.e., with a bare chip IC mounted on a substrate in flip-chip form as described above) and is capable of communicating with the interrogator apparatus, while within the communication region of the interrogator apparatus, irrespective of whether an arbitrarily determined face of the IC card is shielded from incident radio waves. Thus, such transponders can be attached to various objects without regard for the orientations of the transponders on these objects. This is achieved by using a pair of slot antennas, one on either face of the IC card, to perform the functions of the transponder antenna such that even if one of the slot antennas becomes inoperative due to shielding, the other slot antenna will function effectively.

More specifically, such a transponder can be configured as an IC card having a substrate with patterned connecting leads formed on an upper face and an integrated circuit chip in bare chip condition, which constitutes respective internal circuits of the transponder and has a plurality of connector elements (i.e., "bumps") coupled to the internal circuits formed thereon, mounted on the upper face of the substrate, with the IC card comprising:

an antenna connecting lead constituted by a part of the patterned connecting leads, coupled through one of the connector elements to the internal circuits; and first and second layers of electrically conductive material formed respectively formed on opposite sides of the IC card, having respective slot apertures formed therein, the slot apertures being located in a predetermined position relationship to specific portions of the antenna connecting lead to thereby constitute first and second slot antennas, with each of the slot antennas functioning independently of the other one as the antenna of the transponder. In particular, such an IC card transponder can be configured with the antenna connecting lead having a first branch portion and a second branch portion which respectively extend from a junction thereof, each of the first and second branch portions having a length that is determined in accordance with a wavelength of the radio waves transmitted by the interrogator apparatus, with the antenna connecting lead having a common portion which extends between the junction and one of the connector elements, and with the transponder having:

a second substrate formed with an aperture for accommodating the integrated circuit chip and having a lower face thereof fixedly attached to the upper face of the first substrate;

a first layer of electrically conductive material formed over a lower face of the first substrate, having a first slot aperture formed therein, with the first slot aperture located directly over a part of the first branch portion of the antenna connecting lead;

a second layer of electrically conductive material formed over an upper face of the second substrate having a second slot aperture formed therein, with the second slot aperture located directly above a part of the second branch portion of the antenna connecting lead; and connection means such as through-hole connectors, coupled to one of the connector elements of the integrated circuit chip and to each of the first layer of electrically conductive material and second layer of electrically conductive material, for connecting each of the layers to a ground potential of the internal circuits of the transponder.

In that case, the first slot aperture in conjunction with the first branch portion of the antenna connecting lead constitutes a first slot antenna and the second slot aperture in conjunction with the second branch portion of the antenna connecting lead constitutes a second slot antenna.

As a further aspect, the invention provides a mobile body discrimination apparatus in which the radio waves transmitted by the interrogator apparatus are in the microwave frequency range, and each transponder is configured in the form of an IC card, wherein the transponder antenna is implemented as a slot antenna of co-planar form, which is shaped from a single layer of electrically conductive material formed on a substrate to which the IC is attached. Since the slot aperture and antenna connecting lead of such an antenna are co-planar, the directivity of the antenna is oriented perpendicular to the plane of the substrate surface. Hence, such a transponder can be attached to an object by either of its two main faces, with no danger that this will cause shielding of the antenna from incident radio waves.

More specifically, such a transponder, structured as an IC card having a substrate and an integrated circuit chip which constitutes respective internal circuits of the transponder and has a plurality of connector elements coupled to the internal circuits formed thereon, mounted in bare chip form on an upper face of the substrate, can consist of first and second portions of a patterned layer of electrically conductive material formed over the upper face of the substrate, with the first portion connected to the internal circuits and shaped to constitute a co-planar antenna connecting lead of a slot antenna, and the second portion connected to a ground potential of the internal circuits and shaped with a cut-out portion which extends to an edge of the upper face, to constitute the slot antenna in conjunction with the antenna connecting lead.

BRIEF DESCRIPTION OF THE DRAWINGS

FIG. 29 is a system block diagram of an interrogator apparatus in accordance with a 13$^{th}$ embodiment of the invention;

FIG. 34A is a view in elevation of a mobile body discrimination system in accordance with a 16$^{th}$ embodiment, wherein an interrogator apparatus of a mobile body discrimination apparatus is automatically moved to scan a plurality of transponders which are attached to respective stored articles;

FIG. 66 is a conceptual diagram in accordance with a 29$^{th}$ embodiment, of an IC card and an IC card reader/writer apparatus utilized to implement a mobile body discrimination system, wherein the IC card is provided with respective slot antennas on a face which is attached to an article and on an opposing face thereof, to enable communication with the reader/writer apparatus irrespective of the manner of attachment;

FIGS. 67A, 67B are cross-sectional views in plan and elevation respectively of an IC card in accordance with a 30$^{th}$ embodiment, having a slot antenna which is configured to be co-planar with a ground pattern layer and connecting lead of the antenna;

FIG. 68 is a conceptual diagram for illustrating how the sideward-oriented directivity of the antenna of the IC card of FIGS. 67A, 67B is utilized when communicating with a reader/writer apparatus;

DESCRIPTION OF PREFERRED EMBODIMENTS

1$^{st}$ Embodiment

Figure 1:
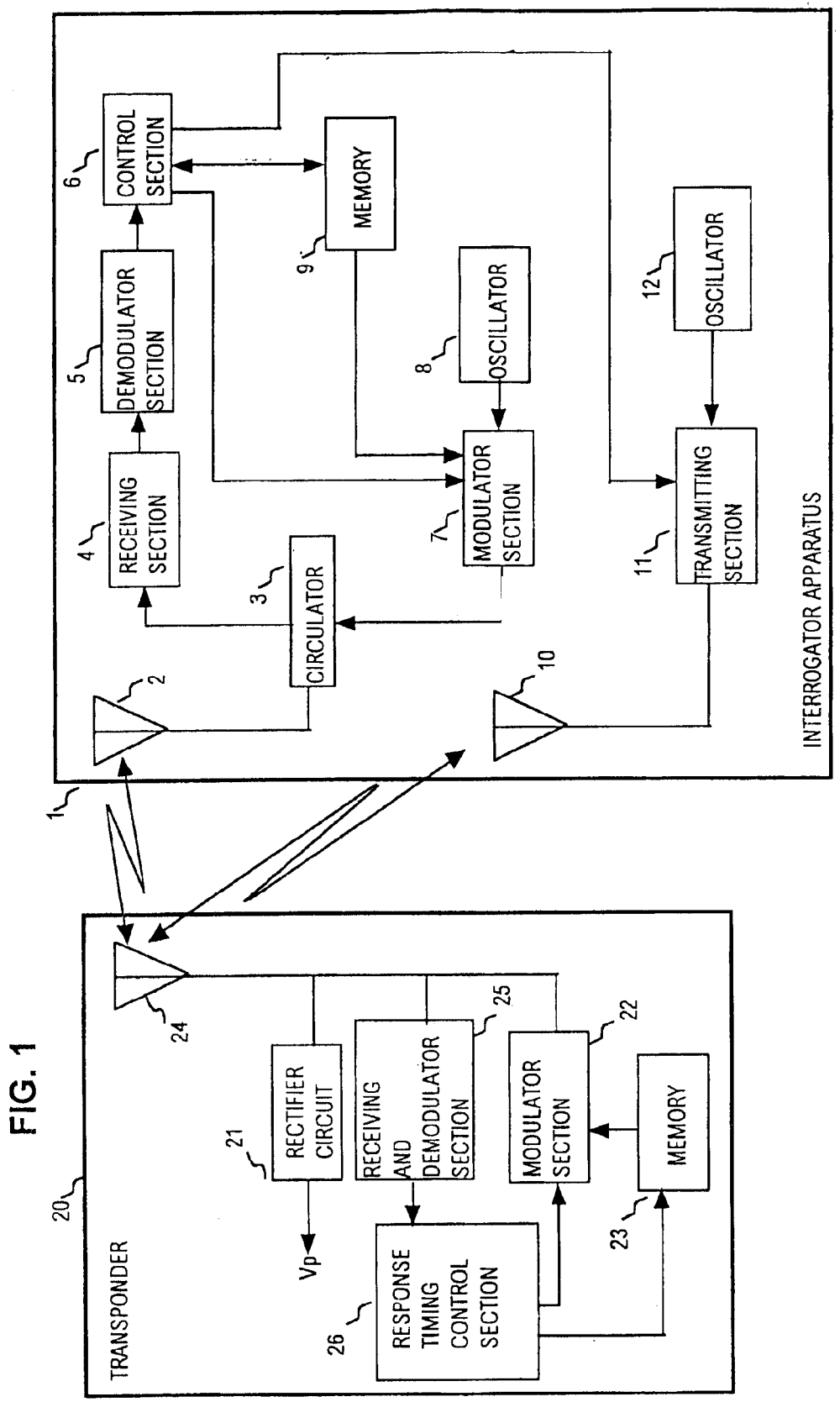
FIG. 1 is a general system block diagram of a first embodiment of the invention, which is an interrogator apparatus and a transponder of a mobile body discrimination apparatus.

A first embodiment of the invention will be described in the following, referring to FIGS. 1 to 3. In FIG. 1, numeral 1 denotes an interrogator apparatus which transmits radio waves of high frequency, for example in the microwave range, 20 denotes a transponder which may be one of a plurality of transponders which are currently capable of communicating with the interrogator apparatus, 2 denotes a first antenna of the interrogator apparatus 1, 3 denotes a circulator which is connected to the first antenna 2, 4 denotes a receiving section which is connected to the circulator 3, 5 denotes a demodulator section for demodulating the output from the receiving section 4, 6 denotes a control section, 7 denotes a modulator section which is connected to the circulator 3 and generates a modulated output signal having a frequency in the microwave range, 8 denotes a source, such as an oscillator, of a high frequency signal having a fixed frequency, 9 denotes a memory, 10 denotes a second antenna, 11 denotes a transmitting section which is connected to the second antenna 10, and 12 denotes a second source, such as an oscillator, which generates a high frequency signal having a fixed frequency.

Numeral 24 denotes the antenna of the transponder 20, 21 denotes a rectifier circuit which is connected to the antenna 24, 22 denotes a modulator section which is connected to the antenna 24, 23 denotes a memory which is connected to the modulator section 22, and 25 is a receiving and demodulator section that is connected to the antenna 24 for demodulating request signals which are sent from the interrogator apparatus as modulated microwave transmissions. Numeral 26 denotes a response timing control section which is connected to the receiving and demodulator section 25 and which determines the timings at which data are transmitted to the interrogator apparatus 1 in response to request signals transmitted from the interrogator apparatus.

Figure 3:
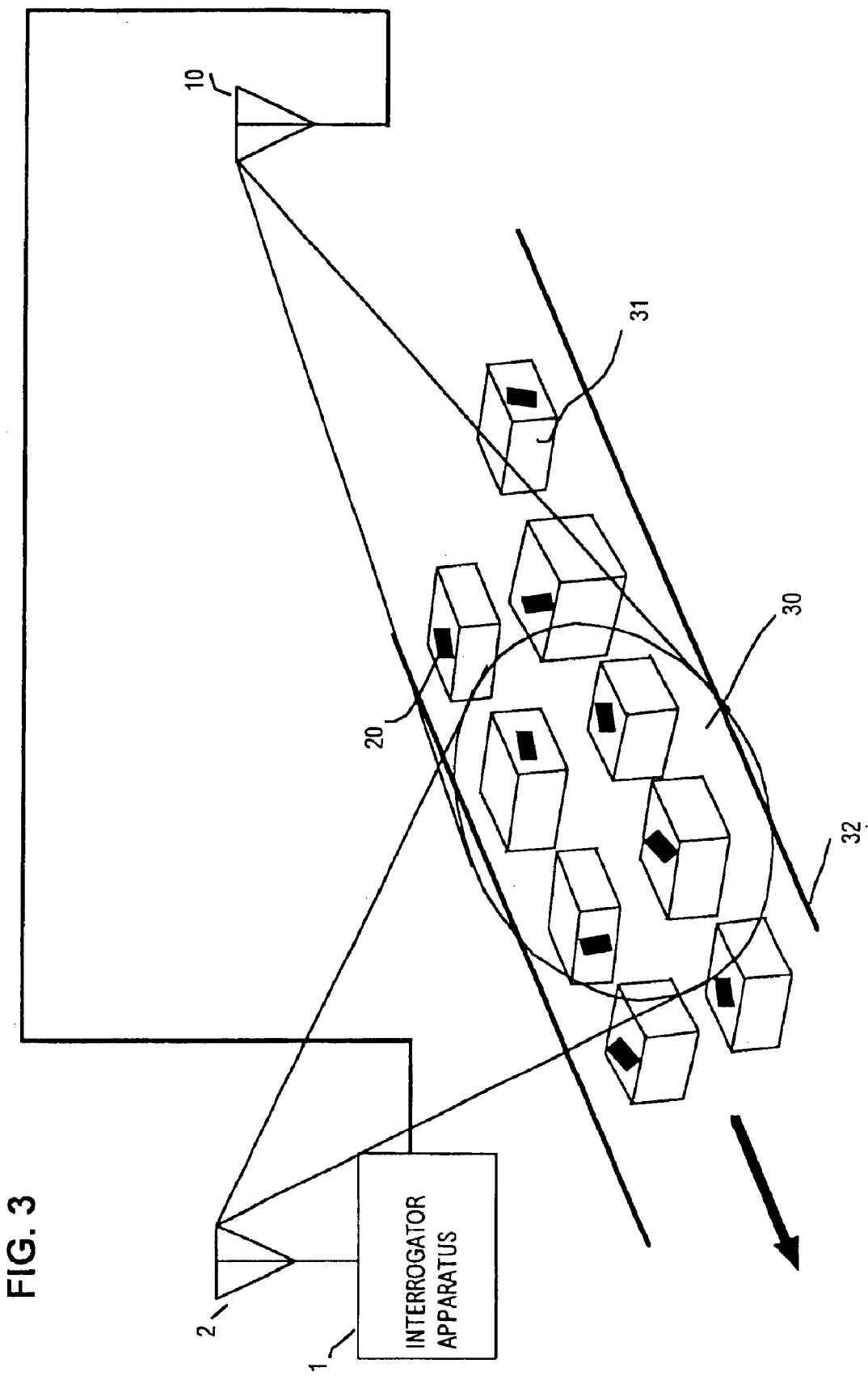
FIG. 3 is a conceptual diagram showing a mobile body discrimination system, which utilizes a mobile body discrimination system of the form shown in FIG. 1.

FIG. 3 is a conceptual diagram for showing the position relationships between the interrogator apparatus 1 and a plurality of transponder 20 of an mobile body discrimination system embodiment. In FIG. 3, numeral 30 denotes a communication region (whose boundary defines the limit of the area within which a transponder may be located and be able to communicate with the interrogator apparatus 1), and 31 denotes respective load items which can be of various different sizes, such as pieces of baggage, with each of these having a transponder 20 attached thereto. 32 denotes a conveyer belt which transports the load items 31 in the direction indicated by the arrow. The respective communication regions for the first antenna 2 and the second antenna 10 of the interrogator apparatus 1 are substantially identical in size and are positioned to overlap one another to form a single communication region 30, but the two antennas emit radio waves in respectively different directions with respect to the transponder 20. For example as shown, the first antenna 2 and the second antenna 10 can be located on opposite sides of the conveyer belt 32.

Figure 2:
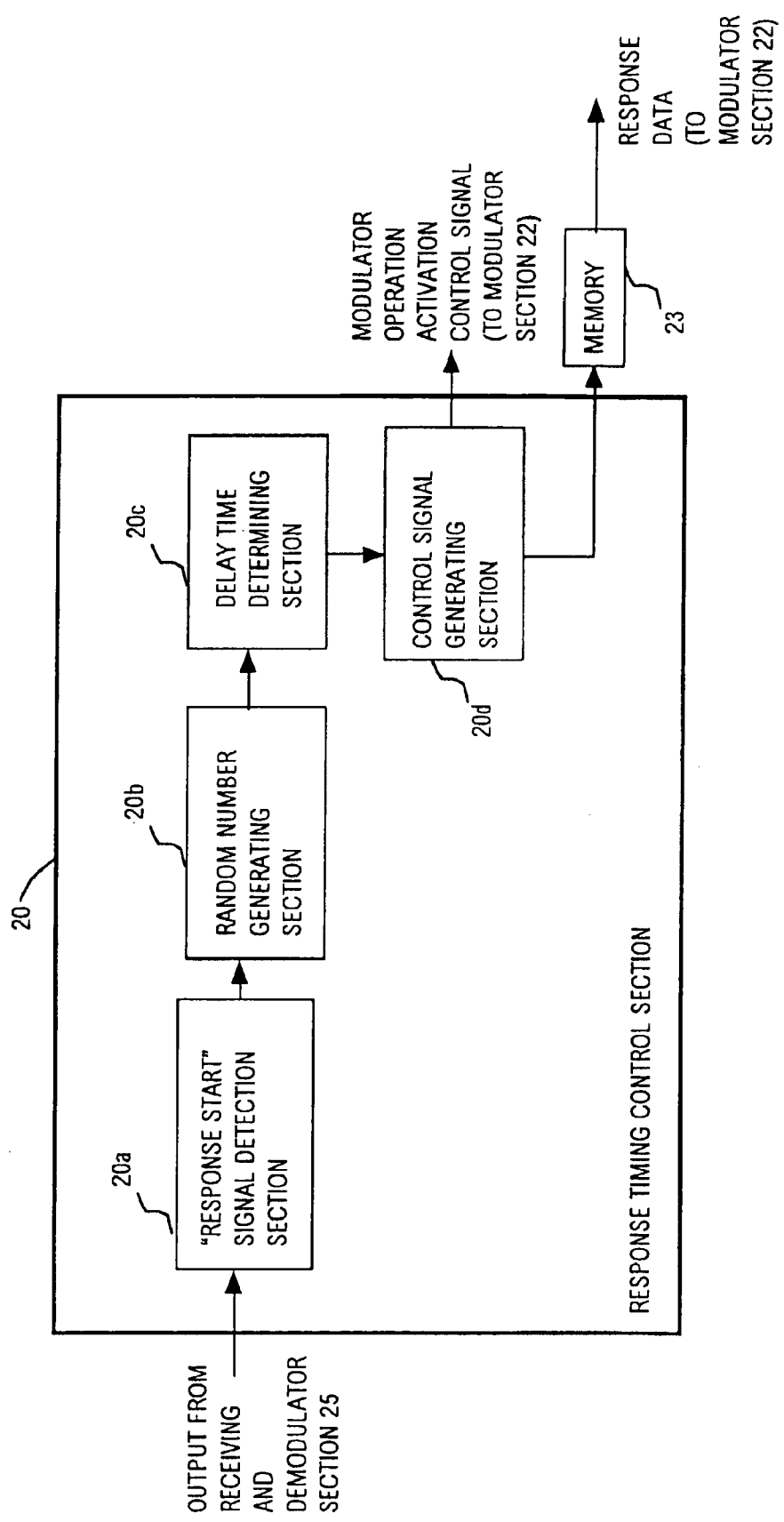
FIG. 2 is a block diagram for describing the configuration of a response timing control section of the transponder shown in FIG. 1.

FIG. 2 is a block diagram showing an example of the internal configuration of the response timing control section 26 of the transponder 20 shown in FIG. 1. In FIG. 2, the output signal from the receiving and demodulator section 25 is supplied to a Response Start command code detection section 20a of the control section 26, which detects each occurrence of a Response Start command code (transmitted periodically by the interrogator apparatus as described hereinafter). When that command is detected, the Response Start command code detection section 20a activates a random number generating section 20b to generate a random number, whose value is supplied to a delay time determining section 20c. The delay time determining section 20c then determines a delay interval whose length is based on the received random number, and generates a trigger signal after that delay interval has elapsed, which is supplied to a control signal generating section 20d. The control signal generating section 20d responds to that trigger signal by generating a control signal for setting the modulator section 22 in an operational condition, and also supplies a read-out control signal to the memory 23, which thereby reads out a data sequence expressing the information stored therein, which is supplied to the modulator section 23, to modulate the radio waves which are reflected by the antenna 24.

The overall operation of this mobile body discrimination system is as follows. The interrogator apparatus 1 and second antenna 10 are positioned beforehand at respective fixed locations, adjacent to the conveyer belt 32. A transponder 20 which enters the communication region 30 receives CW microwave-band radio waves, transmitted from the second antenna 40 of the interrogator apparatus 1, at the antenna 24 of the transponder 20, and the rectifier circuit 21 converts the received CW signal to a DC power supply for operating the various circuits of the transponder 20. The rectifier circuit 21, whose output DC supply voltage is designated in FIG. 1 as Vp, can be configured of devices such as diodes, etc. When thus supplied with operating power, the modulator section 22 modulates the reflected radio waves which result from the CW transmission from the interrogator apparatus 1, with that modulation being in accordance with the predetermined information that is held stored in the memory 23.

It will be assumed that this is amplitude modulation, performed by varying the reflection coefficient of the antenna to thereby vary the amplitude of reflected radio waves which are received from a transponder 20 by the interrogator apparatus. However it would be equally possible to use phase modulation.

The resultant modulated reflected signal that is received from the transponder 20 by the first antenna 2 of the interrogator apparatus 1 is transferred via the receiving section 4 to be demodulation by the demodulator section 5, with the information held at the transponder 20 being thereby acquired by the interrogator apparatus 1.

Figure 4:
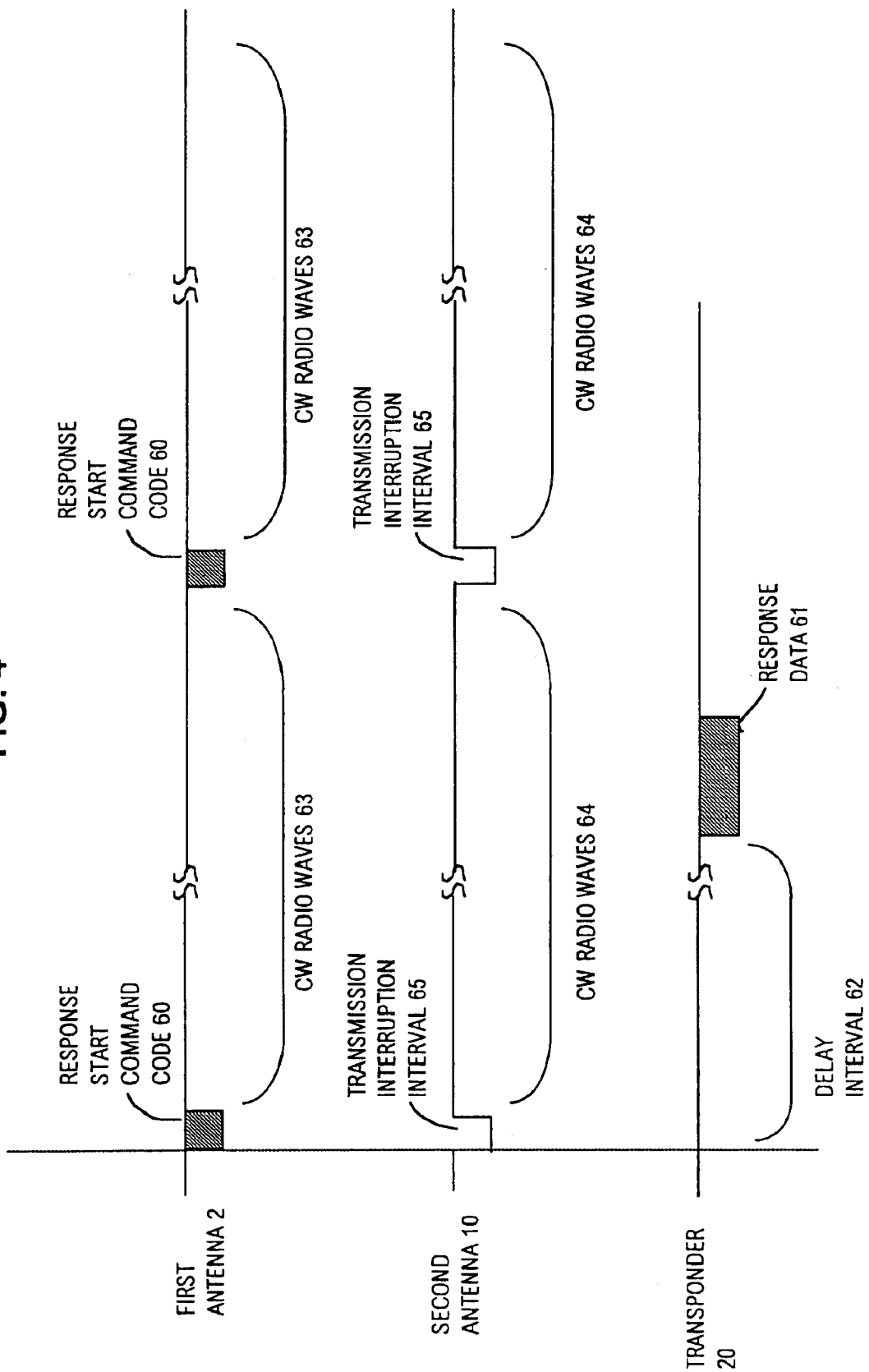
FIG. 4 is a timing diagram for use in describing the operation of the mobile body discrimination apparatus shown in FIG. 1, with respect to transmission and reception of radio waves between the interrogator apparatus and transponder.

The timings at which information is received from the transponder 20 by the interrogator apparatus 1 will be described referring to FIG. 4. This is a general timing diagram of the exchange of signals between the interrogator apparatus 1 and a transponder 20. In FIG. 4 the uppermost portion, designated as "antenna 2", illustrates the timing of signals which are transmitted by the first antenna 2 of the interrogator apparatus 1, the central portion (designated as "second antenna 10") illustrates the timing of signals which are transmitted from the second antenna 10 of the interrogator apparatus 1, and the lowermost portion (designated as "transponder 20") illustrates the timing of signals which are transmitted by a transponder 20. Numeral 60 denotes the Response Start command code, which is formed of a few bits of data and is transmitted periodically by modulating the radio waves transmitted from the first antenna 2, 61 denotes response data which are sent from a transponder 20 to the interrogator apparatus 1, 62 denotes a delay time interval which extends from the timing of a Response Start command code 60 until the transponder 20 begins to transmit a set of response data 61 (i.e., as a modulated reflection signal) in response to that Response Start command code 60. Numeral 63 denotes the CW transmission produced from the first antenna 2, 64 denotes the CW transmission produced from the second antenna 10, 65 denotes a transmission interruption interval which is synchronized with the Response Start command code 60 and has at least as long a duration as the Response Start command code 60, during which transmission from the second antenna 10 is halted.

The control section 6 of the interrogator apparatus 1 periodically reads out from memory 9 a code expressing the Response Start command code 60, which has been stored in the memory 9 beforehand, and supplies that code to the modulator section 7 together with a control signal which sets the modulator section 7 in operation to transmit the Response Start command code 60 from the first antenna 2. The CW radio waves 63 are transmitted during the intervals between transmission of the Response Start command code 60. The control section 6 also controls the transmitting section 11 such that transmission of the CW radio waves 64 from the second antenna 10 is interrupted during each of respective transmission interruption intervals 65, i.e., during each of the periods during which the Response Start command code 60 is being transmitted from the first antenna 2. This interruption can be performed for example by temporarily inactivating an amplifier within the transmitting section 11. At all other times, the control section 6 causes the CW output 64 to be transmitted.

As a result, the transponder 20 can receive and demodulate the Response Start command code 60 from the first antenna 2 without such reception being affected by CW radio waves transmitted from the second antenna 10.

When a transponder 20 has moved within the communication region 30, the CW transmissions 63, 64 from the interrogator apparatus 1 are received by the antenna 24, and DC power is thereby produced by the rectifier circuit 21 to operate the circuits of the transponder 20. When the Response Start command code 60 is received and demodulated by the receiving and demodulator section 25, a random delay interval 62 is then determined by the response timing control section 26, whose start is synchronized with the demodulated Response Start command code 60. After that delay interval 62 has elapsed, the modulator section 22 effects modulation of the reflected CW radio waves 63, which are reflected back to the interrogator apparatus 1, with that modulation being in accordance with the response data 61, which express the aforementioned information which is held in the memory 23 of the transponder 20 and in general will be information relating to the particular load item to which the transponder is attached.

The response data 61 are received by the first antenna 2 of the interrogator apparatus 1, and supplied to the receiving section 4 and so to the demodulator section 5, with the resultant output signal providing the interrogator apparatus 1 with the response data 61 which are held in the memory 23 of the transponder 20.

The Response Start command code 60 is transmitted repetitively at periodic intervals, and, considering any specific transponder 20 which is currently within the communication region 30, the delay interval 62 is randomly altered each time that the Response Start command code 60 is received. Thus, when a plurality of transponders 20 are concurrently within the communication region 30 so that each transponder receives the Response Start command code 60 simultaneously, the random determination of transmitting respective responses by these transponders will reduce the probability that a condition will occur whereby two or more of these transponders will each transmit their respective sets of response data 61 simultaneously, i.e., a condition whereby the interrogator apparatus 1 cannot correctly acquire these respective sets of response data 61 due to data conflict. Furthermore since the Response Start command code is repetitively transmitted by the interrogator apparatus as the transponders traverse the communication region 30, even if a first response from a transponder is not correctly received by the interrogator apparatus due to data conflict, there is a high probability that a subsequent response by that transponder will be correctly received before the transponder exits from the communication region.

Thus, this embodiment serves to increase the speed and reliability of successive acquisition of respective sets of response data from the various transponders 20 which are passing through the communication region 30 of the interrogator apparatus 1.

The maximum distance between the interrogator apparatus 1 and transponder 20 for which communication is possible is determined by the lengths of the circuit lead paths in the transponder 20, which determine the impedance characteristics of the transponder 20, and the level of electrical power that is provided by the rectifier circuit 21 of the transponder 20. If only the antenna 2 were to be provided on the interrogator apparatus, as in the case of a prior art system, then the level of electrical power provided by the rectifier circuit 21 would depend upon the level of received electric field strength of the CW radio waves 63 received from the interrogator apparatus 1, at the antenna 24 of the transponder 20. This received electric field strength depends upon the distance between the antennas of the interrogator apparatus 1 and the transponder 20, and also upon the orientation (in relation to the antenna 2 of the interrogator apparatus) of the antenna 24 of each transponder 20, which will be determined by the orientation of the load item 31 on which that transponder is mounted.

Hence, with only a single antenna being utilized by the interrogator apparatus, the level of electrical power that can be generated in a transponder that enters the communication region 30 may vary considerably, depending upon the orientation of the transponder (i.e., since the transponders 20 may be mounted, at arbitrary positions, on load items 31 which vary substantially in size, and in general the load items 31 will not be uniformly arranged on the conveyer belt 32).

However with the present invention, since CW radio waves 63, 64 are received by a transponder 20 from two antennas 2, 10 of the interrogator apparatus 1, which are located at respectively different locations, even if the orientation of a transponder 20 varies in relation to the interrogator apparatus, it will be possible for the transponder 20 to derive sufficient electrical power to operate its internal circuits at all times while traversing the communication region 30. That is to say, variations in the level of electrical power derived by the transponder 20 can be made small, and it thus becomes unnecessary to provide a high level of transmission power for the interrogator apparatus 1, in order to ensure that a sufficient level of transponder internal DC power will be generated, even in the case of a transponder 20 which attains the most adverse orientation. This enables the problem of interference between the transmissions from the interrogator apparatus 1 and other systems to be substantially reduced, and also eliminates the need to make the interrogator apparatus 1 large in size, while ensuring that the mobile body discrimination apparatus will provide reliable and stable communication between the interrogator apparatus 1 and each transponder 20.

Although in the above description the term "communication region" is used in relation to a region that is illuminated by radio waves from antenna 10 of the interrogator apparatus 1, it will be understood that no actual communication occurs with the transponders via that antenna. In that case the "communication region" is used in relation to antenna 10 for ease of understanding that a communication region 30 is formed by overlapping incident CW radio waves from the antennas 2 and 10 respectively, in the intervals between transmissions of the Response Start command code, with that communication region 30 being a region within which reliable communication between a transponder and the interrogator apparatus (via antenna 2) is possible. It can for example be arranged that the respective levels of incident radio waves from antenna 2 and from antenna 10, within the communication region 30, are approximately identical.

Figure 6:
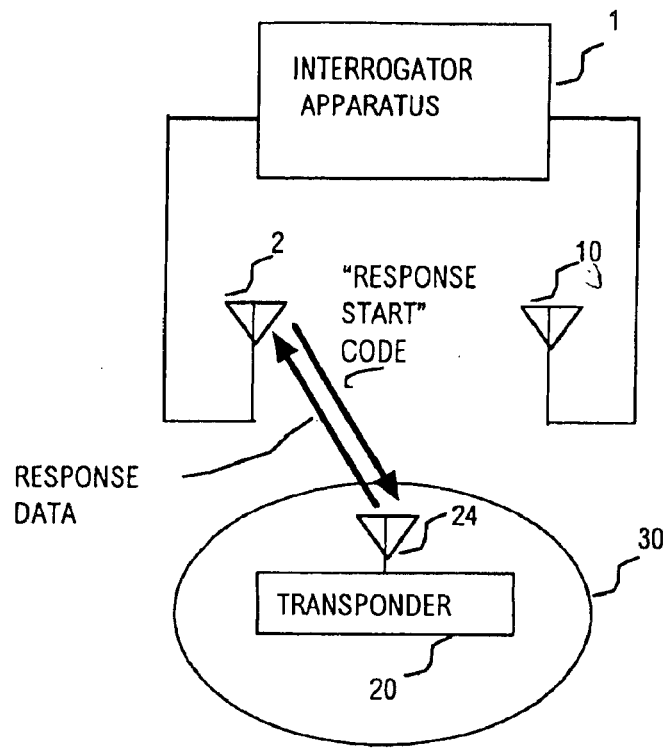
FIG. 6 is a conceptual diagram for use in describing the transfer of data between a transponder and one of a plurality of antennas of the interrogator apparatus in the mobile body discrimination apparatus of FIG. 1.

For ease of understanding the relationship between the modes of data interchange between the interrogator apparatus and transponders of this embodiment and those of other embodiments of the invention described in the following, FIG. 6 is a conceptual diagram for illustrating the flow of data, conveyed by radio waves, between the interrogator apparatus 1 and a transponder 20 that is within the communication region 30, in the case of the first embodiment. The transfer of the Response Start command code is indicated by the arrow extending from the antenna 2 of the interrogator apparatus to the antenna 24 of the transponder, while the transfer of the response data is indicated by the arrow extending from the antenna 24 of the transponder to the antenna 2 of the interrogator apparatus.

2$^{nd}$ Embodiment

Figure 5:
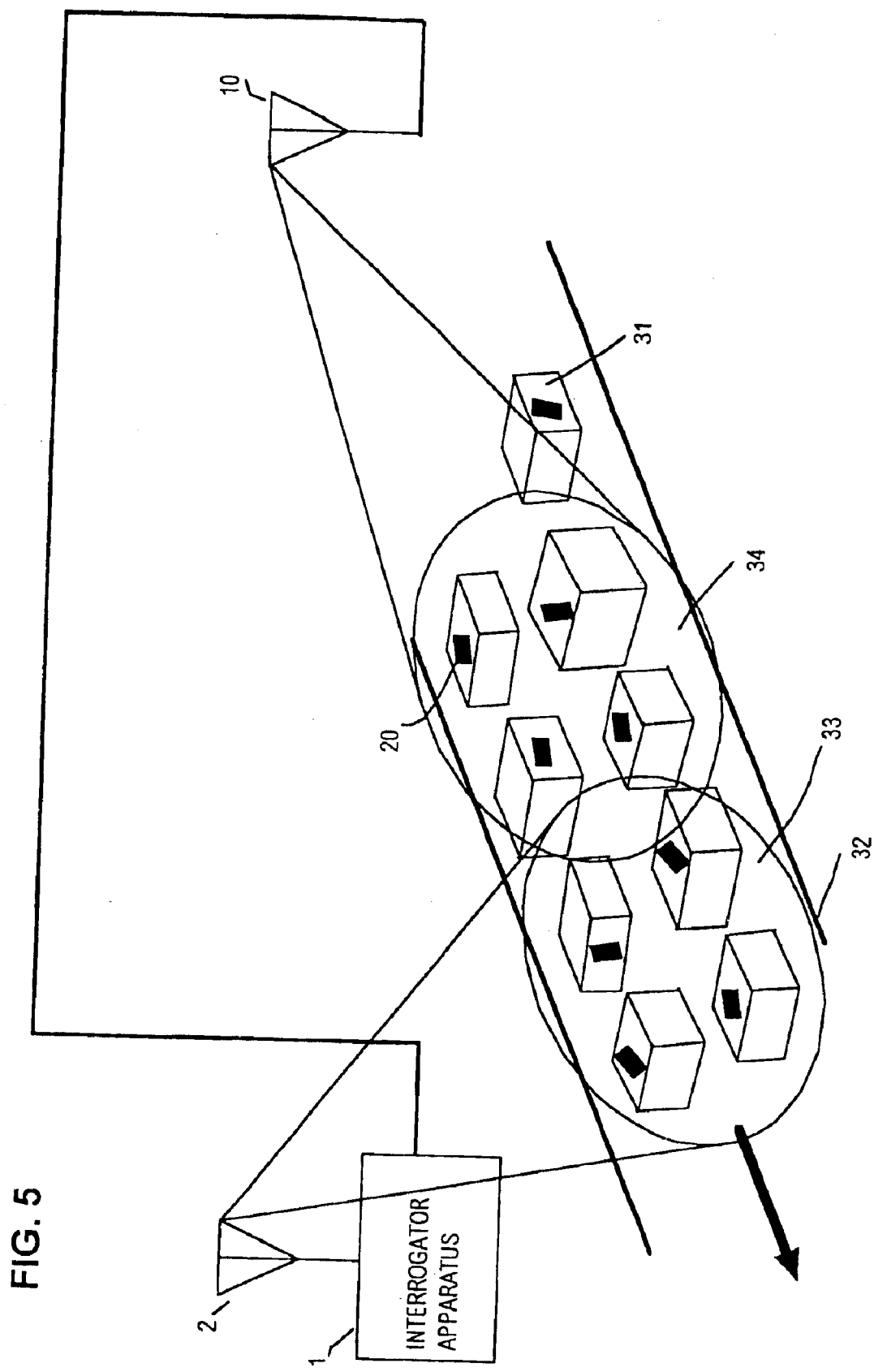
FIG. 5 is a conceptual diagram of a second embodiment of the invention, which is a mobile body discrimination system utilizing a mobile body discrimination apparatus of the form shown in FIG. 1.

FIG. 5 is a diagram showing the general arrangement of position relationships between the interrogator apparatus 1 and transponders 20 of a second embodiment of a mobile body discrimination apparatus, applied to a specific example of a mobile body discrimination system in which, as for the preceding example, load items with respective transponders attached thereto flow along a fixed path in a fixed direction. In FIG. 5, 33 denotes a first communication region which is that of the first antenna 2 and 34 denotes a second communication region which is that of the second antenna 10. The second communication region 34 is positioned before (i.e., upstream from) the first communication region 33, with respect to the direction of flow of the load items, and partially overlaps the first communication region 33. The internal circuit configurations of the interrogator apparatus 1 and each transponder 20 are as shown in FIG. 1, described hereinabove, and the operation of each of these is as described for the first embodiment.

With this embodiment and the preceding embodiment, as is well known, the rectifier circuit 21 of a transponder 20 includes devices such as smoothing capacitors, etc., for removing AC components from the DC power supply that is obtained by rectifying the radio waves received by the antenna 24 and for ensuring stability of that DC power supply. Thus in the case of the first embodiment, when a transponder 20 first enters the communication region 30 and generation of electrical power by the rectifier circuit 21 begins, the supply voltage produced from the rectifier circuit 21 will increase only gradually, as a result of incorporating such smoothing devices. Thus, there will be a certain amount of delay before the circuits of the transponder actually become operational, after a transponder has entered the communication region 30.

However with the second embodiment of the invention the transponders 20, attached to each of the load items which are transported by the conveyer belt 32, first move into the second communication region 34, whereby electrical power is generated by the rectifier circuit 21 from the CW radio waves which reach the antenna 24 from the second antenna 10 of the interrogator apparatus 1. As a result, when the transponder thereafter reaches the first communication region 33 (which as stated above is positioned such as to partially overlap with the communication region 34), electrical power derived from the second communication region 34 is already being supplied at that time to the circuits of the transponder 20. Hence, modulated radio waves conveying the Response Start command code 60 which is transmitted from the first antenna 2 of the interrogator apparatus 1 can be accurately demodulated by the transponder 20 within a short time after the transponder has entered the first communication region 33, and the transponder 20 will thereafter transmit the response data 61 (as described hereinabove for the first embodiment).

In the same way as for the first embodiment, a method of modulation of the response data 61 is used which is based on the Response Start command code 60 that is generated by the interrogator apparatus 1, with the timing of generating the response data 61 by a transponder 20 being determined by a random delay time interval 62 as described referring to FIG. 3. With that method, to ensure that information can be reliably obtained from each of a plurality of transponders 20 which are within the communication region at the same time, it is necessary to ensure that each of the transponders 20 remains within the communication region for a sufficiently long time interval. This is due to the fact that each transponder 20 must remain within the communication region for a sufficiently long time interval to begin to generate a level of electrical power that is high enough to operate the circuits of the transponder. However there are restrictions on the size of such a communication region, to ensure a sufficiently high level of the radio waves received by the transponders within the communication region. Thus with the first embodiment, the time available for communication between the interrogator apparatus 1 and each transponder 20 which enters the communication region 20 is determined by:

(a) the size of the communication region (more specifically, the distance which is traversed by each transponder when passing through the communication region), (b) the rate of motion of the load items, and (c) the time required for the supply power available from the rectifier circuit 21 of a transponder 20 to reach a sufficient level for operating the circuits of the transponder, after the transponder has entered the communication region.

With the second embodiment of the invention however, before each transponder 20 begins to move within the first communication region 33, the circuits of the transponder 20 are already being supplied with electrical power, so that when the transponder moves into the first communication region 33, communication can immediately be established with the interrogator apparatus 1. Hence, almost all of the time for which a transponder 20 remains within the first communication region 33 is available for communication with the interrogator apparatus 1, so that when a plurality of transponders 20 are simultaneously within the first communication region 33, a greater amount of time can be made available for successively obtaining information from each of these transponders, with the second embodiment.

3$^{rd}$ Embodiment

Figure 8:
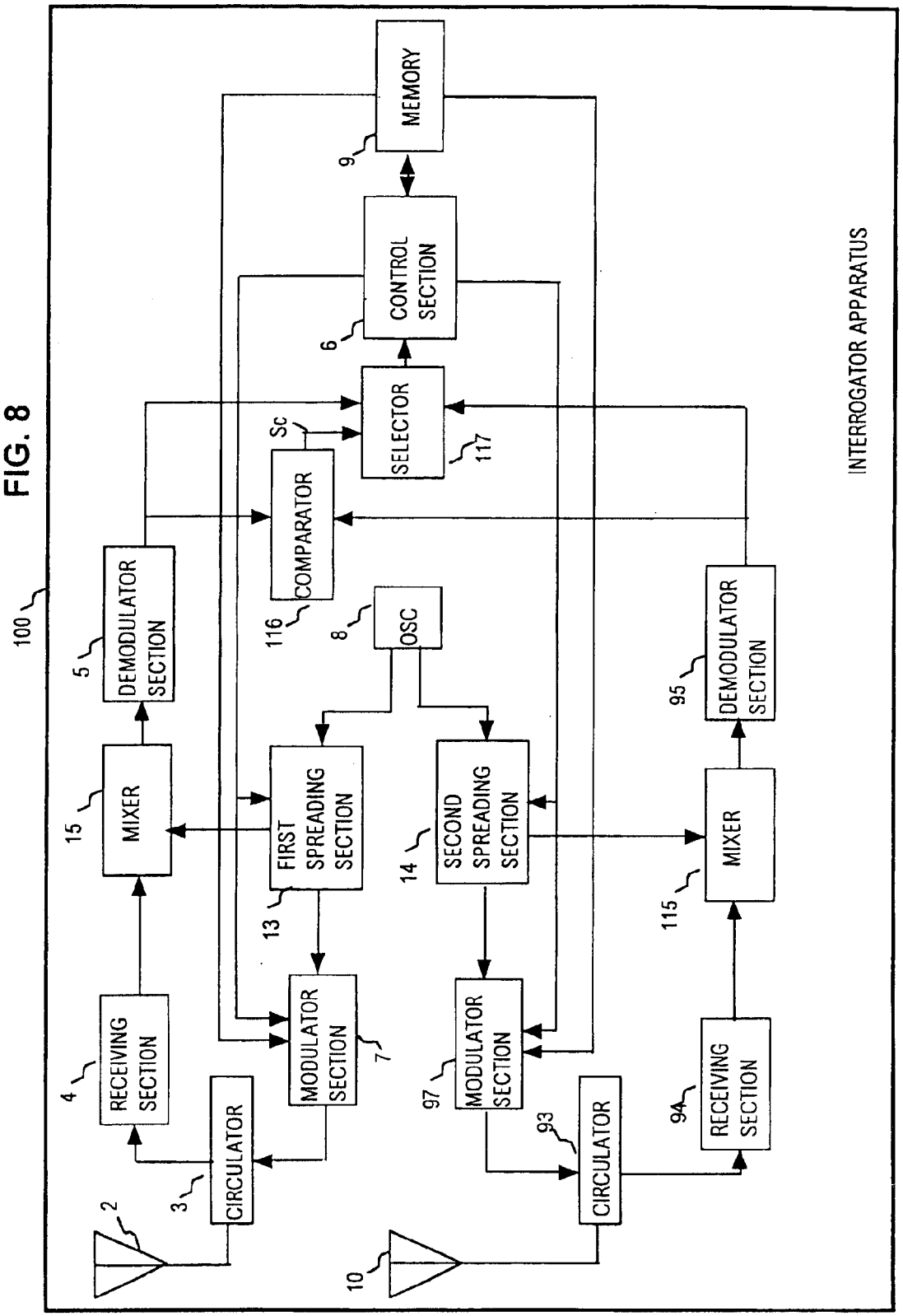
FIG. 8 is a general system block diagram of an interrogator apparatus of the mobile body discrimination apparatus according to the third embodiment.

FIG. 8 shows the general internal circuit configuration of an interrogator apparatus of a third embodiment of the invention, for communicating which transponders 20 which are each configured as described for the first embodiment hereinabove. In FIG. 8, numeral 100 denotes the interrogator apparatus, 20 denotes a transponder, 2 denotes a first antenna of the interrogator apparatus 100, 3 denotes a circulator which is connected to the first antenna 2, 4 denotes a receiving section which is connected to the circulator 3, 15 denotes a mixer which is connected to the receiving section 4, 5 denotes a demodulator section for demodulating the output signal from the mixer section 15, 6 denotes a control section which performs overall control of the operation of the interrogator apparatus, 7 denotes a modulator section which supplies a modulated output to the circulator 3, 8 denotes a fixed-frequency high frequency signal source such as an oscillator, 13 denotes a first spreading section for generating a spectrum-spreading pseudo-noise code sequence, which receives the high-frequency signal produced from the oscillator 8 and supplies output signals to the modulator 7 and mixer 15 respectively. Numeral 9 denotes a memory having one or more sets of data stored therein beforehand, comprising at least a data code expressing the Response Start command code contents. Numeral 10 denotes a second antenna which is coupled via a circulator 93 to a modulator 97 and to a receiving section 94, mixer 115 and demodulator 95 in the same manner as for the first antenna 2. Numeral 14 denotes a second spreading section, which generates a spectrum-spreading pseudo-noise code sequence that is different from that generated by the first spreading section 13, which is connected between the oscillator 8 and the modulator 97 and mixer 115. Numeral 116 denotes a signal strength comparator, for judging which of the two signal receiving paths from the antennas 2 and 10 respectively is currently deriving the highest level of demodulated signal, and for producing a selector control signal Sc in accordance with the. results of that judgement, for controlling a selector 117 to supply either the demodulation output from the demodulator 5 or from the demodulator 95 to the control section 6, for thereby writing into the memory 9 the response data acquired from a transponder, as described for the control section 6 of the first embodiment.

The position relationships between the interrogator apparatus 100 and transponders 20 of this embodiment will be assumed to be as shown in FIG. 2, with the transponders 20 being attached to respective ones of the load items 31, and the interrogator apparatus 100 acquiring response data 61 from each of the transponders 20 which are within the single communication region 30.

The operation timings for this embodiment, determined by the operation of the control section 6, are as shown in FIG. 4 described above, other than in that each of the intervals of transmitting CW radio waves 63 and 64 by the antennas 2 and 10 become intervals in which unmodulated spread-spectrum radio waves are transmitted, with respectively different types of spread-spectrum radio waves (i.e., generated by using respectively different pseudo-noise code sequences) being transmitted from the antennas 2 and 10, and in that the modulator sections 7 and 97 each perform the same modulation operation as that of the modulator 7 of the first embodiment, with each modulator section operating on the fixed frequency high-frequency signal that is produced from the oscillator 8, i.e., with the control section 6 inhibiting the operation of the first and second spectrum spreading sections 13, 14 during each interval in which the Response Start command code is being transmitted.

Alternatively, if the receiving and demodulator section 25 of each transponder is based on a simple microwave detector circuit having broad-band reception characteristics, it would be possible to configure the interrogator apparatus such that the modulator sections 7, 97 of the interrogator apparatus perform amplitude modulation of the respective spread-spectrum signals generated by the first and second spreading sections 13, 14, for transmitting the Response Start command code.

Since the first and second spread-spectrum sections 13, 14 utilize respectively different pseudo-random code sequences to effect spectrum spreading, the spread-spectrum radio waves transmitted from the antennas 2 and 10 are of respectively different types. This enables the resultant two types of spread-spectrum reflected radio waves which are returned to the interrogator apparatus to be mutually separately received and processed by the interrogator apparatus 100. That is to say, the first spreading section 13 supplies a local oscillator signal to the mixer 115 which varies in the appropriate sequence (i.e., the pseudo-noise code sequence used by the first spreading section 13 in generating the spread-spectrum radio waves) for demodulating the modulated spread-spectrum radio waves which were transmitted from the first antenna 2, while similarly the second mixer 115 receives a local oscillator signal which varies in the appropriate sequence for demodulating the modulated spread-spectrum radio waves which were transmitted from the second antenna 10.

In the same way as described for the first embodiment, each transponder 20 has a memory 23 with information stored therein, and performs modulated reflection of the spread-spectrum CW radio waves which are received from the interrogator apparatus 100, to thereby convey the stored information to the interrogator apparatus 100.

Methods of generating spread-spectrum radio waves are well known, so that detailed description of the operation and internal configuration of the first and second spectrum spreading sections 13 and 14 will be omitted.

It can thus be understood that with this embodiment, the reflected radio waves conveying the response data 61 from a transponder 20 are received by the first antenna 2 or the second antenna 10 of the interrogator apparatus 100, subjected to inverse spectrum spreading by the action of the first spreading section 13 or second spreading section 14 operating on the first and second mixers 15, 115 respectively (i.e., by using the same pseudo-noise code sequence as that used to generate the transmitted spread-spectrum radio waves which resulted in these received reflected radio waves) after transfer through the receiving section 4 or 94, and the resultant signal is demodulated by the demodulator 5 or 95, to thereby obtain the information stored in the memory 23 of the transponder 20. During such a receiving operation, since the mixers 15 and 115 perform inverse spectrum spreading of signals which have been generated using specific pseudo-noise code sequences, the demodulator 5 will not demodulate radio waves reflected from a transponder which has received these radio waves from the second antenna 10, and similarly the demodulator 95 will not demodulate modulated radio waves that are reflected from a transponder which has received these radio waves from the first antenna 2.

As described hereinabove, with each of the transponders 20 being attached to a load item such as a piece of baggage, the orientations of each antenna 24 of those transponders which are within the communication region 30 will vary in a random manner. Thus with the first embodiment of the invention the strength of the received reflected signal that is received by the first antenna 2 of the interrogator apparatus 100 may vary substantially, as a result of these different orientations of the antennas of the transponders 20 in relation to that antenna 2. However with the third embodiment of the invention, it is probable that a high level of reflected signal strength will be received either by the second antenna 10 or by the first antenna 2 of the interrogator apparatus 100 from each of the transponders 20 that are within the communication region 30. Hence, more reliable communication between the interrogator apparatus and transponders can be achieved.

With this embodiment, the comparator 116 of the interrogator apparatus 100 compares the respective levels of signal strength of the output signals obtained from the demodulators 5 and 95, and selects the one of these two signals having the higher level, to be supplied to the control section 6, for thereby writing the data held in the memory 23 of a transponder 20 into the memory 9 of the interrogator apparatus 100. As an alternative form of the third embodiment, the operation of the comparator 116 and selector 117 can be modified from that described above, such that normally the signal obtained from a specific one of the receiving signal paths from the antenna 2 and antenna 10 respectively will always be selected, to obtain the information transmitted from transponders 20, but that the selector 117 will select the other one of these signal receiving paths in the event that signal drop-out occurs in the normally selected path.

This embodiment avoids a problem which may occur when using reflected modulated CW radio waves transmitted from two separately located antennas for transferring information from each transponder to the interrogator apparatus. That is to say, due to the first antenna 2 and the second antenna 10 having the same communication region 30, standing waves could be produced within the communication region. The extent of this problem depends upon such factors as the relationship between the respective frequencies of the signals generated by the oscillators 8, 12 of the interrogator apparatus shown in FIG. 1, the distance between the antennas 2, 24 and the stream of transponders, and the size of the communication region 30. This can result in periodic occurrence of a very low level of signal strength being received by a the interrogator apparatus from a transponder, as the transponder moves with respect to the antennas of the interrogator apparatus. This phenomenon places restrictions on the size of the region for which reliable communication between the interrogator apparatus 1 and the transponders 20 is possible. However with the third embodiment described above, the radio waves which are transmitted from the first antenna 2 and from the second antenna 10 respectively are spectrum-spread by using respectively different pseudo-noise code sequences, so that the spatial distribution of standing waves within the communication region 30 will vary with time, thereby reducing the effect of such standing waves on the operation of these two antennas. Hence, in spite of the fact that the position and orientation of each transponder 20 is not fixed with respect to the first antenna 2 or the second antenna 10, the interrogator apparatus 100 of the mobile body discrimination apparatus can reliably obtain response information from each of the transponders 20 which enter the communication region 30.

Figure 7:
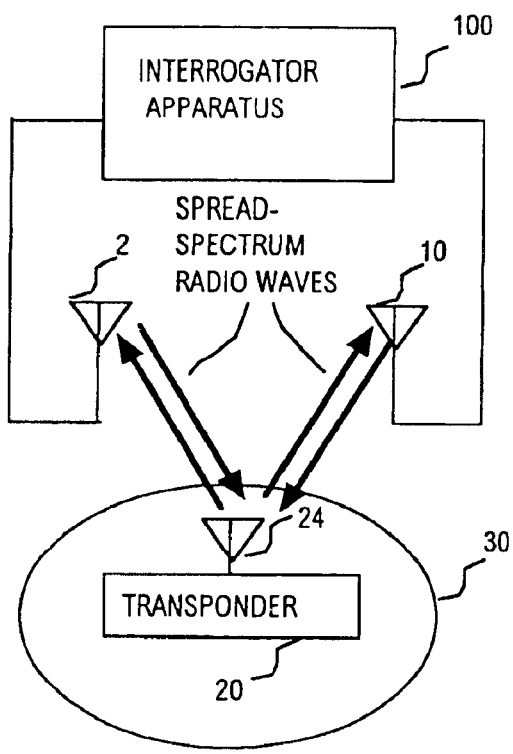
FIG. 7 is a conceptual diagram for use in describing the transfer of data between a transponder and respective ones of a pair of antennas of an interrogator apparatus in a mobile body discrimination apparatus according to a third embodiment of the invention.

The data flows between the interrogator apparatus and a transponder which is within the communication region 30, with this embodiment, are conceptually illustrated in FIG. 7.

In the above explanation, it is assumed that each transponder 20 is configured to internally derive power for driving its electronic circuits by rectifying the received signal obtained from the radio waves which are transmitted by the interrogator apparatus 100. However it would be equally possible to apply the principles of the embodiment described above to a system in which the circuits of each transponder 20 are powered by a battery which is mounted on the transponder.

Also, although in the above description the respective levels of received signal strength for the signal paths of the antennas 2 and 4 respectively are judged on the basis of the output signals from the demodulator sections 5 and 95 respectively, the invention is not limited to such an arrangement, and it may be preferable to extract a signal from some other point in the receiving signal path, for use in making that judgement.

$4^{th}$ Embodiment

Figure 9:
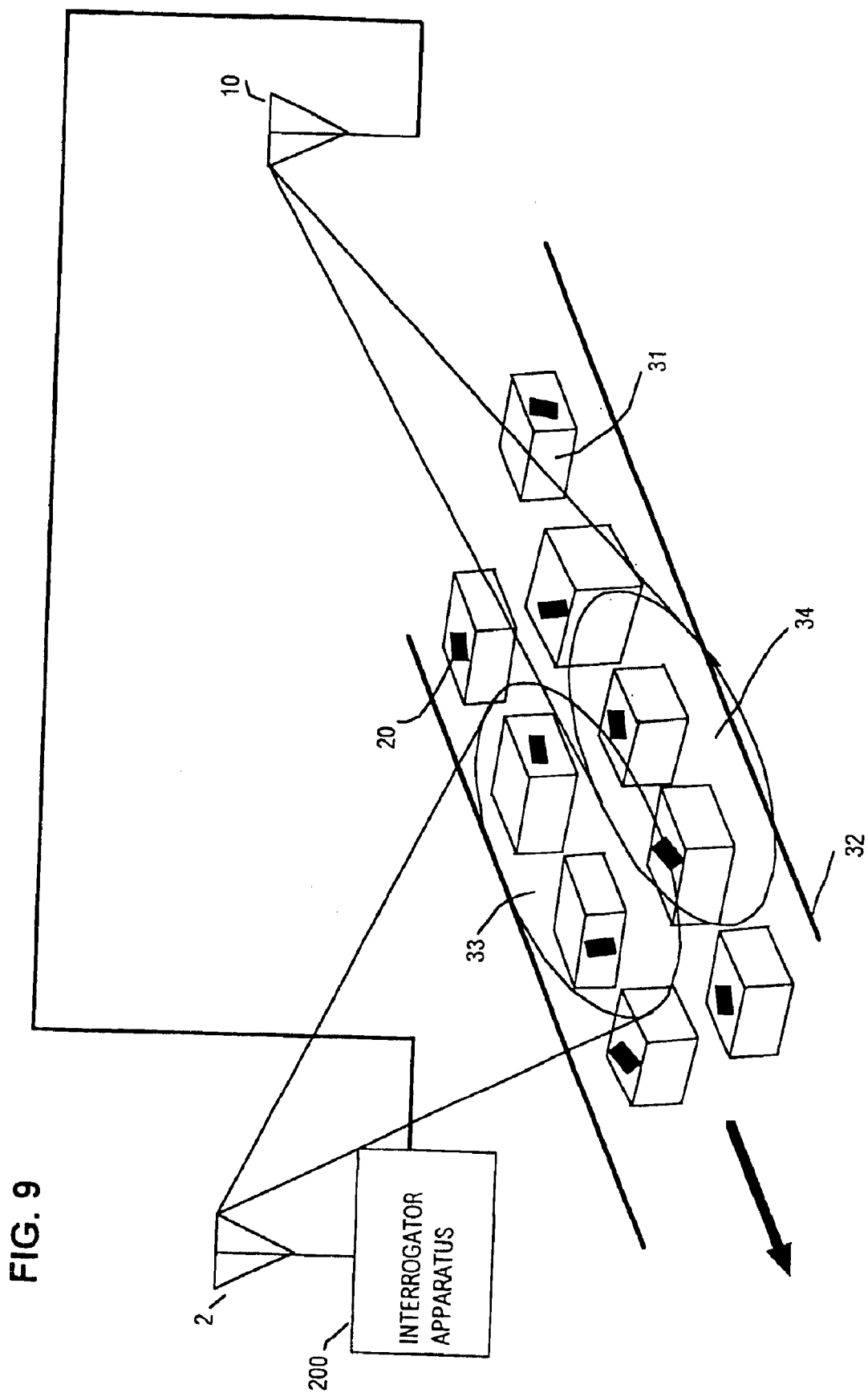
FIG. 9 is a conceptual diagram of a mobile body discrimination system which utilizes a mobile body discrimination apparatus according to a fourth embodiment of the invention.

A fourth embodiment of the invention will be described in the following. The internal configurations of an interrogator apparatus and respective transponders of this embodiment will be assumed to be identical to those of the third embodiment, shown in FIG. 8 and described hereinabove, with respectively independent signal paths being used for the two antennas 2 and 10. FIG. 9 is a diagram showing the general position relationships between transponders 20 and communication regions which are respectively formed by the first antenna 2 and second antenna 10 of the interrogator apparatus 200 of the fourth embodiment. In FIG. 9, 33 denotes a first communication region which is that of the first antenna 2 of the interrogator apparatus 200, and 34 denotes a second communication region which is that of the second antenna 10 of the interrogator apparatus 200. As shown in FIG. 9, the first communication region 33 and second communication region 34 are formed such as to partially overlap one another, and are disposed symmetrically on the left and right sides of the central axis of the conveyer belt 32, i.e., on the left and right sides of the stream of moving load items 31, so that approximately half of the load items 31 will pass through the first communication region 33 and the remaining half will pass through the second communication region 34. The interrogator apparatus 200 obtains the information stored beforehand in a transponder 20, through the operation described hereinabove for the third embodiment.

Each transponder 20, attached to a load item 31, is transported by the conveyer belt 32 such as to pass through either the conveyer belt 32 or the second communication region 34, and thereby generates electrical power from the unmodulated spread-spectrum radio waves which are transmitted from the first antenna 2 and the second antenna 10 of the interrogator apparatus 200. The modulator section 22 of the transponder 20 then performs modulation based on the information which has been stored beforehand in the memory 23, whereby the information is transferred as a reflected modulated radio signal to the interrogator apparatus 200, as described for the preceding embodiments.

With this embodiment, the first communication region 33 and second communication region 34, formed by the first antenna 2 and the second antenna 10 respectively, are spatially displaced from one another. As a result, the interrogator apparatus 200 can receive the reflected response data 61 from various transponders 20 by either the first antenna 2 or the second antenna 10, i.e., response data can be acquired simultaneously from two different transponders via the signal channels of the antennas 2 and 10 respectively. Thus with this embodiment, it is possible for the interrogator apparatus 200 to acquire information from rapidly from the transponders than is possible with the third embodiment.

Figure 10:
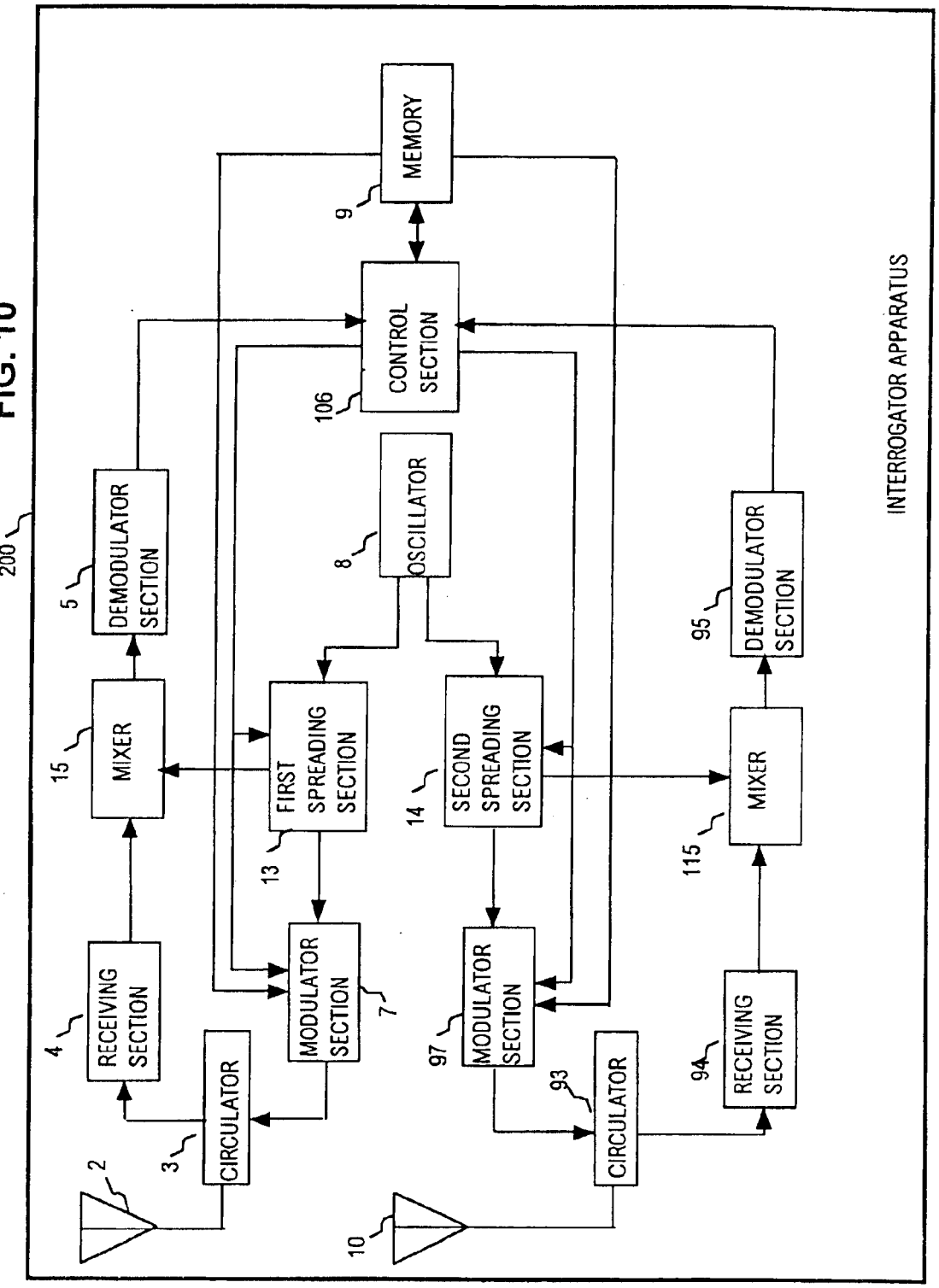
FIG. 10 is a system block diagram of an interrogator apparatus of the mobile body discrimination apparatus according to the fourth embodiment of the invention.

FIG. 10 is a general block diagram of the interrogator apparatus 200 of this embodiment. This differs from that of the third embodiment shown in FIG. 8 in that the comparator 116 and selector 117 are omitted, and also in that a control section 106 is incorporated which, in addition to the functions of the control section 6 of the first embodiment, transfers respective sets of response data that are received via the first and second antennas 2, 10 simultaneously by two different transponders to the memory 9, such as to be stored in respectively different memory locations.

Figure 16:
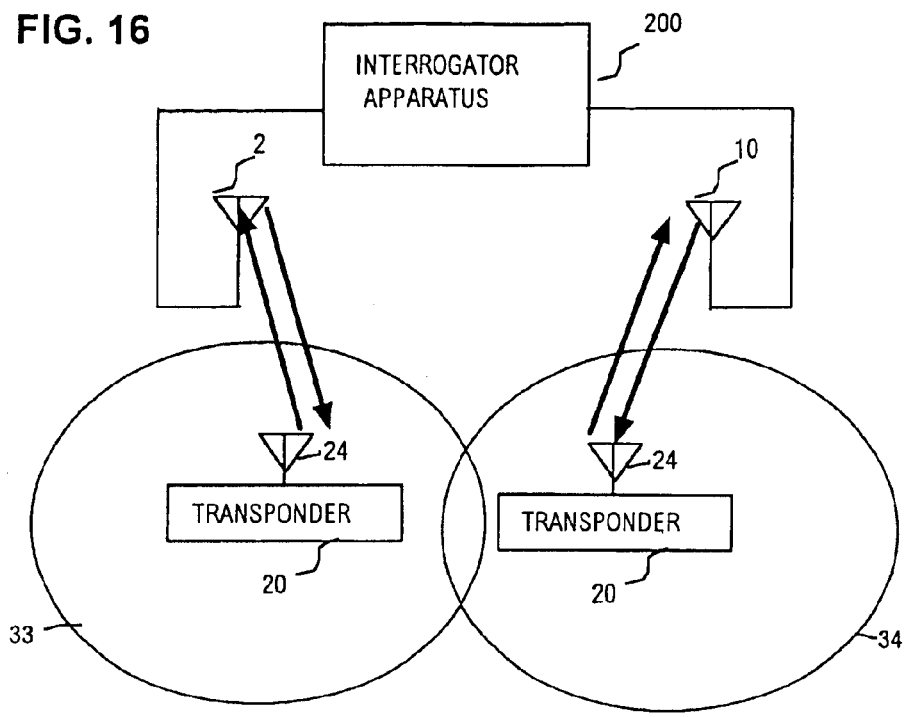
FIG. 16 is a conceptual diagram for describing the interchange of data by radio waves between two transponders and two antennas of an interrogator apparatus, with the mobile body discrimination apparatus of the sixth embodiment.

FIG. 16 conceptually illustrates the flow of data between the interrogator apparatus and two transponders which are respectively located in the communication regions 33 and 34, with this embodiment.

As can be understood from FIG. 9, it is necessary to provide a sufficient degree of overlap between the two communication regions 33, 34. As a result, the same set of response data may be obtained from a transponder via the signal paths of the antennas 2 and 10 of the interrogator apparatus 200 concurrently. However this will simply result in that response data set being stored in duplicate in the memory 9, and the apparatus could be readily configured to prevent such duplication.

5<sup>th</sup> Embodiment

A fifth embodiment of the invention will be described in the following. The internal configuration and operation of the interrogator apparatus of this embodiment is basically similar to that of the third embodiment shown in FIG. 8. However the position relationships between the communication regions 33 and 34 of the first antenna 2 and second antenna 10 of the interrogator apparatus 101, with this fifth embodiment, are as described for the second embodiment and shown in FIG. 5, with the communication region 34 positioned upstream from the communication region 33 with respect to the direction of flow of the load items 31, and with the regions 33, 34 positioned partially overlapping one another. Furthermore with this embodiment when a transponder reads out from the memory 23 a set of response data in response to receiving a Response Start command code from the interrogator apparatus, it also reads out an ID (identification) code which is specific to that transponder, and transmits the ID code and response data set together. In addition, the operation of the control section 106 of the interrogator apparatus of the fifth embodiment differs from that of the third embodiment in that, when the response data 61 transmitted from a transponder are successfully received by the interrogator apparatus 101 via the signal path of antenna 2 or the signal path of antenna 10, without the reception being adversely affected by signals arriving from a plurality of transponders concurrently, the control section 106 reads out from the memory 9 a code for a "Transmission Halt" command which has been stored therein beforehand, and supplies that code together with the ID code of the transponder from which the response data have been successfully received, to the modulator section (7 or 97) of the antenna (2 or 10) from which the response data were received. With this embodiment, each of the transponders is configured such that when this Transmission Halt command code is received together with the ID code of that transponder, the transponder is then set in a condition whereby no further transmissions of the response data 61 will be performed until a predetermined time interval has elapsed.

Figure 11:
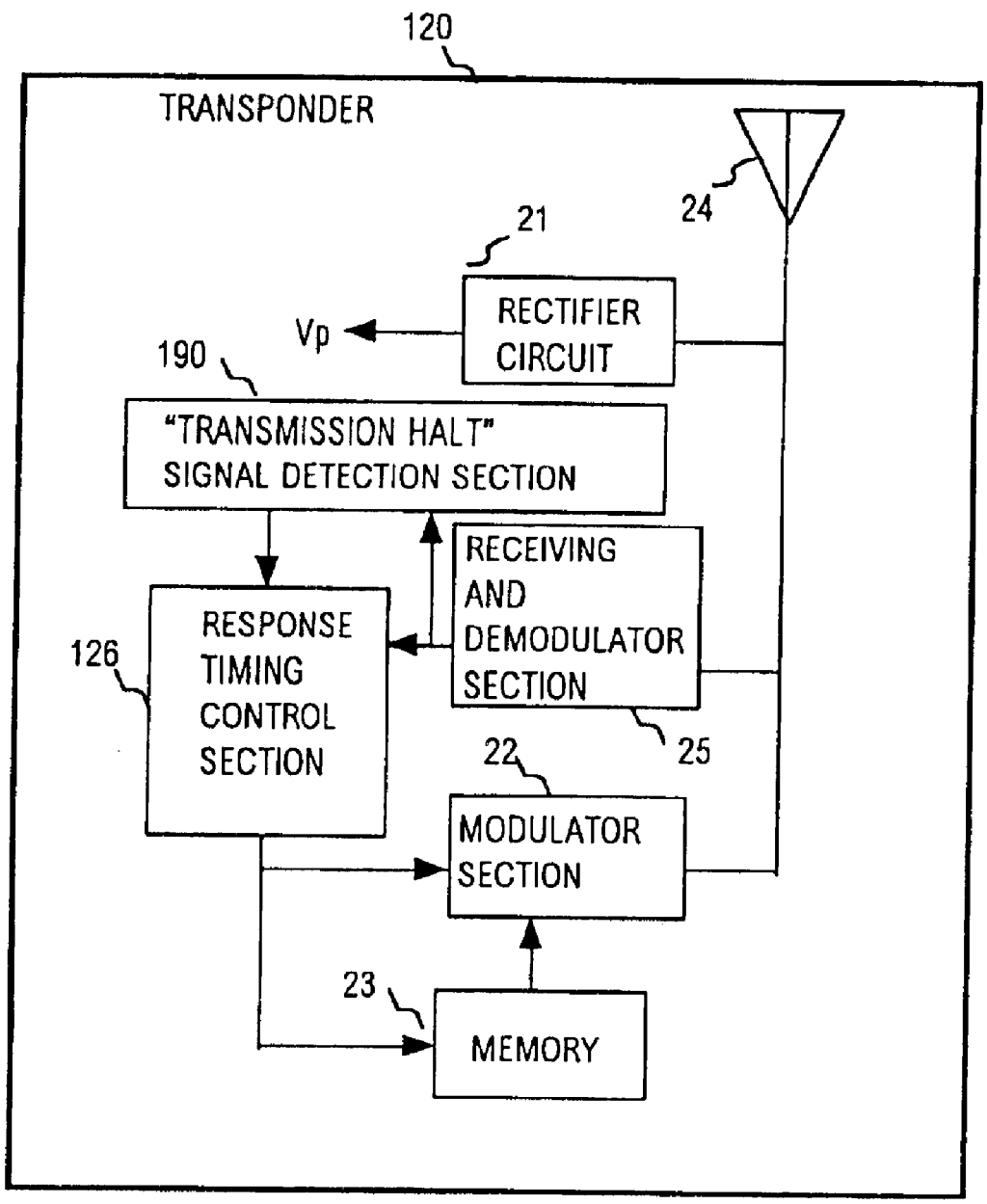
FIG. 11 is a system block diagram of a transponder of a mobile body discrimination apparatus according to a fifth embodiment.

Specifically, as shown in FIG. 11, the internal configuration of each of the transponders 120 of this embodiment differs from the transponder 20 of the preceding embodiments by further including a Transmission Halt command code detection section 190 which receives the output signals from the demodulator section 25. Furthermore, a response timing control section 126 of the transponder 120 functions in a similar manner to that of the response timing control section 26 of the first embodiment, but the operation of the response timing control section 126 is inhibited for a predetermined time interval by an inhibit signal that is produced from the Transmission Halt command code detection section 190 when the Transmission Halt command code is received together with the transponder ID code. The action of that inhibit signal continues until a predetermined time interval has elapsed, with that time interval being predetermined as being at least sufficiently long for the transponder to have completely traversed both of the communication regions 34 and 32 in succession.

Figure 12:
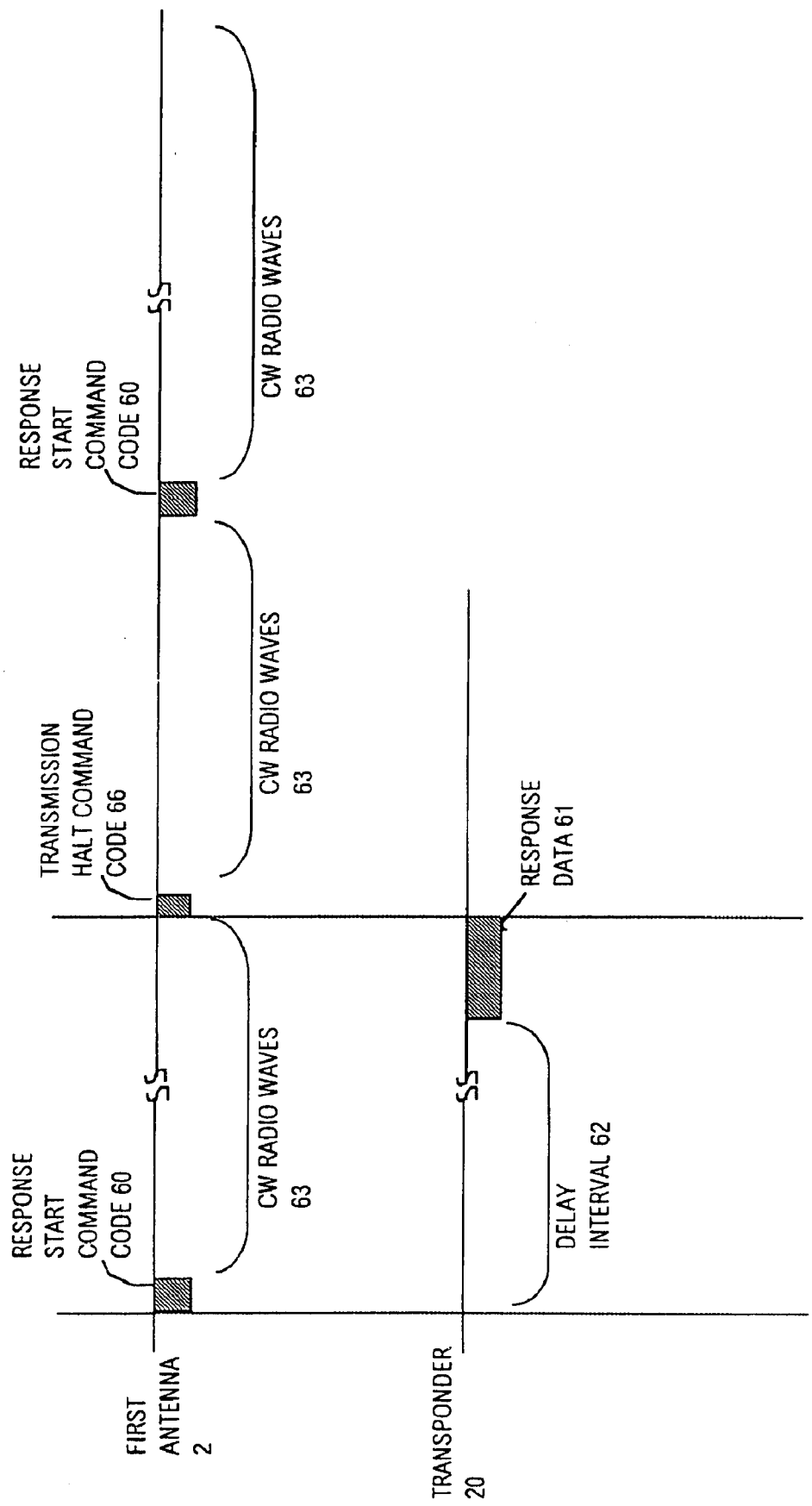
FIG. 12 is a timing diagram for describing the operation of the mobile body discrimination apparatus of the fifth embodiment.

FIG. 12 is a diagram showing the timings of exchange of information between the first antenna 2 or the second antenna 10 of the interrogator apparatus 101 and a transponder 120 with this embodiment. The internal configuration of the interrogator apparatus of this embodiment is as shown in FIG. 8, but with the operation of the control section 106 differing from that of the third embodiment by further including the aforementioned function of controlling transmission of the Transmission Halt command code with a transponder ID code attached.

Figure 13:
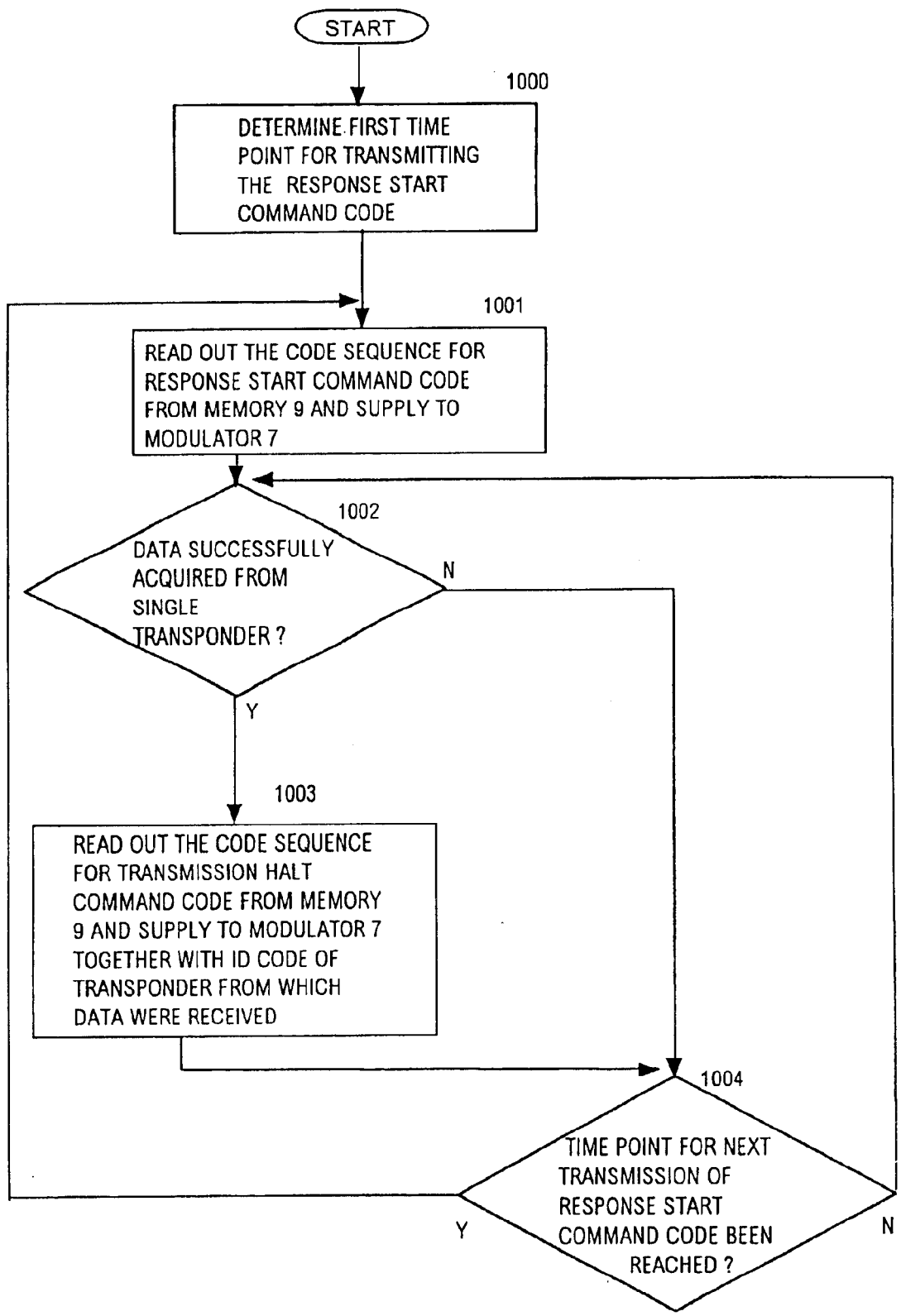
FIG. 13 is a flow diagram for describing the operation of the mobile body discrimination apparatus of the fifth embodiment.

FIG. 13 is a basic flow diagram of the operation of the controller 106 of this embodiment with respect to generating the Response Start and Transmission Halt command codes. For simplicity of description only the operations necessary for transmitting the Transmission Halt command code from the first antenna 2 are shown, i.e., performed when the controller 6 detects that response data have been successfully acquired from a transponder via the first antenna 2. The modulator 97 is similarly controlled to generate the Transmission Halt command code from the second antenna 10, when response data have been successfully acquired by reception via that antenna.

With a mobile body discrimination system according to this embodiment, if the response data which are stored in the memory 23 of a transponder 120, attached to one of the load items 31, are received by the second antenna 10 of the interrogator apparatus 101 while the transponder 120 is within the second communication region 34 shown in FIG. 5, and if the control section of the interrogator apparatus judges that the acquired response data do not overlap with signals received from any other transponders, the interrogator apparatus then transmits via antenna 10 the Transmission Halt command code 66 together with the ID code of that transponder 120. Thereafter, the transponder from which these response data were acquired will not transmit any further (unnecessary) response data while passing through the communication regions 33 and 34 of the interrogator apparatus.

With the present invention, although a plurality of transponders which are each currently within the communication region of an antenna of an interrogator apparatus will transmit their respective sets of response data at randomly determined points in time, there are only a limited number of time slots available in which to provide such random variation. That is to say, there must be a limit on the maximum value of the randomly determined delay interval 62, in order to ensure that every transponder will transmit a response signal before moving out of the communication region. Thus, if a large number of transponder are moving through the communication region together, there is a possibility that response data sets will be transmitted concurrently by two or more transponders in response to a transmission of the Response Start command code from the interrogator apparatus. Thus with the first embodiment, the rate at which transponders move through the communication region 30 must be limited such that the possibility of such concurrent responses from plural transponders is made sufficiently small. Alternatively stated, in the case of the first or second embodiments, in which response data are successively acquired via a single receiving system from a single communication region, the time required for reliably acquiring data from each of a plurality of transponders which are moving through the communication region together will increase linearly in proportion to the number of these transponders.

However with this fifth embodiment, in which the communication regions 33, 34 of the first antenna 2 and second antenna 10 of the interrogator apparatus 101 are arranged spatially separated, with the communication region 34 located upstream from the communication region 33 with respect to the direction of flow of the transponders, response data will be acquired by the interrogator apparatus 101 from a certain proportion of the transponders 120 while the transponders are passing through the communication region 34. When this occurs, the transponders from which data have been acquired will receive the Transmission Halt command code and so will not transmit any subsequent response data signals. Hence, when the transponders then pass through the communication region 33, the effect is as if those transponders which have already transmitted response data in the communication region 34 have been removed. Thus in effect, communication will be performed between the first antenna 2 of the interrogator apparatus 101 and a smaller number of transponders 120 which are within the communication region 33.

Hence this embodiment enables a higher rate of flow of the load items 31, or enables the system to cope with occasional occurrence of a high density of load items on the conveyer belt 32, while maintaining sufficient reliability of data acquisition from all of the transponders.

6$^{th}$ Embodiment

Figure 14:
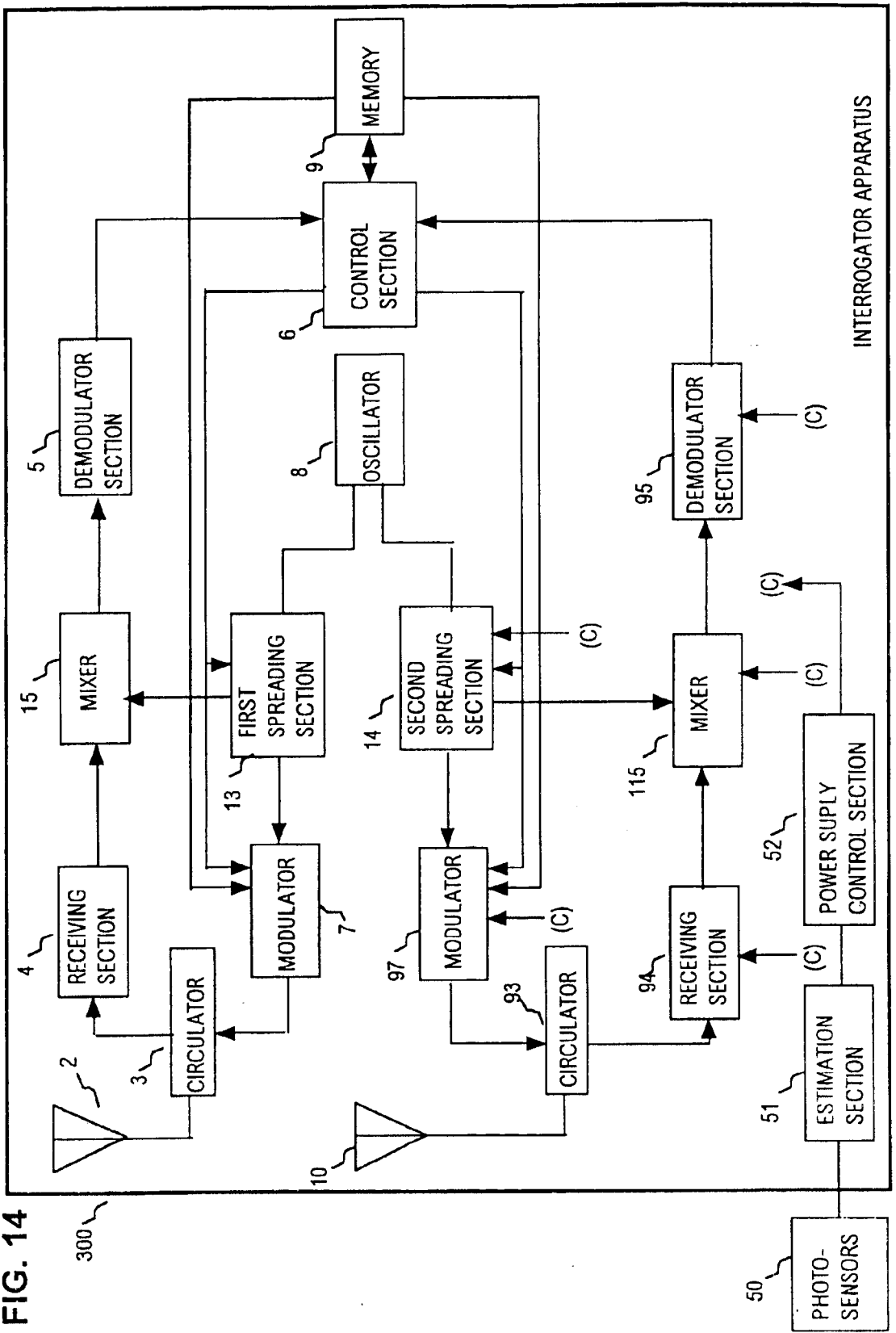
FIG. 14 is a system block diagram of an interrogator apparatus of a mobile body discrimination apparatus according to a sixth embodiment.

FIG. 14 shows the internal configuration of an interrogator apparatus 300 of a sixth embodiment of the invention. With this embodiment, in the same way as for the system configuration of the second embodiment shown in FIG. 5, two communication regions 33 and 34 are utilized, positioned spaced apart but partially overlapping one another and located respectively downstream and upstream with respect to the flow of load items 31. The contents and operation of FIG. 14 are similar to those of the interrogator apparatus 100 of the third embodiment shown in FIG. 8, but the overall system differs from that of the third embodiment in that photoelectric sensors 50 are provided before the upstream communication region 34 that is formed by the second antenna 10 of the interrogator apparatus 1, while the interrogator apparatus 1 further includes an estimation section 51 which estimates the rate at which transponders 20 which are currently moving into the communication regions 33, 34, by using the outputs from the photoelectric sensors 50, and also includes a power source control section 52 which is coupled to signal lines (C) to control on/off switching of power to the transmitting and receiving sections which are coupled the second antenna 10, in accordance with the estimated value that is supplied from the estimation section 51.

Figure 15:
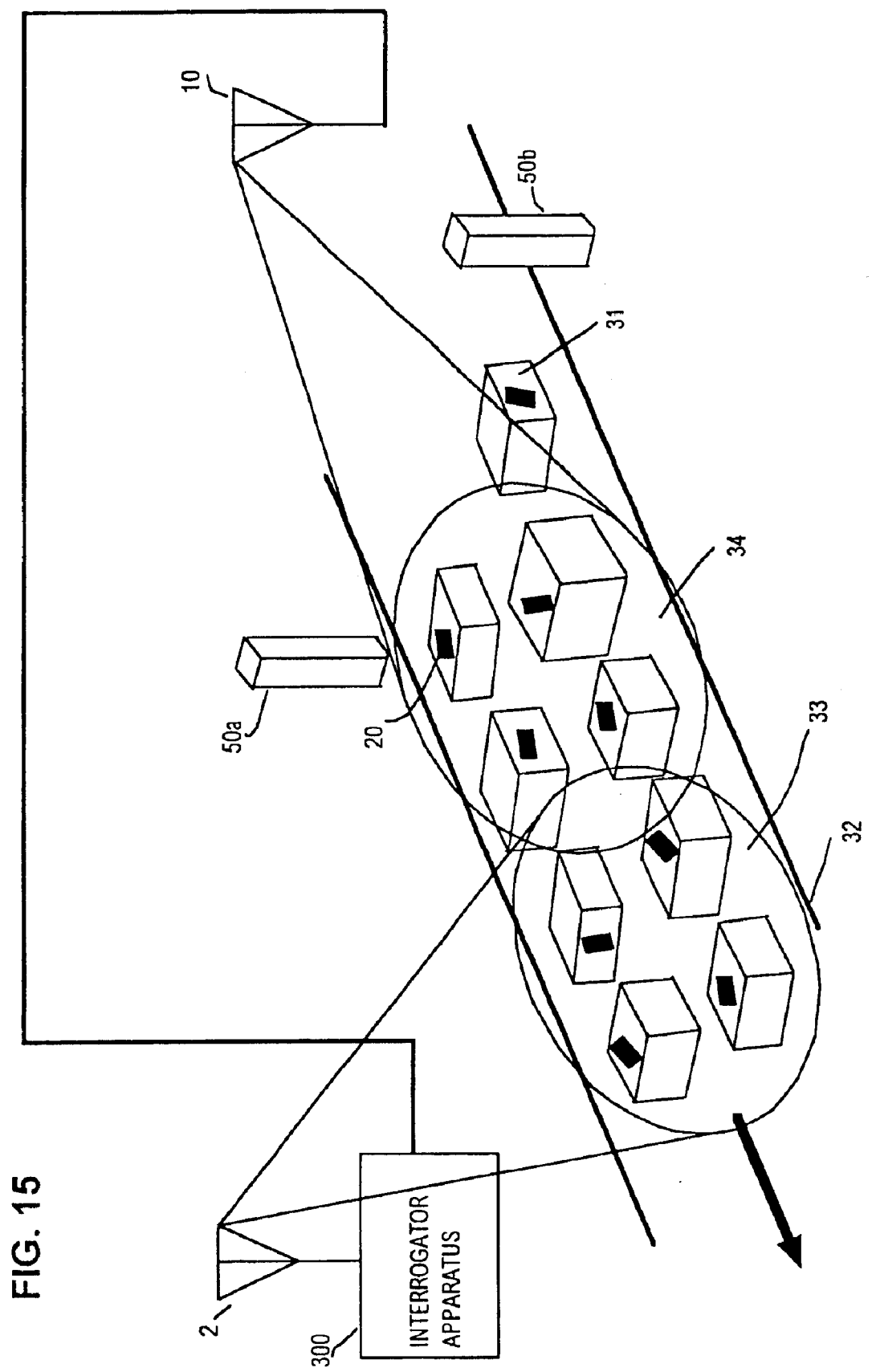
FIG. 15 is a conceptual diagram of a mobile body discrimination system which utilizes the mobile body discrimination apparatus of the sixth embodiment.

FIG. 15 shows the general position relationships between the first antenna 2 and second antenna 10 of the interrogator apparatus 1, the communication regions 33 and 34 of the antennas 2 and 10 respectively, the photoelectric sensors 50, and the transponders 20. Various techniques for utilizing photoelectric sensors to detect the passage of objects are well known, e.g., based on variations in level of reflected light that is incident on a sensor, or interruptions of a light beam that is incident on a sensor, so that detailed description will be omitted.

The operation of this embodiment is as follows. The estimation section 51 uses output signals obtained from the photoelectric sensors 50, which are positioned upstream from the second communication region 34 in relation to the direction of flow of the load items 31, to estimate the rate at which load items which are being transported by the conveyer belt 32, i.e., the number of load items which move past the photoelectric sensors 50 in each of respective unit time intervals. If the estimation section 51 estimates that the number of transponders 20 which pass within the unit time interval is less than a predetermined value (i.e., judges that all of the response data sets 61 from a plurality of transponders 20 which will be concurrently within the first communication region 33 can be acquired successfully by the operation of the transmitting/receiving system which is coupled to the first antenna 2) then a control signal produced from the estimation section 51 causes the power source control section 52 to set the signal lines (C) such as to switch off the supply of power to the transmitting and receiving sections which are coupled to the second antenna 10. Conversely, if it is found that the number of transponders 20 which pass the photoelectric sensors 50 within the predetermined time interval is greater than the aforementioned predetermined value, then a control signal is generated by the estimation section 51 whereby the power source control section 52 causes power to be supplied to aforementioned transmitting and receiving sections, i.e., the receiving section 94, mixer 115 and demodulator section 95 of the receiving path of the second antenna 10, and the modulator 97 and spreading section 14 of the transmission path of the antenna 10.

Thus with this embodiment, the rate at which transponders 20 are being transported by the conveyer belt 32 is judged, and depending upon the judgement result, control is executed to switch on or off the supply of power for operating the transmitting and receiving sections of the interrogator apparatus relating to the second antenna 10. In that way, a mobile body discrimination apparatus can be realized which has a lower level of power consumption for the interrogator apparatus.

The arrangement of data flows between the interrogator apparatus and transponders with this embodiment is as illustrated in the conceptual diagram of FIG. 16, when power is being supplied to the transmitting/receiving sections connected to the second antenna 10.

7$^{th}$ Embodiment

Figure 18:
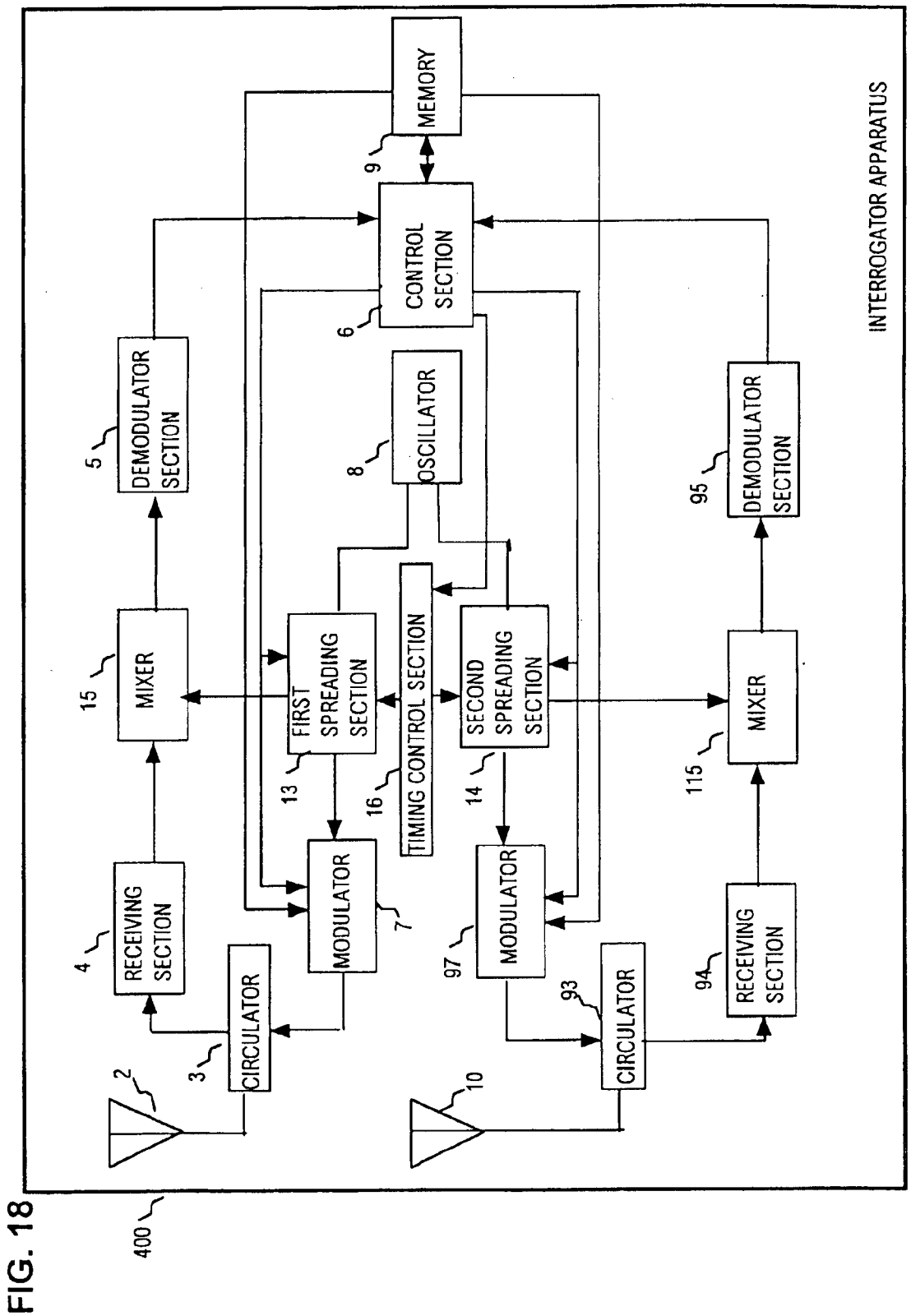
FIG. 18 is a system block diagram of an interrogator apparatus of a mobile body discrimination apparatus according to the seventh embodiment.

FIG. 18 shows the general configuration of the interrogator apparatus 400 of a seventh embodiment of the invention. In the overall system, the position relationships between the antennas 2 and 10, a common communication region 30 formed by the overlapping communication regions of these antennas, and the flow of load items 31 having respective transponders 20 attached thereto, are as described for the first embodiment and shown in FIG. 3. As shown in FIG. 18, the interrogator apparatus of this embodiment differs from that of the third embodiment shown in FIG. 8 in that a timing control section 16 is included, which controls the transmission of radio waves from the antennas 2 and 10. In this embodiment it is assumed that this control is performed by applying respective control signals from the timing control section 16 to the first spreading section 13 and the second spreading section 14, however other arrangements for selectively enabling/inhibiting transmission of radio waves from the antennas could be envisaged.

Figure 17A:
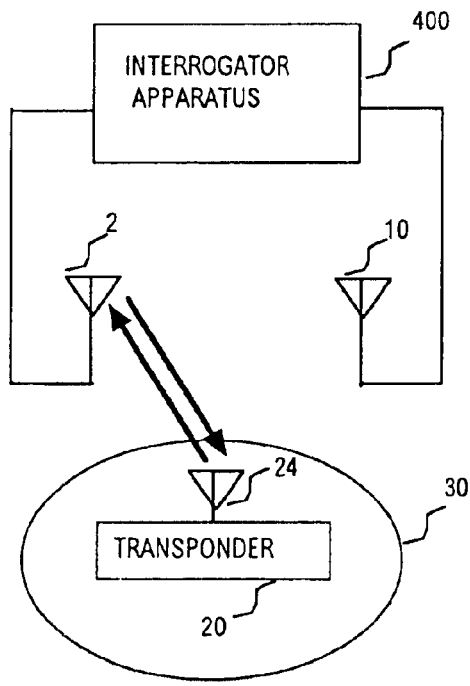
FIGS. 17A, 17B are respective conceptual diagrams for describing the interchange of data by radio waves between a transponder and two antennas of an interrogator apparatus, in a first operation condition and second operation condition respectively of the interrogator apparatus, in a mobile body discrimination apparatus according to a seventh embodiment.
Figure 17B:
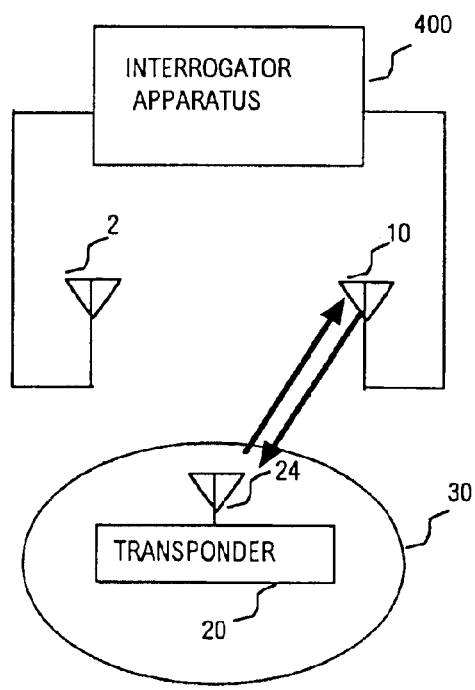

FIG. 17 conceptually illustrates the flow of data between the interrogator apparatus of this embodiment and a transponder which is located within the communication region 30, for the case in which the timing control section 16 is enabling communication to be executed only via the first antenna 2, and for the case in which communication is enabled only via the second antenna 10.

The operation of the seventh embodiment is as follows. In the same way as described for the third embodiment, modulated reflected spread-spectrum radio waves of respectively different types are received via the antennas 2 and 10 respectively, and inverse spectrum spreading is applied by the mixer sections 15 and 115, so that the demodulator sections 9, 5 obtain sets of response data from transponders. However with this embodiment, transmissions are performed alternately from the first antenna 2 and the second antenna 10 in successive time intervals. That is to say, a sequence is repetitively executed whereby transmission of radio waves from the second antenna 10 is inhibited while the unmodulated spread-spectrum radio waves and the Response Start command code are alternately transmitted from the first antenna 2 (as shown in FIG. 4) during a fixed interval, while in the succeeding fixed interval the transmission of radio waves from the first antenna 2 is inhibited while the unmodulated spread-spectrum radio waves and the Response Start command code 60 are being transmitted by the second antenna 10.

As a result, at any particular point in time, any transponder 20 which is within the communication region 30 will either receive only the spread-spectrum CW radio waves 63 and Response Start command code 60 from the first antenna 2, or only the spread-spectrum CW waves 64 and Response Start command code 60 from the second antenna 10 respectively.

The advantage of this is as follows. In the case of the third embodiment, a transponder which is within the communication region 30, i.e. a communication region which is common to both the antennas 2 and 20, will receive radio waves simultaneously from both of these antennas. These will tend to block one another, with respect to reception by the transponder, so that a transponder may be hindered from correctly receiving the Response Start command code 60, or the reflected signals from a transponder may be adversely affected by such concurrent reception of two different types of spread-spectrum radio waves, so that the interrogator apparatus may not receive the response data accurately from the transponders. However with this seventh embodiment, while receiving and demodulation are being applied by a transponder to a Response Start command code received from the first antenna 2 or the second antenna 10 of the interrogator apparatus 1, there will be no adverse effect resulting from reception of spread-spectrum radio waves that are being transmitted by the other one of these antennas. Hence, the response data from each of the transponders 20 which traverse the communication region 30 can be acquired by the interrogator apparatus 1 with a high degree of reliability, free from errors.

8<sup>th</sup> Embodiment

Figure 19:
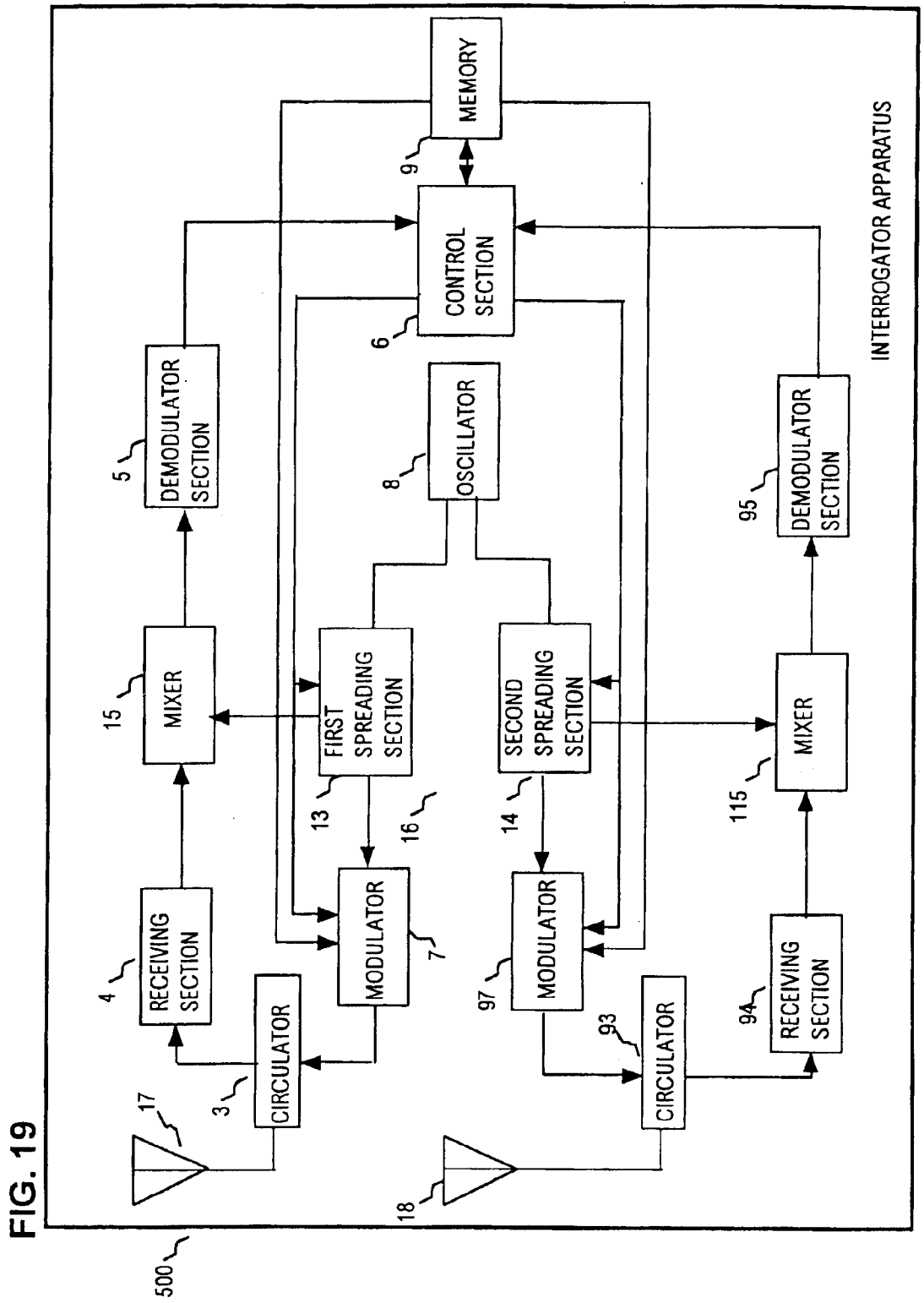
FIG. 19 is a system block diagram of an interrogator apparatus of a mobile body discrimination apparatus according to an eighth embodiment.
Figure 20:
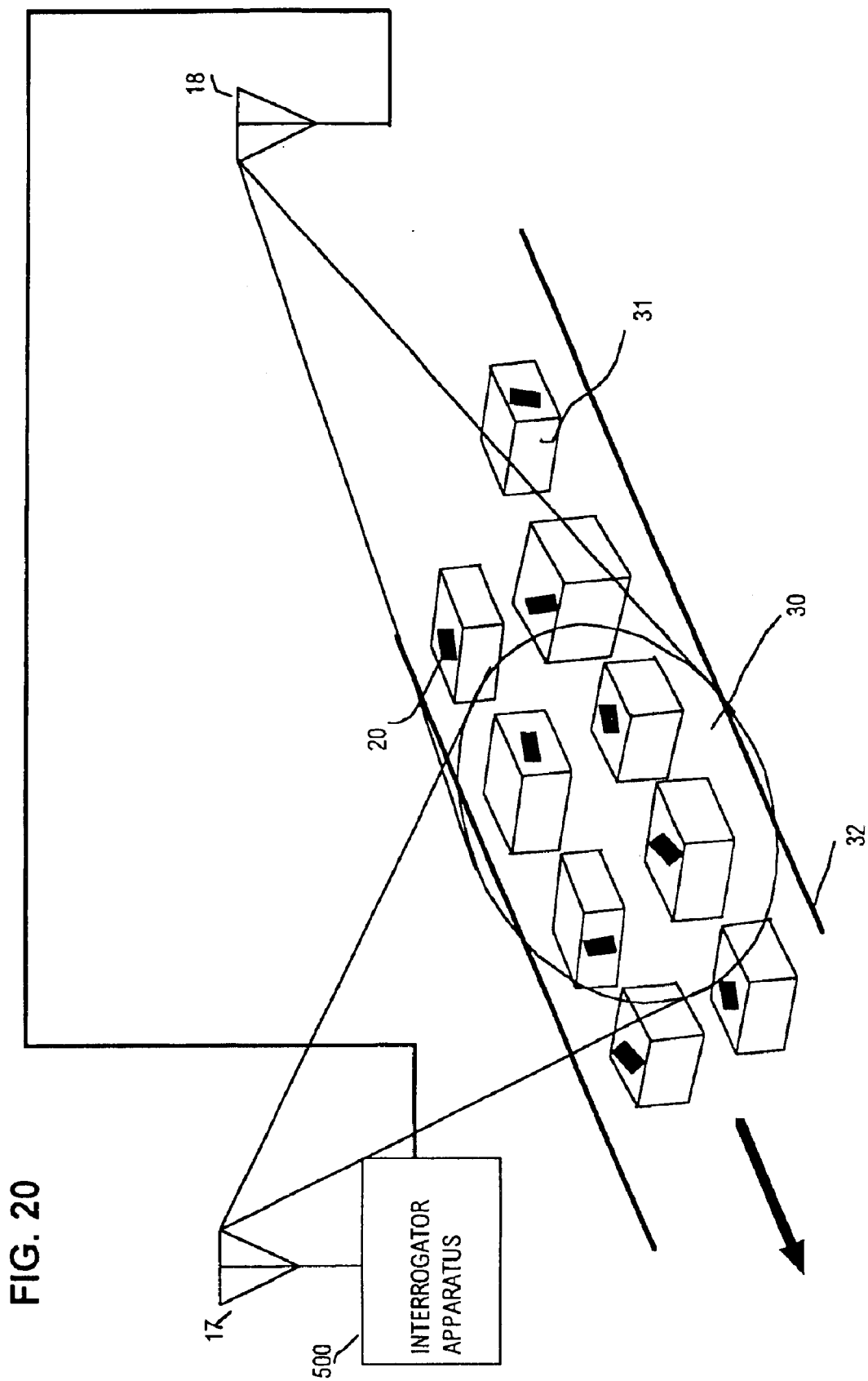
FIG. 20 is a conceptual diagram of a mobile body discrimination system which utilizes the mobile body discrimination apparatus of the eighth embodiment.

FIG. 19 is a diagram showing the internal configuration of an interrogator apparatus 500 of an eighth embodiment of the invention. The contents of FIG. 21 differ from those of the interrogator apparatus of the seventh embodiment shown in FIG. 18 and described above, in that the first and second antennas of the interrogator apparatus are respective polarizing antennas 17, 18 which apply respectively different types of polarization of the radio waves which they transmit. It will be assumed in the following that these are two opposite directions of circular polarization, e.g., with an antenna 17 which transmits radio waves polarized in the right-handed direction of rotation, and an antenna 18 which transmits radio waves polarized in the left-handed direction of rotation. The position relationships between the antennas 17, 18 of the interrogator apparatus 500 and the transponders 20 with this embodiment are as shown in FIG. 20, with a single communication region 30 being common to both of the antennas 17 and 18, formed by the overlapping communication regions of these two antennas.

This embodiment further differs from the seventh embodiment in that each of the transponders of this embodiment is provided with a polarizing antenna to constitute the antenna 24 shown in FIG. 1, i.e., either an antenna which will provide more efficient reception and modulated reflection of incident circular polarization radio waves that are of the right-handed direction, or an antenna which will provide more efficient reception and modulated reflection of left-handed polarization radio waves. In addition it is arranged that, on average, approximately half of the respective antennas 124 of the transponders 220 that are attached to the load items 31 and thereby moved by the conveyer belt 32 are of the first of these two different circular polarization types, and the remaining half of the transponders have respective antennas that are of the second type of circular polarization.

Figure 22:
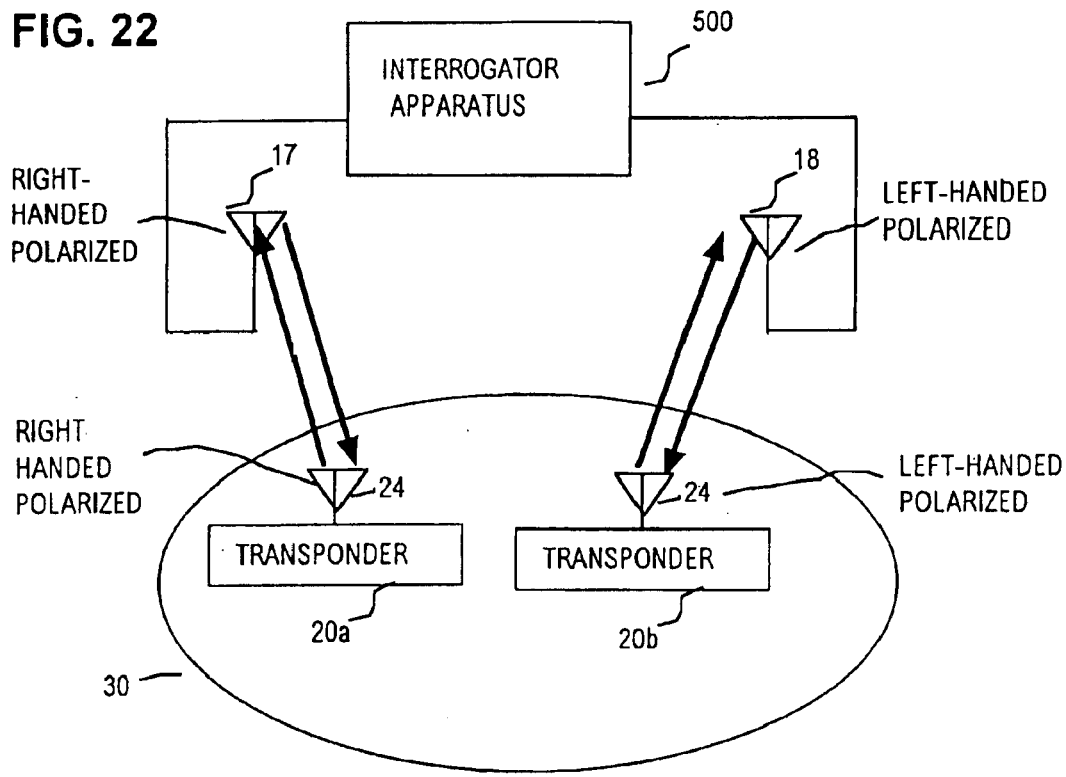
FIG. 22 is a conceptual diagram for describing the interchange of data by radio waves between two transponders and two antennas of an interrogator apparatus, with the mobile body discrimination apparatus of the eighth embodiment.

FIG. 22 conceptually illustrates the flow of data between the interrogator apparatus of this embodiment and two transponders 20a, 20b which have a right-handed polarization antenna and a left-handed polarization antenna respectively, and are located in the communication region 30.

The operation of this eighth embodiment is as follows. As described for the seventh embodiment, spread-spectrum radio waves 63 and 64 are generated using respectively different pseudo-noise code sequences and are transmitted from the right-handed polarization antenna 17 and left-handed polarization antenna 18 respectively. The transponders respond selectively to the transmissions from the interrogator apparatus 500, with each transponder sending a response only to a Response Start command code that is conveyed by radio waves transmitted from antenna 17, or only to a Response Start command code transmitted from the antenna 18, in accordance with the type of polarization of the antenna of the transponder. As a result, each of the right-handed polarization antenna 17 and the left-handed polarization antenna 18 of the interrogator apparatus 500 will reliably obtain response data 61 from approximately half of a plurality of transponders 20 which are moving through the communication region 30 at the same time.

Thus with this embodiment, by providing a right-handed direction circular polarization antenna 17 and a left-handed direction circular polarization antenna 18 and arranging that, on average, approximately half of a plurality of transponders 20 which are passing through the communication region 30 simultaneously can receive signals transmitted by only one of these antennas and the remaining half can receive signals transmitted only by the other one of these antennas, even greater advantages than those described for the seventh embodiment can be obtained with regard to reliable acquisition of data from a plurality of transponders which are passing through the communication region 30.

With this embodiment, it would be possible to position the right-handed polarization antenna 17 and left-handed polarization antenna 18 at approximately the same location, for example on one side of the conveyer belt 32, to form the communication region 30.

As a further alternative, a plurality of interrogator apparatuses could be utilized, to provide a plurality of communication regions 30, respectively positioned such as the two communication regions 33, 34 in the diagram of FIG. 4, i.e., successively arranged along the direction of motion of the conveyer belt 32. In that case, assuming that two such communication regions are formed by a pair of interrogator apparatuses in that way, the information from a transponder which is not acquired by a first interrogator apparatus when that transponder passes through the upstream communication region could be acquired by the other interrogator apparatus when the transponder passes through the downstream communication region.

9$^{th}$ Embodiment

Figure 21:
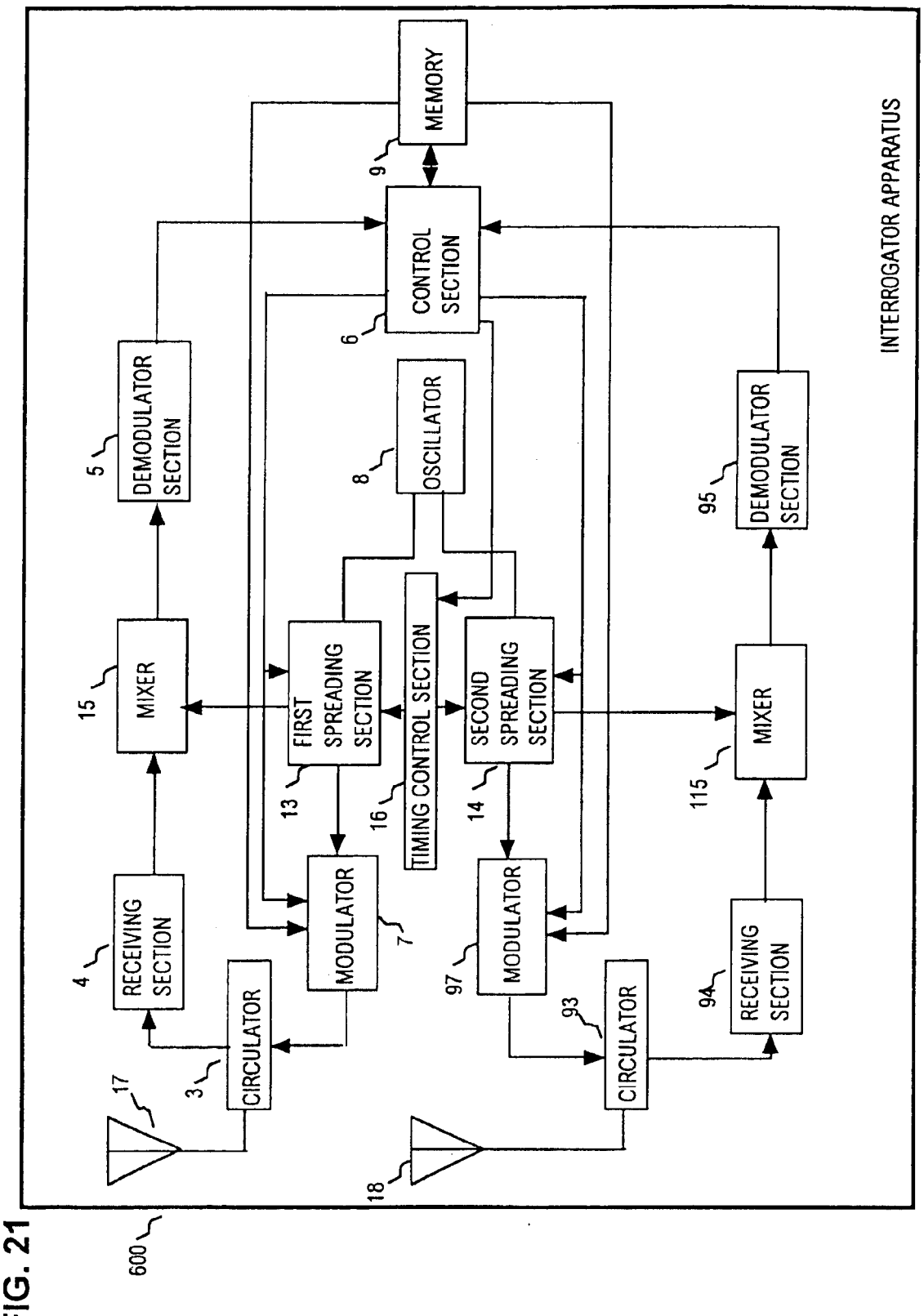
FIG. 21 is a system block diagram of an interrogator apparatus of a mobile body discrimination apparatus according to a ninth embodiment.

FIG. 21 is a general block diagram of the interrogator apparatus 600 of a ninth embodiment of the invention. This embodiment differs from the eighth embodiment described above only in that the interrogator apparatus 600 includes a timing control section 16, as for the interrogator apparatus 400 of the seventh embodiment shown in FIG. 18, for alternately switching the operation of the interrogator apparatus between a condition of enabling transmission of radio waves from the first polarizing antenna 17 of the interrogator apparatus while inhibiting transmission of radio waves from the second polarizing antenna 18, and a condition of enabling transmission of radio waves from the second polarizing antenna 18 while inhibiting transmission of radio waves from the first polarizing antenna 17. Hence, while a transponder of this embodiment is receiving radio waves which are polarized in the appropriate direction for the antenna of that transponder, it will not be subjected to incident radio waves of the other direction of polarization, so that the reception sensitivity of the transponder will not be adversely affected.

10$^{th}$ Embodiment

Figure 24:
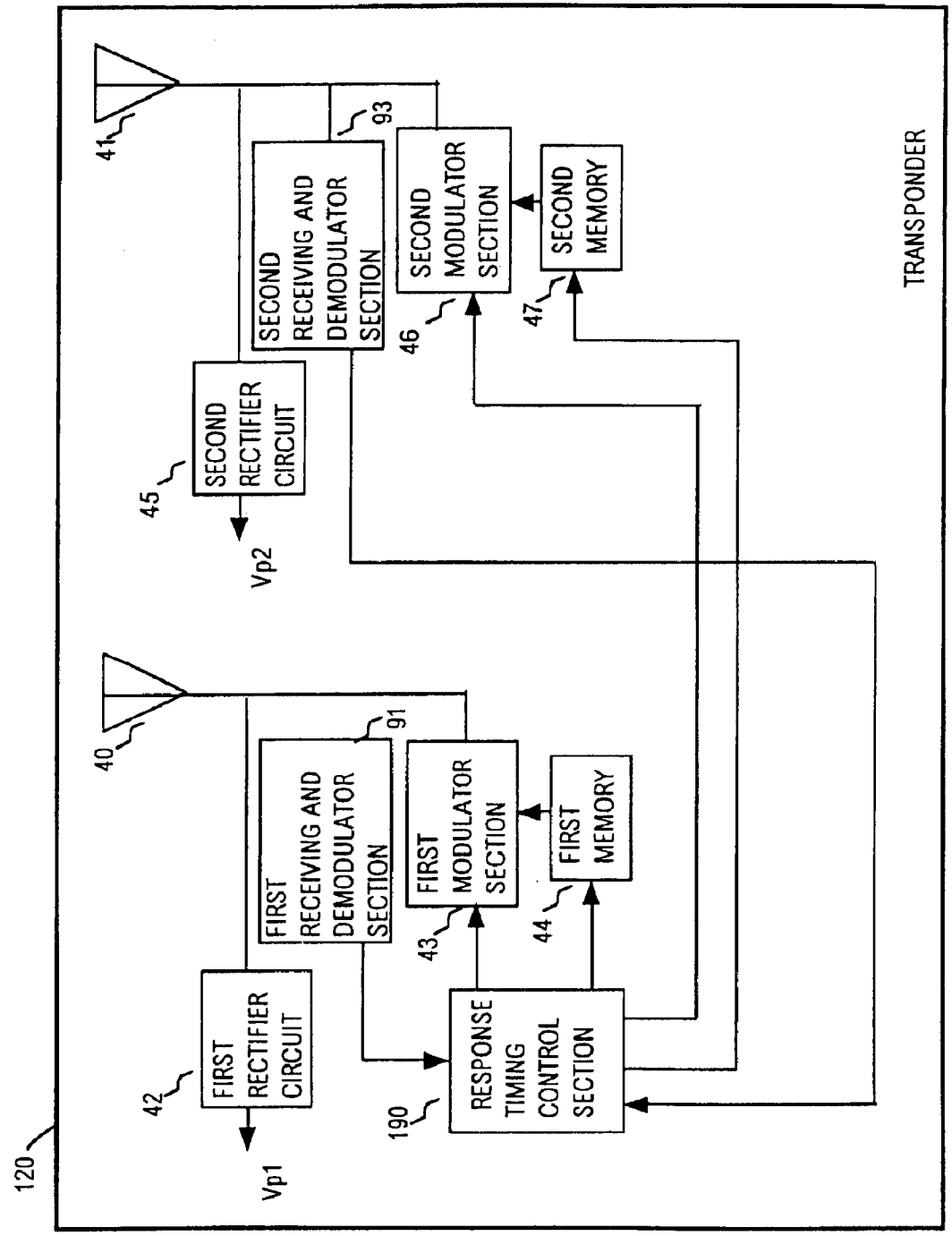
FIG. 24 is a system block diagram of a transponder of the mobile body discrimination apparatus of the tenth embodiment.

FIG. 24 is a system block diagram showing the general configuration of a transponder 120 of a tenth embodiment of the invention. This transponder is for use in conjunction with an interrogator apparatus which transmits polarized radio waves having respectively different types of polarization from the first and second antennas, as with the eighth embodiment described above, but whereby the interrogator apparatus can thereby obtain two different sets of response data (one of which might for example be identification data) concurrently from a transponder. In FIG. 24, numeral 40 denotes a first polarizing antenna, 41 denotes a second polarizing antenna, 42 denotes a first rectifier circuit which is connected to the first antenna 40 and produces a DC power supply designated in FIG. 24 as Vp1, 43 denotes a first modulator section which is connected to the first antenna 40, 44 denotes a first memory which is connected to the first modulator section 43, 91 denotes a first receiving and demodulator section which is connected to the first antenna 40, 190 denotes a response timing control section which controls the operation of the first memory 44 and first modulator section 43, 45 denotes a second rectifier circuit which is connected to the second antenna 41 and produces a DC power supply which is designated as Vp2 in FIG. 24, 46 denotes a second modulator section which is connected to the second antenna 41, 47 denotes a second memory which is connected to the second modulator section 46, with the second modulator section and second memory also being controlled by the response timing control section 190, and 95 denotes a second receiving and demodulator section which is connected to the second antenna 41. The antenna configuration of the transponder 120 is determined in accordance with the polarization method that is used by the interrogator apparatus. The antenna configurations of the interrogator apparatus are as described for the eighth embodiment described above, so that one of the antennas 40, 41 of the transponder 120 is of right-handed circular polarization type, and the other antenna is of left-handed circular polarization type.

The interrogator apparatus of this embodiment is substantially identical to that of the eighth embodiment shown in FIG. 19. When two sets of data, conveyed by modulated reflected right-handed circular polarization radio waves and left-handed circular polarization radio waves respectively, are concurrently (or substantially concurrently) received and demodulated by the receiving systems of the first and second antennas 17, 18 respectively (e.g., an identification code and a response data set transmitted from one of the transponders), the control section 6 writes both of these sets of data into the memory 9, for example into adjacent memory addresses.

Figure 23:
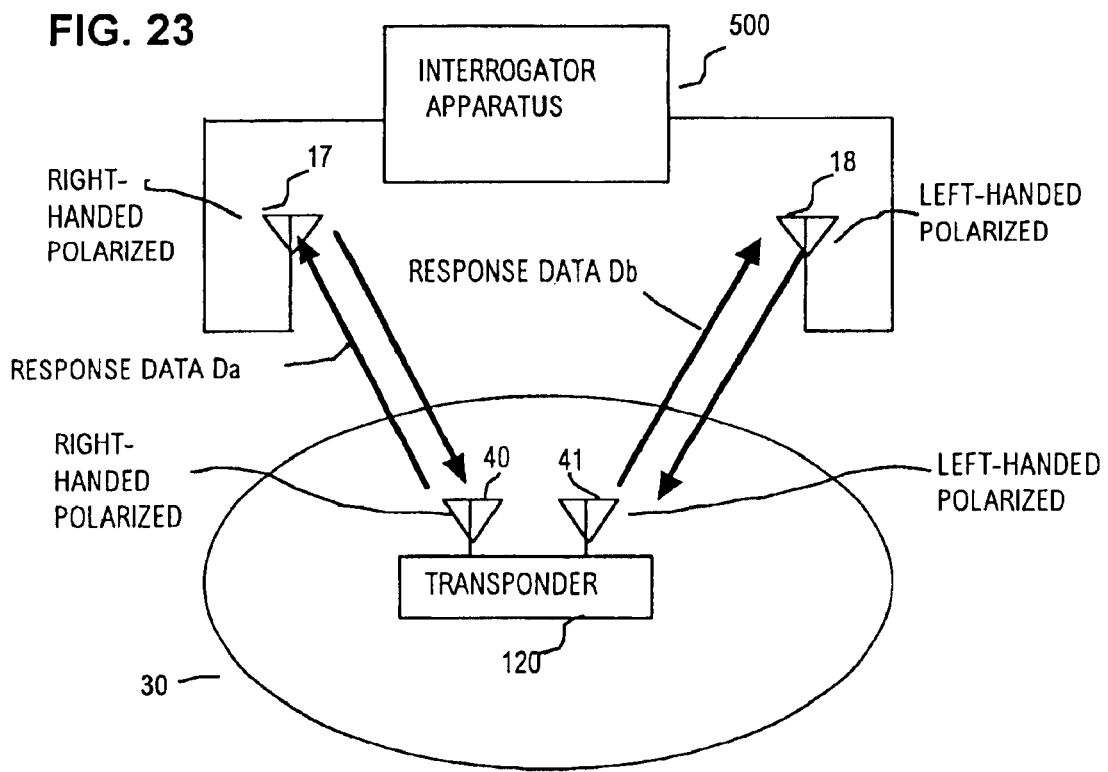
FIG. 23 is a conceptual diagram for describing the interchange of data by radio waves between two transponders and two antennas of an interrogator apparatus, with the mobile body discrimination apparatus of a tenth embodiment.

FIG. 23 conceptually illustrates the flow of data between the interrogator apparatus of this embodiment and a transponder which has a right-handed polarization antenna 40 and a left-handed polarization antenna 41, and is located in the communication region 30, with the diagram illustrating how two different sets of response data, designated as Da and Db respectively, can be concurrently acquired by the interrogator apparatus from a transponder.

The operation of the transponder of this embodiment is as follows. It will be assumed in the following that the DC supply power which is produced by the first rectifier circuit 42 is used to operate each of the circuits which are coupled directly or indirectly to the first antenna 40, while the output from the second rectifier circuit 45 is similarly used to power the remaining circuits, i.e., those associated with the second antenna 41. However since the transponder is to be used under a condition in which spread-spectrum radio waves are being received concurrently by both of the antennas 40, 41, other arrangements for distributing the power produced by the rectifier circuits 42, 45 could be adopted. When the first antenna 40 of a transponder receives the (spread-spectrum) right hand circular polarization radio waves from the interrogator apparatus 1 the first rectifier circuit 42 rectifies these to obtain power to operate circuits of the transponder. The first modulator section 43 applies modulation in accordance with the data which have been stored beforehand in the first memory 44, which are read out under the control of the response timing control section, at a time (following reception of the Response Start command code from the interrogator apparatus) which is randomly determined, i.e., the configuration and operation of the response timing control section 190 is similar to that described for the response timing control section 26 of the first embodiment shown in FIG. 1, other than that the response timing control section 190 responds to reception of the Response Start command code by either or both of the receiving and demodulator sections 91, 93 to randomly determine a time point to commence transmission of data from the antennas 40, 41. As described for the preceding embodiments, the modulation which is applied by the transponder may for example be amplitude or phase modulation.

When the second antenna 41 of the transponder 120 receives the left hand circular polarization radio waves from the interrogator apparatus 1, the second rectifier circuit 45 rectifies these to obtain power to operate circuits of the transponder, and (at each of the above-mentioned randomly determined time points) the second modulator section 46 applies modulation in accordance with the data which have been stored beforehand in the second memory 47, to thereby reflect the spread-spectrum radio waves from the interrogator apparatus 1 such as to transmit to the interrogator apparatus 1 a signal conveying the data held in the second memory 47.

The degree of polarization discrimination provided by the second antenna 41 is such that the right hand circular polarization radio waves from the interrogator apparatus 1 will not be received by the second antenna 41, and conversely, the left hand circular polarization radio waves from the interrogator apparatus 1 will not be received by the first antenna 40.

Thus with this embodiment, communication can be performed between the interrogator apparatus 1 and a transponder 120 using radio waves having two different types of polarization simultaneously, thereby enabling the transponder 120 to transmit two separate set of data concurrently to the interrogator apparatus 1. For example, it becomes possible for a transponder 120 to transmit an ID code via the first antenna 40, and data relating to an object via the second antenna 41. In that way, the requisite data can be rapidly acquired from each of the transponders 20 by the interrogator apparatus 1. That is to say, transponders 20 which have moved into the communication region 30 become illuminated with two different types of (spread-spectrum) polarized radio waves, and each transponder 120 performs respectively different operations in response to reception of these two different types of radio waves, such as transmitting two different types of information simultaneously to the interrogator apparatus 1. As a result, a mobile body discrimination apparatus can be realized whereby information can be rapidly acquired from a plurality of transponders 20 which are currently within the communication region 30.

Furthermore, each transponder 120 can obtain electrical power for operating its internal circuits from both the first antenna 40 and the second antenna 41, so that greater stability can be obtained for that supply of power irrespective of the position and orientation of the transponder within a communication region of the interrogator apparatus.

11$^{th}$ Embodiment

Figure 25:
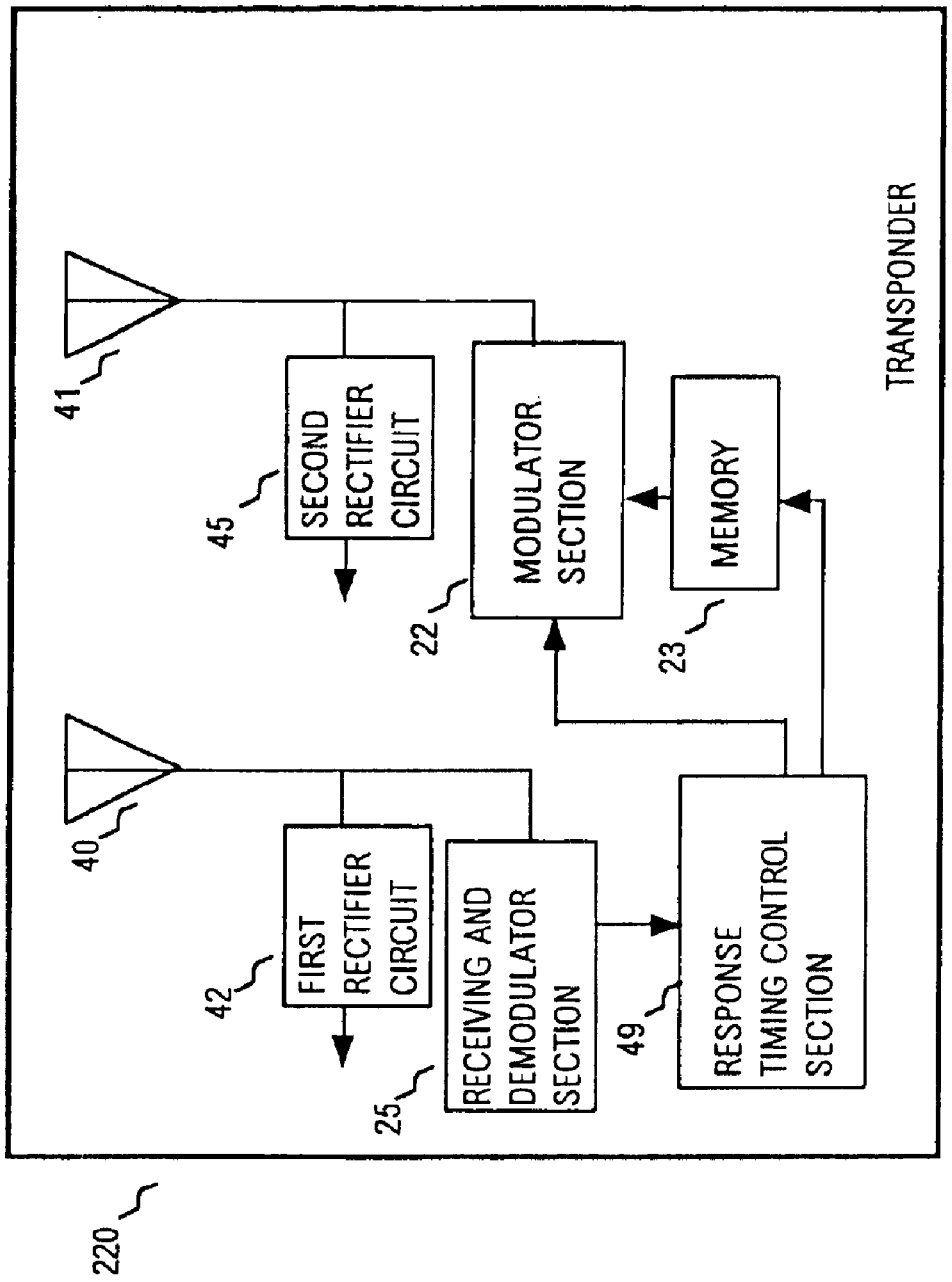
FIG. 25 is a system block diagram of a transponder of a mobile body discrimination apparatus of an eleventh embodiment.

FIG. 25 is a diagram showing the general configuration of a transponder 220 of an eleventh embodiment of the invention. In FIG. 25, numeral 40 denotes a first antenna, 42 denotes a first rectifier circuit which is connected to the first antenna 40, 25 denotes a detection/demodulator section which is connected to the first antenna 40, 41 denotes a second antenna, 45 denotes a second rectifier circuit which is connected to the second antenna 41, 22 denotes a modulator section which is connected to the second antenna 41, 23 denotes a memory which is connected to the modulator section 22, 49 denotes a response timing control section which is connected to the detection and demodulator section 25 and the memory 23. This transponder can be configured such that for example the first antenna 40 is a polarizing antenna having the right-handed circular direction of polarization, the second antenna 41 is a polarizing antenna of the left-handed direction of circular polarization, so that each of these antennas receive only polarized radio waves from the interrogator apparatus 700 which are of the same direction of circular polarization as that antenna.

The overall system configuration can be identical to that shown in FIG. 20, with a single communication region 30 being common to both of the antennas 17 and 18 of the interrogator apparatus.

Figure 26:
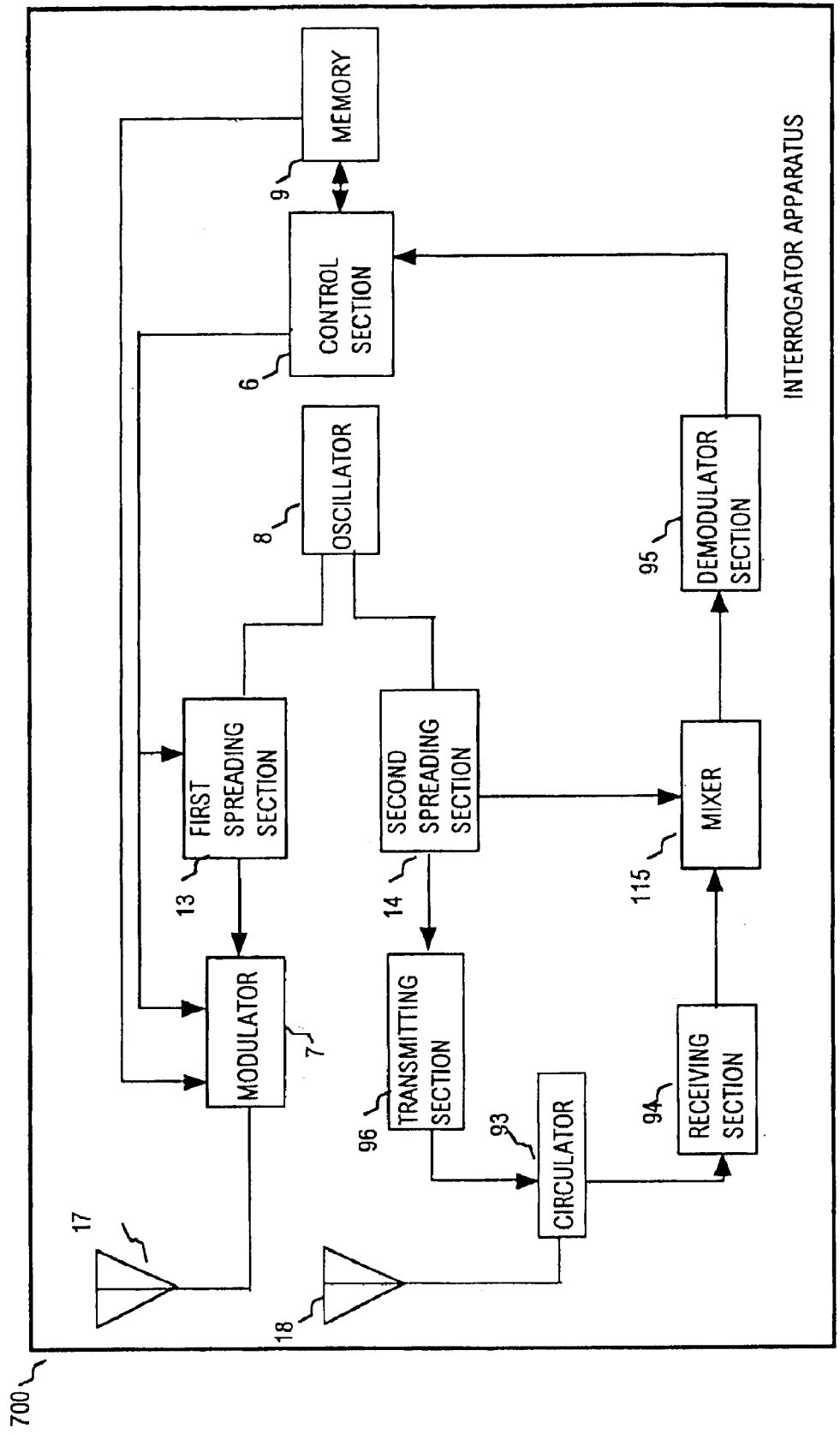
FIG. 26 is a system block diagram of an interrogator apparatus of a mobile body discrimination apparatus in accordance with an eleventh embodiment.

FIG. 26 is a general block diagram of the interrogator apparatus 700 of this embodiment. This is basically similar to that of the eighth embodiment, however since the first antenna 17 is used only to transmit polarized spread-spectrum radio waves, which will be assumed to be of the same polarization type as the first antenna 40 of the transponder 220, no receiving sections are provided for that antenna, while since the second antenna 18 is of the same polarization type as the second antenna 41 of the transponder 220, it is not required to transmit modulated radio waves, but only to transmit unmodulated spread-spectrum polarized radio waves and receive reflected modulated radio waves, so that no modulator section need be provided for that antenna. Furthermore, in addition to the Response Start command code, the memory 9 of the interrogator apparatus of this embodiment also has stored therein arbitrarily determined data which are to be transmitted to each of the transponders or (when accompanied by an identification code) to specific ones of the transponders. The control section 6 may itself include a data I/O section and display device, etc., for inputting such arbitrarily determined data to the memory 9, or may be coupled to an external data processing apparatus which provides such a function.

Figure 27:
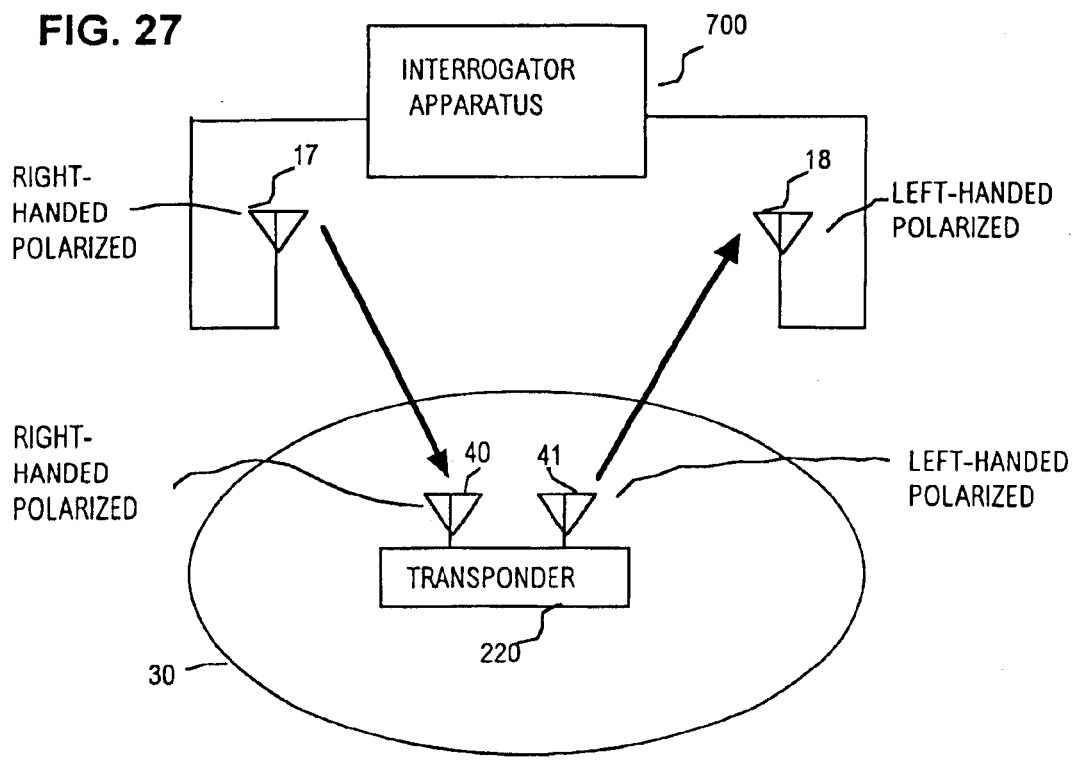
FIG. 27 is a conceptual diagram for describing the interchange of data by radio waves between a transponder having two polarized antennas having respectively different types of polarization and two antennas of an interrogator apparatus, having respectively different types of polarization, with the mobile body discrimination apparatus of an eleventh embodiment.

FIG. 27 conceptually illustrates the flow of data between the interrogator apparatus of this embodiment and a transponder which has a right-handed polarization antenna 40 and a left-handed polarization antenna 41, and is located in the communication region 30, with the diagram illustrating how the interrogator apparatus can utilize the first and second antennas 17, 18 to send data to the transponder concurrently with acquiring data from the transponder.

The operation of this embodiment is as follows. When the second antenna 41 of a transponder 220 receives the left-handed circular polarization radio waves from the second antenna 18 of the interrogator apparatus 700, the second rectifier circuit 45 rectifies these to obtain power to operate the circuits of the transponder, and in addition the modulator section 22 applies modulation in accordance with data which have been stored beforehand in the memory 23, to the CW radio waves transmitted from the interrogator apparatus 700, to thereby generate reflected radio waves for transmitting the information stored at the transponder 220 to the interrogator apparatus 700.

The first antenna 40 of the transponder 220, on the other hand, receives the right-handed direction circular polarization radio waves from the interrogator apparatus, and the first rectifier circuit 42 rectifies these to obtain power to operate the circuits of the transponder. Signals conveyed by modulated radio waves that are received by the first antenna 40 are demodulated by the receiving and demodulator section 25. These signals convey the Response Start command code, which is utilized by the control section 149 in the same manner as for the response timing control section 26 of the first embodiment, and also convey the aforementioned arbitrarily determined data (i.e., transmitted in the intervals between successive occurrences of the Response Start command code) which may be directed to a specific transponder or to all of the transponders. Such data are supplied from receiving and demodulator section 25 to the control section 149, to be written into the memory 23.

If for example such transmitted data includes a transponder identifier code, then the control section 149 can be configured to include a function for recognition of that code, to enable only data intended for that specific transponder to be extracted from the data which are transmitted by the interrogator apparatus.

In that way, the transponder 220 can acquire arbitrary information from the interrogator apparatus 700. The right-handed circular polarization radio waves from the interrogator apparatus 700 cannot be modulated and reflected by the second antenna 41, and conversely the left-handed circular polarization radio waves from the interrogator apparatus 700 cannot be received by the first antenna 40. Hence, each transponder 220 can simultaneously transmit and receive information to and from the interrogator apparatus 700, by using the two different types of radio waves.

Thus with this embodiment, the transponders 20 which successively enter the communication region 30 become illuminated by radio waves of different types of polarization, and each transponder 220 performs respectively different types of operation in response to these two types of radio waves, so that it becomes possible for a transponder 220 to perform transmission and receiving using two antennas simultaneously. As a result, a mobile body discrimination system can be realized whereby bidirectional communication can be successively performed with each of a plurality of transponders 220 which are concurrently within the communication region 30.

12<sup>th</sup> Embodiment

A twelfth embodiment of the invention will be described in the following. With this embodiment, the interrogator apparatus is configured as shown in FIG. 19 for the eighth embodiment, and the overall system configuration can be as shown in FIG. 20, while each of the transponders is configured as shown in FIG. 25. However with the twelfth embodiment, it is arranged that (on average) approximately half of the transponders which move through the communication region 30 are of a first type, which have a first antenna 40 that is of the right-handed direction of circular polarization and a second antenna 41 which is of the left-handed direction of circular polarization, while the other half of the transponders are of a second type, which have a first antenna 40 that is of the left-handed direction of circular polarization and a second antenna 41 which is of the right-handed direction of circular polarization.

As a result, it becomes possible for the interrogator apparatus to send data via the first antenna 17 to a transponder that is of the first type, while concurrently receiving response data from that transponder via the second antenna 18, while at the same time sending data via the second antenna 18 to a transponder that is of the second type, while concurrently receiving response data from that transponder via the first antenna 17.

Figure 28:
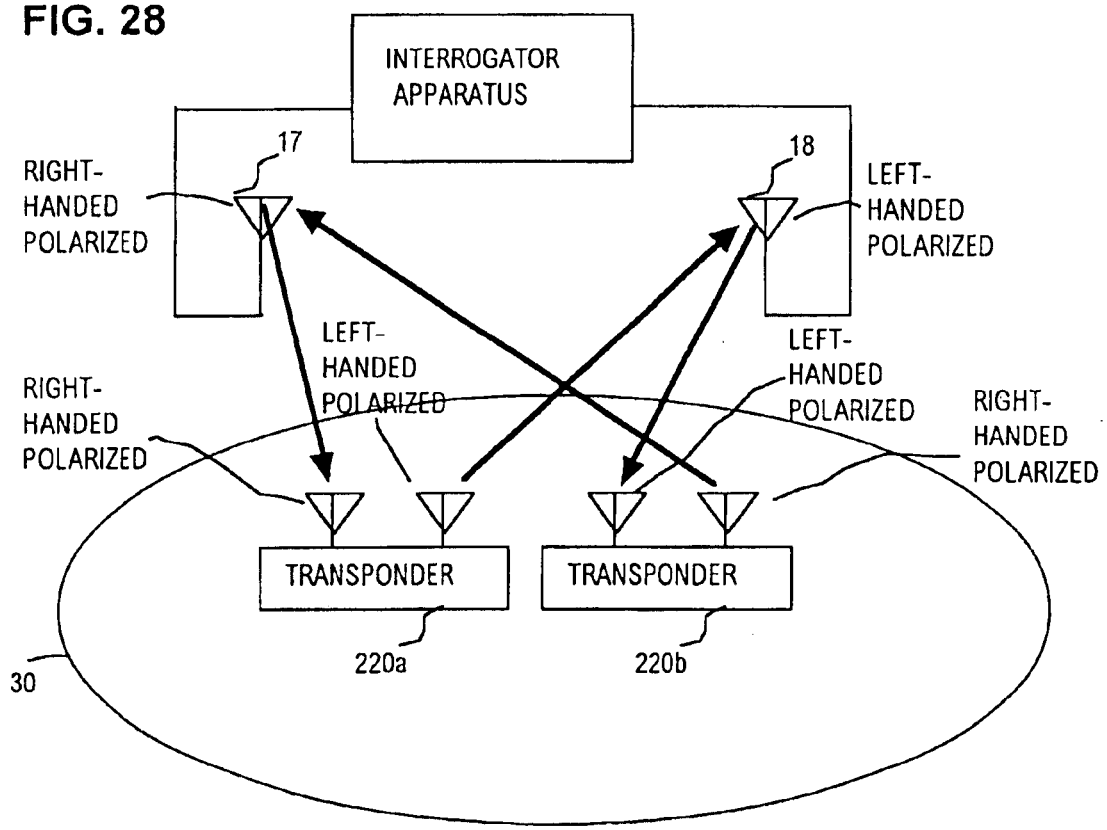
FIG. 28 is a conceptual diagram for describing the interchange of data by radio waves between two transponders, each having two polarized antennas with respectively different types of polarization, and two polarized antennas of an interrogator apparatus, with a mobile body discrimination apparatus in accordance with a twelfth embodiment.

FIG. 28 conceptually illustrates the flow of data between the interrogator apparatus of this embodiment and a first transponder 220a which has the first antenna 40 thereof as a right-handed polarization antenna 40 and the second antenna 41 thereof as a left-handed polarization antenna, and a second transponder 220b which has the first antenna 40 thereof as a left-handed polarization antenna 40 and the second antenna 41 thereof as a right-handed polarization antenna, with both transponders being located in the communication region 30.

Thus with this embodiment, a greater number of transponder can pass through the communication region 30 in each unit time interval while ensuring reliable two-way communication with each of these transponders, by comparison with the preceding embodiment.

13<sup>th</sup> Embodiment

FIG. 29 is a general block diagram of the configuration of each transponder 320 of a thirteenth embodiment of the invention. In FIG. 29, numeral 40 denotes a first polarizing antenna, 41 denotes a second polarizing antenna, 42 denotes a first rectifier circuit which is connected to the first antenna 40, 43 denotes a first modulator section which is connected to the first antenna 40, 44 denotes a first memory which is connected to the first modulator section 43, 194 denotes a response timing control circuit, 45 denotes a second rectifier circuit which is connected to the second antenna 41, 46 denotes a second modulator section which is connected to the second antenna 41, 48 denotes a power comparison section which monitors the respective supply voltage levels produced by the first rectifier circuit 42 and to the second rectifier circuit 45 and which selectively applies operation inhibit signals through the lines 48a, 48b respectively to the first modulator section 43 and second modulator section 46. 23 denotes a memory which is connected to supply data (read out under the control of the response timing control section 194) to the first modulator section 43 and the second modulator section 46, to be transmitted by modulation of reflected radio waves. The antenna configuration is identical to that of the eighth embodiment shown in FIG. 19, with the first antenna 40 and second antenna 41 being respectively of right-handed and left-handed directions of circular polarization.

Figure 30A:
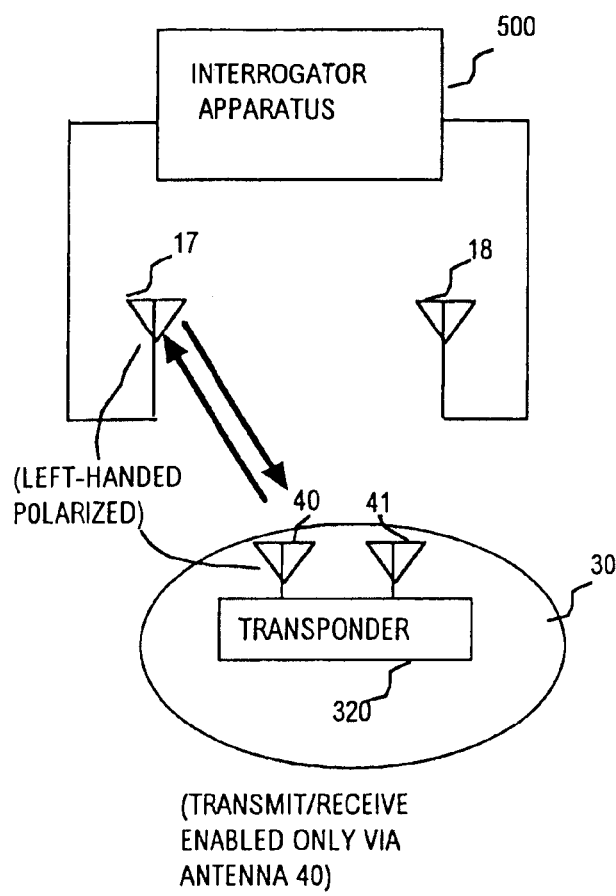
FIGS. 30A, 30B are conceptual diagrams for describing the interchange of data by radio waves between a transponder having two polarized antennas having respectively different types of polarization and two antennas of an interrogator apparatus, having respectively different types of polarization, with the mobile body discrimination apparatus of the 13$^{th}$ embodiment.
Figure 30B:
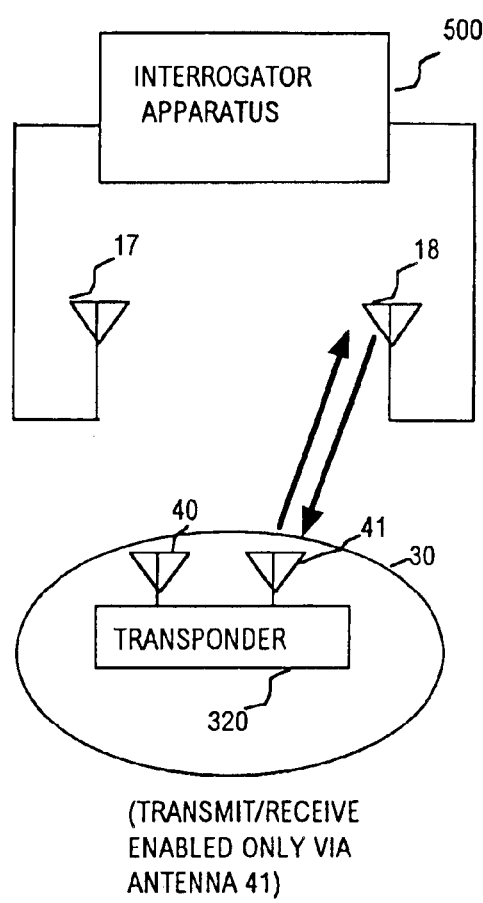

The configuration of the interrogator apparatus of this embodiment can be substantially identical to that of the eighth embodiment shown in FIG. 19. However with this embodiment, the interrogator apparatus acquires response data from only one transponder at a time, with the response data being transmitted from either the first antenna 40 or the second antenna 41 of the transponder. This is conceptually illustrated in FIGS. 30A, 30B.

The operation of this embodiment is as follows. As described for the eighth embodiment, the interrogator apparatus 1 communicates with each of the transponders 20 by using two types of radio waves, i.e., right-handed and left-handed direction circularly polarized radio waves. When the first antenna 40 of a transponder 20 receives the right-handed direction polarization radio waves from the interrogator apparatus 1 the first rectifier circuit 42 rectifies these to obtain power to operate the electronic circuits of the transponder. In addition, the level of power that is currently available from the first rectifier circuit 42 is detected by the power comparison section 48, e.g., based on the level of output DC voltage produced from that rectifier circuit when supplying operating current to circuits of the transponder. Similarly, when the second antenna 41 of the transponder 20 receives the left-handed direction polarization radio waves from the interrogator apparatus 1, the second rectifier circuit 45 rectifies these to obtain power to operate circuits of the transponder, and the level of power that is currently available from the second rectifier circuit 45 is detected by the power comparison section 48. The power comparison section 48 compares the respective power levels that are available from the first rectifier circuit 42 and the second rectifier circuit 45, and enables the operation of the one of the modulator sections 43, 46 which corresponds to the higher one of these two levels of e power, while inhibiting the operation of the other one of these modulator sections. Thus, when the Response Start command code is received via one or both of the antennas 40, 41, then as described for the preceding embodiments, the response timing control section 194 applies control signals whereby the response data are read out frame the memory 23 and supplied to the modulator sections 43, 46, to be transmitted as modulated reflected radio waves by the operation of the one of the two modulator sections 43, 46 which is currently operative. Thus, a type of polarization diversity operation is implemented by the transponders with this embodiment.

In that way, as the transponders 320 successively enter the communication region 30 of the interrogator apparatus and become illuminated by the differently polarized radio waves, response data sets are successively received from each of these transponders 320 via the type of polarized radio waves for which the higher value of power is currently being derived by the transponder. Hence, each of the transponders 320 can communicate with the interrogator apparatus by using the optimum condition of propagation of radio waves, so that a mobile body discrimination apparatus can be realized which provides a high degree of reliability of communication.

With each of the mobile body discrimination apparatus embodiments described above, it should be noted that it would be equally possible to either utilize a rectifier circuit to derive power for operating the circuits of the transponder from incident radio waves, or to use a battery mounted in the transponder to supply the circuits.

14th Embodiment

Figure 31:
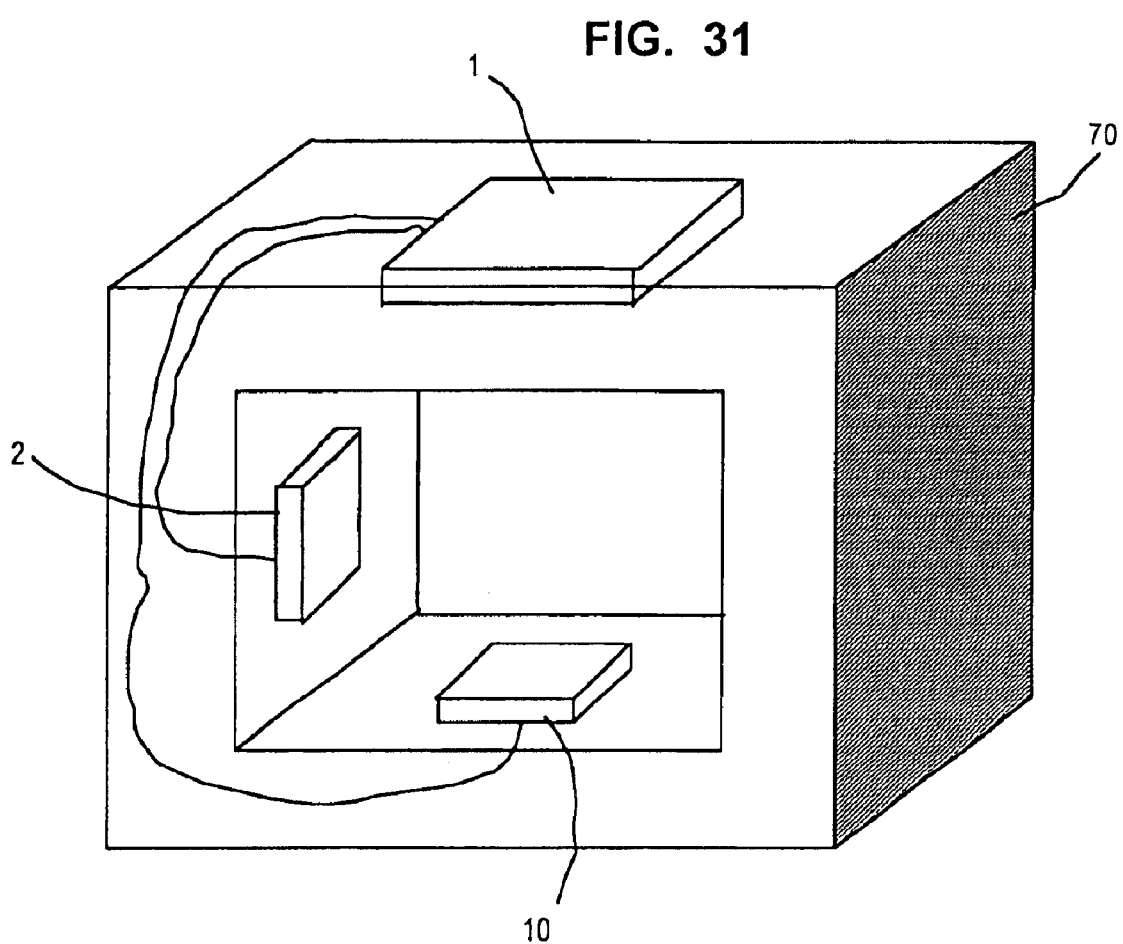
FIG. 31 is a diagram illustrating the configuration of a housing in accordance with a 14$^{th}$ embodiment, for maintaining a plurality of antennas of an interrogator apparatus in respective specific position relationships to a moving stream of articles having respective transponders attached thereto, in a mobile body discrimination system.

FIG. 31 shows the general configuration of a fourteenth embodiment of the invention, which is a housing for supporting antennas of an interrogator apparatus in appropriate relationship to a stream of transponders, such as the antennas 2, 10 of the interrogator apparatus of the first embodiment in relation to the transponders which are transported by the conveyer belt 32 in the system shown in FIG. 3. In FIG. 31, numerals 2 and 10 respectively denote first and second antennas of the interrogator apparatus, and 70 denotes a housing which encloses and supports the interrogator apparatus 1, the first antenna 2 and the second antenna 10. The housing 70 is configured with a central part of the housing being open to form a central aperture, to permit a stream of load items having transponders 20 attached thereto to move through that central aperture. The housing 70 is formed of a suitable electrically conductive material which is selected to provide effective shielding against leakage of radio waves between the exterior of the housing and the central aperture.

Although it is assumed here that this housing 70 is applied to the apparatus and system of the first embodiment, it would be equally applicable to various other ones of the embodiments described above. However in the case of a method in which both a first communication region 33 and a second communication region 34 are formed at respectively different positions as in the example of FIG. 5, the first antenna 2 and second antenna 10 must be mounted within the interior of the housing 70 at locations close to these respective positions. The respective positions shown for the antennas 2, 10 in FIG. 31 are intended only for ease of understanding, and in a practical apparatus the antennas would be respectively oriented such as to form respective communication regions 33, 34 as shown in FIG. 5, or a common communication region 30 as shown in FIG. 2, in relation to the stream of transponder.

The operation of this embodiment is as follows, assuming for the purpose of description that it is applied to the mobile body discrimination system of the first embodiment. As the stream of transponders 20 mounted on respective load items 31 passes through the central aperture of the housing 70, radio waves which are transmitted from by the first antenna 2 and the second antenna 10 (each located within the interior of the housing 70) are incident on the transponders. However these radio waves are substantially entirely prevented from leaking to the exterior of the housing 70, due to the constituent material and shape of the housing. In addition, the material and shape of the housing 70 serves to prevent extraneous radio waves from falling on the antennas of the transponders which are passing through the housing. The interior surfaces of the central aperture may also be suitably shaped, and/or coated with a suitable material, to substantially prevent reflection of the microwave radio waves, to thereby prevent multiple-reflection radio waves from reaching the antennas of the transponder.

As a result with this embodiment, the signals emitted from the interrogator apparatus 1 can be prevented from affecting other equipment, while the effects of multiple reflection components, or noise due to equipment located external to the housing 70 can be reduced. The reliability of communication between the interrogator apparatus and a plurality of transponders which are passing through the communication region (or regions) can thereby be substantially enhanced in a simple manner.

In the above description, the system is assumed to be configured such that the interrogator apparatus 1 is mounted within the interior of the housing 70. However it would be equally possible to have the interrogator apparatus 1 located at the exterior of the housing 70, connected to the first antenna 2 and the second antenna 10. Furthermore, although in the above description the housing 70 has a central opening formed therein, similar results could be achieved by using a housing which is configured to be open at one side thereof, for example having an inverted U-shape rather than an enclosed rectangular configuration.

In the above description, it has been assumed that scanning of a plurality of transponders by the antennas of an interrogator apparatus is performed by moving a substantially continuous stream of transponders (i.e., attached to respective articles) through the communication region (or communication regions) of the antennas of the interrogator apparatus, as illustrated in FIG. 3. However the above embodiments of a mobile body discrimination apparatus are not limited to such a system, and it would for example be possible to move successive batches of transponders into the communication region of the interrogator apparatus antennas, with each batch moving continuously through the communication region or being momentarily halted while within the communication region.

Figure 32:
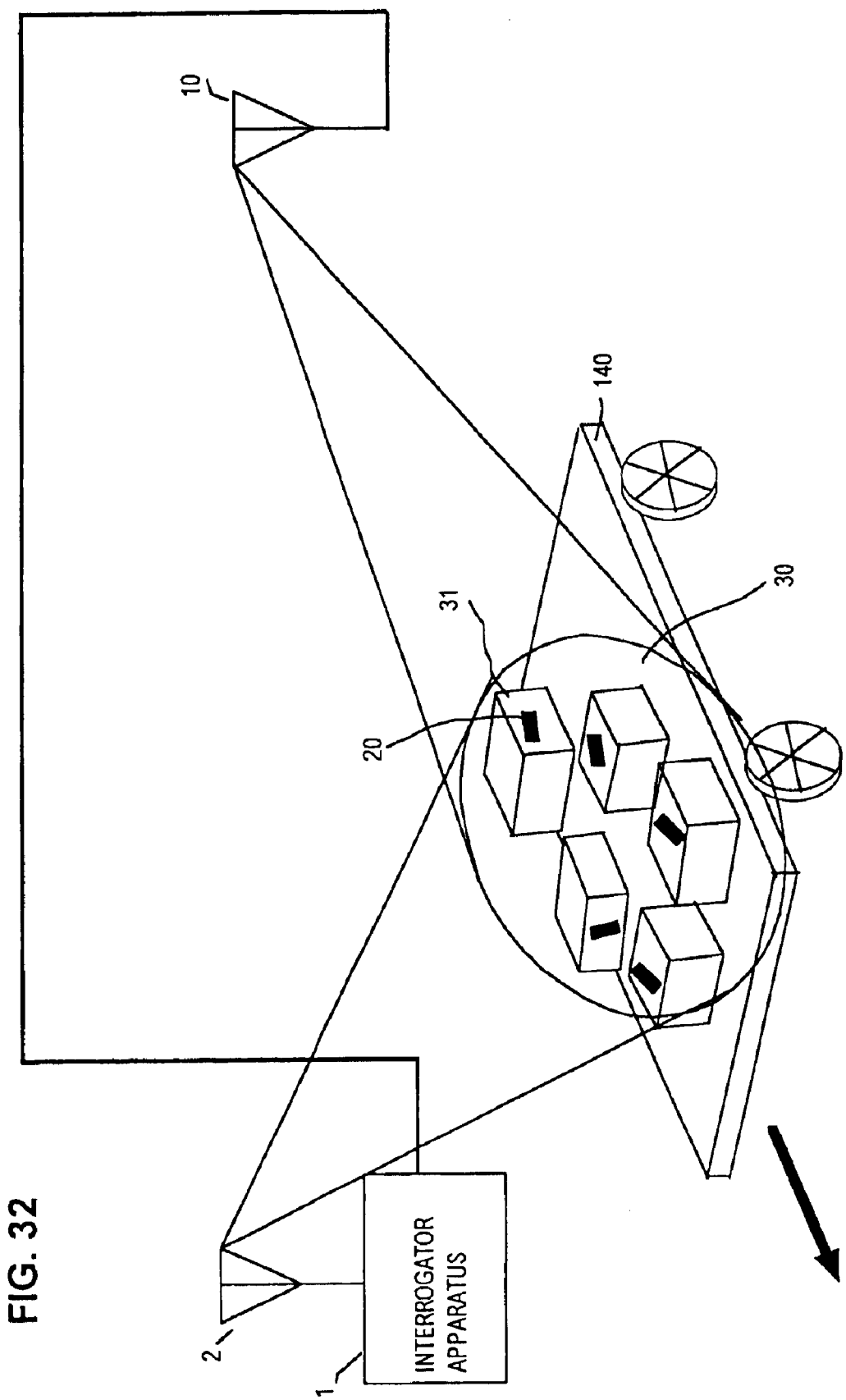
FIG. 32 is a diagram for illustrating an alternative arrangement of a mobile body discrimination system, in which batches of transponder are successively transported to be brought within a communication region of an interrogator apparatus.

For example as illustrated in the diagram of FIG. 32, each of successive batches of transponders 20 attached to respective load items such as pieces of baggage, etc., might be transported by respective wheeled carts 140 (which could be manually or automatically controlled) along a fixed path extending in the direction indicated by the arrow, with each batch of transponders moving continuously through the communication region 30 of the antennas 2, 10 of the interrogator apparatus 1, or being halted for a short period of time while within the communication region 30.

15th Embodiment

Figure 33:
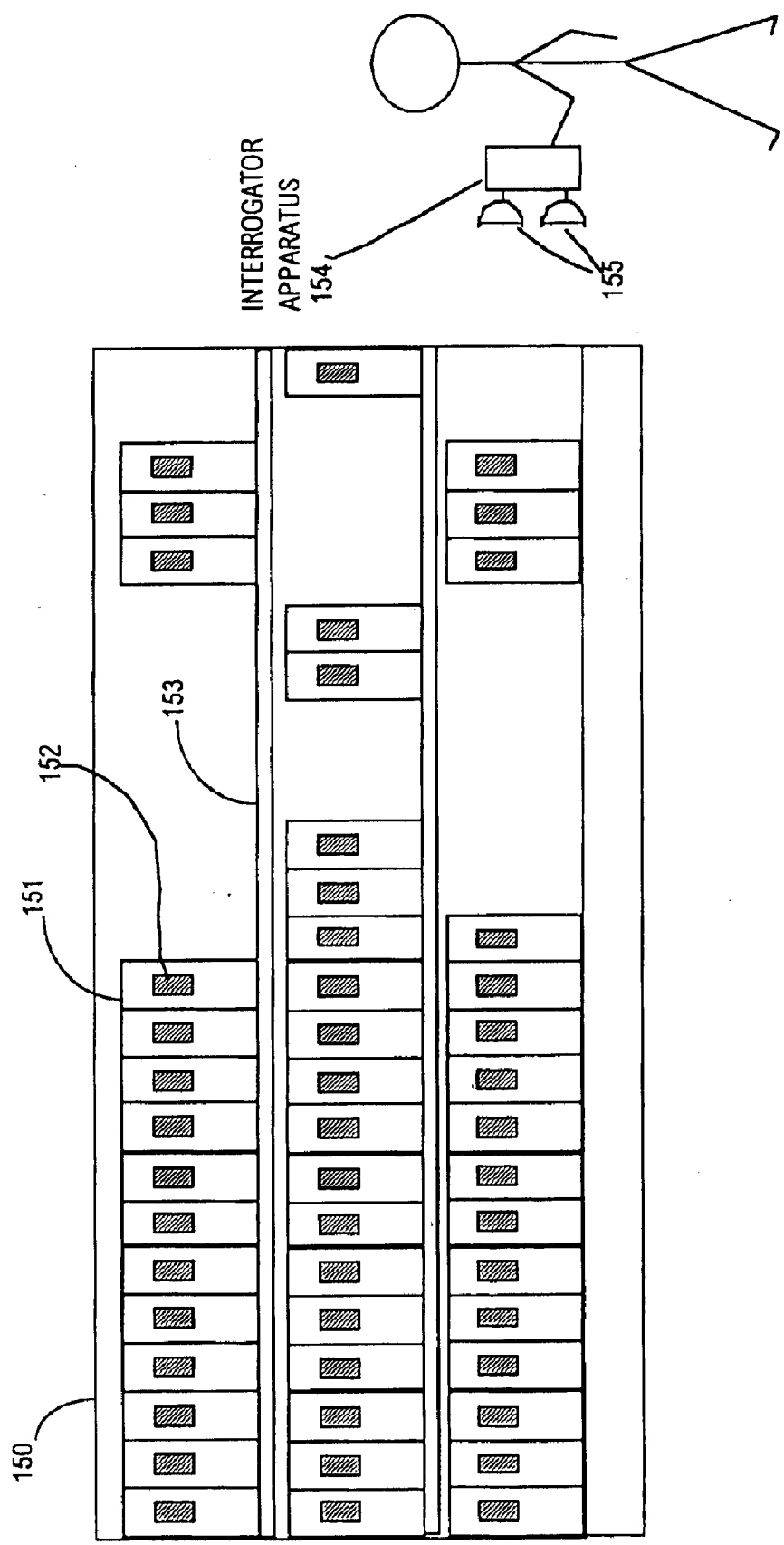
FIG. 33 is a diagram for conceptually illustrating a mobile body discrimination system in accordance with a 15$^{th}$ embodiment, wherein an interrogator apparatus of a mobile body discrimination apparatus is manually transported to scan a plurality of transponders which are attached to respective stored articles.

A further manner of applying the various mobile body discrimination apparatus embodiments described above (in which the interrogator apparatus antennas are moved with respect to the bodies which are discriminated) is to scan a plurality of transponders by moving the communication region (or communication regions) of the antennas of a mobile body discrimination apparatus with respect to the transponders. Such a mobile body discrimination system is provided by the fifteenth embodiment of the invention that is illustrated in FIG. 33, in which a plurality of articles 151 such as books, etc., are supported on shelves 153 to be thereby situated in proximity to a common vertical plane (i.e., the plane of the front faces of the shelves 153), with each of the articles 151 having attached thereto a transponder 152 having stored within its memory information concerning that article 151, and with the transponders 152 each being oriented approximately facing outward, i.e., towards the common vertical plane. Each of the transponders 152 can be configured to be thin in shape, e.g., of the form of an IC card. A person carrying an interrogator apparatus 154, which is configured such as to be portable by an individual, walks alongside the shelves 153 while orienting the antennas 155 of the interrogator apparatus 154 towards the articles 151, to thereby bring successive groups of the transponder 152 within the communication region (or communication regions) of the antennas 155. In that way, the interrogator apparatus 154 can rapidly scan successive transponders to acquire complete information concerning all or part of the articles 151 and, if necessary, transfer data to one or more of the transponders 151 to be written into the memory of the transponder.

16$^{th}$ Embodiment

Figure 34B:
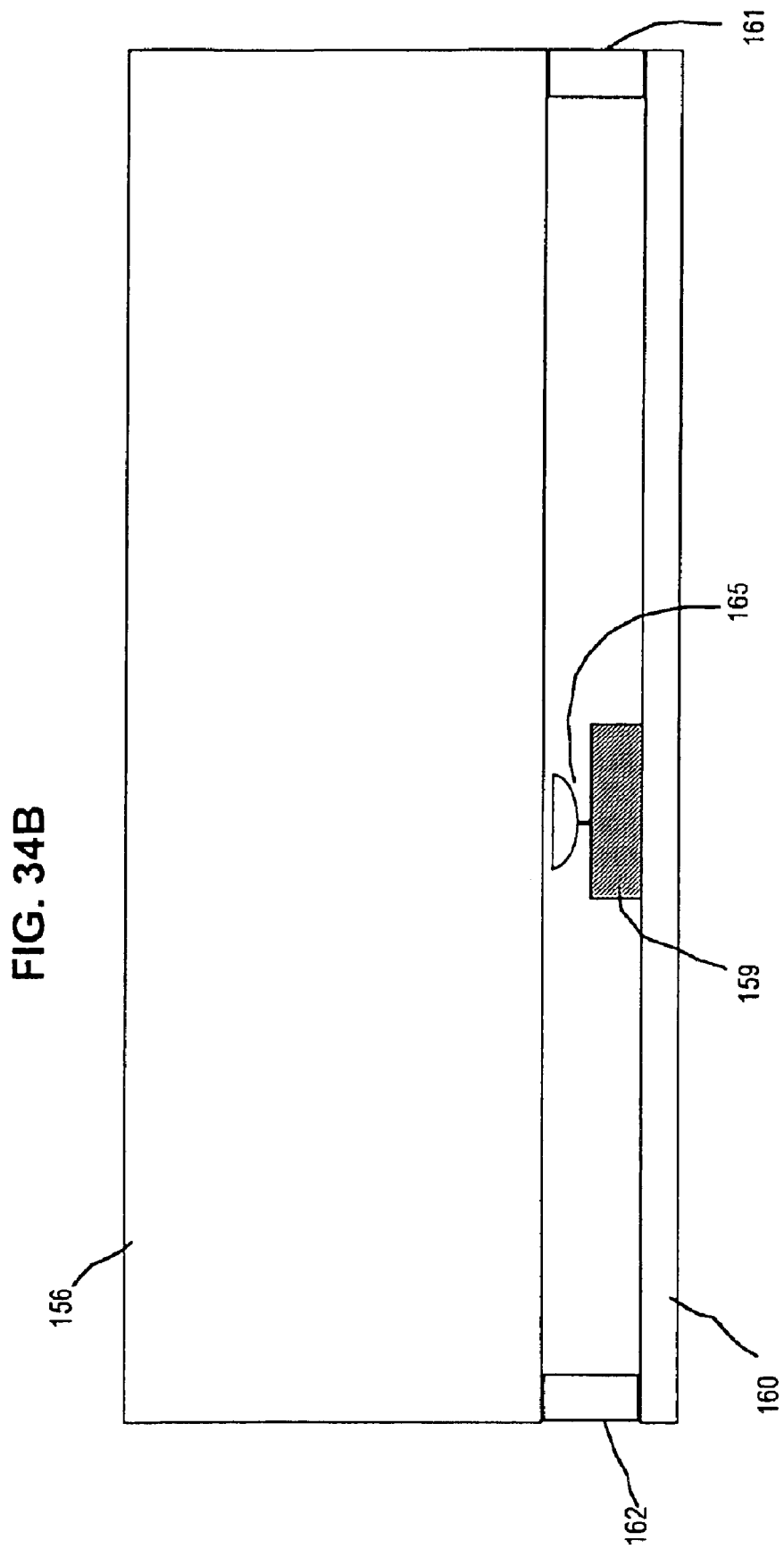
FIG. 34B is a plan view corresponding to FIG. 33.

A 16$^{th}$ embodiment of the invention is illustrated in views in elevation and plan, in FIGS. 34A, 34B respectively. Here again, the bodies which are discriminated are held stationary, while the interrogator apparatus antennas are moved in relationship to these bodies. This embodiment is applicable for example to a warehouse in which information concerning stored items is automatically acquired and/or updated. In FIGS. 34A, 348, a plurality of stored items 157 are supported on shelves 158 of a housing 162, to be thereby respectively set in proximity to a common vertical plane as described for the preceding embodiment, with each of the stored items 157 having attached thereto a transponder 152 which has stored in its memory information concerning that item 157, with the transponders oriented outward towards the common vertical plane. An interrogator apparatus 159 is movably mounted for lateral motion on a horizontal rail 160, while the rail 160 is movably mounted for vertical motion on a pair of fixed vertical rails 161, 162. The interrogator apparatus 159 and transponders 152 can be in accordance with any of the mobile body discrimination apparatus embodiments described hereinabove. The antennas 165 of the interrogator apparatus 159 are disposed in proximity to and oriented towards the shelves 158, so that by moving the interrogator apparatus 159 vertically and horizontally (by some form of drive mechanism, not shown in the drawing), all of the transponders 152 can be successively scanned by the interrogator apparatus 159.

The motion of the interrogator apparatus 159 can for example be controlled by a computer system 164, which can be coupled to receive data that are transferred from the transponders to the interrogator apparatus 159, to thereby acquire and process the data which are stored in the memories of the transponders 152 by automatic operation. That is to say, with such a mobile body discrimination system, the contents of a warehouse or other storage facility can be periodically automatically checked and registered by the operation of the computer system.

17$^{th}$ Embodiment

Figure 35:
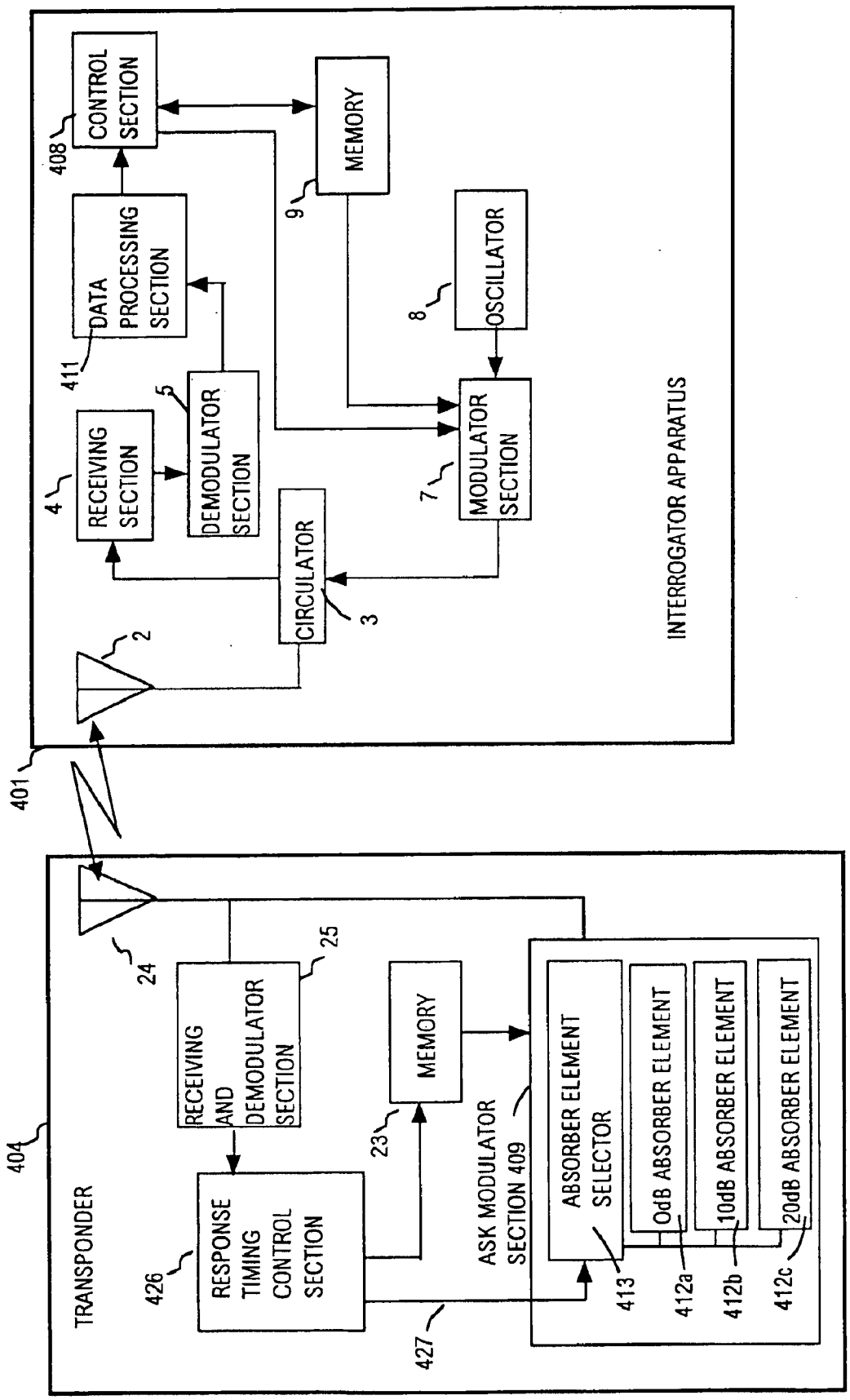
FIG. 35 is a system block diagram of a mobile body discrimination apparatus in accordance with a 17$^{th}$ embodiment, wherein a transponder applies a plurality of different degrees of absorption of radio waves received by an antenna, to effect ASK (amplitude shift keying) modulation of reflected radio waves by selectively applying either a first or a second depth of ASK modulation.

FIG. 35 is a general block diagram of a transponder and interrogator apparatus of a mobile body discrimination apparatus according to a 17$^{th}$ embodiment of the invention. This embodiment basically differs from the first embodiment shown in FIG. 1 in that the interrogator apparatus 401 of this embodiment utilizes a single antenna 2 and incorporates a data processing section 411 for deriving received response data and transponder ID (identification) codes from the output baseband signal of the demodulator section 5, and in that the transponder 404 of this embodiment randomly selects from a plurality of possible depths of modulation of the signal that is reflected from the antenna 24, with binary ASK (Amplitude Shift Keying) modulation being applied.

With this embodiment, the received demodulated response start command code which is obtained by the receiving and demodulator section 25 is supplied to a response timing control circuit 426, which in addition to applying a read-out control signal to the memory 23 to initiate transfer of the response data (together with the ID code assigned to that transponder) to the modulator at a time point that is selected based on a random number, as described for the first embodiment, also at that time applies an absorber element selection control signal via a line 427 to the ASK modulator section 409, to determine the modulation depth that is to be used in transmitting response data to the interrogator apparatus.

The internal configuration of the ASK modulator section 409 is represented in a simple conceptual manner in FIG. 35, as a combination of a plurality of absorber elements, i.e., a 0 dB absorber element 412a, a 10 db absorber element 412b and a 20 dB absorber element 412c in this example, and an absorber element selector 413 which is controlled by the modulation depth control signal to select a specific combination of two of the plurality of absorber elements to be used in ASK modulation operation. With this embodiment, the combination of the 0 dB and 20 dB absorber elements (i.e., providing a modulation depth of 20 dB) or of the 0 dB and 10 dB absorber elements (i.e., providing a modulation depth of 10 dB) can be selected. The "0 dB absorber element 412a" need not necessarily correspond to an actual physical component, but may simply represent the condition of the antenna 24 in which no absorption of the incident radio waves is applied. With this embodiment, the combination of absorber elements that is selected to perform the ASK modulation is determined by the response timing control circuit 426 based on a random number which is generated when the response start command code is received from the interrogator apparatus 401 by the transponder 404. It would be possible to use the same random number which is employed to determine the time at which the response data are transmitted, as described for the transponder of the first embodiment. However with this embodiment, if respective sets of response data and ID data are transmitted by two transponder such as to overlap one another, and if these are transmitted using two respectively different modulation depths (i.e., with this example, 10 dB and 20 dB), the interrogator apparatus can acquire both of these two sets of response data, through the operation of a data processing section 411 as described in the following. Hence, it is preferable that the random number which is used for transmission timing determination be different from that used for determining the modulation depth.

Figure 38:
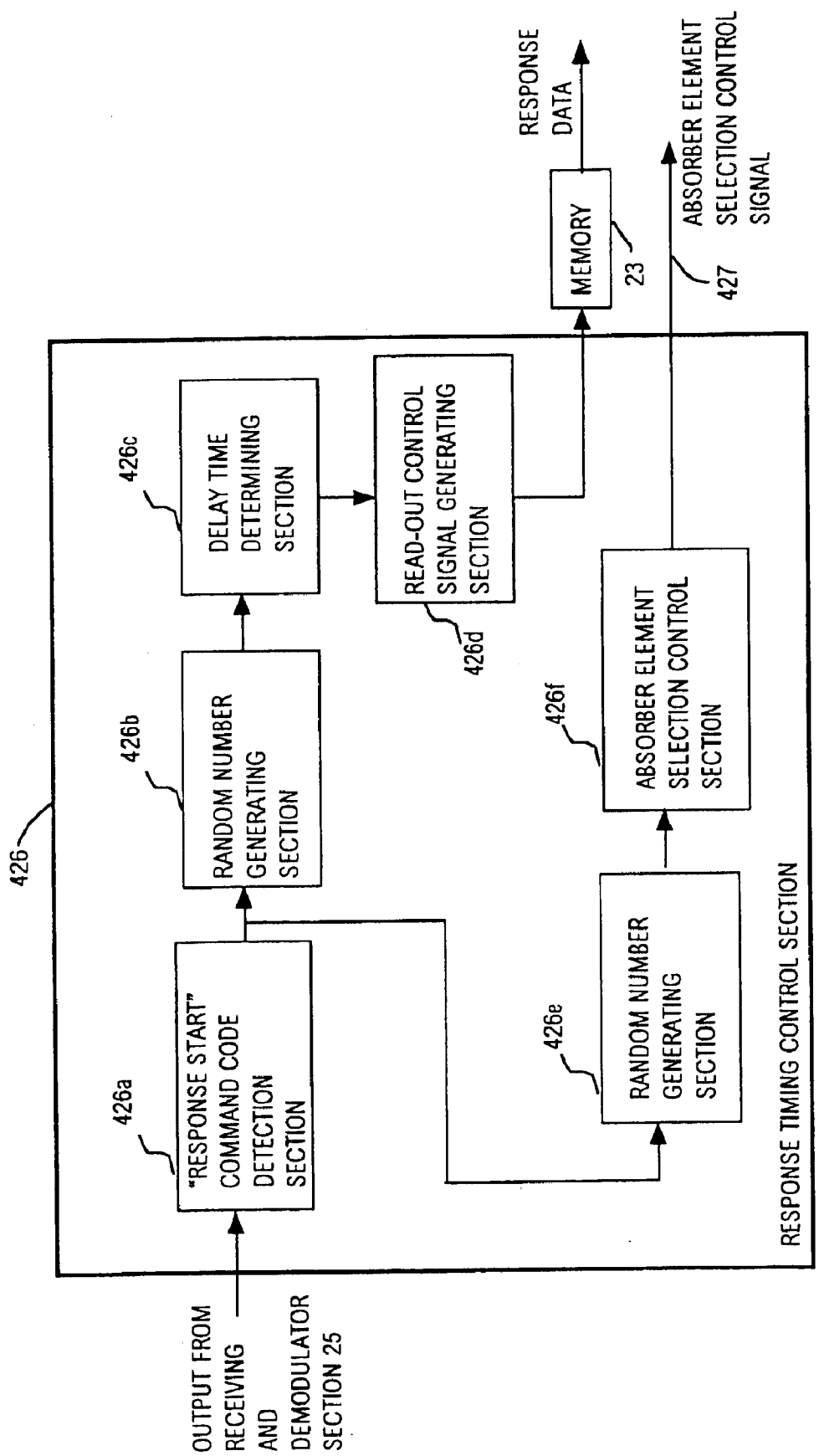
FIG. 38 is a system block diagram of the internal configuration of a response timing control section in a transponder of the mobile body discrimination apparatus of FIG. 35.

This can be understood from FIG. 38, which shows the internal configuration of the response timing control section 426 of the transponder 404 of this embodiment. As shown, this differs from that of the first embodiment in that a random number generating section 426e is included, together with an absorber element selection control section 426f which generates the aforementioned absorber element selection control signal.

Figure 36:
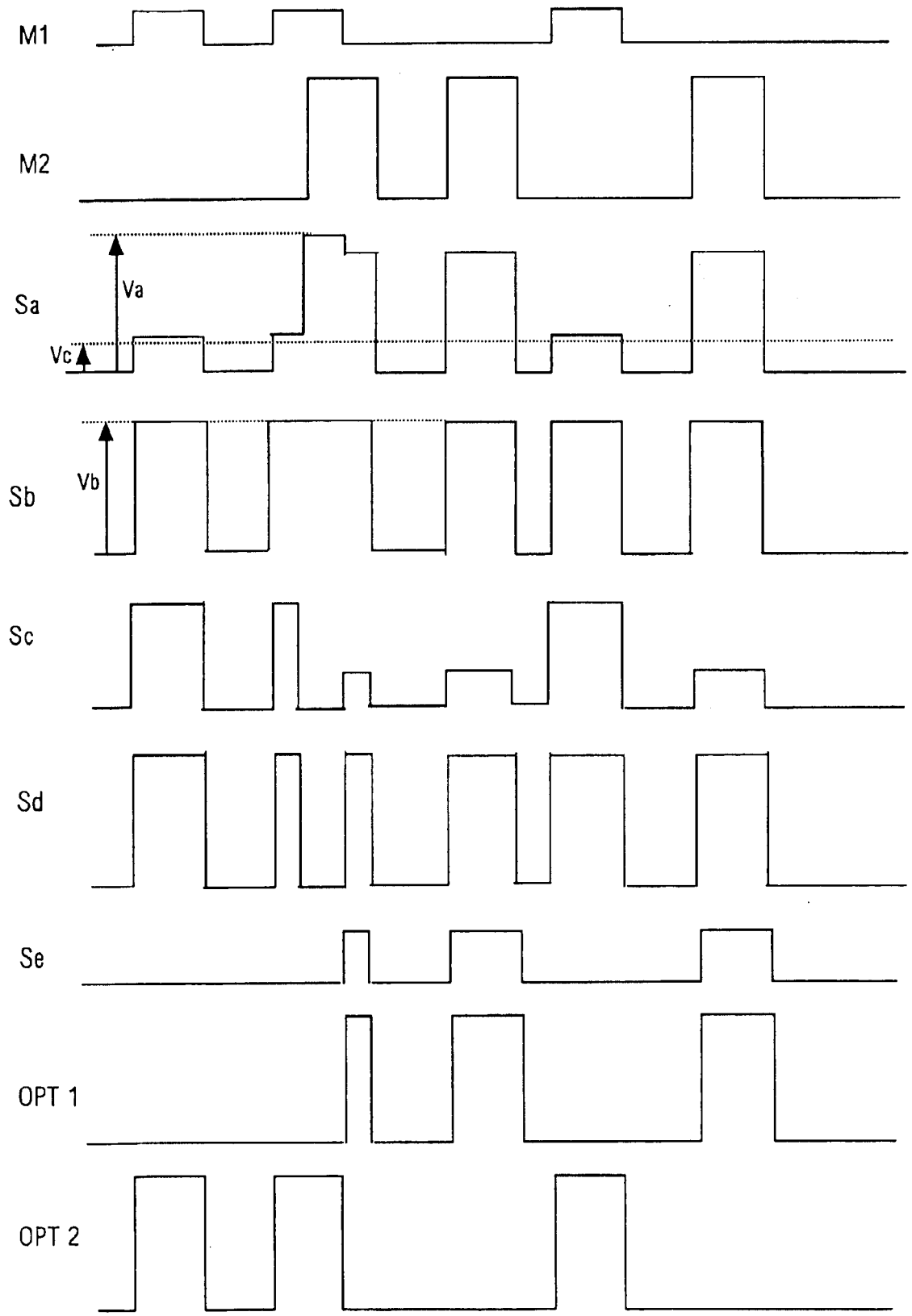
FIG. 36 is a waveform diagram for describing the operation of a data processing section in an interrogator apparatus of the mobile body discrimination apparatus of FIG. 35.
Figure 37:
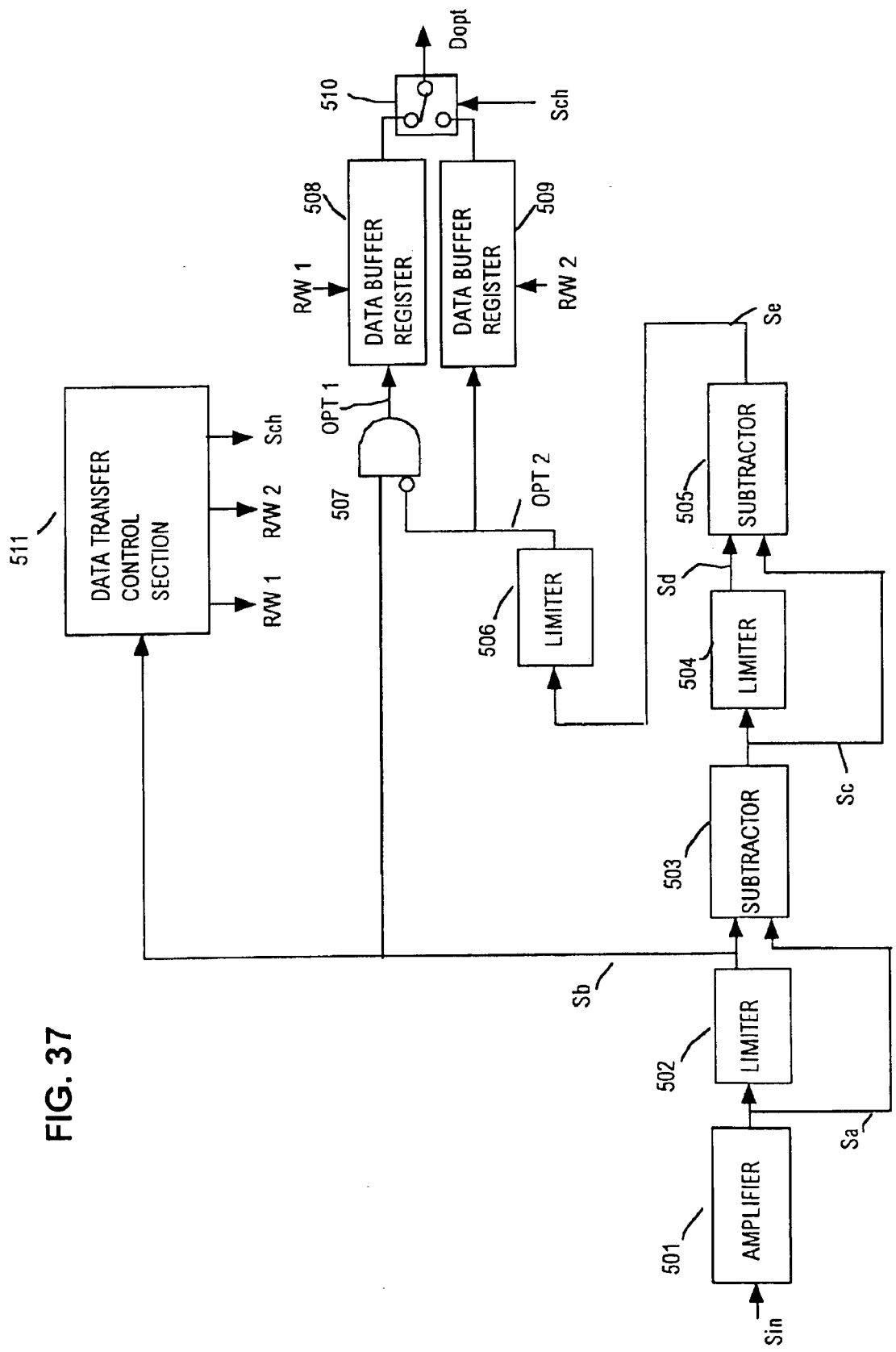
FIG. 37 is a circuit block diagram of an example of the internal configuration of the data processing section in the interrogator apparatus of the mobile body discrimination apparatus of FIG. 35.

The internal configuration of the data processing section 411 is as shown in FIG. 37, whose operation will be described referring to the waveform diagram example of FIG. 36. In FIG. 36, it is assumed that with a plurality of transponders moving through the communication region of the interrogator apparatus, a first transponder has transmitted its ID code and response data during a time interval which overlaps the transmission of ID code and response data by a second transponder. It is further assumed that the respective modulation depths that have been selected for the first and second transponders are 10 dB and 20 dB, so that the demodulated received baseband signals for these would respectively be as illustrated by the waveforms M1 and M2 if data conflict did not occur. In fact, the waveform of the received baseband signal that is produced in this case from the demodulator section 5 of the interrogator apparatus 401 will be as designated by Sa in FIG. 36. Here, Va indicates the baseband signal level which occurs when the 10 dB and 20 dB modulation levels overlap.

In FIG. 37, Sin is the received baseband signal, e.g., having the waveform of signal Sa in FIG. 36. This is supplied to sequentially connected amplifier 501, limiter 502, subtractor 503, limiter 504, subtractor 505, and limiter 506, whose output is applied to an inhibit input of an AND gate 507. Sets of response data from respective transponders, produced from the AND gate 507 and from the limiter 506 respectively, are written into a data buffer register 508 and a data buffer register 509, before being successively transferred to the memory 9 by a selector 510 under the control of a changeover signal Sch produced from a data transfer control section 511, which also controls data read-out and write-in operations of the buffer registers 508 509.

Each of the limiters can be implemented as a comparator which produces an output signal at a fixed high level when the input signal applied thereto exceeds a predetermined threshold value, indicated as Vb in FIG. 36, and otherwise produces the output signal at a fixed low level, e.g., 0 V. It will be assumed that Vb is made approximately equal to the aforementioned value Va.

In FIG. 37, the output signal Sa from amplifier 501 is subtracted from the corresponding amplitude-limited signal Sb produced from limiter 502, to obtain signal Sc. That signal is similarly processed by the limiter 504 and subtractor 505 to obtain signal Se, which is converted to a fixed amplitude by the limiter 506 to obtain the signal Opt 1, from which the bit sequence corresponding to M2, i.e., the data conveyed by high-amplitude modulation can be obtained. Signal Sb is applied to one input of an AND gate 507 while signal OPT 1 is applied to an inhibit input of that AND gate to thereby mask the signal Sb, and so obtain the output signal Opt 2, from which the bit sequence corresponding to M2, i.e., the data conveyed by the low-amplitude modulation, can be obtained.

In that way, a set of response data from one transponder which are conveyed using the 10 dB modulation depth, and a temporally overlapping set of response data from another transponder which are conveyed using the 20 dB modulation depth, will be respectively written into the data buffer register 508 and the data buffer register 509 under the control of the data transfer control section 511. The two sets of response data are then sequentially transferred to the memory 9, via the selector 510.

It can thus be understood that with this embodiment, the maximum number of transponders which can move through the communication region of the antenna 2 of the interrogator apparatus 401 can be increased by comparison with the first embodiment, since even if conflict occurs between respective sets of response data transmitted from two transponders, the random selection of the 10 dB and 20 dB modulation depths for these transmissions ensures that there is a 50% probability that the transmissions will have respectively different depths of modulation, and so can be separated from one another by the data processing section 411 of the interrogator apparatus 401 in the manner described above.

Although not shown in the drawings, each transponder of this embodiment may include a rectifier circuit for deriving an internal DC power supply from the incident radio waves, as described for the first embodiment. In that case it would also be possible with this embodiment, as for the first embodiment, to provide a second antenna which transmits only CW radio waves. Alternatively, each transponder may be powered by an internal battery.

Furthermore, it would be possible to use a greater number of absorber elements, to obtain an increased number of modulation depths that can be randomly selected.

Also, it would be possible to modify this embodiment such that when the interrogator apparatus 401 correctly receives a set of response data and ID code from a transponder, it transmits to that transponder a transmission halt command code, as described for the fifth embodiment, and such that each transponder 404 further includes a "transmission halt" detection section and is controlled accordingly, as described for the fifth embodiment. This will enable the rate at which transponders pass through the communication region of the interrogator apparatus 401 to be further increased without loss of reliability of communication, by reducing the number of transmissions from transponders which are passing through the communication region. That is to say, the possibility of concurrent transmission by two transponders which coincidentally determine the same modulation depth, by random selection, will be reduced.

18$^{th}$ Embodiment

Figure 39:
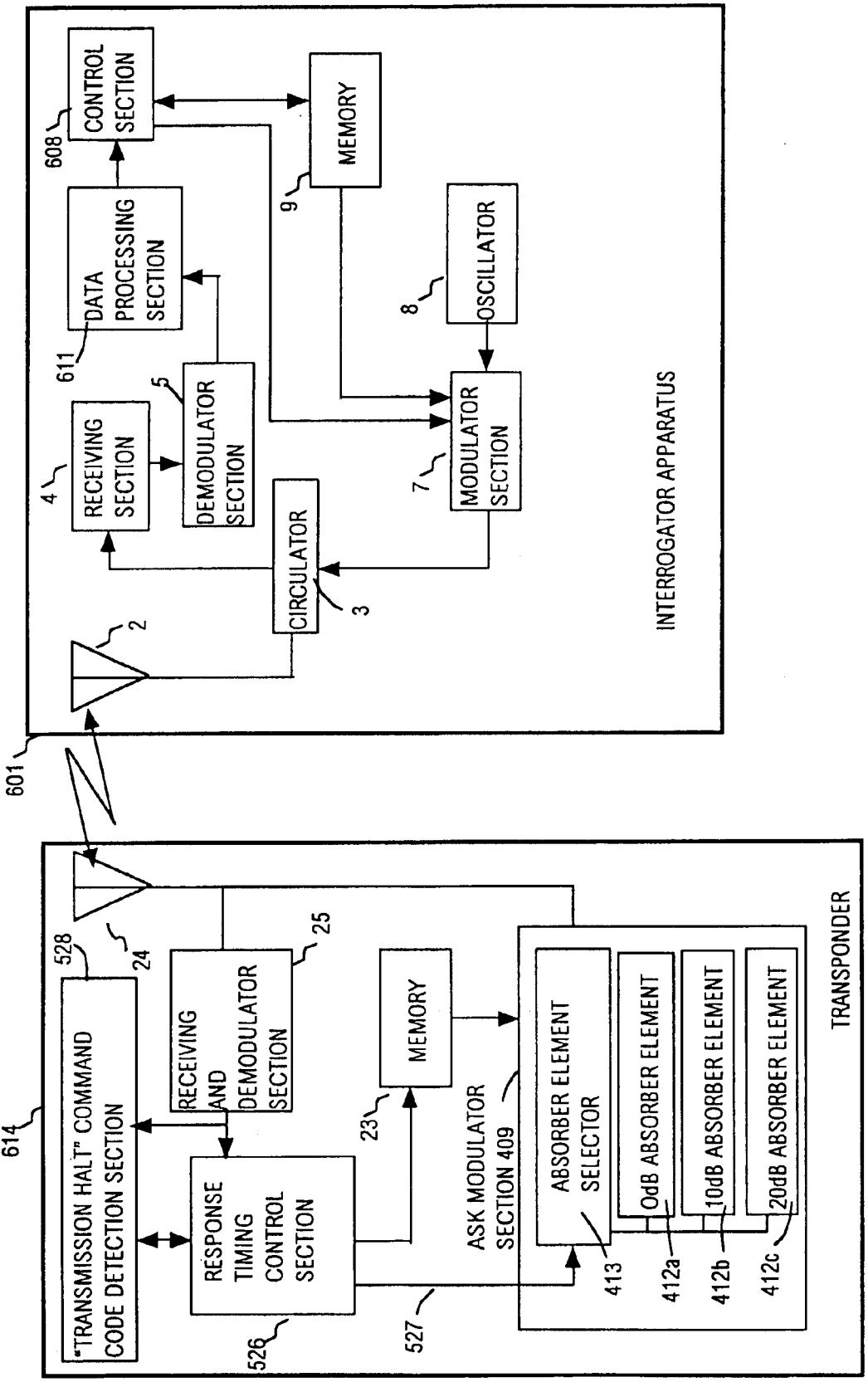
FIG. 39 is a system block diagram of a mobile body discrimination apparatus in accordance with an 18$^{th}$ embodiment, wherein a transponder applies a plurality of different degrees of absorption of radio waves received by an antenna, to effect ASK (amplitude shift keying) modulation of reflected radio waves by applying a first depth of ASK modulation when performing an initial transmission of data after entering the communication region of the interrogator apparatus, and applying a second depth of ASK modulation for subsequent transmissions.

FIG. 39 is a general block diagram of a transponder and interrogator apparatus of a mobile body discrimination apparatus according to an 18$^{th}$ embodiment of the invention. This embodiment basically differs from the preceding embodiment with respect to the operation of a data processing section 611 of the interrogator apparatus 601, the inclusion of a transmission halt command code detection section 528 (which operates similarly to that described for the fifth embodiment hereinabove), and the manner of selecting the modulation depths by the transponder 614, whereby the 20 dB value is selected only after the transponder has initially transmitted response data by using the 10 dB modulation depth after entering a communication region of the interrogator apparatus.

Specifically, when a transponder first transmits a response data set together with its ID code, performed following a randomly determined time interval after having entered the communication region of antenna 2 of the interrogator apparatus 601 and received a first response start command code from the interrogator apparatus, the response timing control section 526 of the transponder 614 generates a selection control signal whereby the 0 dB and 10 dB absorber elements are applied in ASK modulation, i.e., the modulation depth is selected as 10 dB for transmitting the response data and ID code of that transponder by modulated reflected radio waves back to the interrogator apparatus 601. If that transmission is successfully received completely by the interrogator apparatus 601, without conflict with any transmissions from other transponders, then the interrogator apparatus 601 transmits the "transmission halt" command signal, with the ID code of that transponder attached thereto. When reception of that combination of transmission halt command code and ID code is detected by the transmission halt command code detection section 528 of the transponder 614, a control signal is generated which causes the response timing control section 526 to halt any further transmissions from that transponder until a predetermined time interval has elapsed, i.e., at least until after the transponder has exited from the communication region of antenna 2.

However if the transmission halt command code detection section 528 of the transponder 614 does not detect reception of that combination of the transmission halt command code and local ID code, then when the next response start command code is received by the response timing control section 526, it generates a selection control signal whereby the 0 dB and 20 dB absorber elements are selected, i.e., the response data and ID code are then transmitted using the 20 dB modulation depth. This is illustrated in the timing diagram of FIG. 43, in which one transponder, designated as 504a, has its first transmission (using the 10 dB modulation depth) successfully received by the interrogator apparatus, then receives the transmission halt command code and the ID code assigned to transponder 614a. Another transponder, designated as 504b, does not receive that combination of the transmission halt command code and its ID code, so that when transponder 614b receives the response start command code for the second time after entering the communication region of antenna 2, it transmits its ID code and the response data with the 20 dB modulation depth being applied.

Figure 41:
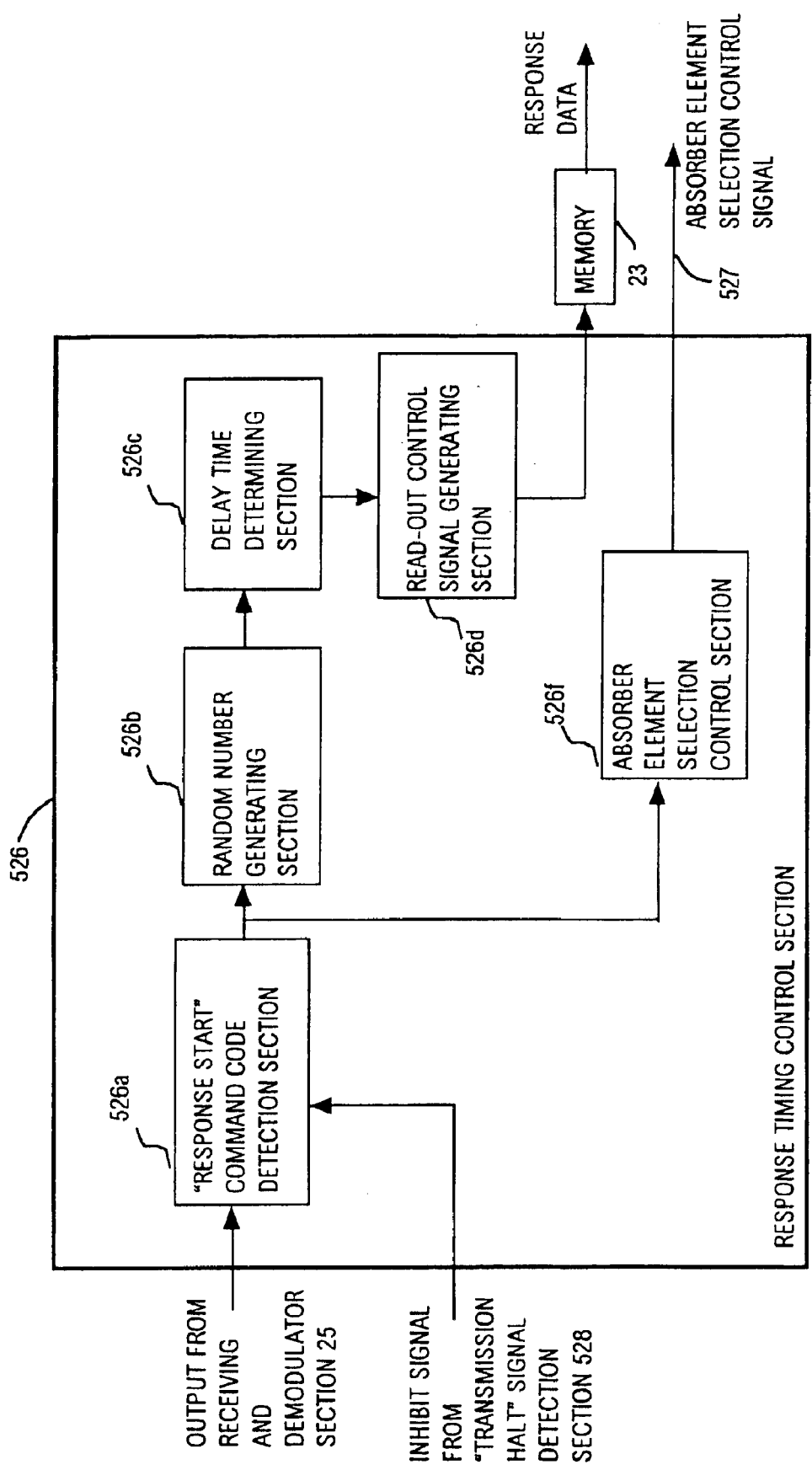
FIG. 41 is a system block diagram of the internal configuration of a response timing control section in a transponder of the mobile body discrimination apparatus of FIG. 39.

FIG. 41 is a general block diagram showing the internal configuration of the response timing control section 526 of the transponder 614. An absorber element selection section 526f is based on a counter circuit, which is automatically reset to produce the absorber element selection control signal at a first level (for selection of the 10 dB modulation depth) when the transponder enters (or exits from) the communication region of the interrogator apparatus antenna, and is set to produce the absorber element selection control signal at a second level (for selection of the 20 dB modulation depth) when two successive occurrences of the response start command code have been detected by the response start command code detection section 526a. The absorber element selection section 526f can thus be easily configured as a counter which has a maximum count value of 2.

The automatic resetting of the absorber element selection section 526f can readily be implemented, for example when power is applied to the circuits of the transponder, in the case of the transponder being powered by a rectifier circuit utilizing radio waves which are incident on the transponder as it passes through a communication region.

Thus, the absorber element selection control section 526f produces a selection signal whereby the 10 dB modulation depth is applied by the ASK modulator section 409 of the transponder at the first transmission of response data and ID code by the transponder, in response to the first reception of a response start command code from the interrogator apparatus, thereby initiating a transmission by the transponder. At the next reception of a response start command code, the absorber element selection control signal is produced at the second level, thereby causing the 20 dB modulation depth to be applied for all subsequent transmissions of the response data and ID code by that transponder.

Figure 43:
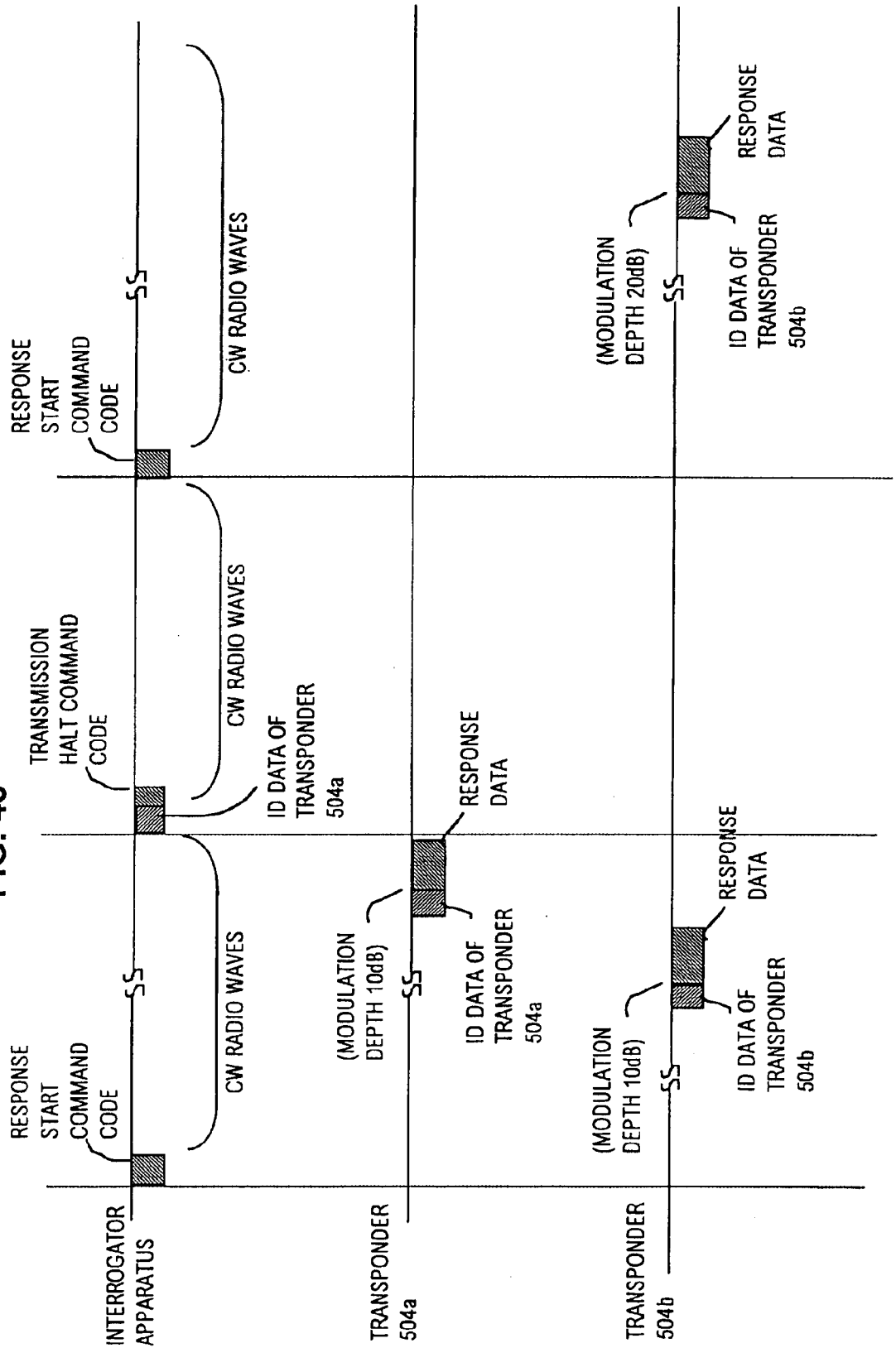
FIG. 43 is a timing diagram for describing the interchange of identification codes and data between a plurality of transponders and the interrogator apparatus of the mobile body discrimination apparatus of FIG. 39.

The above operations are illustrated in the timing diagram of FIG. 43. Here, one transponder which is designated as 504a successfully transmits its ID code and response data after its first reception of a response start command code from the interrogator apparatus. Hence, a transmission halt command code with the ID code for transponder 614a is then transmitted, so that no further data are transmitted by that transponder. Another transponder, which is designated as 504b, is not successful in transmitting its ID code and response data following its first reception of a response start command code after entering the communication region. Hence, when the transponder 614b performs its next transmission, after a randomly determined time interval following the next transmission of the response start command code from the interrogator apparatus, the 20 dB modulation depth depth is applied.

Figure 42:
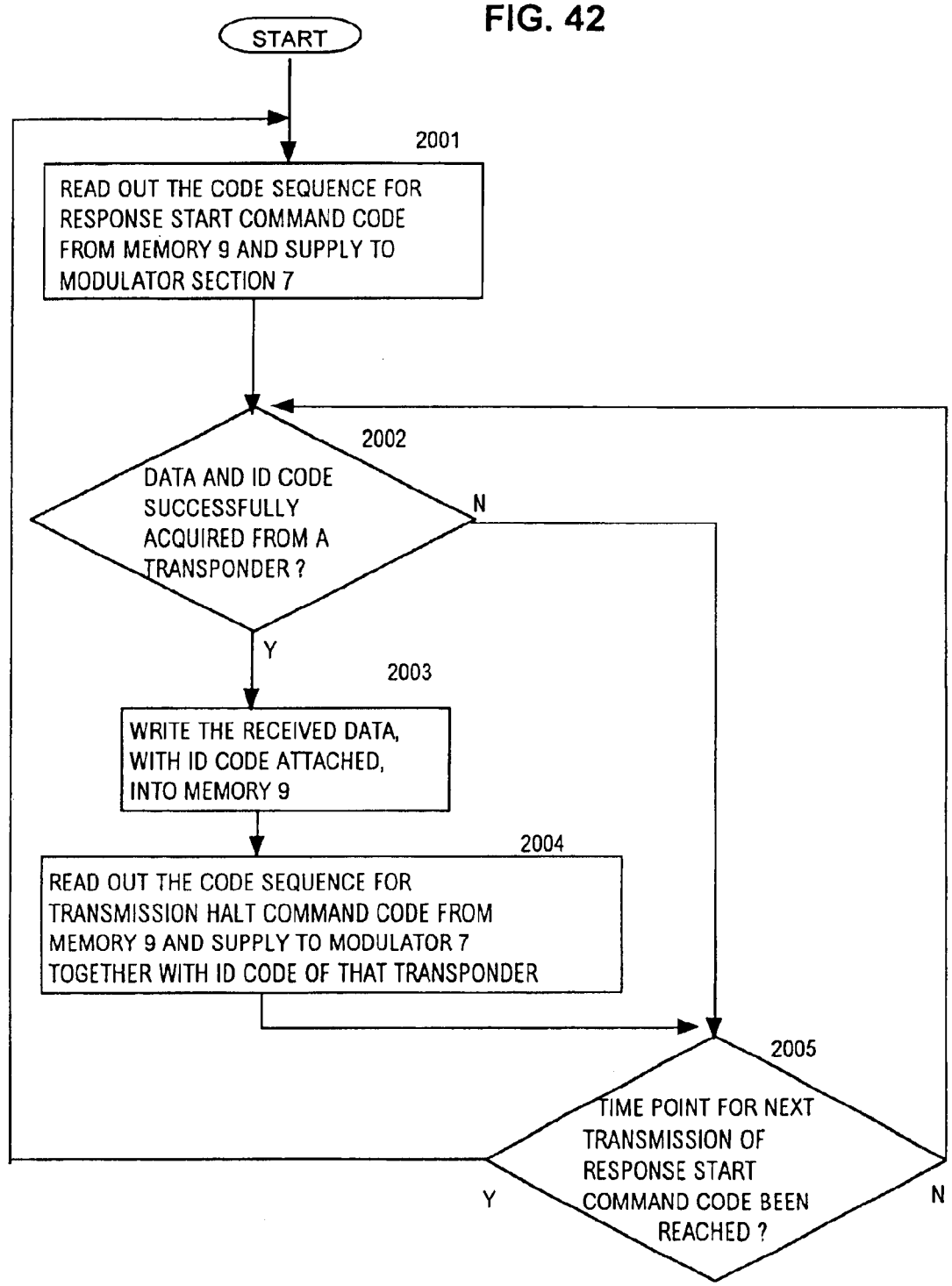
FIG. 42 is a flow diagram for describing the operation of the interrogator apparatus of the mobile body discrimination apparatus of FIG. 39.

The basic operation of the control section 608 of the interrogator apparatus 601 of this embodiment is illustrated in the flow diagram of FIG. 42. Here, the response start command code is periodically transmitted, at each execution of step 2001. At each such execution, steps 2002, 2005 are successively executed to detect whether a set of response data and ID code are successfully acquired from a transponder before the next execution of step 2001. When such a successful acquisition from a transponder occurs, the received data and ID code are written into the memory 9 (step 2003), then the code for the transmission halt command code is read out and supplied, together with the ID code of the transponder whose data have been received, to the modulator section 7 to be transmitted (step 2004)

Figure 40:
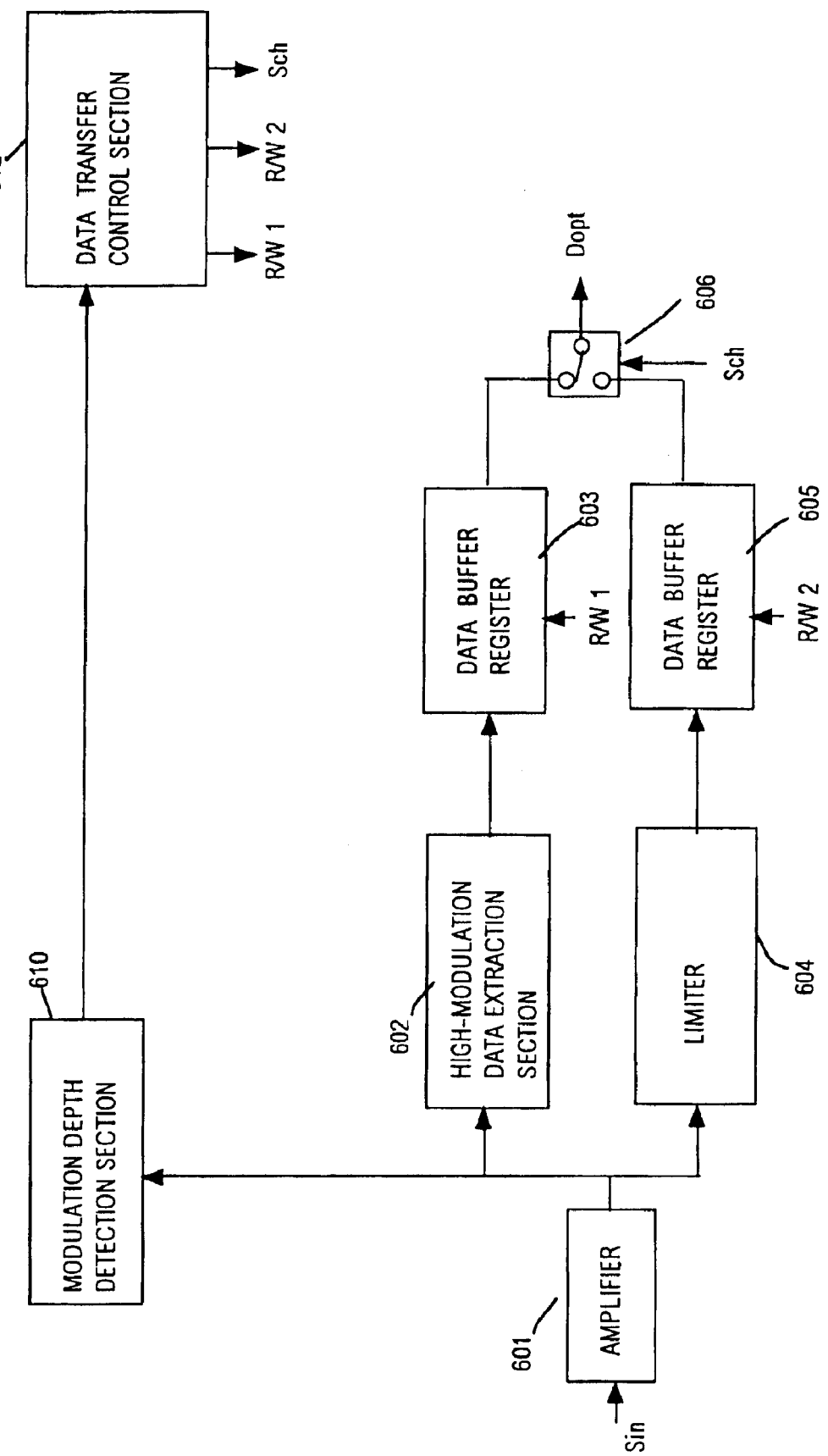
FIG. 40 is a circuit block diagram of an example of the internal configuration of a data processing section in the interrogator apparatus of the mobile body discrimination apparatus of FIG. 39.

FIG. 40 shows the internal configuration of the data processing section 611 of the interrogator apparatus 601 of this embodiment. Here, a modulation depth detection section 610 judges the amplified baseband signal produced from amplifier 601, to produce an output signal at a first level when it is found that reception of data modulated with the 20 dB depth has started, and at a second level when it is found that reception of data modulated with the 10 dB depth has started, with that output signal being supplied to a data transfer control section 612. A high-modulation data extraction section 602 can be configured as the combination of limiters and subtractors 501 to 506 shown in FIG. 37 described above, which perform the function whereby only the data modulated using the 20 dB depth are extracted (as "Output 1) when conflict occurs between sets of received data which are respectively modulated at the 10 dB and 20 dB depths. The data thus extracted are written into a buffer register 603, under the control of the data transfer control section 612.

On the other hand if a response data set and ID code are received without data conflict, which are modulated using the 10 dB depth, then these data are obtained from the output of a limiter 604, and are written into a buffer register 605. If reception of data having the 20 dB modulation depth should begin while this is occurring, then the data transfer control section 612 terminates write-in to the buffer register 605.

If the combination of limiters and subtractors 501 to 506 shown in FIG. 37 were to be used to implement the high-modulation data extraction section 602, then the function of the limiter 604 in FIG. 40 could actually be performed by the limiter 502.

When a complete set of response data and ID code have been written into either the buffer register 603 or buffer register 605, the data transfer control section 612 begins to read out the contents of that buffer, after setting a selector 606 such as to select the output data from that buffer, and supplies the response data and ID code to the control section 608. The control section 608 can then attach that ID code to the transmission halt command code which is transmitted at that time.

It can thus be understood that with this embodiment, if a transponder successfully transmits its response data and ID code to the interrogator apparatus 601 upon its first transmission of response data and ID code after entering the communication region of the interrogator apparatus, with that transmission being performed using a low modulation depth such as 10 dB, then that transponder will then receive a transmission halt command code that is addressed to it, and so will not perform any further transmissions while it traverses the communication region. However if the transponder fails to successfully transmit its response data and ID code to the interrogator apparatus 601 upon its first transmission after entering the communication region, then the second transmission of response data and ID code from that transponder (and any subsequent transmissions) will be performed using a high depth of modulation, e.g., 20 dB. In that case, even if the second transmission or any subsequent transmissions from that transponder should occur concurrently with a transmission from any other transponder which is executed using the low modulation depth, reception of the response data and ID code which are transmitted using the high modulation depth will not be obstructed by such data conflict.

In that way, this apparatus assigns priority to receiving data from a transponder which has failed in a first attempt to communicate with the interrogator apparatus. In addition, the apparatus functions such as to prevent any unnecessary transmissions from transponders which have already successfully communicated with the interrogator apparatus and are traversing the communication region of the antenna of the interrogator apparatus. As a result, improved reliability of acquiring data from transponders can be achieved, together with an increase in the rate at which transponders can pass through the communication region.

As noted above, each transponder of this embodiment may include a rectifier circuit for deriving an internal DC power supply from the incident radio waves, as described for the first embodiment. In that case it would also be possible with this embodiment, as for the first embodiment, to provide a second antenna which transmits only CW radio waves. Alternatively, each transponder may be powered by an internal battery. Furthermore, although in the above description the change to applying a high modulation depth (20 dB) from a low modulation depth (10 dB) is performed after a transponder has unsuccessfully performed a first transmission of data after entering the communication region of the interrogator apparatus, it would be possible to effect that change in the modulation depth after a greater number of transmissions have been performed unsuccessfully by a transponder after entering the communication region.

19$^{th}$ Embodiment

Figure 44:
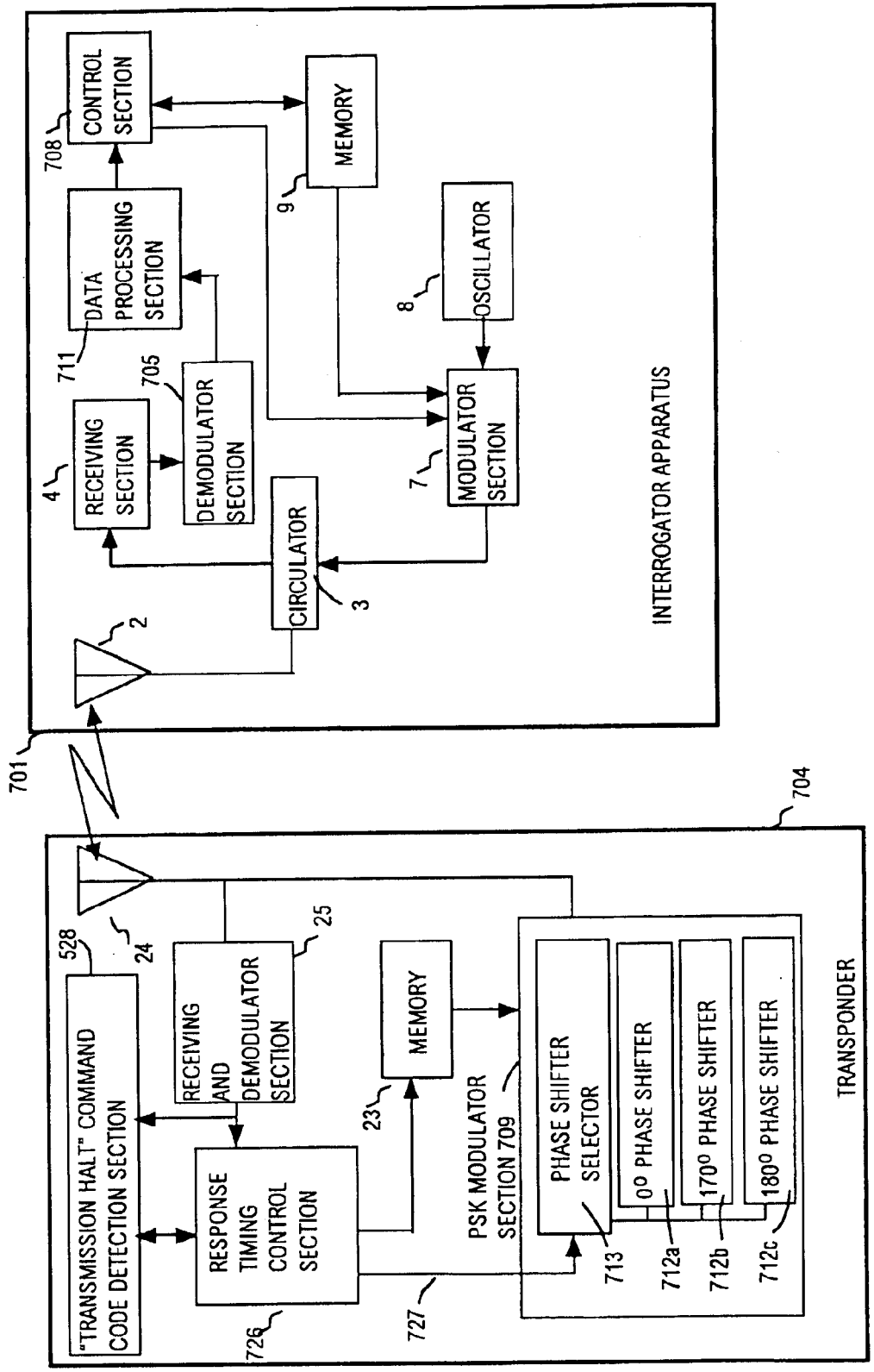
FIG. 44 is a system block diagram of a mobile body discrimination apparatus in accordance with a 19$^{th}$ embodiment, wherein a transponder applies a plurality of different degrees of phase shift to radio waves received by an antenna, to effect PSK (phase shift keying) modulation of reflected radio waves by applying a first depth of PSK modulation when performing an initial transmission of data after entering the communication region of the interrogator apparatus, and applying a second depth of PSK modulation for subsequent transmissions.

FIG. 44 is a general block diagram of a transponder and interrogator apparatus of a mobile body discrimination apparatus according to a 19$^{th}$ embodiment. This embodiment basically differs from the 18$^{th}$ embodiment described above in that PSK (Phase Shift Keying) modulation is utilized by each transponder 704 rather than ASK modulation.

The response timing control section 726 of the transponder 704 produces a phase shifter selection control signal on a line 727, which is supplied to a PSK modulator section 709 to determine whether a combination of 0 degrees and 170 degrees phase shifters 712*a*, 712*b*, providing a PSK modulation range of 170 degrees, or a combination of 0 degrees and 180 degrees phase shifters 712*a*, 712*c*, providing a PSK modulation range of 108 degrees, will be selected to apply PSK modulation to radio waves which are reflected from the antenna 24.

Figure 45:
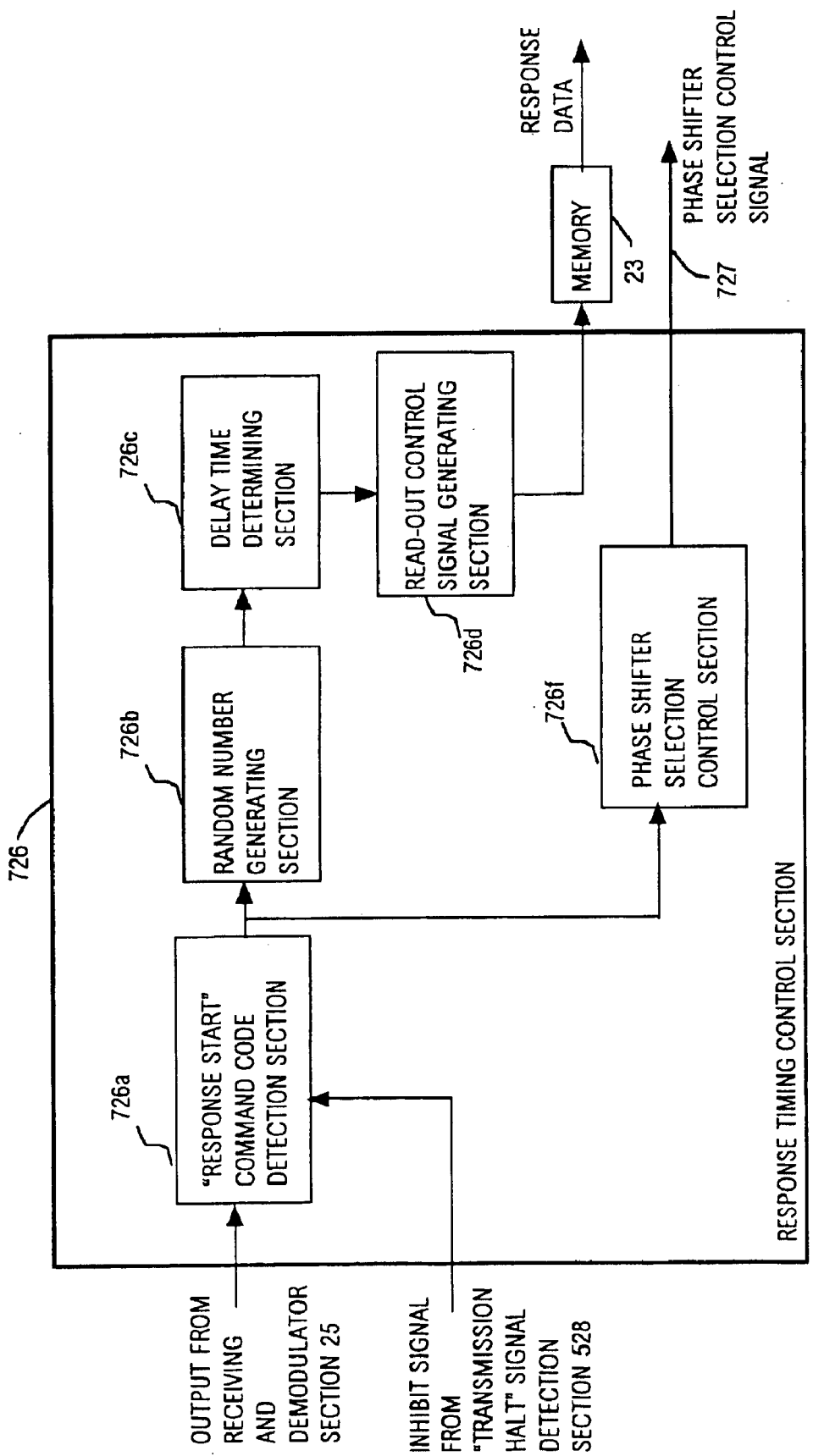
FIG. 45 is a system block diagram of the internal configuration of a response timing control section in a transponder of the mobile body discrimination apparatus of FIG. 44.

FIG. 45 shows the internal configuration of a response timing control section 726 of a transponder 704 of this embodiment. In the same way as for the preceding embodiment, the phase shifter selection control section 726*f* can be configured as a counter which is automatically reset when the transponder enters (or exits from) the communication region of the antenna of the interrogator apparatus, and which counts to a maximum value of 2 successive occurrences of the response start command code, whereupon the phase shifter selection control signal is changed from a first level (specifying selection of the 0 to 170 degrees PSK modulation range) to a second level (specifying selection of the 0 to 180 degrees PSK modulation range).

Figure 46:
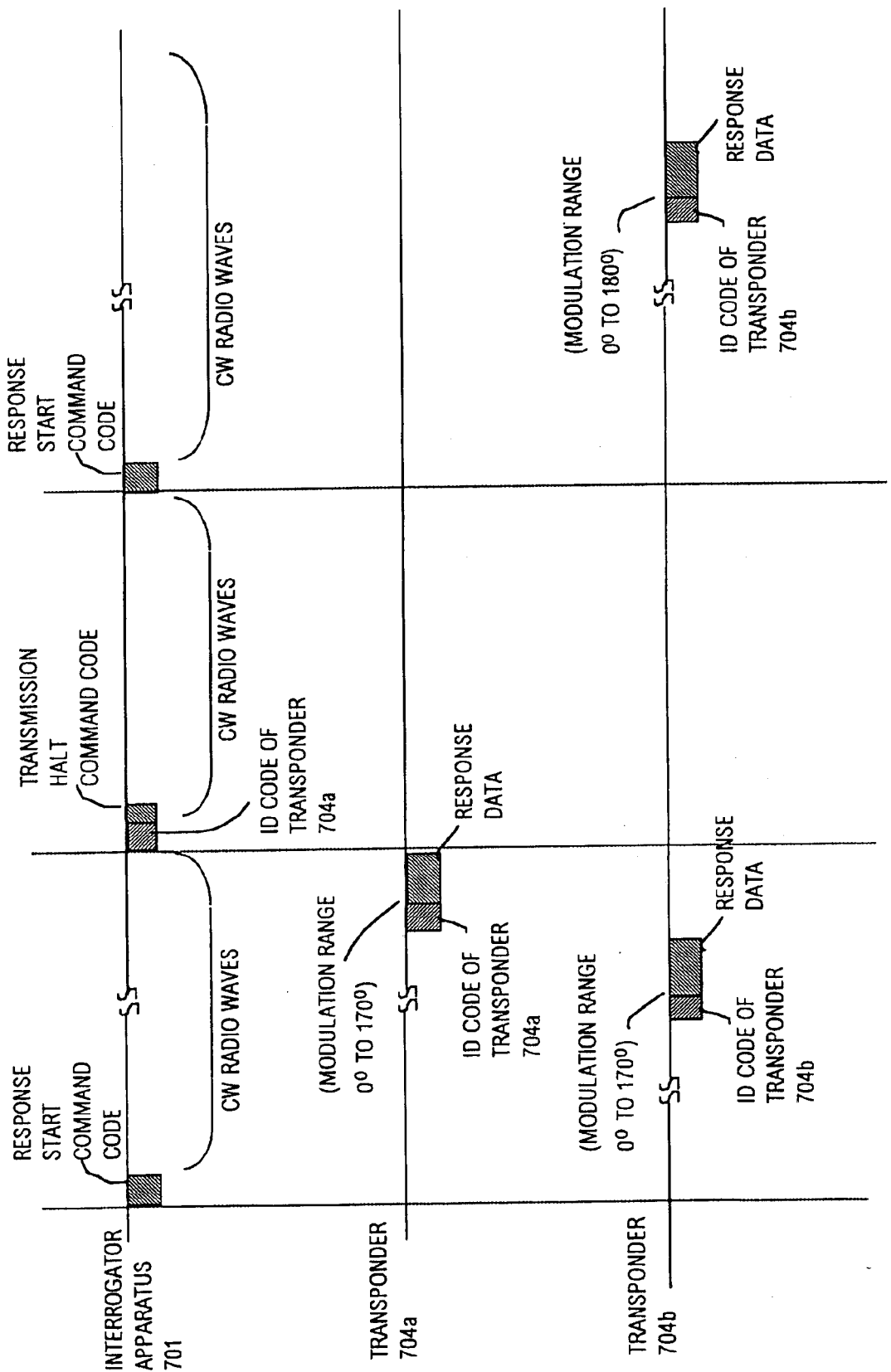
FIG. 46 is a timing diagram for describing the interchange of identification codes and data between a plurality of transponders and the interrogator apparatus of the mobile body discrimination apparatus of FIG. 44.

The operation of this embodiment is illustrated in the timing diagram of FIG. 46, in which a transponder which is designated as 704*a* successfully transmits its ID code and response data, using the 0 to 170 degrees PSK modulation range, after a randomly determined time interval following its first reception of a response start command code from the interrogator apparatus. Hence, a transmission halt command code with the ID code for transponder 704*a* is then transmitted, so that no further data are transmitted by that transponder. Another transponder, designated as 704*b*, is not successful in transmitting its ID code and response data following its first reception of a response start command code after entering the communication region. Hence, when the transponder 704*b* performs its next transmission, after a randomly determined time interval following the next transmission of the response start command code from the interrogator apparatus, the 0 to 180 degrees range PSK modulation is applied by that transponder.

In that way, by using respectively different ranges of PSK modulation for the first transmission and for all subsequent transmissions of data by a transponder after entering the communication region, the interrogator apparatus can discriminate between reception of a signal from a transponder which is transmitting for the first time, and a transponder which has failed in at least one attempt at communication. The demodulator section 705 of the interrogator apparatus 701 of this embodiment can for example apply phase discrimination to produce an output signal whose amplitude varies in accordance with the degree of phase shift of the received PSK signal, with that output signal being processed by the data processing section 811 of this embodiment in a similar manner to that described for the demodulated ASK signals of the preceding embodiment, and assign priority to obtaining the response data and ID code from a transponder which has previously failed to communicate with the interrogator apparatus.

As noted above, each transponder of this embodiment may include a rectifier circuit for deriving an internal DC power supply from the incident radio waves, as described for the first embodiment. In that case it would also be possible with this embodiment, as for the first embodiment, to provide a second antenna which transmits only CW radio waves. Alternatively, each transponder may be powered by an internal battery.

Furthermore, although in the above description the change to applying the 0 to 180 degrees PSK modulation range from the 0 to 170 degrees modulation range is performed after a transponder has performed a first transmission of data after entering the communication region of the interrogator apparatus, it would be possible to effect that change in the PSK modulation range after a greater number of transmissions have been performed by a transponder.

Also, the invention is not limited to the use of the specific values of PSK modulation ranges of 0 to 180 degrees and 0 to 170 degrees described for the above embodiment, and it would be possible to use other values.

20th Embodiment

Figure 47:
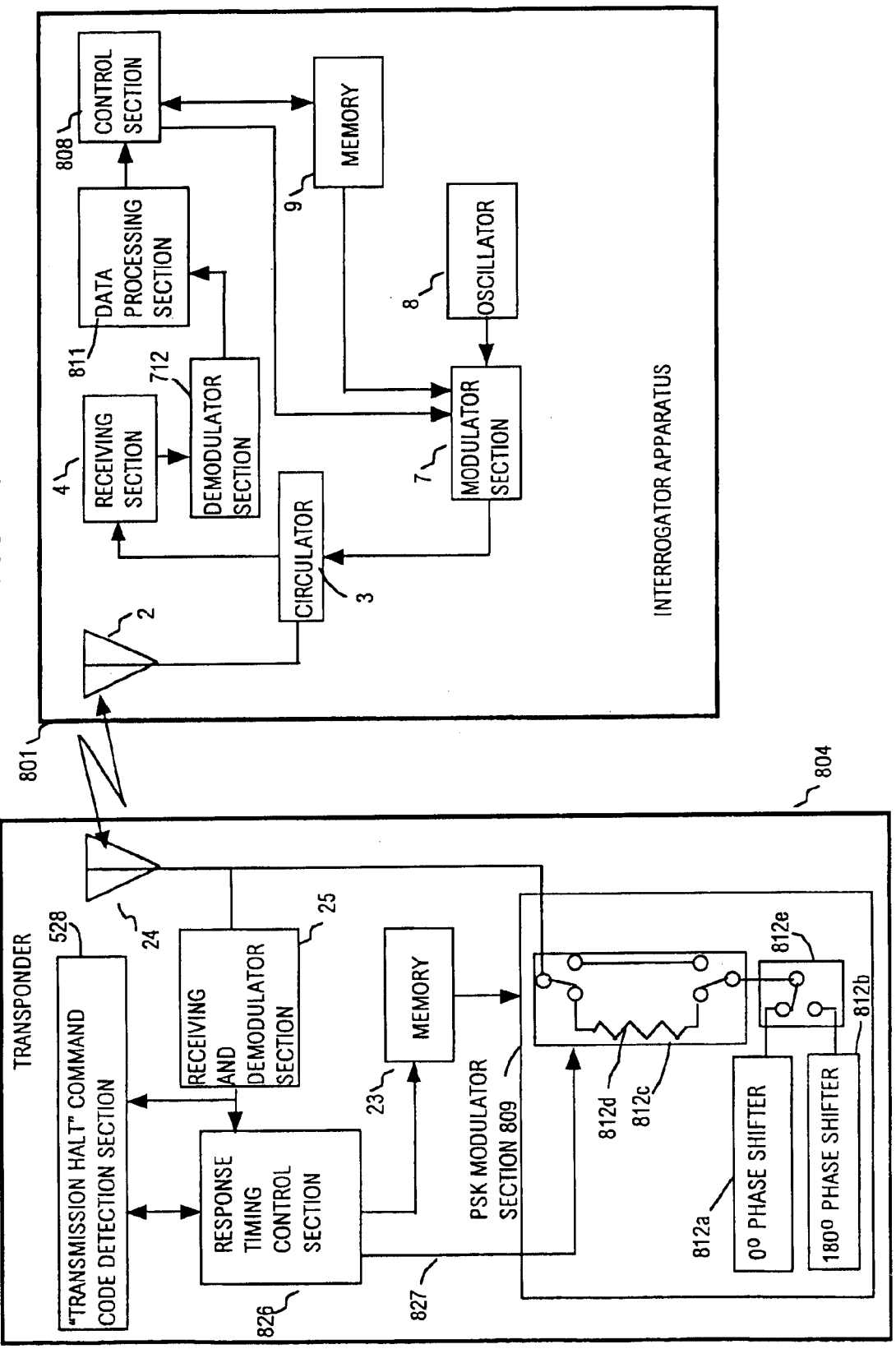
FIG. 47 is a system block diagram of a mobile body discrimination apparatus in accordance with a 20$^{th}$ embodiment, wherein a transponder applies PSK (phase shift keying) modulation of reflected radio waves while applying a fixed degree of attenuation to the reflected radio waves, when performing an initial transmission of data after entering the communication region of the interrogator apparatus, and removes the attenuation when performing subsequent transmissions.

FIG. 47 is a general block diagram of a transponder and interrogator apparatus of a mobile body discrimination apparatus according to a 20th embodiment. This differs from the 19th embodiment described above in that only a single PSK modulation range can be applied by each transponder 804, and in that a transponder applies attenuation of the reflected modulated radio waves when performing a first transmission of response data and ID code after entering a communication region of the interrogator apparatus, and performs any subsequent transmissions (if the first transmission is unsuccessful), while traversing the communication region, without such attenuation being applied.

In FIG. 47, the PSK modulator section 809 of a transponder 804 contains an attenuation section 812c having a selectable attenuator 812d, which is inserted or removed under the control of an attenuator insertion control signal applied via a line 827 from the response timing control section 826. As shown, the attenuation section 812c is connected between the antenna 24 of the transponder and a selector 812a which, in conjunction with a 0 degrees phase shifter 812a and a 180 degrees phase shifter 812b performs the PSK modulation function, i.e. with the selector 812a being driven in accordance with data read out from the memory 23.

Figure 48:
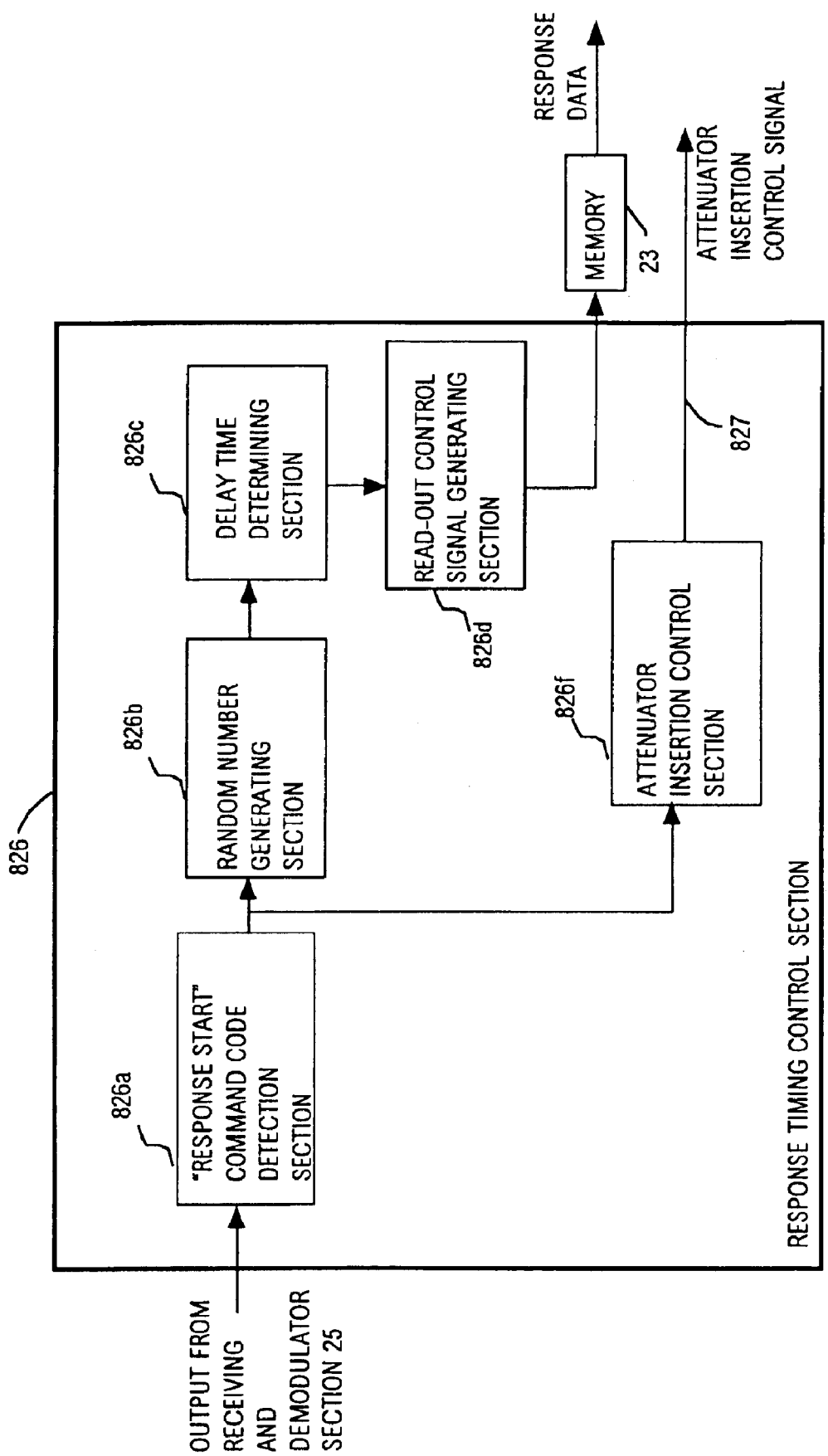
FIG. 48 is a system block diagram of the internal configuration of a response timing control section in a transponder of the mobile body discrimination apparatus of FIG. 47.
Figure 49:
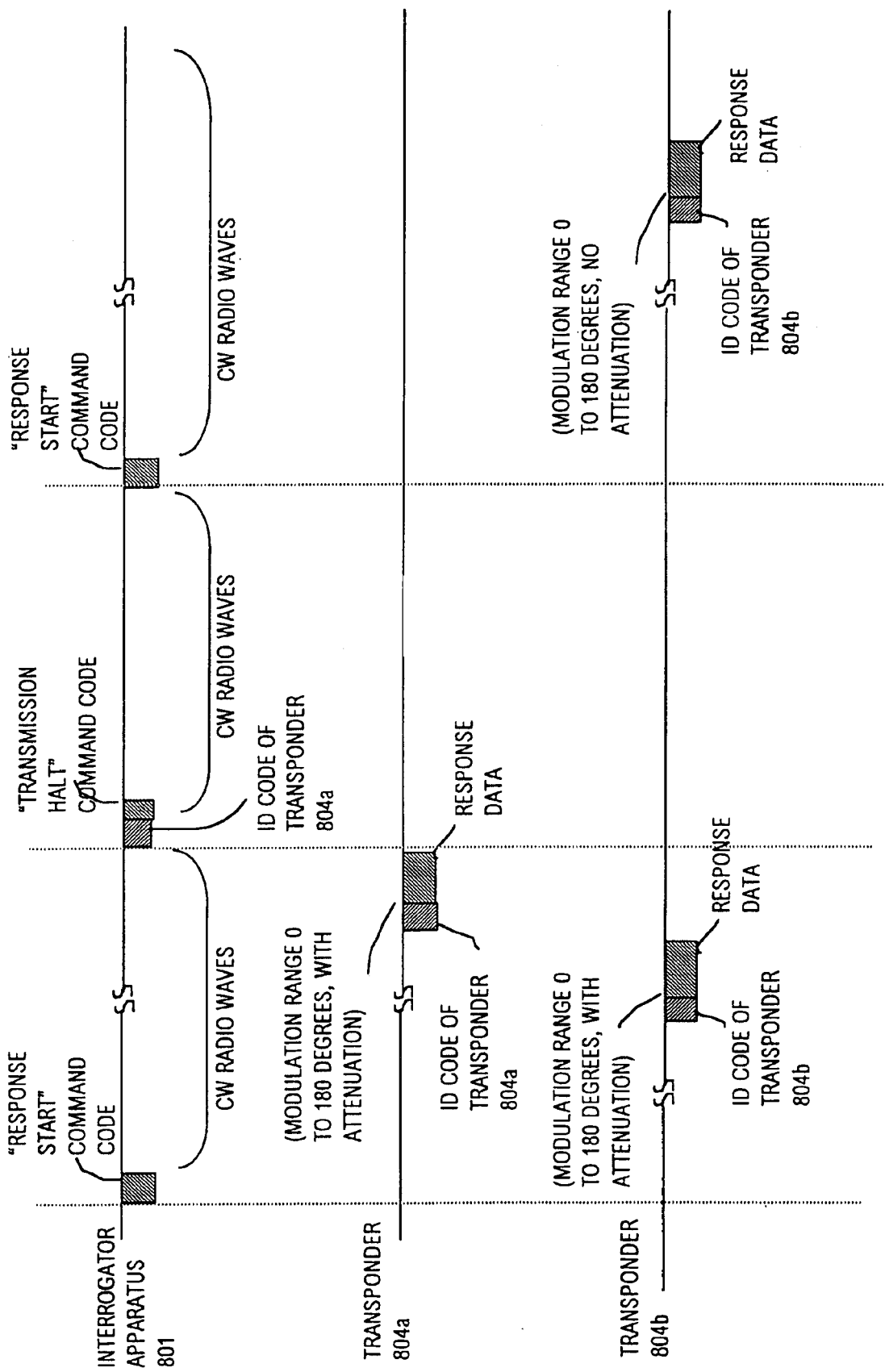
FIG. 49 is a timing diagram for describing the interchange of identification codes and data between a plurality of transponders and the interrogator apparatus of the mobile body discrimination apparatus of FIG. 47.

FIG. 48 shows the internal configuration of the response timing control circuit 826 of a transponder of this embodiment. This is similar to that of the preceding embodiment, and an attenuator insertion control section 862f which generates the aforementioned insertion control signal can for example be configured as a counter which is reset when the transponder enters (or exits from) the communication region of the interrogator apparatus, and whose output changes in level when two successive response start command code occurrences have been detected by the response start command code detection section 826a.

The operation of this embodiment is illustrated in the timing diagram of FIG. 46, in which a transponder which is designated as 804a successfully transmits its ID code and response data, with the attenuator 812c applied, after a randomly determined time interval following its first reception of a response start command code from the interrogator apparatus after entering the communication region of the antenna 2. Hence, a transmission halt command code with the ID code for transponder 804a is then transmitted to that transponder, so that no further data are transmitted by it. Another transponder, designated as 804b, is not successful in transmitting its ID code and response data following its first reception of a response start command code after entering the communication region. Hence, when the transponder 804b performs its next transmission, after a randomly determined time interval following the next transmission of the response start command code from the interrogator apparatus, the transponder 804b again transmits its ID code and response data by PSK modulation of the reflected radio waves, but with the attenuator 812c disconnected from the antenna 24, so that a substantially higher amplitude of modulated reflected signal will be received by the interrogator apparatus 801 from that transponder.

In that condition, if another transponder should also perform a transmission at that time with the attenuator applied, so that conflict occurs between that transmission and the transmission from transponder 804b, the substantially higher amplitude of the PSK modulated signal that is received by the interrogator apparatus 801 from the transponder 804b will ensure that the output signal obtained from the demodulator section 712 of the interrogator apparatus 801 will accurately express the ID code and response data which have been transmitted from transponder 804b.

Hence with this embodiment, as for the preceding embodiment, the interrogator apparatus assigns priority to reception of data from transponders which have failed in a first attempt at communication after entering the communication region, thereby ensuring higher reliability of operation.

Although not shown in the drawings, each transponder of this embodiment may include a rectifier circuit for deriving an internal DC power supply from the incident radio waves, as described for the first embodiment. In that case it would also be possible with this embodiment, as for the first embodiment, to provide a second antenna which transmits only CW radio waves. Alternatively, each transponder may be powered by an internal battery.

21st Embodiment

Figure 50:
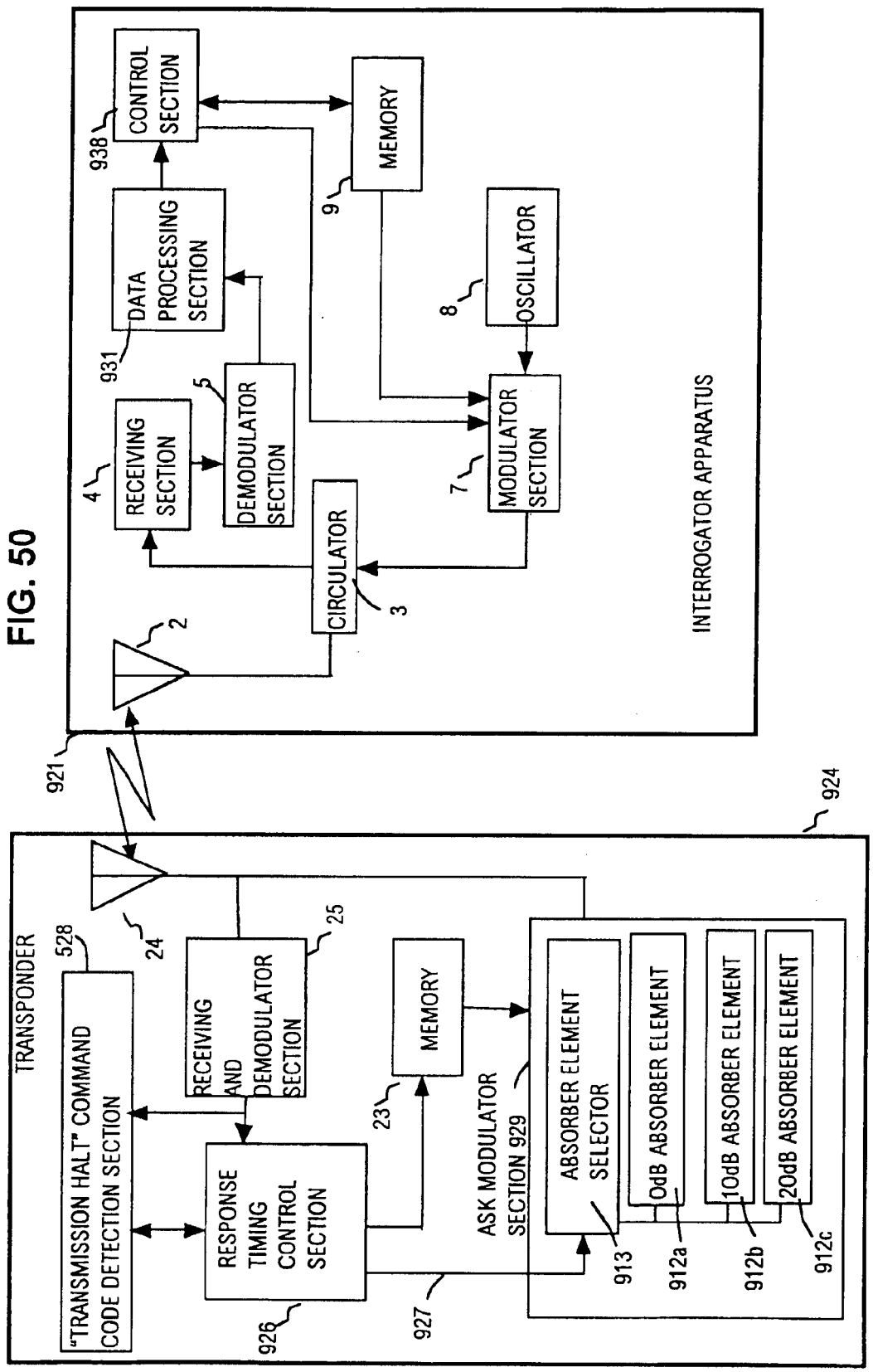
FIG. 50 is a system block diagram of a mobile body discrimination apparatus in accordance with a 21$^{st}$ embodiment, wherein a transponder applies a first depth of ASK modulation when transmitting an identification code and a second depth of ASK modulation when transmitting data.

FIG. 50 is a general block diagram of a transponder and interrogator apparatus of a mobile body discrimination apparatus according to a 21st embodiment. The configuration shown in FIG. 50 is similar to that of the 19th embodiment described hereinabove, however this embodiment differs from the 19th embodiment in that each data transmission performed by a transponder consists of a header portion containing the ID code of the transponder together with data key information (described hereinafter), which precedes the response data set, and also in that the header portion is always transmitted using a high ASK modulation depth (e.g., 20 dB) while the response data is always transmitted using a lower depth of modulation (e.g., 10 dB). The data key information is derived beforehand, in relation to a response data set, in such a way as to enable the data key information to be used by the interrogator apparatus to correct errors which may occur due to conflict with response data that are transmitted from some other transponder. Since various well-known ways of implementing such a feature could be utilized, which might for example include encoding of the response data before transmission and applying decoding through use of the data key information at the time of extraction by the data processing section 931, detailed description will be omitted. In addition, this embodiment applies the feature, described for the preceding embodiments, of transmitting the transmission halt command code to each transponder from which the interrogator apparatus has successfully acquired data.

Figure 52:
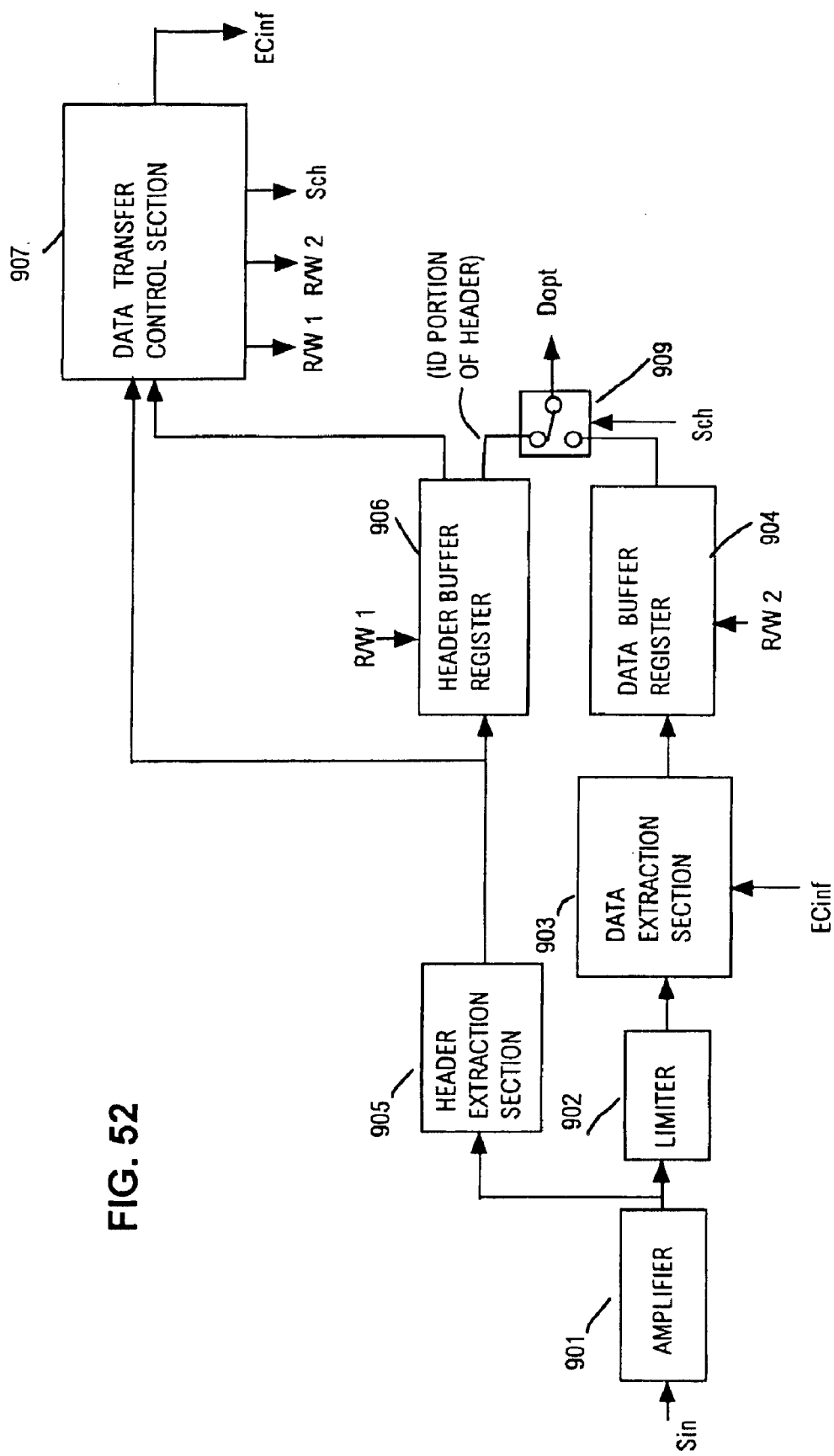
FIG. 52 is a system block diagram of a data processing section in the interrogator apparatus of the mobile body discrimination apparatus of FIG. 50.

FIG. 52 shows the configuration of the data processing section 931 of the response timing control circuit 921 of this embodiment. A received amplified baseband signal conveying a header and response data set transmitted from a transponder 924 is supplied from the amplifier 901 to a limiter 902, and to a header extraction section 905 which begins to extract the header portion, containing the transponder ID code and the aforementioned data key information, supplies the leading part of the header to the data transfer control section 907 to notify the data transfer control section that a new set of data have started to be received from a transponder, and supplies the header to a buffer register 906 to be written therein under the control of the data transfer control section 907.

The header extraction section 905 performs a similar function to that of the high-modulation data extraction 602 of the 18$^{th}$ embodiment shown in FIG. 40, i.e., that of the series of limiters and subtractors 502 to 506 shown in FIG. 37 which can operate on a received signal containing overlapping ASK modulated data at the 20 dB modulation depth and 10 dB modulation depth to extract only the data conveyed using the 20 dB modulation depth. Thus, when a transponder transmits a header while another transponder is already transmitting response data at the 10 dB modulation depth, the header will be correctly obtained from the header extraction section 905. The extracted header is written into the buffer register 906, then supplied to the data transfer control section 907. The data transfer control section 907 then extracts the aforementioned data key information ECinf from the header, and supplies that information to the data extraction section 903.

The limiter 902 converts the output signal from amplifier 901 to a binary signal, which is supplied to the data extraction section 903, in which the response data set which succeeds the header are processed to correct any errors which may result from data conflict specifically, if that response data set should be received while a preceding response data set is being received, then the data key information ECinf is applied such as to ensure that the later response data set will be correctly produced from the data extraction section 903. The resultant data are written into the data buffer register 904, with any existing contents being overwritten.

When a complete set of response data have been written into the data buffer register 904, the data transfer control section 907 generates a selection control signal Sch such as to first set a selector 909 to select the output from the header buffer register 906, then reads out the ID code portion of the header that is held in the buffer register 906, to be transferred and written into the memory 9. The selector 909 is then controlled to select the output from the data buffer register 904, and the response data set which is held in that buffer register is then read out and transferred to be written into the memory 9.

Figure 53:
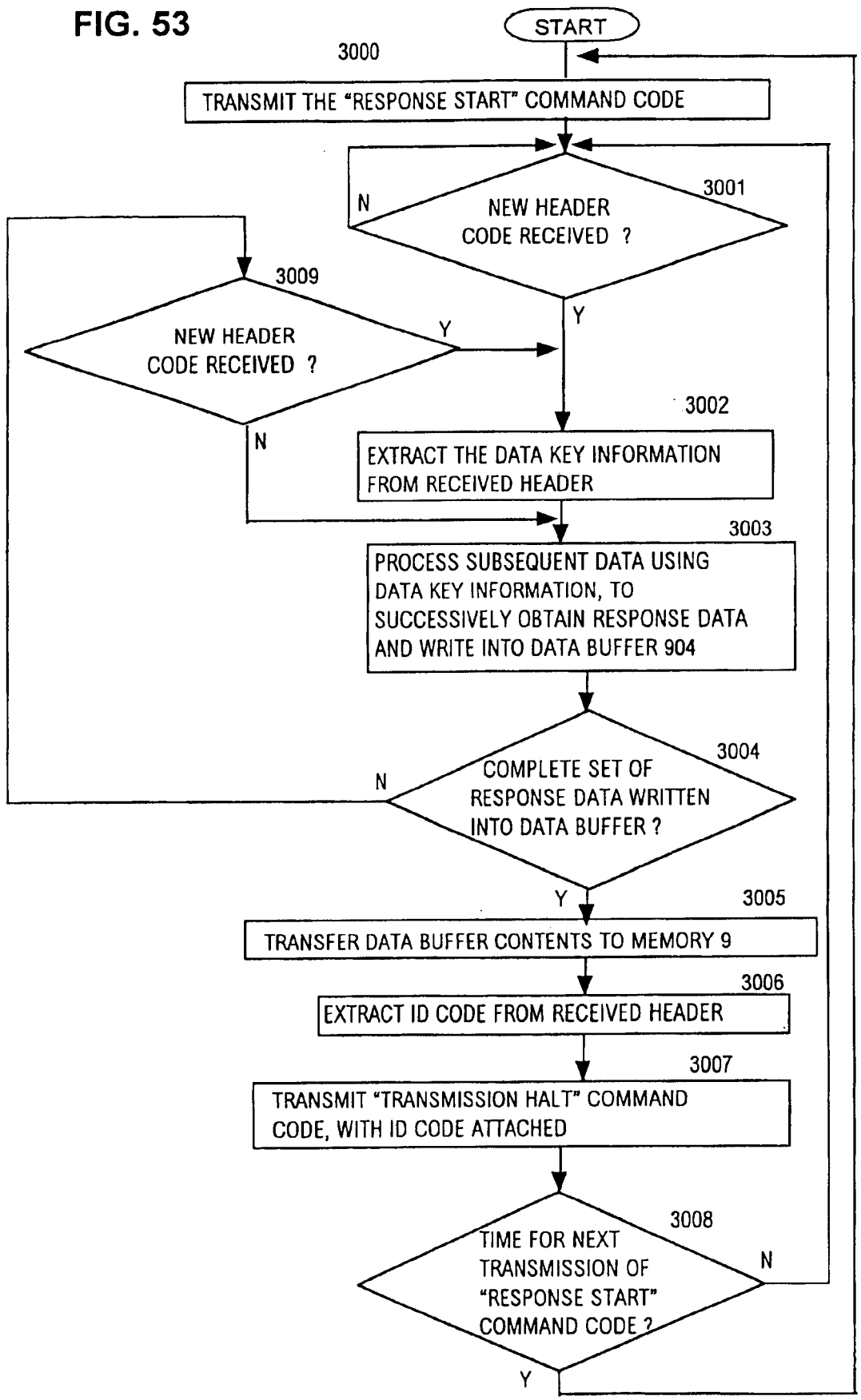
FIG. 53 is a flow diagram for describing the operation of the interrogator apparatus of the mobile body discrimination apparatus of FIG. 50.

The above operation is illustrated in the flow diagram of FIG. 53, which shows the basic operation of the data processing section 931and control section 938 in combination. As can be understood from steps 3003, 3004, 3009, if a new header is received while processing of a response data is in progress, then the response data set which is attached to that new header will begin to be processed and written into the data buffer register, i.e., the previous contents of that buffer register are discarded. Also, as shown in step 3007, after the ID code and response data set have been successfully acquired from a transponder, the transmission halt command code is then sent to that transponder, to prevent any further transmissions from it as it traverses the communication region of the interrogator apparatus.

Figure 51:
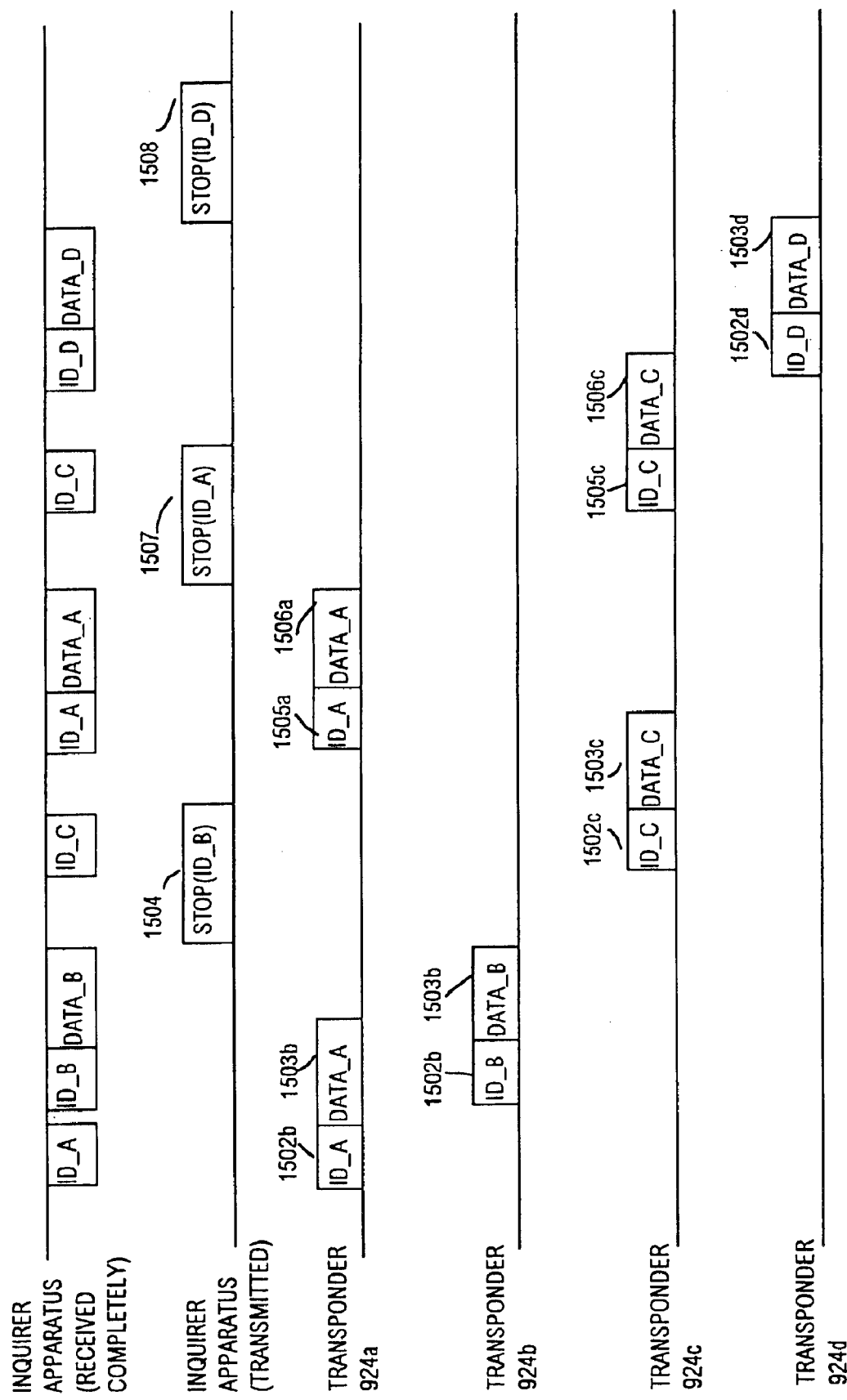
FIG. 51 is a timing diagram for describing the operation of the mobile body discrimination apparatus of FIG. 50.

FIG. 51 is a timing diagram showing an example of the interrogator apparatus 921 receiving transmissions from four transponders, respectively designated as 924a, 924b, 924c and 924d, with parts of these transmissions overlapping along the time axis. The uppermost line of the diagram illustrates the data which are received completely by the interrogator apparatus (i.e., are written into the buffer registers 904, 906 of the data processing section 931 in their entirety). The second line shows respective transmissions of the transmission halt command code by the interrogator apparatus. The third, fourth, fifth and sixth lines show the transmissions respectively performed by the transponders 924a, 924b, 924c and 924d. It is assumed that the transponder 924a transmits a header and response data set, designated as 1502a, 1503a respectively, whereupon the data processing section 931 of the interrogator apparatus stores the received header, and begins to write the response data set 1503a into the data buffer register 904. While that is in progress, the transponder 924b transmits a header and response data set, designated as 1502b, 1503b respectively, whereupon the data processing section 931 writes that header into the buffer register 906 and begins to write the response data 1503a into the buffer register 904. Since this is completed without conflict with any other transmissions, the ID code and response data set-of transponder 924b are then written into the memory 9 of the interrogator apparatus, which then transmits the transmission halt command code 1504 to that transponder.

In this example, a part of the response data 1503atransmitted from the transponder 924a overlap the response data 1503b which are transmitted from transponder 924b, i.e., data conflict occurs. However as described hereinabove, the response data 1503b are related to the data key information conveyed in the header 1502b such that the response data 1503b can be correctly extracted by the data processing section 931.

Subsequently, transponder 924a again transmits its header and response data, and in this case there is no data conflict with a header transmitted from some other transponder, so that the ID code and response data set of transponder 924a are acquired by the interrogator apparatus 921, which then transmits a transmission halt command code 1507 directed to the transponder 924a. In a similar manner, the ID code and response data set of transponder 924d are successfully acquired by the interrogator apparatus, which then transmits the transmission halt command code 1509 directed to transponder 924d.

If conflict occurs between two headers which are transmitted by respective transponders, then it will not be possible for the interrogator apparatus 921 to acquire data from either of these transponders. However since the header can be configured from only a small number of bits, the probability of such conflict is relatively small.

In the above, it is assumed that each header is transmitted using the large depth of ASK modulation (20 dB), so that a header can be correctly extracted even when data conflict occurs between it and a response data set that is transmitted using the low modulation depth (10 dB). However as described for the circuit of FIG. 37, it is possible to configure a data processing section such as to extract either the high modulation depth data (i.e., OPT 1), or the low modulation depth data (i.e., OPT 2). Hence, with the 21$^{st}$ embodiment it would be equally possible for each transponder to transmit a header by applying the low modulation depth and transmit a response data set by applying the high modulation depth, with similar effects to those described above being obtainable.

Furthermore although the above embodiment has been described for the case of ASK modulation being performed by each transponder, it would be equally possible to apply PSK modulation. In that case for example, the principles described hereinabove for the 20$^{th}$ embodiment could be utilized, such that attenuation of the reflected PSK modulated signal from a transponder is applied when a response data set is transmitted, with that attenuation being removed when a header is transmitted. In that way, the data processing section of the response timing control circuit 921 can easily be configured to extract each header, even when data conflict occurs between a header and a response data set which are transmitted by respectively different transponders.

Furthermore the above embodiment could be modified such that when an ID code of a transponder is acquired by the interrogator apparatus but (due to data conflict) the corresponding response data set is not acquired, the interrogator apparatus subsequently transmits a retransmit request signal, attached to the ID code of that transponder. In the same way as for the response start command code transmissions, these retransmit request signals could be transmitted at predetermined periodic timings when required. In that case it could be arranged that each transponder normally performs only one data transmission after entering the communication region and receiving a response start command code, but performs one or more subsequent transmissions if the retransmit request signal is received. In that case, use of the transmission halt command codes would be unnecessary.

Each of the apparatuses of the $17^{th}$ to $21^{st}$ embodiments described above can be applied to a mobile body discrimination system such as that shown in FIG. 3, with a transmitting section and second antenna as shown in FIG. 1 being added, for illuminating the transponders with unmodulated radio waves in the intervals between transmissions of the Response Start command code, as described for the first embodiment.

$22^{nd}$ Embodiment

A $22^{nd}$ embodiment of the invention will be described in the following, which is a microwave power supply circuit for use in a transponder of a mobile body discrimination apparatus such as that of the transponder 20 of the first embodiment shown in FIG. 54, to generate DC supply power for operating the circuits of the transponder by rectifying a signal obtained from received radio waves, with a high level of rectification efficiency being achieved.

Figure 54:
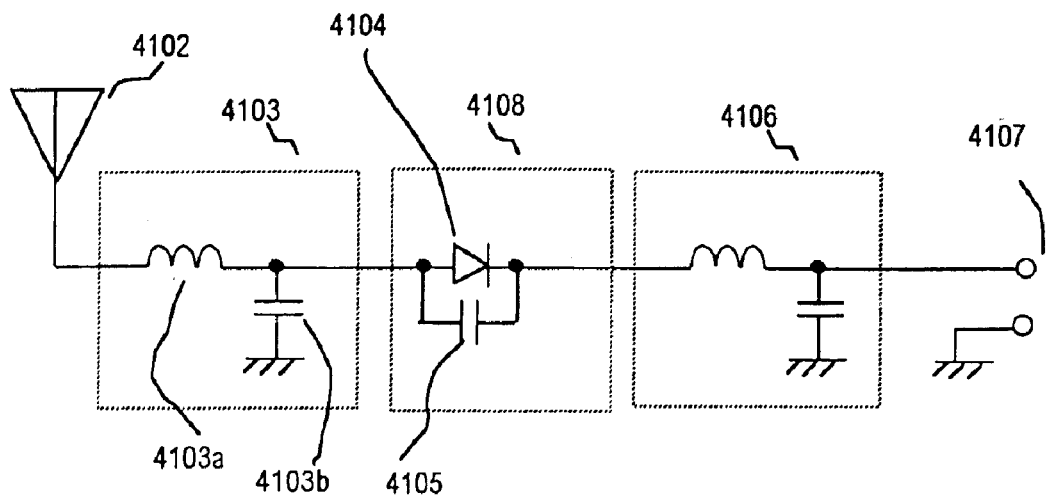
FIG. 54 is a circuit diagram of a 22$^{nd}$ embodiment, which is a DC power supply circuit which derives power from received radio waves, for a transponder of a mobile body discrimination apparatus.

FIG. 54 is a circuit diagram of this embodiment, in which 4102 is a microwave receiving antenna, 4103 is a representation of the distributed inductance and capacitance (indicated by inductor 4103a and capacitor 4103b respectively) of a matching circuit section which is connected to the antenna 4102, and 4108 is a rectifier circuit section for performing half-wave rectification, formed of a diode 4104 and an adjustment capacitor 4105 that is connected in parallel with the diode 4104. 4104 is a low pass filter section for smoothing the output power from the rectifier circuit section 4108, and 4107 denotes the output terminals of the power supply circuit.

The antenna 4102 is preferably formed by pattern shaping, as a patch antenna, on the substrate of an IC. The matching circuit section 4103 is designed in conjunction with the reactance of the rectifier circuit section 4108 (i.e., as determined by the inter-terminal capacitance of the diode 4104, the series inductance of the diode and its connecting leads, stray capacitances of the diode with respect to ground), such as to maximize the transfer of energy from the antenna to the rectifier circuit, i.e., such as to maximize the rectification efficiency. The matching circuit section 4103 would typically be formed of a suitable length of microstrip (sometimes referred to as a strip transmission line) which connects the antenna 4102 to the diode 4104. The low pass filter section 4106 smoothes the output DC supply that is produced from the diode 4104.

Figure 55:
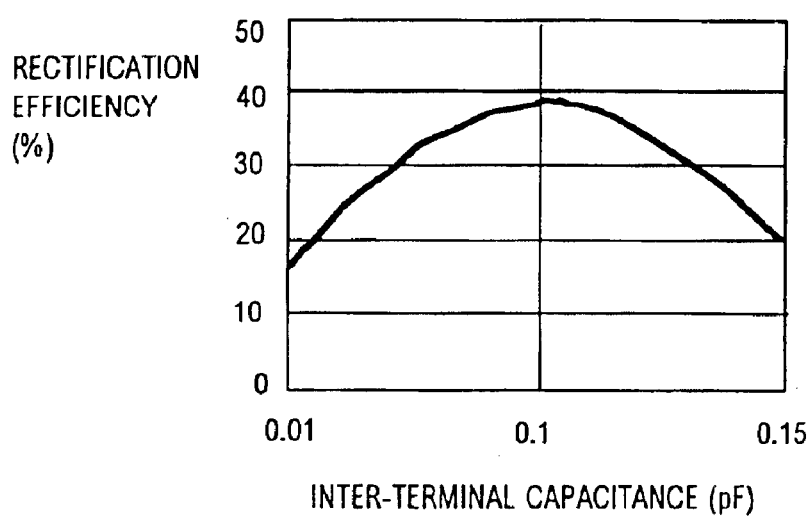
FIG. 55 is a graph showing a relationship between an inter-terminal capacitance value of a rectifier diode utilized in the power supply circuit of FIG. 54 and the rectification efficiency which is achieved by that circuit.

With the above configuration, the antenna 4102 receives radio waves in the microwave band which are transmitted from an inquiry apparatus, and supplies the received signal via the matching circuit section 4103 to the rectifier circuit section 4108. The rectifier circuit section 4108 rectifies the microwave signal, by the diode 4104, and the resultant output is passed through the low pass filter section 4106 to the output terminal 4107, as DC power. If the capacitance and inductance values of the matching circuit section 4103 are appropriate in relation to those of the diode 4104, then the rectification efficiency of the microwave power supply circuit will be maximized, i.e., the received microwave signal will reach the rectifier circuit section with a minimum of losses. However the value of capacitance between the terminals of the diode 4104 exhibits a large amount of manufacturing variations. The graph of FIG. 55 illustrates the relationship between the rectification efficiency achieved and the inter-terminal capacitance of the diode 4104. FIG. 55 shows the case is in which the matching circuit section 4103 has been designed on the assumption that a diode 4104 having an inter-terminal capacitance value of 0.1 pF will be used in the rectifier circuit of the microwave power supply circuit, and the variation of the rectification efficiency as the actual inter-terminal capacitance value of the diode 4104 varies with respect to that design value of capacitance of 0.1 pF. As can be seen from FIG. 55, the rectification efficiency deteriorates substantially if the actual inter-terminal capacitance value differs by as small an amount as plus or minus 0.5 pF from the nominal value of 0.1 pF. This is due to the fact that the degree of impedance matching between the rectifier circuit and the antenna 4102 is adversely affected by such a change in the inter-terminal capacitance value, so that the losses which result from mismatching are increased.

To counteract this, the values of the inductance 4103a and the capacitance 4103b which constitute the matching circuit section 4103 can be adjusted, i.e., to compensate for the manufacturing deviations of the inter-terminal capacitance value of the diode 4104. However such adjustment is difficult to perform, and this is a reason why satisfactory characteristics cannot be obtained from mass-production of such microwave power supply circuits. Specifically, it is the main reason that rectification efficiency figures which are based on results obtained from small-lot testing cannot be achieved in actual mass-production.

However with this embodiment of the present invention, such adjustment is implemented by providing an adjustment capacitor 4105 connected between the anode and cathode terminals of the diode 4104, with the manufacturing variations of the inter-terminal capacitance value of the diode 4104 being compensated by adjusting the value of the adjustment capacitor 4105 such as to bring the rectification efficiency to a satisfactory level, i.e., to thereby counteract the mismatching which results from variations in the inter-terminal capacitance value of the diode 4104 from a nominal value. That is to say, the matching circuit section 4103 can be configured (e.g., as a fixed length of microstrip) on the assumption of a standard value of that inter-terminal capacitance value for the diode 4104. At the time of manufacture, by varying the value of the adjustment capacitor 4105 to counteract any variation of the actual value of the inter-terminal capacitance value of the diode 4104 from the design value (e.g., 0.1 pF in the example of FIG. 55) the deterioration of the rectification efficiency which results from such manufacturing variations can be quickly and easily prevented. The value of capacitance of the adjustment capacitor 4105 can for example be made variable in the range 0 pF to 0.5 pF.

Thus with this embodiment, a microwave power supply circuit for operating the internal circuits of a transponder can be realized whereby the deterioration of rectification efficiency that results from manufacturing deviations of the capacitance value of the rectifier diode of such a power supply circuit in relation to an optimum value of such capacitance can be easily compensated. A uniformly high level of rectification efficiency can thereby be achieved, in mass-production of such a power supply.

Figure 56:
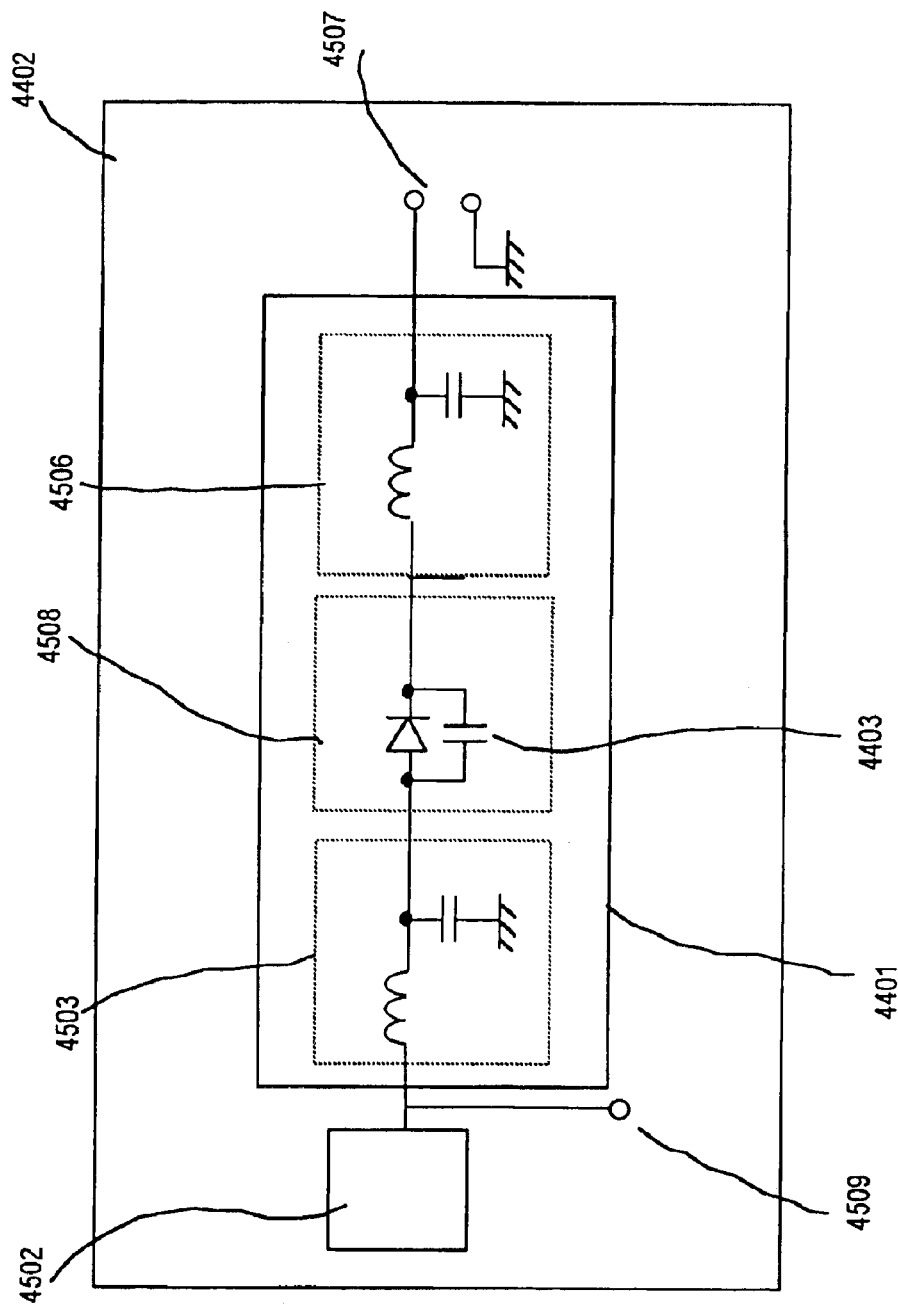
FIG. 56 is a diagram for conceptually illustrating the relationship between components in the circuit diagram of FIG. 54 and a physical configuration of a transponder.

FIG. 56 is a conceptual diagram for illustrating the relationship between a power supply circuit of the form described above, implemented in a transponder having a main substrate 4402 upon which a number of integrated circuit chips are mounted, respectively interconnected by a pattern of connecting leads which are formed on the main substrate, and with the components of the power supply circuit of FIG. 54 other than the antenna being formed in one of these integrated circuit chips, designated by numeral 4401, and with the antenna being formed as a patch antenna 4502 upon the main substrate of the transponder. Numeral 4509 denotes a test terminal, to which a standard test signal in the microwave band is applied at the time of adjusting the adjustment capacitor 4403, while monitoring the output DC power obtained from the output terminals 4507. The matching circuit 4503 can consist of a fixed length of microstrip as described above, formed on the main substrate 4402 and extending from the antenna 4502 to a connecting terminal (i.e., a "bump" as described hereinafter) of the integrated circuit chip 4401, which is coupled to the rectifier diode.

Figure 57:
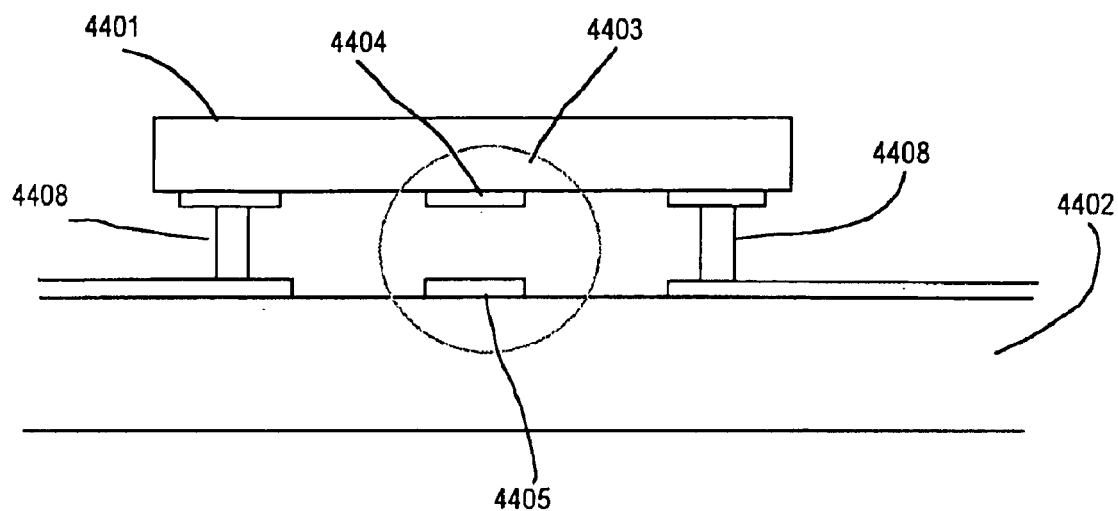
FIG. 57 is a cross-sectional view in elevation of an integrated circuit chip containing components of the circuit of FIG. 55, mounted on a transponder substrate in a manner whereby the inter-terminal capacitance value of a rectifier diode of the power supply circuit can be optimized at the time of manufacture.

FIG. 57 is a general view of a physical arrangement corresponding to FIG. 56 whereby the capacitance adjustment feature of this embodiment can be readily implemented. Specifically, FIG. 56 is a view in elevation of the integrated circuit chip 4401 constituting the power supply circuit of FIG. 54, mounted on the main substrate 4402 of the transponder. In FIG. 57, the adjustment capacitor 4105 shown in FIG. 54 is constituted by an electrode 4404 which is formed on a surface of the IC chip 4401 in combination with an electrode 4405 which is formed the transponder main substrate 4402. Numeral 4408 denotes one of a plurality of "bumps", i.e. portions of a suitable electrically conductive material such as solder, for connecting the circuits of the integrated circuit chip 4401 to circuit leads that are formed on the main substrate 4402, and attaching the integrated circuit chip to the main substrate.

The integrated circuit chip 4401 is mounted in flip-chip configuration on the main substrate 4402, i.e., with the side of the integrated circuit chip having external connection terminals formed thereon being disposed opposite and adjacent to the transponder main substrate 4402, and connected to the main substrate by the aforementioned bumps 4408. With the arrangement shown in FIG. 57, a parallel-plate type of capacitor is formed, which functions as the adjustment capacitor 4105. At the time of mounting the integrated circuit chip 4401 on the main substrate 4402 and performing adjustment, a fixed-amplitude test signal which is in the microwave frequency band is supplied to the aforementioned test terminal 409, in place of an antenna signal, and the level of output DC power that is thereby obtained from the output terminals 4107 is measured, e.g., based on the output voltage obtained when the circuits of the transponder are being supplied. The ratio of the available output power to the test signal amplitude expresses the rectification efficiency of the power supply circuit, which attains a maximum when the actual inter-electrode capacitance of the rectifier diode is close to its design value, as described above referring to the graph of FIG. 55.

Specifically, as an initial condition prior to beginning adjustment, the initial height of each of the bumps 4408 is made such that the initial capacitance value of the adjustment capacitor 4105 (determined by the spacing between the integrated circuit chip 4401 and the main substrate 4402) is made sufficiently small, e.g., substantially close to 0 pf. The adjustment is performed by applying a fixed level of test signal to the test terminal 4109 while monitoring the aforementioned output DC power level, and adjusting the height of the bumps 4408 by applying a successively increasing degree of force in a direction such as to move the integrated circuit chip 4401 towards the main substrate 4402. As a result, the rectification efficiency will gradually increase as shown in FIG. 55, with the output DC power correspondingly increasing. When the output DC power level attains a predetermined value, the adjustment operation is terminated.

In that way, adjustment can be applied to eliminate the loss of rectification efficiency due to impedance mismatching in the connection between the antenna 4102 and rectifier diode 4104.

For example, assuming the size of each of the electrodes 4404, 4405 to be 250 microns square, and the dielectric constant of the supporting material to be 5, and that the bump height can be varied from 60 to 20 microns, then the value of the adjustment capacitor 4105 can be varied from 0.5 pF to 15 pF.

In that way, a microwave power supply circuit can be realized whereby, by gradually altering an amount of force that is applied to the IC 4401 when performing mounting of the IC on the main substrate, the value of the capacitor 4105 can be adjusted such as to establish a substantially uniformly high degree of rectification efficiency for such power supply circuits, even when manufactured under mass-production conditions.

In the above description, electrodes are provided on the IC 4401 and on the main substrate 4402, to constitute the adjustment capacitor 4105. However it would be equally possible to mount both of the electrodes of the adjustment capacitor 4105 on the IC 4401, or to mount both of the electrodes on the main substrate 4402, with one of these electrodes being made movable and provided with an adjustment portion. The adjustment portion can be configured such as to move one electrode towards the other when force is applied to the integrated circuit chip causing the chip to be moved towards the main substrate 4402.

Furthermore, in the above description it is assumed that adjustment is applied to each of the microwave power supply circuits individually. However it would be equally possible to measure the characteristics of respective manufacturing batches of rectifier diodes 4104 beforehand, and to apply the same amount of compensation to all of a set of microwave power supply circuits which each incorporates a diode from the same manufacturing batch.

$23^{rd}$ Embodiment

Figure 58:
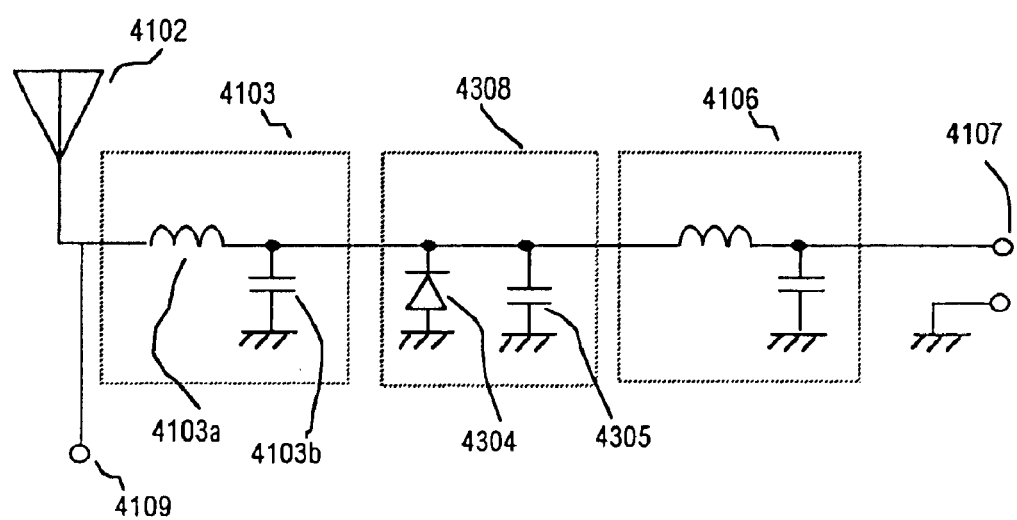
FIG. 58 is a circuit diagram of a 23$^{rd}$ embodiment, which is a DC power supply circuit which derives power from received radio waves, for a transponder of a mobile body discrimination apparatus.

A $23^{rd}$ embodiment will be described in the following, which is also a microwave power supply circuit for a transponder of a mobile body discrimination apparatus, having the circuit configuration shown in FIG. 58. In FIG. 58, a rectifier circuit section 4308 has a diode 4304 with the anode terminal connected to the circuit ground potential and an adjustment capacitor 4305 connected in parallel with the diode. This embodiment differs from that of FIG. 54 in that the anode terminal of the diode 4304 is connected to ground, so that the rectification conversion losses due to the series resistance component of the diode are eliminated. The circuit is implemented on an integrated circuit chip.

With this embodiment, with the adjustment capacitor 4305 connected in parallel with the diode 4304, the capacitance of the adjustment capacitor 4305 alone can readily be adjusted to compensate for the impedance mismatching that may be caused by manufacturing variations in the inter-terminal capacitance value of the diode 4304 and in the mounting conditions of the diode 4304, and the effects of variations in the shapes of connecting leads on the integrated circuit chip. The relationship between rectification efficiency and deviations of inter-electrode capacitance of the rectifier diode 4304 of this embodiment from a design value of capacitance, for this embodiment, is similar to that shown in FIG. 55. The value of capacitance of the adjustment capacitor 4305 can for example be made variable in the range 0 pF to 0.5 pF.

The physical implementation of the adjustment capacitor 4305 can for example be as shown in FIG. 57 described above, in which case the electrodes 4404 and 4405 will constitute the respectively electrodes of the adjustment capacitor 4305, with the adjustment being performed by applying a gradually increasing force which brings the integrated circuit chip gradually closer to the main substrate, as described for the preceding embodiment.

24th Embodiment

Figure 60:
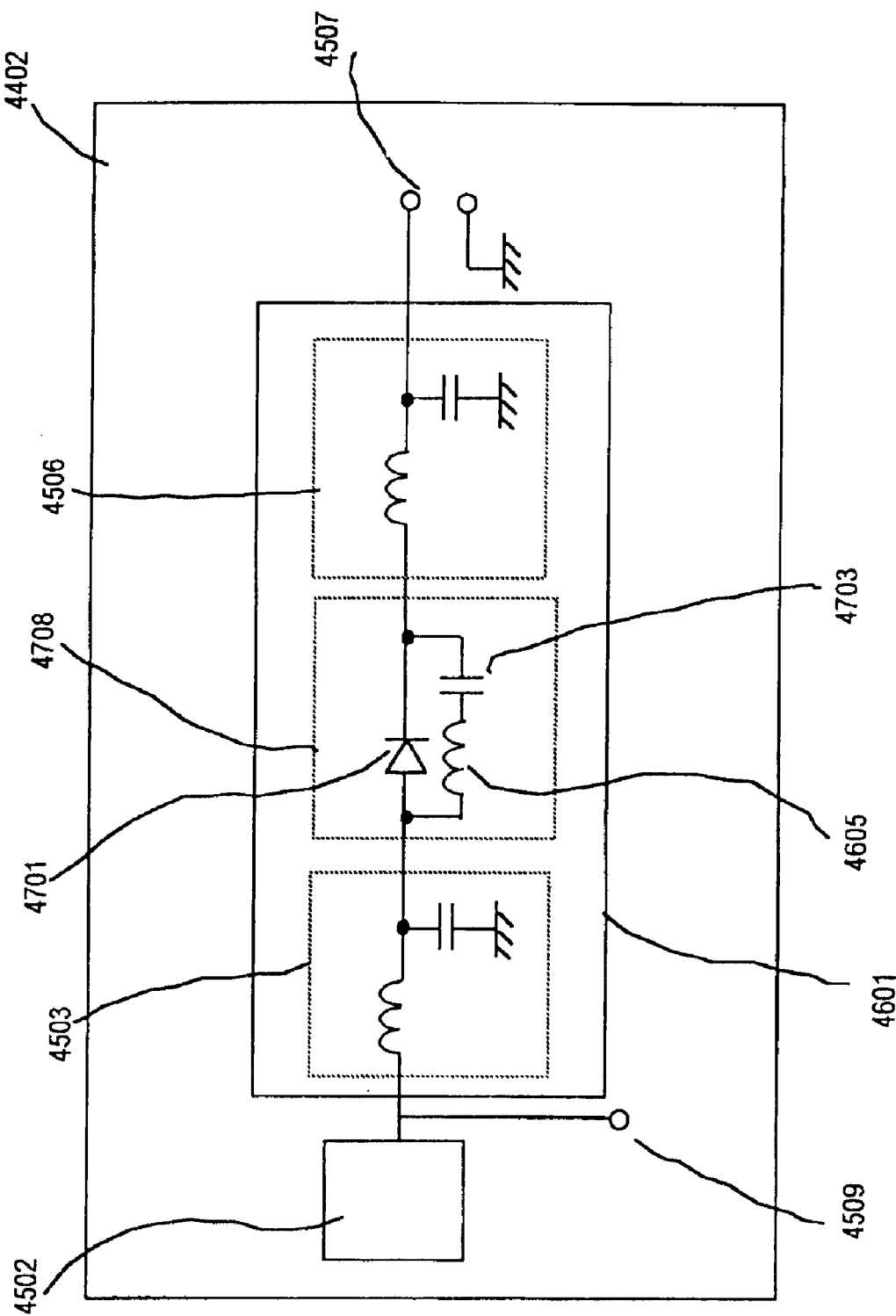
FIG. 60 is a circuit diagram of the power supply circuit of the 24$^{th}$ embodiment.

A 24th embodiment of the present invention will be described in the following, which is also a power supply circuit for use in a transponder. The circuit of this embodiment is shown in FIG. 60. As can be seen, the circuit configuration and physical arrangement, with an integrated circuit chip constituting the circuits of the power supply circuit being mounted on a main substrate of a transponder, and with the antenna used by the power supply circuit being formed by patterning on that main substrate, are similar to those of the 22nd embodiment shown in FIG. 56. However this embodiment differs in that a combination of a fixed (DC blocking) capacitor 4703 and an adjustment inductor 4605, connected in series, is connected in parallel with the rectifier diode 4701, to form the rectifier circuit section 4708 of this embodiment. The adjustment inductor is formed in the shape of a flat spiral, and adjustment is performed by successively short-circuiting adjacent conductors which form part of the spiral, to thereby successively reduce the inductance from an initial value.

When the inductance value of the adjustment inductor 4605 is altered, a relationship is obtained between the changes in inductance and the rectification efficiency of the power supply circuit which is similar to the relationship shown in the graph of FIG. 55 between the rectification efficiency and variation of the capacitance between the terminals of the rectifier diode, for the 22nd embodiment.

Figure 59:
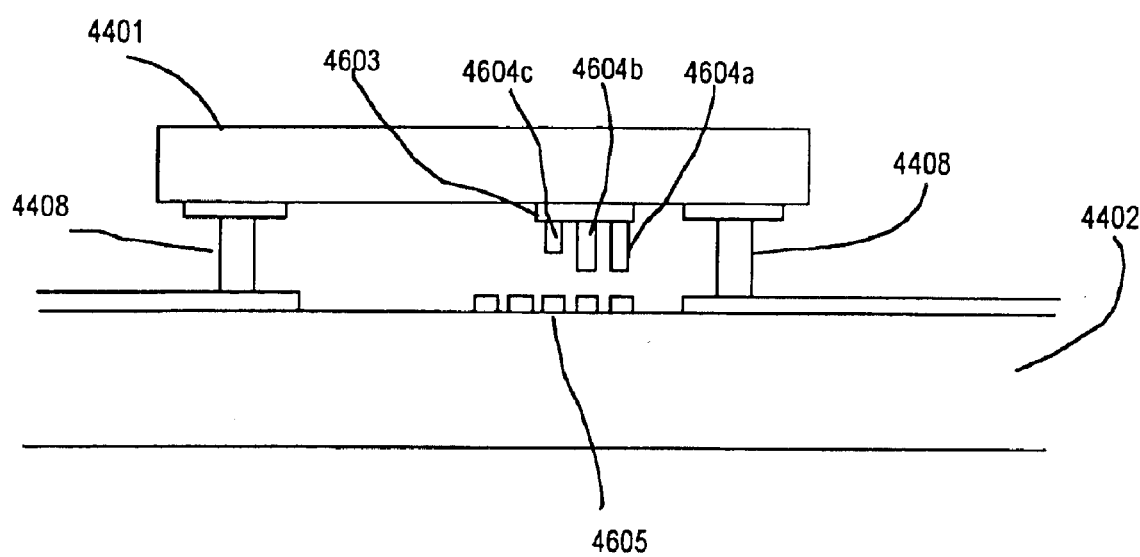
FIG. 59 is a cross-sectional view in elevation of an integrated circuit chip containing components of a power supply circuit in accordance with a 24$^{th}$ embodiment, mounted on a transponder substrate in a manner whereby a parallel inductance value of a rectifier diode of the power supply circuit can be optimized at the time of manufacture.

FIG. 59 is a general view in elevation of a physical arrangement corresponding to FIG. 60 whereby the inductance adjustment feature of this embodiment can be readily implemented. Only the points of difference between this embodiment and the 22nd embodiment will be described, since the basic configuration is similar to that shown in FIG. 57 described above. Specifically, FIG. 59 is a view in elevation of the integrated circuit chip 4601 constituting the power supply circuit of FIG. 60, mounted on the main substrate 4402 of the transponder. In FIG. 59, the adjustment inductor 4605 shown in FIG. 60 is constituted by a flat spiral inductor which is formed as a patterned layer of conducting material on the upper surface of main substrate 4402. Numeral 4603 denotes a connecting lead which interconnects a plurality of protrusions 4604a, 4604b, 4604c, referred to in the following as adjustment bumps, which can be formed of a similar material to that of the aforementioned bumps 4408, i.e., an electrically conducting material such as solder which is sufficiently ductile at normal temperatures to be capable of being deformed by the application of a moderate amount of force (that is to say, a level of force which can be applied, acting on the body of the integrated circuit chip 4401, without causing damage to the chip). The adjustment bumps 4604a, 4604b, 4604c are of varying lengths, are all connected together within the integrated circuit chip 4401, and are respectively positioned above the spiral inductor 4606 as shown, such that by applying force which pushes the integrated circuit chip 4401 towards the main substrate 4402, and so gradually deforming and reducing the height of the bumps 4408, a first point will be reached at which two adjacent portions of the spiral conductor of the inductor 4605 will be short-circuited by the adjustment bumps 4604a, 4604b, thereby producing a specific amount of reduction of the inductance of the spiral inductor 4605. If that force continues to be applied, subsequently a second point will be reached at which three adjacent portions of the spiral conductor of the inductor 4605 will be short-circuited by the adjustment bumps 4604a, 4604b and 4604c.

It will be understood that in practice the number of turns constituting the spiral inductor 4605, and the number of adjustment bumps, may be greater than those shown in the simple example of FIG. 59. However it can be seen that this embodiment enables inductor adjustment, for optimizing the degree of matching between the antenna 4502 and the power supply circuit section 4708, and thereby maximizing the amount of energy which is transferred from the antenna to be converted to output DC power, to be easily performed at the stage of manufacture of a transponder which incorporates such a power supply circuit. That is to say, such adjustment is performed simply by applying a gradually increasing level of force to the integrated circuit chip 4601 while applying a fixed-amplitude test signal to the test terminal 4509 and monitoring the level of output DC power which can be obtained at the output terminals 4507, and halting the application of force to the integrated circuit chip when the level of DC power reaches a predetermined acceptable value.

Thus in the same way as for the 22nd embodiment, this embodiment enables compensation to be applied for variations of the inter-terminal capacitance of the rectifier diode 4701, variations in stray capacitances between circuit leads and ground potential, etc., such as to enable a uniformly high degree of rectification efficiency to be achieved, even under mass-production conditions of manufacture.

When a transponder incorporates a microwave power supply circuit according to any of the 20th, 21st or 22nd embodiments described above, it has been found that even if only a low level of input power such as 1 milliwatt is received as the electric field strength at the antenna of the transponder, the rectifier circuit section will provide satisfactory operation, with a high degree of rectification efficiency being achieved. In the case of the 20th embodiment, assuming that the transmission power of the inquirer apparatus is 300 mW, and that the antenna gain factor of the transmitting/receiving antenna of the transponder is 15 dBi, received signal power of 1 mW will be obtained at the transponder antenna when the inquirer apparatus is spaced apart from the transponder by approximately 1 meter.

Thus for example if the transponders 815 are respectively attached to articles such as baggage items which are moved by a conveyer belt, so that the articles can be respectively identified by the inquirer apparatus, then since the operating range of the transponder is approximately 1 meter, a mobile body discrimination system can be realized which is capable of handling variations in the distance between the inquirer apparatus antenna and the transponders that may result from variations in height of the articles having the transponders attached thereto.

25$^{th}$ Embodiment

A 25$^{th}$ embodiment of the invention will be described referring to FIGS. 61 and 62. This is a transponder for use in a mobile body discrimination apparatus, which functions as a non-contact IC card that can be attached to an article and store data relating to that article, and can both transmit and receive data to/from an interrogator apparatus, i.e., an IC card reader/writer apparatus. The IC card is shown in a cross-sectional view in elevation in FIG. 61 while FIG. 62 shows the configuration of an antenna connecting lead of the embodiment.

Figure 61:
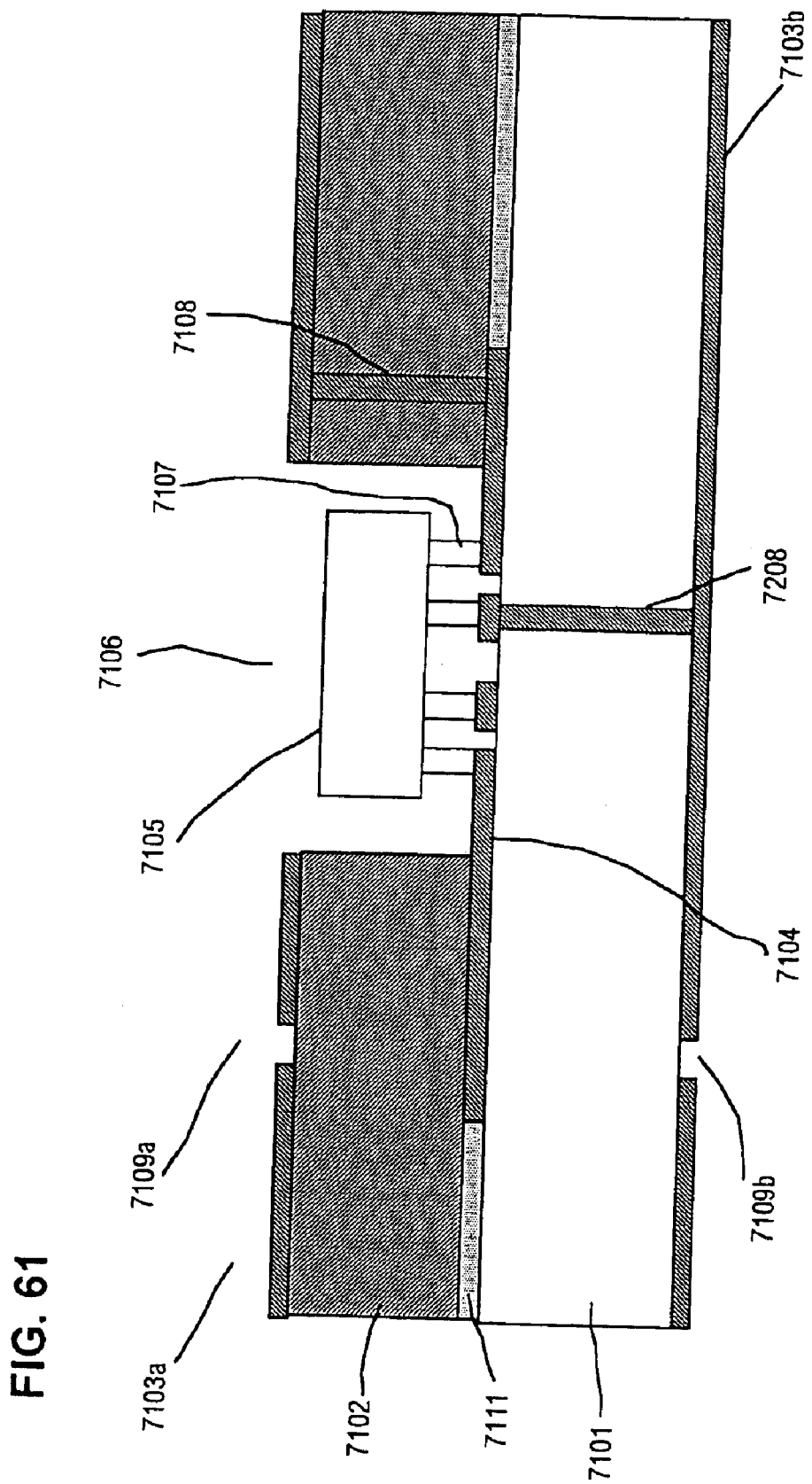
FIG. 61 is a cross-sectional view in elevation of a transponder integrated circuit chip mounted in an IC card in accordance with a 25$^{th}$ embodiment of the invention, having respective microwave slot antennas formed on opposing faces of the card.
Figure 62:
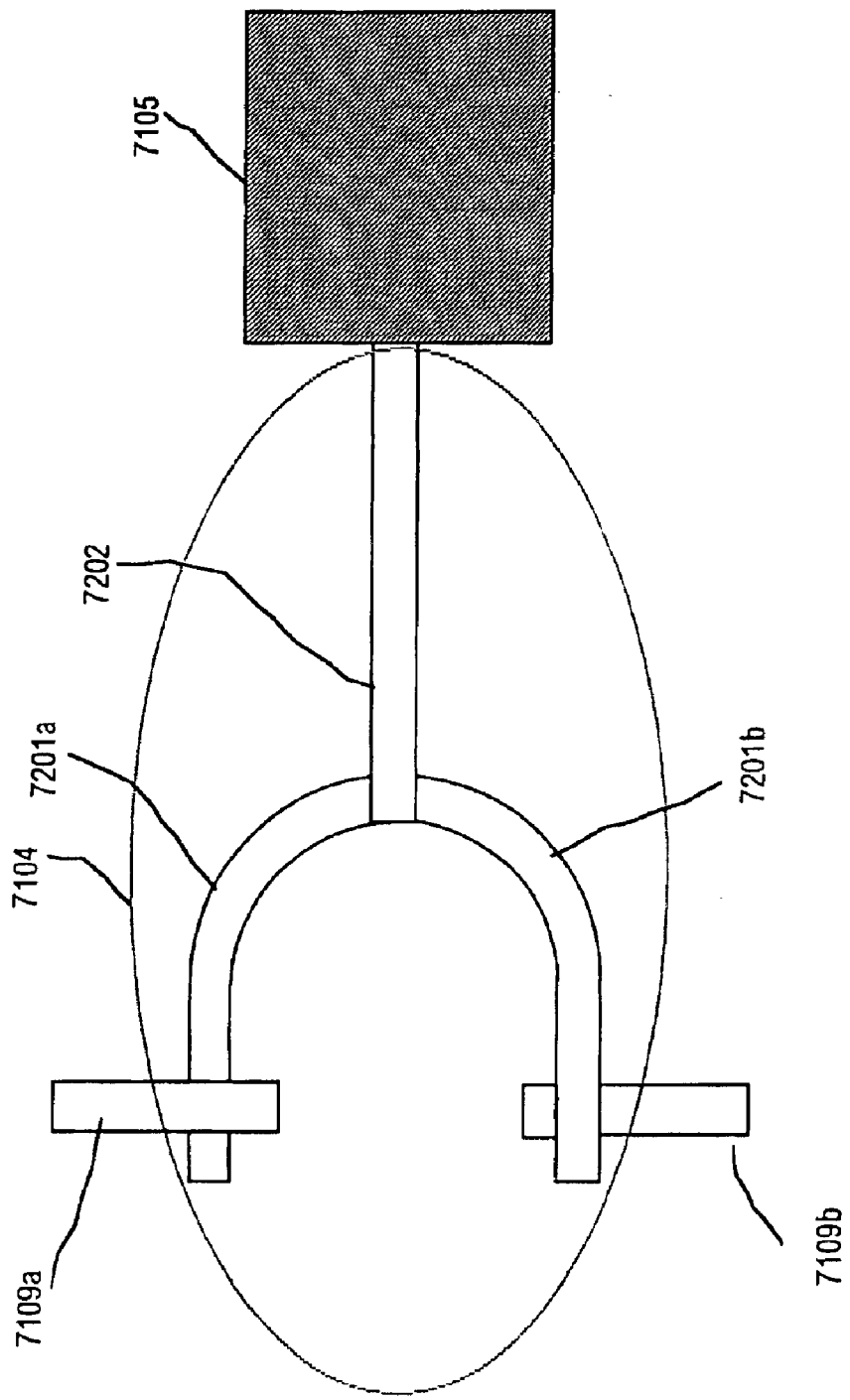
FIG. 62 is a diagram for illustrating the configuration of a two-branch antenna connecting lead for coupling the transponder integrated circuit to the slot antennas in the IC card of FIG. 61.

In FIG. 61, 7101 and 7102 are two substrates having respective plane faces attached together, such as by an adhesive material 7111, and 7103a, 7013b are respective electrically conductive layers each connected to ground potential, which have respective slot apertures formed therein by a patterning process, and will be referred to in the following as ground pattern layers. These are formed on respective outer faces of the two substrates 7101, 7102 as shown. 7104 is an antenna connecting lead that is formed on an inner layer of one of the substrates 7010, 7102, 7106 is an aperture formed in the substrate 7102 to accommodate a transponder IC 7105 which is mounted on that substrate. The transponder IC 7105, in addition to circuit sections for implementing the functions of a transponder, such as those of transponder 20 of FIG. 1 or of various other transponder embodiments described above, contains a power supply circuit which is connected via one of a plurality of bumps 7107 to the antenna connecting lead 7104, and which can constitute for example the rectifier circuit 21 of the first embodiment shown in FIG. 1. The transponder IC 7105 is mounted in flip-chip configuration on the substrate 7101, by means of the bumps 7107. Respective slots 7109a, 7109b are formed in the ground pattern layers 7103a, 7103b that are formed on the substrates 7102, 7101 respectively. The slots function in combination with respective portions of the antenna connecting lead 7104 as respective slot antennas, for receiving signals in the microwave frequency range which are transmitted from an external interrogator apparatus, i.e., an IC card reader/writer apparatus (not shown in the drawing) and for returning modulated reflected signals to that reader/writer apparatus. The ground pattern layer 7103a is connected to the circuit ground potential of the integrated circuit chip 7105 via a through-hole connector 7108, a connecting lead formed on the substrate 7101, and one of the bumps 7107. The ground pattern layer 7103b is similarly connected to the circuit ground potential, via a through-hole connector 7208.

Various types of microwave-band antennas are used in non-contact IC cards, for example an antenna formed as a patterned portion of an electrically conducting layer which is formed on a substrate of the card, such as a line antenna or a loop antenna, or a flat patch antenna. However when such an antenna is formed internally in a non-contact IC card, the communication characteristics of the antenna will be adversely affected by the conditions of use of the card, such as if the antenna is disposed close to a metal body. A flat patch antenna is formed above and separated from a layer of electrically conductive material which functions as a ground plane, and will generally not be adversely affected by the presence of an object close to the rear face of the card, i.e., adjacent to the ground plane layer. However when that rear face is disposed facing towards the reader/writer apparatus, communication between the IC card and the reader/writer apparatus may not be possible, since the antenna may become substantially shielded from incident radio waves. Thus there is the problem that when such a non-contact IC card can be used in a mobile body discrimination system, it must be attached to an article by a specific one of its main faces.

With this embodiment of the invention, having each of the slot antennas 7109a, 7109b coupled to the antenna connecting lead 7104, if there is an object disposed adjacent to the rear face of the card (for example, if the outer face of the ground pattern layer 7103b is adhesively attached to an article), then the impedance of the slot 7109b will be thereby altered, and the electromagnetic field coupling between that slot and the antenna connecting lead 7104 will be eliminated, so that the antenna formed at that side of the card by the slot 7109b will be unable to receive signals. However in that case, the slot 7109a on the other side of the card will function as an antenna so that communication with the reader/writer apparatus can be performed.

The antenna connecting lead 7104 of the slots 7109a, 7109b can for example be implemented as shown in FIG. 62. Here, the antenna connecting lead 7104 is formed of a straight portion 7202 and a pair of branch leads 7201a, 7201b, with the portion 7202 connecting the circuits of the IC chip 7105 to a junction of the two branch leads 7201a, 7201b, which are respectively coupled to the slots 7109a. 7109b. Thus for example if there is an object on the side of the non-contact IC card that is adjacent to the slot 7109b, then the impedance and the resonance frequency of the slot 7109b will be changed, and the electromagnetic field coupling to the corresponding connection lead branch 7201b will disappear. However this will not result in an alteration of the characteristics of the slot 7109a, which will function as an antenna. Hence, signals produced from the IC 7105 can be transmitted by that antenna, and signals transmitted by the reader/writer apparatus can be received by the IC 7105.

If the length of each of the antenna connecting lead branches 201a, 201b is made equal to ½ wavelength of the microwave frequency which is used for communication with the IC card, then impedance variations of the slot 7109b will not adversely affect the operation of the slot 7109a as an antenna, and vice-versa.

Thus with this embodiment as described above, respective ground pattern layers are formed on the front and rear faces of the IC card, and respective apertures are formed in these ground pattern layer to function as microwave slot antennas. As a result, a non-contact IC card can be realized which can be oriented with either the front or the rear face of the card oriented towards an IC card reader/writer apparatus, with reliable communication being ensured in either condition.

26$^{th}$ Embodiment

A 26$^{th}$ embodiment of the invention will be described referring to FIG. 63. This is a non-contact IC card which is shown in a cross-sectional view in elevation in FIG. 63.

Figure 63:
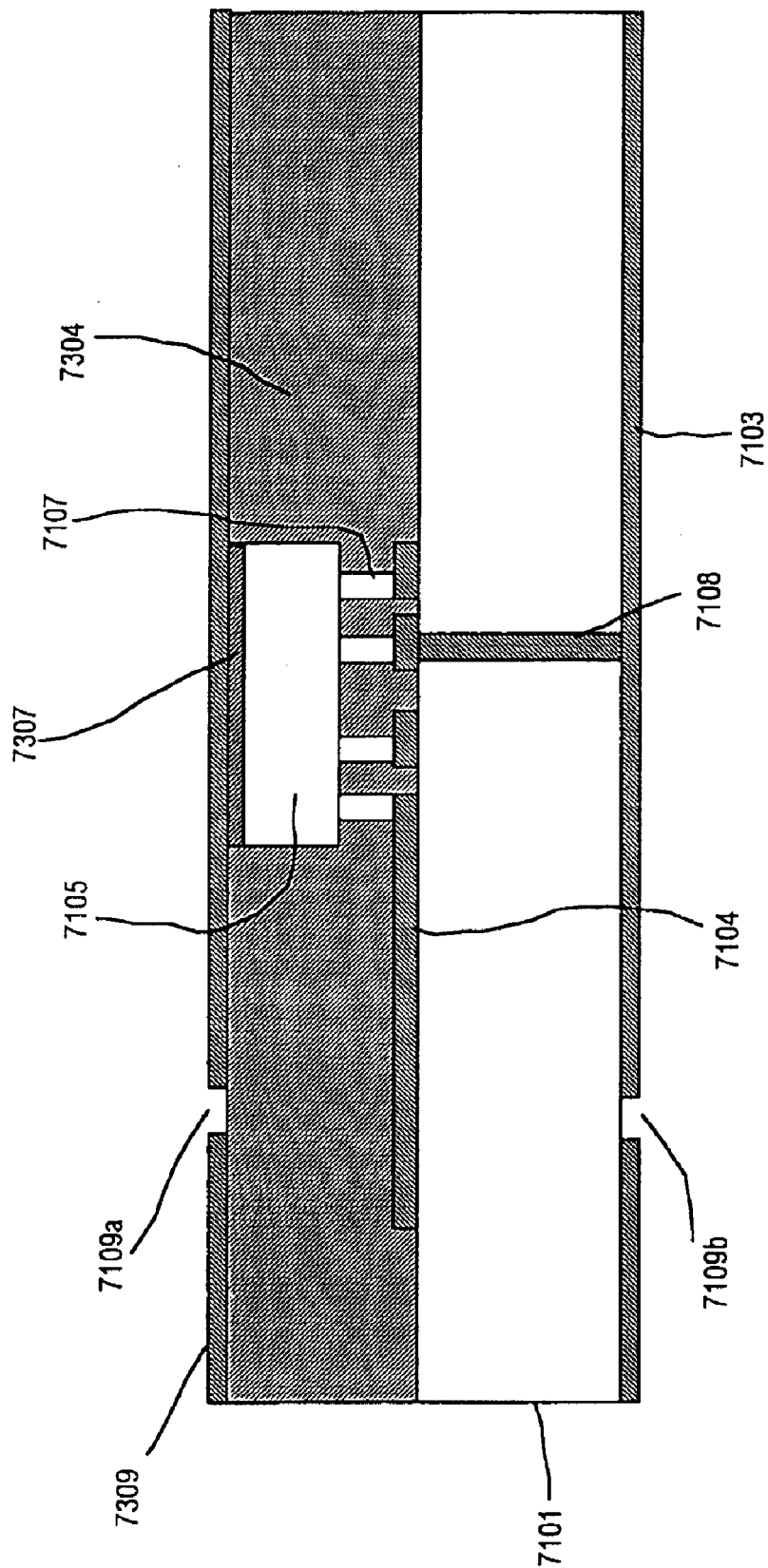
FIG. 63 is a cross-sectional view in elevation of a transponder integrated circuit chip mounted in an IC card in accordance with a 25$^{th}$ embodiment, having respective microwave slot antennas formed on opposing faces of the card, wherein a ground pattern layer for an antenna is partly constituted by a conductive layer formed upon the transponder integrated circuit chip.

In FIG. 63, 7304 is a sealing material which seals a transponder IC 7105, 7309 is a ground pattern layer which is formed on top of the sealing material 7304, 7109a is a slot which is formed in the ground pattern layer 7309. The embodiment of FIG. 63 differs from the twenty-fifth embodiment in that, instead of the substrate 7102, the sealing material 7304 is used as a dielectric material, with the slot 7109a being formed as an antenna on top of the sealing material 7304. Hence with the 24$^{th}$ embodiment, only a single substrate is used, so that it has the advantage of enabling the IC card to be made thin in shape and low in manufacturing cost. In other respects, the configuration and operation are basically similar to those of the twenty-fifth embodiment.

The ground pattern layer 7103, the slot 7109*b*, and the antenna connecting lead 7104 are formed on the substrate 7101, while the transponder IC 7105 is mounted in flip-chip configuration on the substrate, sealed by the sealing material 7304. The ground pattern layer 7309 and slot 7109*a* are formed on top of the sealing material 7304. If the IC 7105 were to be mounted in the face-up configuration, then in order to make the ground pattern layer 7309 and the ground pattern layer 7103 have the same electrical potential it would be necessary to form through-hole connectors in the substrate 7101 and in the sealing material 7304 to establish a connection. However with the configuration of this embodiment, the integrated circuit chip 7105 is manufactured with a layer of electrically conductive material 7307 formed over at least a part of the opposite face of the integrated circuit chip from the bumps 7107, i.e., formed over the face of the integrated circuit chip which becomes the upper face when the chip is mounted in flip-chip configuration, as viewed in FIG. 63. That layer of electrically conductive material 7307 is connected (via the interior of the integrated circuit chip, or via an external connection and one of the bumps) to the ground potential of the internal circuits of the integrated circuit chip 7105, at the time of manufacture of the integrated circuit chip, and comes into contact with the ground pattern layer 7309 which is formed over the IC 7105 and the sealing material 7304. As a result, it is not necessary with this embodiment to provide a through-hole connector in the sealing material 7304.

The antenna connecting lead 7104 can be configured as shown in FIG. 62 and described hereinabove for the preceding embodiment.

Thus with this embodiment, the IC 7105 is mounted in flip-chip configuration on the substrate 7101, and is sealed using the sealing material 7304, which also functions as a dielectric layer, with the ground pattern layer 7309 being formed over the sealing material 7304 and a microwave slot antenna 7109*a* formed in that ground pattern layer 7309, while in addition a second slot antenna 7109*b* is formed in the ground pattern layer 7103, on the opposite face of the IC card. Hence, an IC card can be realized which is thin in shape, and inexpensive to manufacture, and which provides the advantages described hereinabove for the preceding embodiment.

27$^{th}$ Embodiment

A 27$^{th}$ embodiment of the invention will be described referring to FIG. 64. This is a non-contact IC card which is shown in a cross-sectional view in elevation in FIG. 64.

Figure 64:
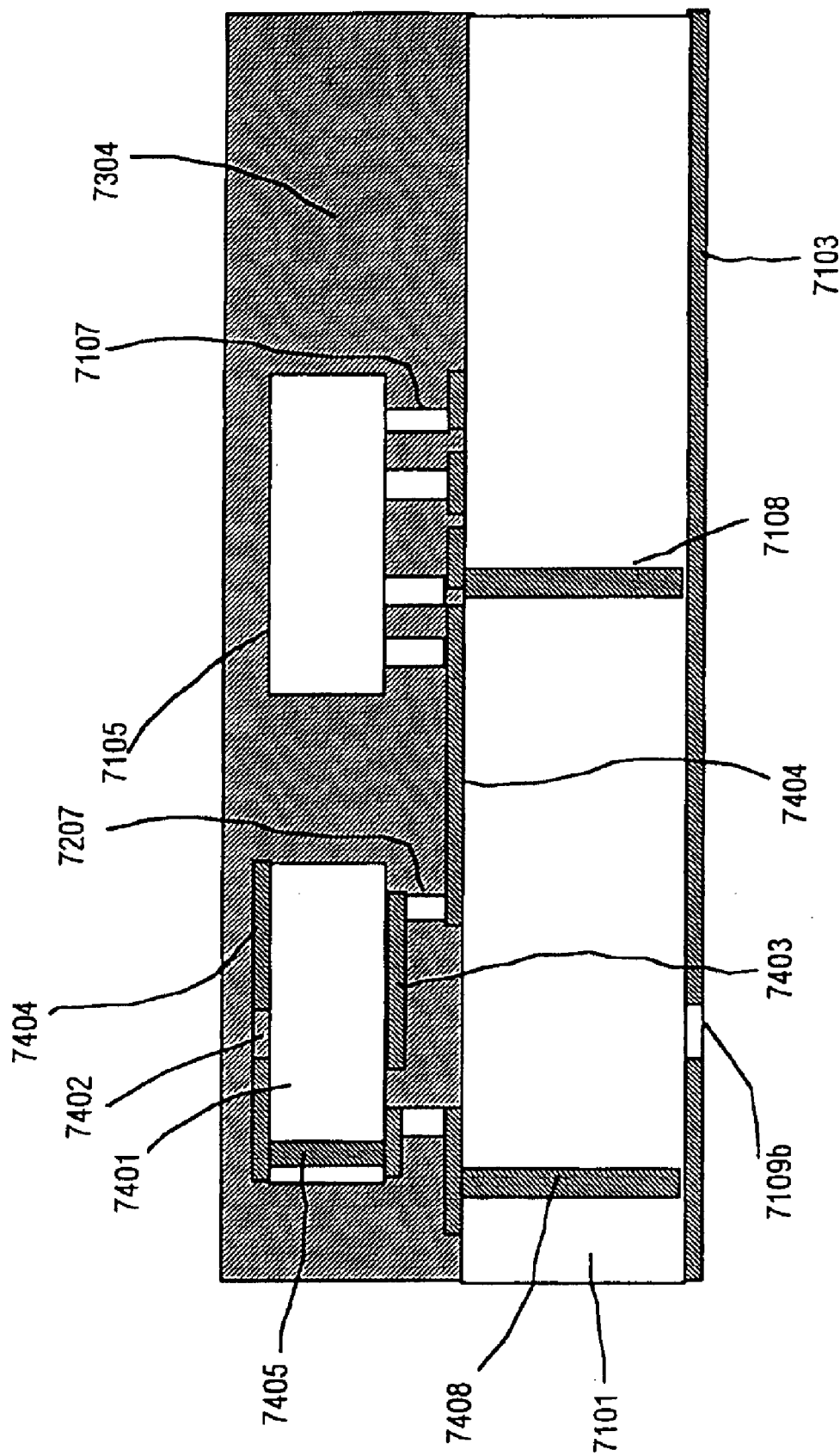
FIG. 64 is a cross-sectional view in elevation of a transponder integrated circuit chip mounted in an IC card in accordance with a 27$^{th}$ embodiment, having respective microwave slot antennas formed on opposing faces of the card, containing an antenna chip as a separate component which constitutes one of the slot antennas.

In FIG. 64, 7401 is an antenna chip, having a slot aperture 7402 of a slot antenna and an antenna connecting lead portion 7403 formed thereon. The antenna chip is mounted on the substrate 7101 by means of bumps 7207. The term "antenna chip" is used herein with the significance of a device which is formed of a small block of a dielectric material, having a ground pattern layer 7404 formed on one face thereof with a slot aperture formed in that layer to function in conjunction with an antenna connecting lead portion as the microwave slot antenna 7402. Specifically, the antenna chip of this embodiment has a plurality of bumps 7207 formed on the opposing face from the slot aperture, for attachment to the substrate 7101, a connecting lead 7403 formed on that opposite face and connected via a bump 7207 to an antenna connecting lead portion 7404 formed on the upper face of the substrate 7101, and a through-hole connector 7405, for connecting the ground pattern layer 7404 (via a bump 7207 and a through-hole connector 7408 formed in the substrate 7101) to the ground pattern layer 7103.

This 27$^{th}$ embodiment differs from the 25$^{th}$ embodiment in that a slot antenna is formed on the antenna chip 7401, while in other respects the embodiment is substantially identical to the twenty-fifth embodiment. In particular, the connecting lead portion 7403 formed on the antenna chip 7401 can be configured to constitute the two branches 7201*a*, 7201*b* of the antenna connecting lead 7104 shown in FIG. 62 for the first embodiment, while the connecting lead 7404 can be configured to constitute the common portion 7202 of that antenna connecting lead 7104, with the junction of the two branches being connected thereto via a bump 7207.

With this embodiment since an antenna is formed by an antenna chip 401 which is mounted as a separate component, there is the advantage that during mass-manufacture production of such IC cards, changes to the antenna in order to provide different characteristics can be easily performed, since only the antenna chip need be modified. In addition, there is the advantage that such an IC card can be manufactured at low cost. In other respects, the configuration, operation and advantages of this embodiment are similar to those described for the twenty-fifth embodiment.

28$^{th}$ Embodiment

Figure 65:
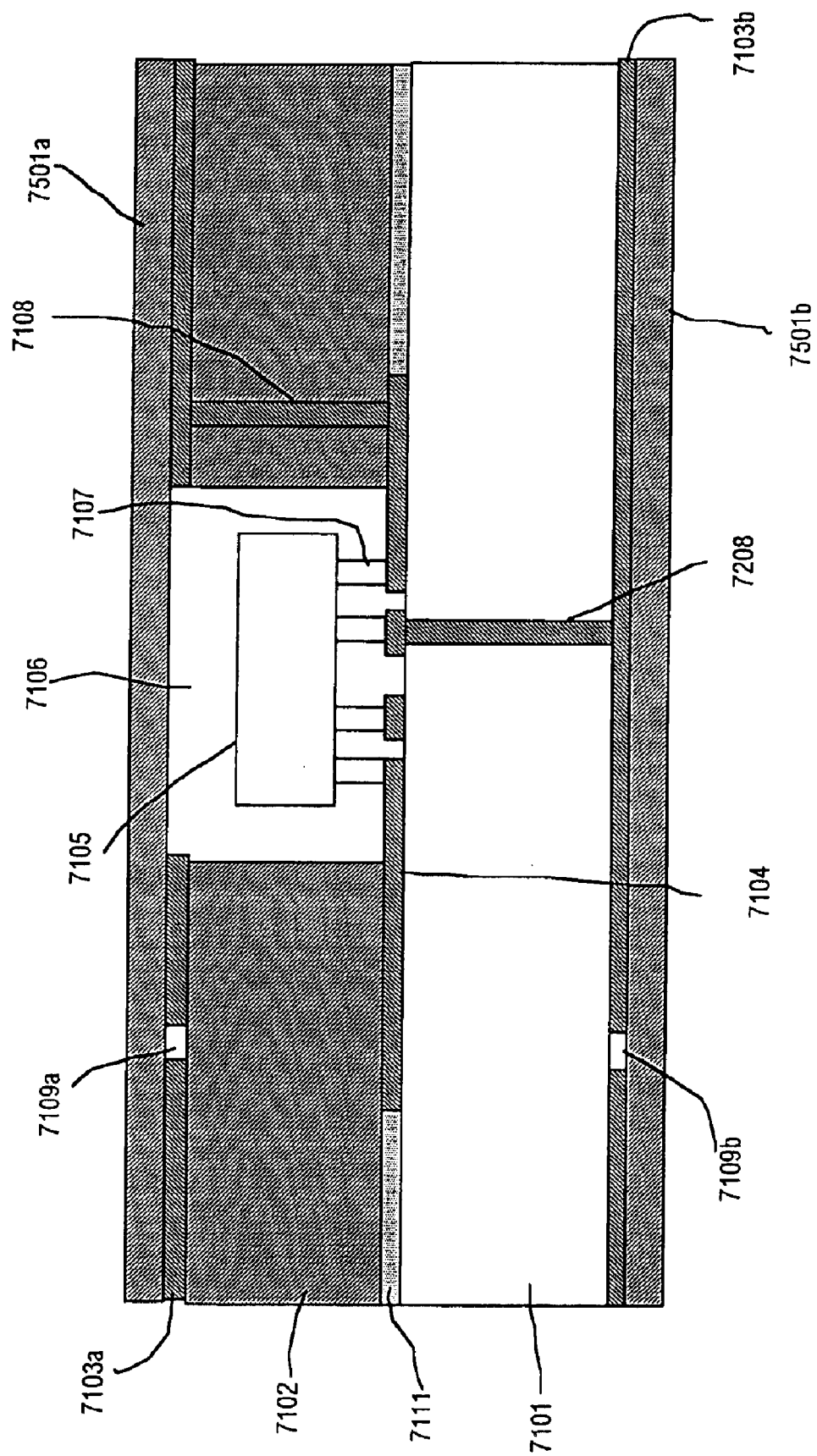
FIG. 65 is a cross-sectional view in elevation of a transponder integrated circuit chip mounted in an IC card in accordance with a 28$^{th}$ embodiment, having respective microwave slot antennas formed on opposing faces of the card, wherein the antenna slots are covered by respective films of a dielectric material, to enable the slot size to be reduced.

A 28$^{th}$ embodiment of the invention will be described, which is a non-contact IC card that is shown in a cross-sectional view in elevation in FIG. 65.

This embodiment differs from the twenty-fifth embodiment shown in FIG. 61 in that respective dielectric films 7501*a* and 7501*b* are adhesively attached to the outer faces of the ground pattern layers 7103*a*, 710*b* respectively, thereby enabling the slots 7109*a*, 7109*b* of the respective slot antennas to be made smaller. In other respects this embodiment is identical to the twenty-fifth embodiment.

The configuration of the slot antennas 7109*a*, 7109*b* depends upon the frequency used for communication, and on the dielectric constant of the substrate on which the slot antenna is formed. For example, in the case of an IC card that operates in the 2.45 GHz band, with the slot antenna being formed on a substrate which is made of polyamide having a dielectric constant of 3.4, the length of the slot must be approximately 40 mm. However with this embodiment, by adhesively attaching a polymide film having a thickness of several micronmeters over each of the slot apertures, the slot length can be reduced to approximately 30 mm.

Thus with this embodiment, it becomes possible to reduce the overall size of an IC card.

29$^{th}$ Embodiment

A 29$^{th}$ embodiment of the invention will be described referring to FIG. 66. This is a general block diagram of the 29$^{th}$ embodiment, which is a non-contact IC card reader/writer system.

In FIG. 66, 7601 is a non-contact IC card, 7602 is an article having the IC card 7601 attached thereto, 7603 is an inquirer apparatus which functions as an IC card reader/writer apparatus. The IC card 7601 can have the configuration of any of the twenty-fifth twenty-sixth, twentyseventh or twenty-eighth embodiments of the invention described above. 7604 is a transmitting/receiving antenna for communication with the IC card 7601, 7607 is a circulator which is connected to the transmitting/receiving antenna 7604, 7606 is a transmitting section which supplies a transmission signal to the transmitting/receiving antenna 7604, 7605 is a frequency synthesizer section formed of a VCO, etc., which generates a signal at the transmission frequency, 7608 is a demodulator which is connected to the circulator 7607, for demodulating a signal received from an IC card 7601. 7609 is a reader/writer apparatus control section which is connected to the transmitting section 7606, the receiving section 7608 and the frequency synthesizer section 7605.

The operation of the system having the above configuration is as follows. The IC card 7601 is attached to a article 7602, and has information relating to the article 7602 stored internally within an IC. The reader/writer apparatus 7603 is set up in a fixed location. When power is applied to the reader/writer apparatus 7603, the reader/writer apparatus control section 7609 controls the synthesizer section 7605 to produce a signal having a specific frequency, which is amplified by the transmitting section 7606 to a predetermined level and transferred through the circulator 7607 to the transmitting/receiving antenna 7604, to be transmitted.

When the IC card 7601 is moved to the vicinity of the transmitting/receiving antenna 7604, the signal from the reader/writer apparatus 7603 is received by the antenna of the IC card 7601 which is located on the side of the IC card 7601 that is not affixed to the article 7602. As described for the twenty-fifth embodiment, there is no deterioration of the communication performance due to the IC card 7601 being attached to the article 7602, so that it is not necessary to take into consideration the orientation of the IC card 7601 when attaching a card to an article, or to adjust the orientation of the article 7602 in relation to the transmitting/receiving antenna 7604.

30$^{th}$ Embodiment

A 30$^{th}$ embodiment of the invention will be described referring to FIGS. 67A, 67B, and 68. This is a transponder which is a non-contact IC card, shown in a plan view and in a cross-sectional view in elevation in FIGS. 67A and 67B respectively. FIG. 68 is a conceptual diagram to illustrate the operation of a mobile body discrimination system which incorporates IC cards having the configuration shown in FIGS. 67A, 67B.

In FIGS. 67A, 67B, 7703 is a ground pattern layer which is formed on the front face of a substrate 7707, 7705 is a co-planar antenna connecting lead, i.e., configured as a microstrip that has been formed on the substrate 7707 out of the same layer of electrically conductive material as the ground pattern layer 7703, extending from one of a plurality of bumps 7107 of the transponder IC 7105 to a slot aperture 7704 of a slot antenna. The slot aperture 7704 is configured, with this embodiment, as part of a region 7706 which has been cut out of the layer 7703, i.e., a region in which the upper face of the substrate is exposed, having the shape shown in FIG. 67A, with its narrowest portion located adjacent to the antenna connecting lead 7705. The use of the co-planar connecting lead configuration serves to suppress any deterioration of the characteristics of the slot antenna 7704 which might otherwise result when the IC card is adhesively attached to an article, since the directivity of such an antenna is oriented parallel to the ground pattern layer 7703, i.e., to the side of the IC card, rather than perpendicular to a front or rear main face of the IC card.

In the mobile body discrimination system shown in FIG. 68, a transponder 7801 is a non-contact IC card having the configuration shown in FIGS. 67A, 67B described above, and 7802 is an article having the IC card 7801 attached thereto. An IC card reader/writer apparatus 7603 has the same configuration and functions as those of the reader/writer apparatus of the 27$^{th}$ embodiment shown in FIG. 66, i.e., functioning as an interrogator apparatus which can transmit data to and receive data from the IC cards.

The operation of the system having the above configuration is as follows. The IC card 7801 is attached to an article 7802, and has information relating to the article 7802 stored internally within the IC 7105 of the card. The reader/writer apparatus 7603 is set up in a fixed location. When the IC card 7801, attached to the article 7802, moves along the direction indicated by the arrows to the vicinity of the transmitting/receiving antenna 7604, the slot antenna 7604 receives a signal conveyed by microwave band radio waves which are transmitted from the reader/writer apparatus 7603, and a resultant received signal is transferred to the IC 7105 via the antenna connecting lead 7705.

Since the directivity of the slot antenna of the IC card 7801 is oriented parallel to the substrate 7707, it is not necessary for the article 7802 to be positioned such that a specific main face such as the front face of the IC card 7801 faces the transmitting/receiving antenna 7604 of the reader/writer apparatus 7603 in order for the IC card to receive the radio waves from the antenna 7604 at a satisfactory level of received signal strength, since radio waves can still be received by the transponder antenna in a condition in which either of the main faces of the IC card is shielded from incident radio waves. Thus with this embodiment, a non-contact IC card system can be realized whereby such positioning is made unnecessary. Furthermore, since the non-contact IC card 7801 can be made extremely thin in shape, it could for example be attached to an article which is sent by mail.

Any of the above 25$^{th}$ to 28$^{th}$ and 30$^{th}$ embodiments of non-contact IC cards could be utilized to implement any of the preceding embodiments of transponders, such as those of FIG. 1, FIG. 11, etc., which utilize a single antenna. In that case, the function of that single antenna, such as the antenna 24 of the transponder 20 shown in FIG. 1, is performed jointly by a pair of slot antennas such as the pair of antennas 7109a, 7109b shown in FIG. 61. In the case of any of the preceding embodiments of transponders, such as those of FIG. 24 etc., which utilize a pair of antennas, the respectively functions of these antennas can be implemented by modifying any of the above 25$^{th}$ to 28$^{th}$ embodiments to provide an additional pair of slot antennas on the opposing faces of the IC card, and an additional antenna connecting lead for coupling that pair of slot antennas to the transponder IC. In that case the two pairs of slot antennas will perform the respective functions, for example, of the two antennas 40, 41 shown in the circuit diagram of FIG. 24.

Figure 69:
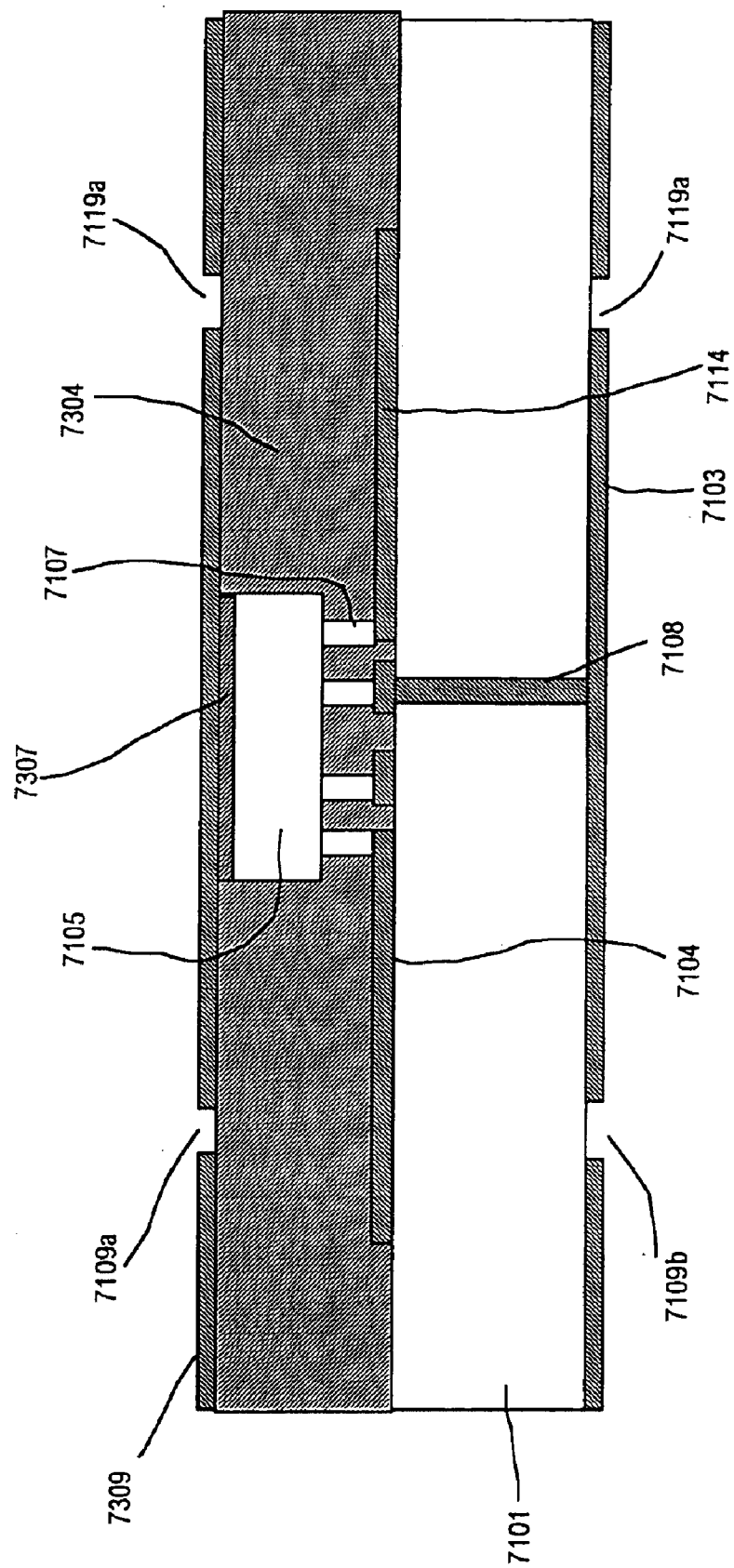
FIG. 69 is a cross-sectional view in elevation of an IC card which is a modified version of the 26$^{th}$ embodiment, having two separate pairs of slot antennas.
Figure 70:
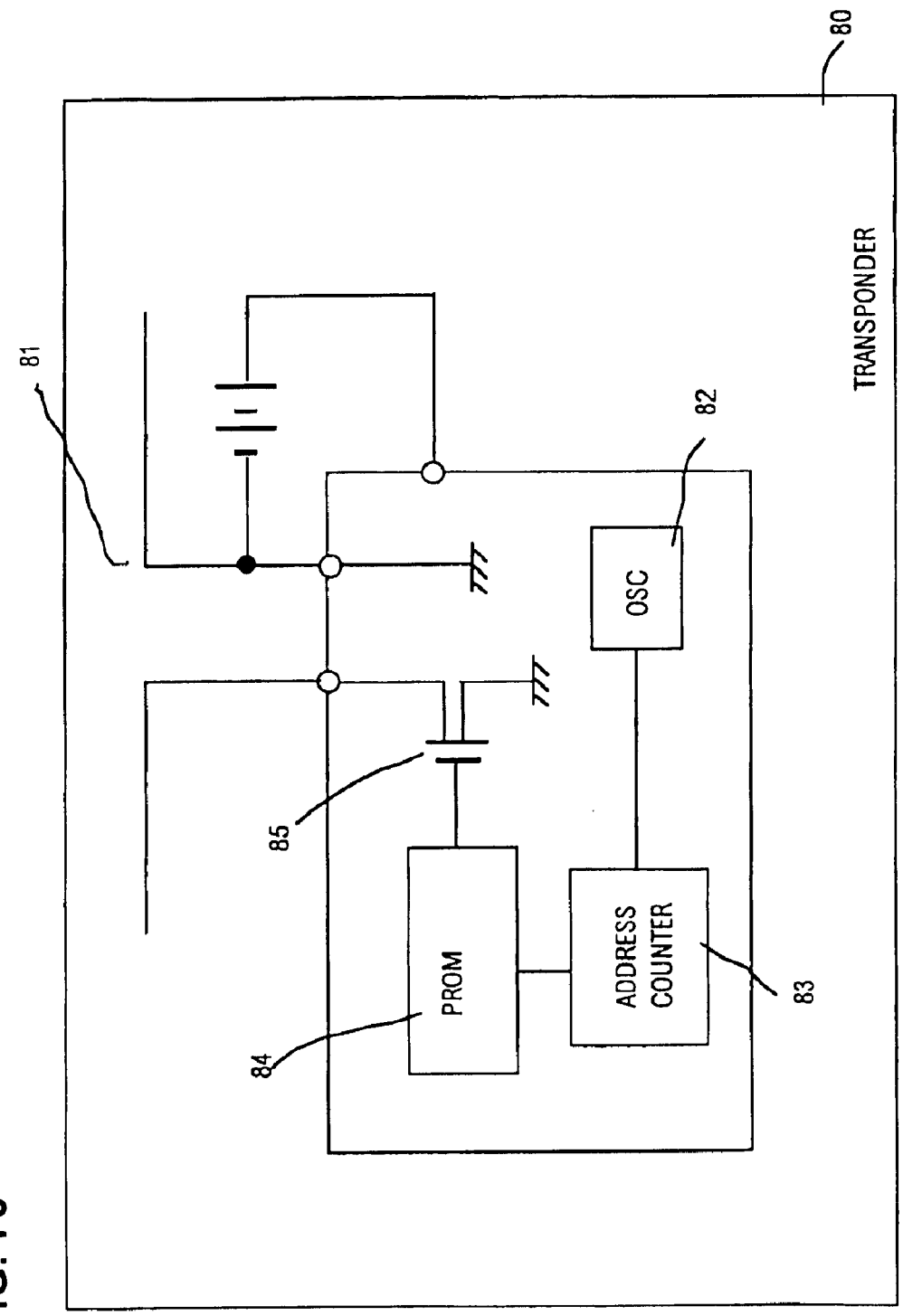
FIG. 70 is a circuit diagram of an example of a prior art type of transponder for a mobile body discrimination apparatus which utilizes modulation of reflected radio waves to achieve non-contact communication.
Figure 71:
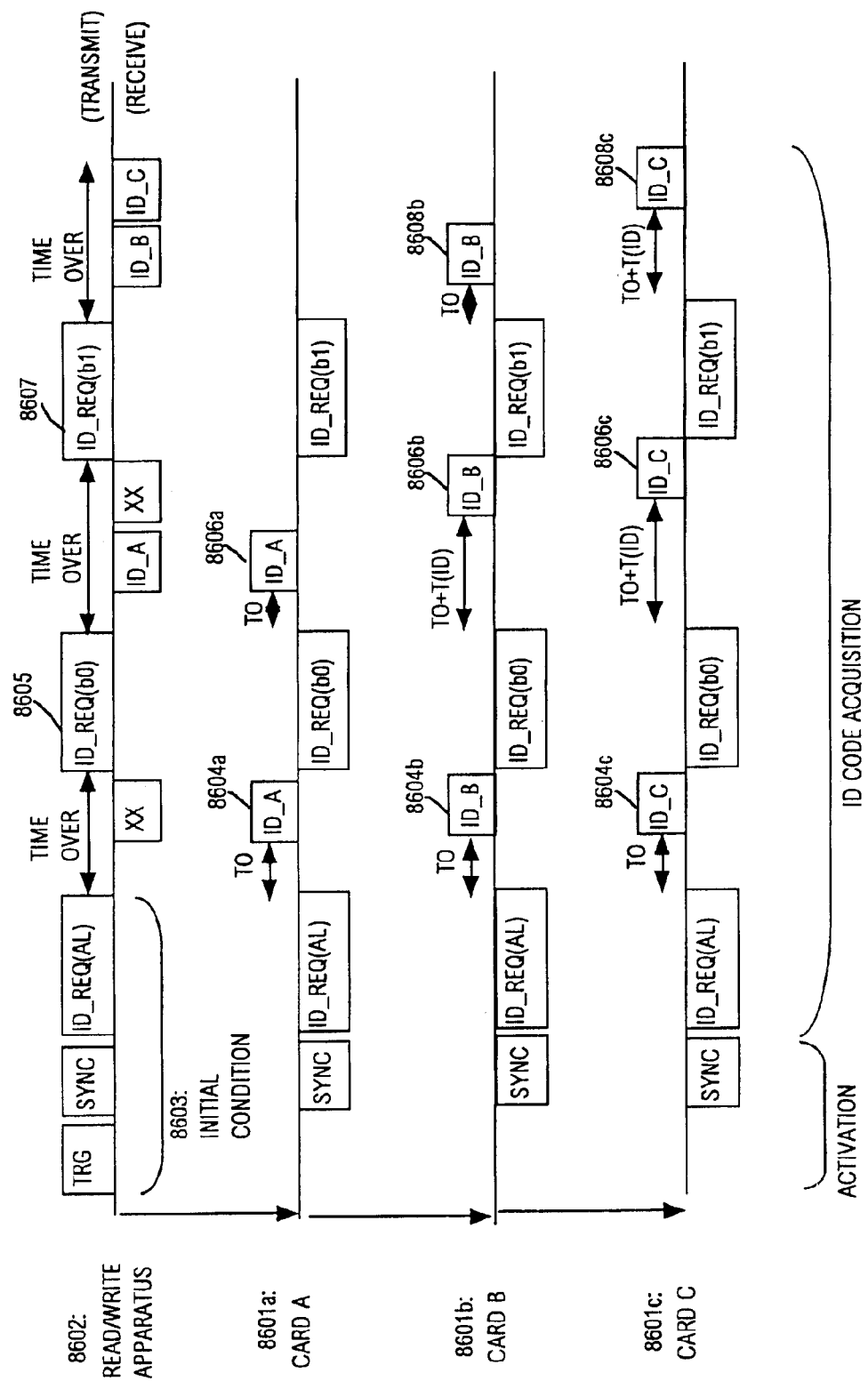
FIG. 71 is a timing diagram for use in describing an example of a prior art type of mobile body discrimination system which utilizes IC cards, and enables communication with successive ones of a plurality of IC cards which are concurrently within a communication region of a card reader/writer apparatus.
Figure 72:
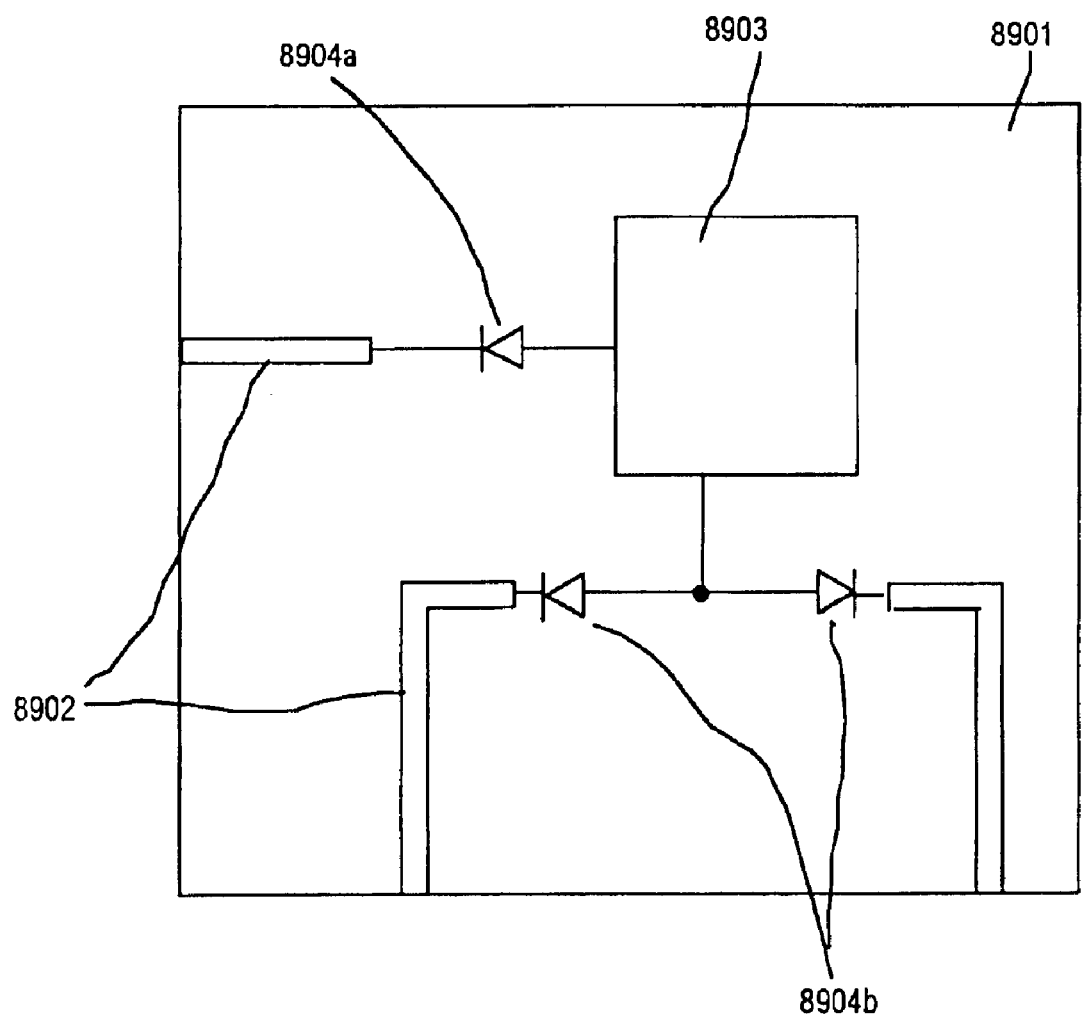
FIG. 72 is a diagram for describing a prior art example of a transponder of a mobile body discrimination apparatus wherein the transponder derives a DC power supply from received radio waves; and, FIG. 73 is a cross-sectional view in elevation of an example of a prior art type of IC card.
Figure 73:
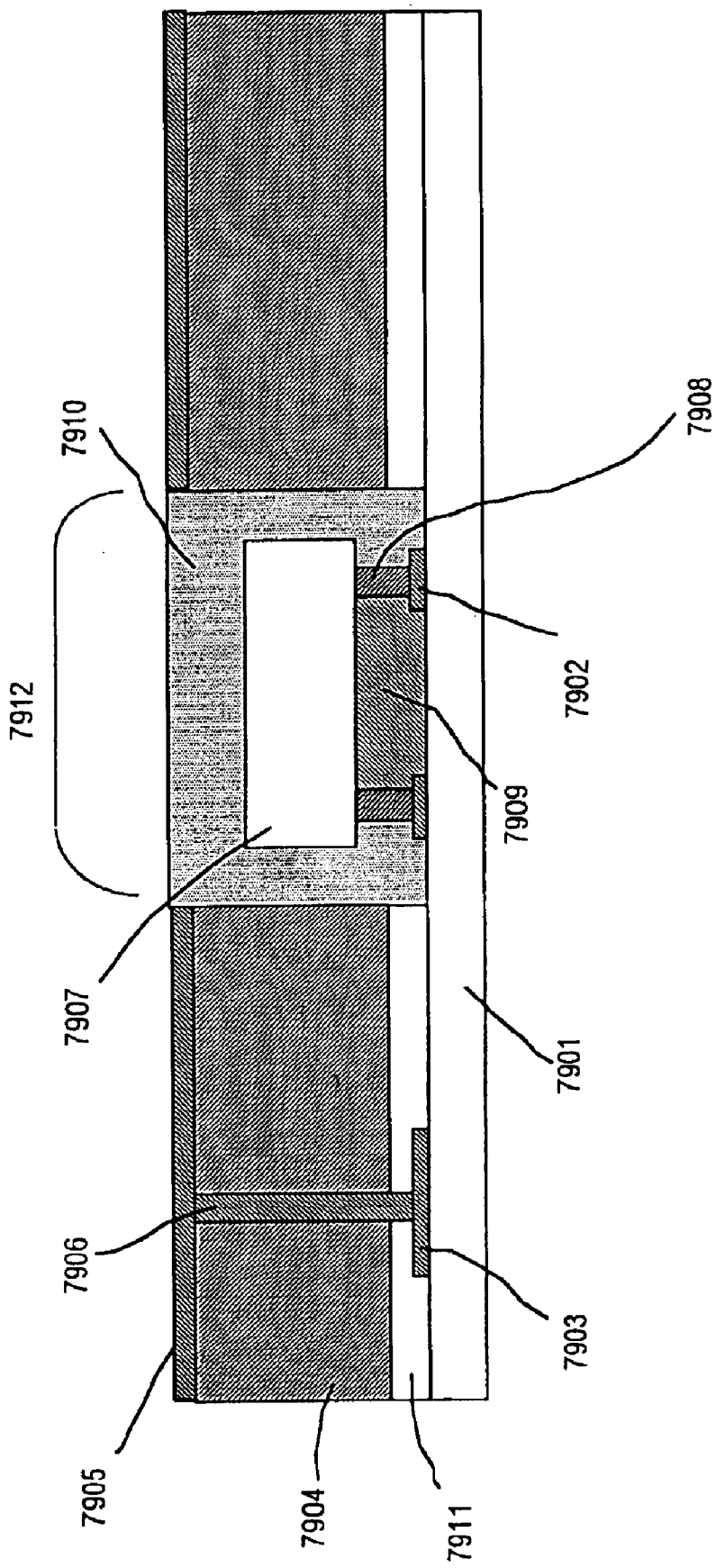

An example of this is shown in FIG. 69, which is a cross-sectional view of an IC card which is an alternative version of the 26$^{th}$ embodiment shown in FIG. 63, described above. With the IC card shown in FIG. 69, two pairs of slot apertures 7109a, 7109b and 7119a, 7119b are formed in the ground layers 7103, 7309, and these in conjunction with two antenna connecting leads 7104, 7114 (each having, for example, the configuration shown in FIG. 62) which are connected to the internal circuits of the integrated circuit chip 7105 via respective ones of the bumps 7107, constitute two pairs of slot antennas.

In this case, if for example both of the slot apertures 7109b, 7119b become shielded from incident radio waves (due to the face of the IC card containing these slot apertures being attached to some article), the functions of two antennas such as the antennas 40, 41 shown in FIG. 24 will continue to be performed, by the two slot antennas formed by the slot apertures 7109a, 7119a in conjunction with the respective branch portions of the antenna connecting leads 7104, 7114 (each of which could be configured as for the branch portion 7201a shown in FIG. 62), so that satisfactory operation of the transponder will be achieved.

Although the invention has been described in the above referring to specific embodiments, it should be understood that various modifications to these embodiments, or combinations of various features of embodiments, could be envisaged, which fall within the scope claimed for the present invention.

What is claimed is:

1. A mobile body discrimination apparatus comprising a plurality of transponders and an interrogator apparatus, said interrogator apparatus comprising:

at least one interrogator antenna;

control means;

transmitting means controlled by said control means for driving said interrogator antenna to periodically transmit a transmission start command code conveyed by modulated radio waves, directed at each of said transponders which are currently within a communication region of said interrogator antenna, and for transmitting CW (continuous-wave) radio waves in intervals between transmissions of said transmission start command code;

interrogator receiving means coupled to said interrogator antenna, for obtaining requested signals from said transponders, conveyed by modulated reflected radio waves from said transponders which are within said communication region; wherein said at lest one interrogator antenna comprises a first antenna and a second antenna, and said transmitting means comprises first transmitting means controlled by said control means for driving said first antenna to periodically transmit said transmission start command code conveyed by modulated radio waves and to transmit CW radio waves in intervals between said transmission of said transmission start command code, and second transmitting means for driving said second antenna to transmit said CW radio waves;

wherein said control means comprises means for periodically interrupting said transmission fo said CW radio waves by said second transmitting means and said second antenna, for the duration of each of respective time intervals in which said transmission start command code is transmitted by said fist transmitting means and first antenna; and each of said transponders comprising:

a transponder antenna;

rectifier circuit means coupled to said transponder antenna, for converting a signal received by said transponder antenna to electrical power for operating circuits of said transponder;

transponder receiving means coupled to said transponder antenna, for obtaining said transmission start command code from said modulated radio waves transmitted by said interrogator apparatus;

memory means for storing data therein;

modulator means controllable for varying a reflection condition of said transponder antenna with respect to incident radio waves; and response timing control means responsive to reception of said transmission start command code by said transponder receiving means for controlling said modulator means to vary said reflection condition of said transponder antenna according to response data comprising at least a part of said data of said memory means, to generate modulated reflected radio waves conveying said response data after a specific delay time has elapsed following reception of said transmission start command code;

wherein said response timing control means comprises means for setting a randomly determined value of said delay time, at each reception of said transmission start command code.

2. The mobile body discrimination apparatus according to claim 1, wherein said first antenna comprises a first communication region and said second antenna comprises a second communication region, and said first and second communication regions overlap one another to comprise a common communication region.

3. The mobile body discrimination apparatus according to claim 1, wherein said first antenna comprises a first communication region and said second antenna comprises a second communication region, and said first and second communication regions overlap one another, so that said plurality of transponders are for moving continuously or intermittently in a fixed direction along a fixed path comprising a series of positions, and are for being respectively located at a first position and a second position of said series of positions.

4. A mobile body discrimination system comprising in combination therewith said interrogator apparatus and said plurality of transponders according to claim 2, wherein said first and second antennas of said interrogator apparatus are spaced apart at respective fixed locations, the system comprising:

conveyer belt transport means for transporting a plurality of load items along a fixed path in a fixed direction for passing through said common communication region of said first and second antennas, with each of said transponders being attached to a corresponding one of such load items and with at least a part of said data stored in said memory means of said each transponder being data relating to a corresponding load item.

5. A mobile body discrimination system comprising in combination therewith said interrogator apparatus and said plurality of transponders according to claim 2, the system comprising transport means for transporting a plurality of load items along a fixed path in a fixed direction for passing through said common communication region of said first and second antennas, with each of said transponders being attached to a corresponding one of such load items and with at least a part of said data stored in said memory means of said each transponder being data relating to a corresponding load item, the system comprising:

a housing comprising a material for shielding electromagnetic waves and having a central aperture, wherein said transport means is for transferring such load items through said central aperture;

wherein said first antenna and second antenna are attached within said housing, at respective positions located on a periphery of said central aperture, and each oriented to comprise said common communication region within said central aperture.

6. A mobile body discrimination system comprising in combination therewith said interrogator apparatus and said plurality of transponders according to claim 2, wherein said first and second antennas of said interrogator apparatus are spaced apart at respective fixed locations, the system comprising:

a plurality of transport vehicles controllable for transporting respective pluralities of load items along a fixed path in a fixed direction for passing through said common communication region of said first and second antennas, with each of said transponders being attached to a corresponding one of such load items and with at least a part of said data stored in said memory means of said each transponder being data relating to a corresponding load item.

7. A mobile body discrimination system comprising in combination therewith said interrogator apparatus and said plurality of transponders according to claim 3, wherein said first and second antennas of said interrogator apparatus are spaced apart at respective fixed locations, the system comprising:

conveyer belt transport means for transporting a plurality of load items along a fixed path in a fixed direction for passing first through said second communication region of said second antenna then through said first communication region of said first antenna, with each of said transponders being attached to a corresponding one of such load items and with at least a part of said data stored in said memory means of said each transponder being data relating to a corresponding load item.

8. A mobile body discrimination system comprising in combination therewith said interrogator apparatus and said plurality of transponders according to claim 3, the system comprising transport means for transporting a plurality of load items along a fixed path in a fixed direction for passing successively through said second communication region of said second antenna and then through said first communication region of said first antenna, with each of said transponders being attached to a corresponding one of such load items and with at least a part of said data stored in said memory means of said each transponder being data relating to a corresponding load item, comprising:

a housing comprising material for shielding electromagnetic waves and having a central aperture, wherein means is for transferring such load items through said central aperture;

wherein said first antenna and second antenna are attached within said housing, at positions on a periphery of said central aperture, and each oriented to comprise said first communication region and second communication region within said central aperture.

9. A mobile body discrimination system comprising in combination therewith said interrogator apparatus and said plurality of transponders according to claim 3, with said first and second antennas of said interrogator apparatus are spaced apart at respective fixed locations, the system comprising:

a plurality of transport vehicles controllable for transporting respective pluralities of load items along a fixed path in a fixed direction for passing successively through said first communication region of said first antenna and then through said second communication region of said second antenna, with each of said transponders being attached to a corresponding one of such load items and with at least a part of said data stored in said memory means of said each transponder being data relating to a corresponding load item.

10. A mobile body discrimination system comprising in combination therewith said interrogator apparatus and said plurality of transponders according to claim 2, wherein:

said interrogator apparatus is portable;

said system comprises supporting means for supporting a plurality of articles aligned along a common vertical plane, with each of said transponders being attached to a corresponding one of such articles and with at least a part of said data stored in said memory means of said each transponder being data relating to a corresponding article; and each of said transponders is for being oriented substantially facing said common vertical plane, thereby enabling said transponders to be successively scanned by said antennas of said interrogator apparatus oriented towards said transponders while said interrogator apparatus is for being moved in a direction parallel to said common vertical plane.

11. A mobile body discrimination system comprising in combination therewith said interrogator apparatus and said plurality of transponders according to claim 2, the system comprising:

supporting means for supporting a plurality of articles aligned along a common vertical plane, with each of said transponders being attached to a corresponding one of such articles and each of said transponders oriented substantially facing towards said common vertical plane, and with at least a part of said data stored in said memory means of said each transponder being data relating to a corresponding article;

a movable supporting mechanism operable for moving said interrogator apparatus in directions parallel to said common vertical plane with said antennas of said interrogator apparatus oriented towards said common vertical plane, for thereby enabling said transponders to be successively scanned by said interrogator apparatus.

12. The mobile body discrimination system according to claim 11, comprising a computer system for automatically controlling said movement of said interrogator apparatus by said movable supporting mechanism.

13. The mobile body discrimination apparatus according to claim 1, wherein in said interrogator apparatus:

said at least interrogator one antenna comprises a first antenna and second antenna;

said transmitting means comprises first transmitting means controlled by said control means to periodically drive said first antenna to transmit modulated radio waves conveying a transmission start command code and to drive said first antenna to transmit spread spectrum radio waves which have been generated using a first pseudo-noise code sequence during intervals between transmitting said transmission start command code, and second transmitting means controlled by said control means to periodically drive said second antenna to transmit modulated radio waves conveying said transmission start command code, and to drive said second antenna to transmit spread spectrum radio waves which have been generated using a second pseudo-noise code sequence which is different from said first pseudo-noise code sequence, during intervals between transmitting said transmission start command code; and said interrogator receiving means comprises first receiving means coupled to said first antenna, for obtaining said requested signals from said transponders, conveyed by modulated reflected spread spectrum radio waves which have been transmitted by said first antenna, and second receiving means coupled to said second antenna, for obtaining said requested signals from said transponders, conveyed by modulated reflected spread spectrum radio waves which have been transmitted by said second antenna.

14. The mobile body discrimination apparatus according to claim 13, wherein:

said first antenna comprises a first communication region and said second antenna comprises a second communication region, and said first and second communications substantially entirely overlap one another to comprise a common communication region; and said interrogator apparatus further comprises comparator and selector means for comparing a signal received via said first antenna and first receiving means of said interrogator apparatus, conveying a set of data from one of said transponders, with a signal received via said second antenna and said second receiving means of said interrogator apparatus, conveying said set of data from said transponder, to determine that one of said signals is stronger than the other, and for selecting a set of data expressed by said stronger one of said signals to be stored in said memory means.

15. The mobile body discrimination apparatus according to claim 13, wherein:

said plurality of transponders are for moving continuously or intermittently in a fixed direction along a fixed path, and said first antenna and said second antenna are located spaced apart from one another, with a first communication region of said first antenna and a second communication region of said second antenna positioned to partially overlap one another, and respectively located in relation to said fixed path such that said first communication region of said first antenna extends over a left-side portion of said path and said second communication region of said second antenna extends over a right-side portion of said path; and said control means of said interrogator apparatus comprises means for storing in said memory means a set of data conveyed by a first signal which is transmitted by a first one of said transponders and is received via said first antenna and first receiving means of said interrogator apparatus, while also storing in said memory means of said interrogator apparatus a set of data conveyed by a second signal which is transmitted by a second one of said transponders and is received via said second antenna and second receiving means of said interrogator apparatus entirely or partially concurrently with said reception of said first signal from said first transponder.

16. The mobile body discrimination apparatus according to claim 13, wherein:

each of said transponders has stored in said memory means thereof a corresponding identification code, and said response timing control section is for controlling said modulator means of said transponder to transmit said identification code together with said response data, by said modulated reflected radio waves;

each of said transponders comprises means for detecting reception of a transmission halt command code by said transponder receiving means and for inhibiting further operation of said modulation means of said transponder for a predetermined time duration following reception of said transmission halt command code;

said plurality of transponders are for being moved continuously or intermittently in a fixed direction along a fixed path, and said first antenna comprises a first communication region and said second antenna comprises a second communication region, and said first and second communications partially overlap one another, and are respectively located in relation to said fixed path such that all of said transponders first pass through said second communication region of said second antenna and then pass through said first communication region of said first antenna; and said control means of said interrogator apparatus comprises means for detecting that said response data and identification code have been successfully acquired from a transponder by said first receiving means or said second receiving means of said interrogator apparatus, and, when said successful acquisition has been detected, for controlling at least one of said first transmitting means and second transmitting means of said interrogator apparatus to transmit said transmission halt command code together with the identification code of the one of said transponders from which said response data was successfully acquired.

17. The mobile body discrimination apparatus according to claim 13, wherein said plurality of transponders move continuously or intermittently in a fixed direction along a fixed path, and said first antenna comprises a first communication region and said second antenna comprises a second communication region, and said first and second communications partially overlap one another, and are respectively located on said fixed path at a succeeding position and at a preceding position with respect to said fixed direction, further comprising:

detector means located adjacent to said fixed path at a position preceding said communication region of said second antenna, for detecting transfer of successive numbers of said transponders along said fixed path and for producing signals indicative of said numbers; and operation control means located in said interrogator apparatus (300), responsive to said signals from said detector means for selectively enabling and inhibiting operation of at least a part of said second transmission means and second receiving means according to said numbers of said transponders.

18. The mobile body discrimination apparatus according to claim 17, further comprising a DC power supply, wherein said operation control means comprises power supply control means operable for selectively connecting and disconnecting the DC power supply for supplying power to least a part of said second transmission means and second receiving means.

19. The mobile body discrimination apparatus according to claim 13, wherein said first antenna and second antenna are respectively spaced apart and said first antenna comprises a first communication region and said second antenna comprises a second communication region, and said first and second communications are oriented such that respective communication regions of said first and second antennas partially overlap one another to comprise a common communication region, and wherein said interrogator apparatus comprises timing control means for alternately establishing, in successive time intervals, a first condition in which said first transmission means of said interrogator apparatus is in operation and said second transmission means is inoperative and a second condition in which said first transmission means is inoperative and said second transmission means is in operation.

20. The mobile body discrimination apparatus according to claim 13, wherein said first antenna comprises a polarizing antenna having a first type of polarization and said second antenna comprises a polarizing antenna having a second type of polarization.

21. The mobile body discrimination apparatus according to claim 20, wherein said antenna of each of said transponders is a polarizing antenna, and wherein in approximately half of said plurality of transponders said antenna has said first type of polarization and a remainder of said plurality of transponders has said second type of polarization.

22. The mobile body discrimination apparatus according to claim 20, further comprising timing control means for alternately establishing, in successive time intervals, a first condition in which said first transmission means is in operation and said second transmission means is inoperative and a second condition in which said first transmission means is inoperative and said second transmission means is in operation.

23. A mobile body discrimination apparatus according to claim 20, wherein each of said transponders comprises a first transmitting/receiving system comprising:

a first polarizing antenna comprising said first type of polarization;

first receiving means coupled to said first polarizing antenna, for obtaining said transmission start command code from said modulated radio waves transmitted by said interrogator apparatus;

first memory means for storing data;

first modulator means controllable for varying a reflection condition of said first polarizing antenna with respect to incident radio waves; and first response timing control means responsive to reception of said transmission start command code by said first receiving means for controlling said modulator means to vary said reflection condition of said first polarizing antenna according to response data comprising at least a part of said data of said first memory means, to generate modulated reflected radio waves conveying said response data after a specific delay time has elapsed following reception of said transmission start command code;

and a second transmitting/receiving system comprising:

a second polarizing antenna comprising said second type of polarization;

second receiving means coupled to said second polarizing antenna, for obtaining said transmission start command code from said modulated radio waves transmitted by said interrogator apparatus;

second memory means for storing data therein;

second modulator means controllable for varying a reflection condition of said second polarizing antenna with respect to incident radio waves; and second response timing control means responsive to reception of said transmission start command code by said second receiving means for controlling said second modulator means to vary said reflection condition of said second polarizing antenna according to response data constituted by at least a part of said data of said second memory means, to generate modulated reflected radio waves conveying said response data after a specific delay time has elapsed following reception of said transmission start command code.

24. A mobile body discrimination apparatus according to claim 23, wherein said first transmitting/receiving system comprises first rectifier circuit means coupled to said first polarizing antenna, for converting a signal received by said antenna to electrical power for operating at least a part of all circuits of said transponder, and said second transmitting/ receiving system comprises second rectifier circuit means coupled to said second polarizing antenna, for converting a signal received by said second polarizing antenna to electrical power for operating at least a part of all circuits of said transponder.

25. A mobile body discrimination apparatus according to claim 20, wherein each of said transponders comprises a first polarizing antenna and a second polarizing antenna, and wherein said receiving means of said transponder is coupled to receive modulated radio signals from said first polarizing antenna and said modulator means of said transponder is coupled to said second polarizing antenna, for varying said reflection condition of said antenna with respect to incident radio waves.

26. A mobile body discrimination apparatus according to claim 25, comprising first rectifier circuit means coupled to said first polarizing antenna, for converting a signal received by said antenna to electrical power for operating at least a part of all circuits of said transponder, and second rectifier circuit means coupled to said second polarizing antenna, for converting a signal received by said second polarizing antenna to electrical power for operating at least a part of all circuits of said transponder.

27. A mobile body discrimination apparatus according to claim 20, wherein each of said transponders comprises:

a first polarizing antenna comprising said first direction of polarization and a second polarizing antenna comprising said second direction of polarization;

first rectifier circuit means coupled to said first polarizing antenna, for converting a signal received by said first polarizing antenna to electrical power for operating at least a part of all circuits of said transponder, and second rectifier circuit means coupled to said second polarizing antenna, for converting a signal received by said second polarizing antenna to electrical power for operating at least a part of all circuits of said transponder;

first receiving means coupled to said first polarizing antenna, for obtaining said transmission start command code and supplying said transmission start command code to said response timing control means;

second receiving means coupled to said second polarizing antenna, for obtaining said transmission start command code and supplying said transmission start command code to said response timing control means;

first modulator means controllable for varying a reflection condition of said first polarizing antenna, and second modulator means controllable for varying a reflection condition of said second polarizing antenna; and power comparison circuit means for determining which of said first rectifier circuit means and said second rectifier circuit means is currently providing a higher level of supply power, and for enabling operation of one of said first modulator means and said second modulator means, which is coupled to the same one of said first polarizing antenna and second polarizing antenna as said determined one of said first and second rectifier circuit means providing the higher level of supply power, while inhibiting operation of the other one of said first modulator means and second modulator means.

28. A mobile body discrimination apparatus according to claim 20, wherein said first type of polarization is a right-handed direction of circular polarization and said second type of polarization is a left-handed direction of circular polarization.

29. A mobile body discrimination system comprising in combination therewith said interrogator apparatus and said plurality of transponders according to claim 19, with said first antenna and second antenna of said interrogator apparatus spaced apart at respective fixed locations, the system comprising:

conveyer belt transport means for transporting a plurality of load items along a fixed path in a fixed direction for passing through said common communication region of said first and second antennas, with each of said transponders being attached to a corresponding one of such load items and with at least a part of said data stored in said memory means of said each transponder being data relating to a corresponding load item.

30. A mobile body discrimination system comprising in combination therewith said interrogator apparatus and said plurality of transponders according to claim 19, the system comprising transport means for transporting a plurality of load items along a fixed path in a fixed direction for passing through said common communication region of said first and second antennas, with each of said transponders being attached to a corresponding one of such load items and with at least a part of said data stored in said memory means of said each transponder being data relating to a corresponding load item, the system comprising:

a housing comprising a material for shielding electromagnetic waves and having a central aperture adapted to permit transfer of such load items by said transport means through said central aperture;

wherein said first antenna and second antenna of said interrogator apparatus are attached within said housing, at respective positions located on the periphery of said central aperture, respectively oriented to comprise said common communication region within said central aperture.

31. A mobile body discrimination system comprising in combination therewith said interrogator apparatus and a plurality of transponders according to claim 19, with said first and second antenna of said interrogator apparatus spaced apart at respective fixed locations, the system comprising:

a plurality of transport vehicles controllable for transporting respective pluralities of load items along a fixed path in a fixed direction for passing through said common communication region of said first and second antennas, with each of said transponders being attached to a corresponding one of such load items and with at least a part of said data stored in said memory means of said each transponder being data relating to a corresponding load item.

32. A mobile body discrimination system comprising in combination therewith said interrogator apparatus and said plurality of transponders according to claim 19, wherein said interrogator apparatus is, the system comprising supporting means for supporting a plurality of articles aligned along a common vertical plane, with each of said transponders being attached to a corresponding one of said articles and with at least a part of said data stored in said memory means of said each transponder being data relating to a corresponding article;

wherein each of said transponders is for being oriented substantially facing said common vertical plane, thereby enabling said transponders to be successively scanned by said antennas of said interrogator apparatus oriented towards said transponders while said interrogator apparatus is for being moved in a direction parallel to said common vertical plane.

33. A mobile body discrimination system comprising in combination therewith said interrogator apparatus and said plurality of transponders according to claim 19, the system comprising:

supporting means for supporting a plurality of articles aligned along a common vertical plane, with each of said transponders being attached to a corresponding one of such articles and each of said transponders oriented substantially facing towards said common vertical plane, and with at least a part of said data stored in said memory means of said each transponder being data relating to a corresponding article; and a movable supporting mechanism operable for moving said interrogator apparatus in directions parallel to said common vertical plane with said antennas of said interrogator apparatus oriented towards said common vertical plane, for thereby successively scanning said transponders by said interrogator apparatus.

34. A mobile body discrimination apparatus according to claim 1, wherein:

each of said transponders comprises modulator means comprising a plurality of absorber elements for applying respectively different degrees of absorption of said radio waves reflected by said antenna, response timing control means, selection control means for generating a selection control signal which specifies an arbitrarily determined pair of said absorber elements, and absorber element selector means controlled by said selection control signal to select a pair of said plurality of absorber elements each time that said response start command code is obtained by said receiving means, and for effecting said variation of said reflection condition of said antenna by selectively connecting the absorber elements constituting said selected pair of absorber elements to said antenna, to thereby perform amplitude modulation of said reflected radio waves with a modulation depth determined by said arbitrarily determined pair of absorber elements; and said interrogator apparatus comprises data processing means for operating on an output signal produced from said receiving means of said interrogator apparatus for extracting, from said output signal, respective sets of data which have been transmitted by said transponders by modulation utilizing said arbitrarily determined pairs of absorber elements.

35. A mobile body discrimination apparatus according to claim 34, wherein said selected pair of absorber elements arbitrarily determined by said selection control means of said each transponder, and wherein said data processing means of said interrogator apparatus comprises means for separately extracting respective sets of data which are received concurrently by said receiving means of said interrogator apparatus and have been transmitted by a plurality of said transponders which select respectively different pairs of said plurality of absorber elements to transmit the corresponding data sets.

36. A mobile body discrimination apparatus according to claim 1, wherein:

said modulator means of each of said transponders comprises a first absorber element for applying a minimum amount of absorption of said incident radio waves, a second absorber element for applying an amount of absorption of said incident radio waves greater than said minimum amount, and a third absorber element for applying an amount of absorption of said incident radio waves greater than said amount applied by said second absorber element, selection control means for generating a selection control signal, and absorber element selector means controlled by said selection control signal for effecting either a first depth of amplitude modulation of reflected radio waves by selectively coupling said first and second absorber elements to said antenna of said transponder or a second depth of amplitude modulation of said reflected radio waves by selectively coupling said first and third absorber elements to said antenna of the transponder; and said interrogator apparatus comprises data processing means for operating on an output signal produced from said receiving means of said interrogator apparatus for extracting, from said output signal, respective sets of data which have been transmitted by said transponders by modulation through selective coupling of said first and second absorber elements to said antenna of said transponder and sets of data which have been transmitted by modulation through selective coupling of said first and third absorber elements to said antenna of said transponder.

37. The mobile body discrimination system according to claim 36 wherein said selection by said absorber element selector means of amplitude modulation through selective coupling of said first and second absorber elements to said antenna of said transponder and amplitude modulation through selective coupling of said first and third absorber elements to said antenna of said transponder is arbitrarily determined at each occurrence of data transmission by said transponder.

38. The mobile body discrimination system according to claim 37, wherein each of said transponders further comprises random number generating means controlled to generate a random number in response to each detection of said response start command code by said response timing control means, and absorber element selection control means for operating on said absorber element selector means to determine that, in accordance with said random number, either said amplitude modulation is performed by selective coupling of said first and second absorber elements to said antenna of said transponder, or by selective coupling of said first and third absorber elements to said antenna.

39. The mobile body discrimination system according to claim 36, wherein said selection control means of each of said transponders comprises means for determining that, when said response start command code is first obtained by said receiving means of said transponder after said transponder has entered a communication region of said antenna of said interrogator apparatus, said amplitude modulation performed by selective coupling of said first and second absorber elements to said antenna of said transponder is applied, to transmit said response data by said modulated reflected radio waves, and that thereafter during at least a time duration for which said transponder remains within said communication region, said amplitude modulation performed by selective coupling of said first and third absorber elements to said antenna of said transponder is applied, to transmit said response data by said modulated reflected radio waves.

40. The mobile body discrimination apparatus according to claim 36, wherein:

said memory means of each of said transponders comprises a stored identification code, and said response timing control section is for controlling said modulator means of said transponder to transmit said identification code together with said response data, by said modulated reflected radio waves;

each of said transponders comprises means for detecting reception of a transmission halt command code by said receiving means of said transponder and for inhibiting further operation of said modulation means of said transponder for a predetermined time duration following reception of said transmission halt command code; and said control means of said interrogator apparatus comprises means for detecting that said response data and identification code have been successfully acquired from a transponder by said receiving means and data processing means of said interrogator apparatus, and, when said successful acquisition has been detected, for controlling at said transmitting means of said interrogator apparatus to transmit said transmission halt command code together with the identification code of the one of said transponders from which said response data was successfully acquired.

41. The mobile body discrimination apparatus according to claim 36, wherein said first, second and third absorber elements apply respective degrees of absorption of 0 db, 10 db and 20 dB.

42. The mobile body discrimination apparatus according to claim 36, wherein:

said memory means of each of said transponders comprises a stored identification code, and said response timing control section is for controlling said modulator means of said transponder to transmit said identification code together with said response data, by said modulated reflected radio waves;

said selection control means of said transponder is for determining that said amplitude modulation by selective coupling of said first and third absorber elements to said antenna of said transponder is applied by said modulator means when said identification code is being transmitted and that said amplitude modulation by selective coupling of said first and second absorber elements to said antenna of said transponder is applied by said modulator means when said response data are being transmitted.

43. A mobile body discrimination apparatus according to claim 34, wherein:

said memory means of each of said transponders comprises a stored identification code, and said response timing control section is for controlling said modulator means of said transponder to transmit said identification code together with said response data, by said reflected phase-shifted radio waves;

each of said transponders comprises means for detecting reception of a transmission halt command code by said receiving means of said transponder and for inhibiting further operation of said modulation means of said transponder for a predetermined time duration following reception of said transmission halt command code; and said control means of said interrogator apparatus comprises means for detecting that said response data and identification code have been successfully acquired from a transponder by said receiving means and data processing means of said interrogator apparatus, and, when said successful acquisition has been detected, for controlling said transmitting means of said interrogator apparatus to transmit said transmission halt command code together with the identification code of the one of said transponders from which said response data was successfully acquired.

44. A mobile body discrimination apparatus according to claim 43, wherein:

said plurality of absorber elements of said each transponder comprises at least a first absorber element for applying a minimum amount of absorption of said incident radio waves, a second absorber element for applying an amount of absorption of said incident radio waves greater than said minimum amount, and a third absorber element for applying an amount of absorption of said incident radio waves greater than said amount applied by said second absorber element;

said selection control means of said transponder is for generating said selection control signal such that said first absorber element and third absorber element are selected to be applied in said amplitude modulation of said reflected radio waves when said identification code is being transmitted, and that said first absorber element and second absorber element are selected to be applied in said amplitude modulation of said reflected radio waves when said response data set is being transmitted.

45. A mobile body discrimination apparatus according to claim 44, wherein each of said transponders comprises means for processing said response data prior to transmission thereof, to generate data key information for use in extracting said response data from a demodulated received signal, and for combining said data key information with said identification code of said transponder to comprise a header which is transmitted immediately prior to said response data set, in response to each said reception of said response start command code by said transponder, and wherein said first absorber element and third absorber element are selected to be applied in said amplitude modulation of said reflected radio waves when said header is being transmitted; and said data processing section of said interrogator apparatus comprises means for operating on said output signal from said receiving means of said interrogator apparatus by applying said data key information of said header to correctly extract the contents of a corresponding response data set, when data conflict occurs within said output signal between said corresponding response data set and a response data set which is transmitted by another one of said transponders.

46. A mobile body discrimination apparatus according to claim 1, wherein:

said modulator means of each of said transponders comprises a plurality of phase shifter elements for applying respectively different degrees of phase shift to said radio waves which are reflected by said antenna, phase shifter selection control means, and phase shifter element selector means controlled by said phase shifter selection control means to select a specific pair of said phase shifter elements each time that said response start command code is obtained by said receiving means, and for effecting said variation of said reflection condition of said antenna of said transponder by selectively coupling respective ones of said selected pair of phase shifter elements to said antenna of said transponder; and said interrogator apparatus comprises data processing means for operating on an output signal produced from said receiving means of said interrogator apparatus to extract data which have been transmitted by said transponders by modulation utilizing said selected pair of phase shifter elements.

47. The mobile body discrimination system according to claim 46 wherein said selection control means of each of said transponders comprises means for determining that, when said response start command code is first obtained by said receiving means of said transponder after said transponder has entered a communication region of said antenna of said interrogator apparatus, said phase modulation performed by selective coupling of said first and second phase shifter elements to said antenna of said transponder is applied, to transmit said response data by phase modulation of said reflected radio waves, and that thereafter during at least a time duration for which said transponder remains within said communication region, said phase modulation performed by selective coupling of said first and third phase shifter elements to said antenna of said transponder is applied, to transmit said response data by phase modulation of said reflected radio waves.

48. The mobile body discrimination apparatus according to claim 46, wherein:

said memory means of each of said transponders comprises a stored identification code, and said response timing control section is for controlling said modulator means of said transponder to transmit said identification code together with said response data, by said reflected phase-shifted radio waves;

each of said transponders comprises means for detecting reception of a transmission halt command code by said receiving means of said transponder and for inhibiting further operation of said modulation means of said transponder for a predetermined time duration following reception of said transmission halt command code; and said control means of said interrogator apparatus comprises means for detecting that said response data and identification code have been successfully acquired from a transponder by said receiving means and data processing means of said interrogator apparatus, and, when said successful acquisition has been detected, for controlling said transmitting means of said interrogator apparatus to transmit said transmission halt command code together with the identification code of the one of said transponders from which said response data was successfully acquired.

49. The mobile body discrimination apparatus according to claim 46, wherein each of said transponders further comprises attenuator insertion control means and said modulator means of each of said transponders comprises attenuator means controlled by said attenuator insertion control means to selectively apply a fixed amount of attenuation to said reflected phase-shifted radio waves.

50. The mobile body discrimination system according to claim 49, wherein said attenuator insertion control means (826f) of each of said transponders comprises means for determining that, when said response start command code is first obtained by said receiving means of said transponder after said transponder has entered a communication region of said antenna of said interrogator apparatus, said attenuator is applied to effect attenuation of said phase-shifted reflected radio waves when data are transmitted by said transponder in response to said first reception of said response start command code, and that thereafter during at least a time duration for which said transponder remains within said communication region, no attenuation is applied by said attenuator to said phase-shifted reflected radio waves.

51. A mobile body discrimination apparatus according to claim 1, wherein said rectifier circuit means comprises a rectifier element, impedance matching means for transferring said signal received by said antenna to an input terminal of said rectifier element, and a low-pass filter for smoothing a rectified output voltage produced at an output terminal of said rectifier element;

and wherein said rectifier circuit means comprises an impedance adjustment element coupled to at least said input terminal of said rectifier element, said impedance adjustment element for optimizing a degree of rectification efficiency of said rectifier circuit means, by applying compensation for a deviation of an impedance parameter of said rectifier element from a nominal predetermined value of said parameter.

52. The mobile body discrimination apparatus according to claim 51, wherein said rectifier circuit means comprises means for supplying a fixed-amplitude test signal to said impedance matching means in place of a signal from said antenna, for thereby performing said adjustment of said impedance adjustment element by setting said impedance adjustment element in a condition whereby a predetermined minimum level of output power is available from said rectifier circuit means when said test signal is being supplied.

53. The mobile body discrimination apparatus according to claim 51, wherein said rectifier element is a single diode, said impedance parameter is a value of inter-terminal capacitance of said diode, and said impedance adjustment element is an adjustable capacitor which is connected in parallel with said input and output terminals of said diode.

54. The mobile body discrimination apparatus according to claim 53, wherein said diode is connected in series between said impedance matching means and said low-pass filter.

55. The mobile body discrimination apparatus according to claim 53, wherein said diode is connected in parallel between a junction point of said impedance matching means and low-pass filter and a ground potential of said rectifier circuit means.

56. The mobile body discrimination apparatus according to claim 53, wherein said diode is a component of an integrated circuit chip, wherein said integrated circuit chip is mounted in a flip-chip configuration on a substrate, and said adjustable capacitor is a first electrically conductive region on said substrate and a second electrically conductive region located adjacent to said first conductive region and is for being moved towards said first electrically conductive region by displacement of said integrated circuit chip towards said substrate.

57. The mobile body discrimination apparatus according to claim 56, wherein said first electrically conductive region is a conductive layer portion located on said substrate adjacent said integrated circuit chip, said second electrically conductive region is a conductive layer portion on an outer face of said integrated circuit chip, said face being oriented opposing said first electrically conductive region, and wherein said adjustment is performed by applying force between said integrated circuit chip and said substrate in a direction such as to displace said integrated circuit chip successively towards said substrate.

58. The mobile body discrimination apparatus according to claim 51, wherein said rectifier element is a diode, said impedance parameter is a value of internal series inductance of said diode, and said impedance adjustment element is an adjustable inductor which is connected in parallel with said input and output terminals of said diode, with respect to high-frequency signals, and wherein said adjustable inductor comprises a flat spiral coil adapted for selectively short-circuiting adjacent portions of aid coil for effecting said inductance adjustment.

59. The mobile body discrimination apparatus according to claim 58, wherein said diode is a component of an integrated circuit chip, wherein said integrated circuit chip is mounted in a flip-chip configuration on a substrate, and said adjustable inductor is a patterned electrically conductive layer on said substrate, comprising an elongated connecting lead having a curved shape such that a plurality of portions of said connecting lead are disposed adjacent to one another, and connection means attached to said integrated circuit chip and adapted to be brought into contact with respective pairs of said separate portions, to thereby reduce an inductance value of said adjustable inductor, as a result of displacement of said integrated circuit chip towards said substrate.

60. The mobile body discrimination apparatus according to claim 59, wherein:

said shaped connecting lead is located adjacent said integrated circuit chip on said substrate;

said connection means comprises a plurality of protrusions comprising an electrically conductive material each having respectively different heights, each protruding from a face of said integrated circuit chip towards said substrate and respectively positioned directly adjacent corresponding ones of said portions of the shaped connecting lead, and said integrated circuit chip and said substrate are for receiving a force applied in a direction that displaces said integrated circuit chip successively towards said substrate thereby adjusting an inductance value of said adjustable inductor.

61. A mobile body discrimination apparatus according to claim 1, wherein said radio waves transmitted by said interrogator apparatus are in the microwave frequency range and wherein each of said transponders is structured as an IC (integrated circuit) card having a substrate with patterned connecting leads on a face thereof and an integrated circuit chip in bare chip condition, which comprises internal circuits of said transponder and has a plurality of connector elements, which are respectively coupled to said internal circuits, located thereon, said integrated circuit chip being mounted on said face of said substrate;

wherein said IC card comprises:

an antenna connecting lead comprising a part of said patterned connecting leads, coupled through one of said connector elements to said internal circuits; and first and second layers of electrically conductive material each located on one of opposite sides of said IC card, and having respective slot apertures therein, said slot apertures being located relative to specific portions of said antenna connecting lead to thereby comprise first and second slot antennas, with each of said slot antennas functioning independently of the other one thereof as said antenna of said transponder.

62. A mobile body discrimination apparatus according to claim 1, wherein said radio waves transmitted by said interrogator apparatus are in the microwave frequency range and wherein each of said transponders is structured as an IC (integrated circuit) card having a first substrate with patterned connecting leads on a first face thereof and an integrated circuit chip in bare chip condition, which comprises internal circuits of said transponder and has a plurality of connector elements, which are respectively coupled to said internal circuits, located thereon, said integrated circuit chip being mounted on said first face of said first substrate, said IC card comprising:

an antenna connecting lead comprising part of said patterned connecting leads, having a first branch portion and a second branch portion which respectively extend from a junction thereof, each of said first and second branch portions having a length that is determined in accordance with a wavelength of said radio waves transmitted by said interrogator apparatus, and with said antenna connecting lead having a common portion which extends between said junction and one of said connector elements;

a second substrate having an aperture for receiving said integrated circuit chip and having a first face thereof fixedly attached to said first face of said first substrate;

a first layer of electrically conductive material formed over a second face of said first substrate, having a first slot aperture formed therein, with said first slot aperture located directly over a part of said first branch portion of said antenna connecting lead;

a second layer of electrically conductive material formed over a second face of said second substrate, having a second slot aperture formed therein, with said second slot aperture located directly above a part of said second branch portion of said antenna connecting lead; and connection means coupled to one of said connector elements and to each of said first layer of electrically conductive material and second layer of electrically conductive material, for connecting each of said layers to a ground potential of said internal circuits of said transponder;

wherein said first slot aperture in conjunction with said first branch portion of the antenna connecting lead comprises a first slot antenna and said second slot aperture in conjunction with said second branch portion of the antenna connecting lead comprises a second slot antenna, whereby each of said first and second slot antennas implements the functions of said antenna of said transponder independently of the other one of said first and second slot antennas.

63. The transponder for a mobile body discrimination apparatus according to claim 62, further comprising a first layer of a dielectric material located over said first layer of electrically conductive material and a second layer of a dielectric material located over said second layer of electrically conductive material, with said first and second layers of dielectric material respectively covering said first and second slot apertures.

64. A mobile body discrimination apparatus according to claim 1, wherein said radio waves transmitted by said interrogator apparatus are in the microwave frequency range and wherein each of said transponders is structured as an IC (integrated circuit) card having a first substrate with patterned connecting leads located on a first face thereof and an integrated circuit chip in bare chip condition, which comprises internal circuits of said transponder and has a plurality of connector elements, which are respectively coupled to said internal circuits, located thereon, said integrated circuit chip being mounted on said first face of said first substrate;

wherein said integrated circuit chip comprises a ground connecting layer of electrically conductive material connected to a ground potential of said internal circuits, located over at least a part of a face of said integrated circuit chip that is opposite to a face which supports said connector elements, and said IC card comprises:

an antenna connecting lead formed as part of said patterned connecting leads, having a first branch portion and a second branch portion which respectively extend from a junction thereof, each of said first and second branch portions having a length that is determined in accordance with a wavelength of said radio waves transmitted by said interrogator apparatus, and with said antenna connecting lead having a common portion which extends between said junction and one of said connector elements;

a layer of electrically insulating sealing material formed upon said first face of said substrate surrounding said integrated circuit chip while leaving at least a part of said ground connecting layer uncovered by said layer of sealing material;

a first layer of electrically conductive material formed over a second face of said first substrate, having a first slot aperture therein, located to extend adjacent a part of said first branch portion of said antenna connecting lead;

a second layer of electrically conductive material located over an second face of said layer of electrically insulating sealing material and said ground connecting layer, having a second slot aperture therein, with said second slot aperture located to extend adjacent a part of said second branch portion of said antenna connecting lead; and connection means coupled to one of said connector elements and to said first layer of electrically conductive material, for connecting said layer to said ground potential;

wherein said first slot aperture in conjunction with said first branch portion of the antenna connecting lead comprises a first slot antenna and said second slot aperture in conjunction with said second branch portion of the antenna connecting lead comprises a second slot antenna, whereby either one of said first and second slot antennas can implement the functions of said antenna of said transponder independently of the other one of said first and second slot antennas.

65. The transponder for a mobile body discrimination apparatus according to claim 60, further comprising a first layer of a dielectric material located adjacent said first layer of electrically conductive material and a second layer of a dielectric material located adjacent said second layer of electrically conductive material, with said first and second layers of dielectric material respectively covering said first and second slot apertures.

66. A mobile body discrimination apparatus according to claim 1, wherein said radio waves transmitted by said interrogator apparatus are in the microwave frequency range and wherein each of said transponders is structured as an IC (integrated circuit) card having a substrate with patterned connecting leads located on a first face thereof and an integrated circuit chip in bare chip condition, which comprises circuits of said transponder and has a plurality of connector elements, which are respectively coupled to said internal circuits, located thereon, said integrated circuit chip being mounted on said upper face of said substrate;

wherein said IC card comprises:

an antenna chip comprises a block of dielectric material with planar first and second faces, mounted on said first face of said substrate, with a layer of electrically conductive material having a slot aperture therein and connected to a ground potential of internal circuits of said integrated circuit chip, located adjacent said first face of said block;

an antenna connecting lead, having a first portion located on said second face of said antenna chip and a second portion located on said first face of said substrate, coupled through one of said connector elements to said internal circuits; and a layer of electrically conductive material located over a second face of said substrate and connected to said ground potential, having a slot aperture therein;

wherein said slot apertures are located in a relative to respective portions of said antenna connecting lead to thereby constitute respective slot antennas, and each of said slot antennas is configured to function independently of the other one thereof as said antenna of said transponder.

67. A mobile body discrimination apparatus according to claim 1, wherein said radio waves transmitted by said interrogator apparatus are in the microwave frequency range and wherein each of said transponders is structured as an IC (integrated circuit) card comprising a first substrate with patterned connecting leads located on a first face thereof and an integrated circuit chip in bare chip condition, comprising respective internal circuits of said transponder and has a plurality of connector elements, respectively coupled to said internal circuits, located thereon, said integrated circuit chip being mounted on said first face of said first substrate;

wherein said IC card comprises:
      an antenna chip comprising a block of dielectric material mounted on said first face of said substrate, said antenna chip being shaped with planar first and second faces and having a first layer of electrically conductive material located on said first face thereof and a plurality of connector elements attached to said second face thereof, said first layer of electrically conductive material having a first slot aperture therein, and patterned connecting leads located on said second face of said block to comprise a first branch portion and a second branch portion of an antenna connecting lead, with said first and second branch portions extending from a junction thereof which is coupled to a first one of said connector elements and said first branch portion positioned with a part thereof located adjacent said first slot aperture, each of said first and second branch portions having a length that is determined in accordance with a wavelength of said radio waves transmitted by said interrogator apparatus;
      a common portion of said antenna connecting lead, located on said first face of said substrate to connect said first connector element of said antenna chip to one of said connector elements of said integrated circuit chip;
      a second layer of electrically conductive material, located over a second face of said substrate, having a second slot aperture therein, with said second slot aperture positioned adjacent a part of said second branch portion of said antenna connecting lead;
      first through-hole connection means located in said substrate, coupled to one of said connector elements and to said first layer of electrically conductive material, for connecting said layer to said ground potential; and
      second through-hole connecting means located in said substrate, and third through-hole connecting means located in said block of dielectric material, to electrically interconnect said first layer of electrically conductive material of said antenna chip and said second layer of electrically conductive material of said substrate via one of said connector elements of said antenna chip;
   wherein said first slot aperture in conjunction with said first branch portion of the antenna connecting lead constitutes a first slot antenna and said second slot aperture in conjunction with said second branch portion of the antenna connecting lead constitutes a second slot antenna, whereby either one of said first and second slot antennas can implement the functions of said antenna of said transponder independently of the other one of said first and second slot antennas.

68. A mobile body discrimination apparatus according to claim 1, wherein said radio waves transmitted by said interrogator apparatus are in the microwave frequency range and wherein each of said transponders is structured as an IC (integrated circuit) card comprising a substrate and an integrated circuit chip which comprise respective internal circuits of said transponder and has a plurality of connector elements, which are respectively coupled to said internal circuits, located thereon, said integrated circuit chip being mounted in bare chip form on a first face of said substrate;

wherein said IC card comprises:
      first and second portions of a patterned layer of electrically conductive material located adjacent said first face of said substrate, said first portion connected to said internal circuits and shaped to comprise a co-planar antenna connecting lead of a slot antenna, and said second portion connected to a ground potential of said internal circuits and shaped with a cut-out portion which extends to an edge of said first face, to comprise said slot antenna in conjunction with said antenna connecting lead;
      whereby said slot antenna has a directivity oriented parallel to said upper face of said substrate.

69. A mobile body discrimination apparatus according to claim 1, wherein said radio waves transmitted by said interrogator apparatus are in the microwave frequency range and wherein each of said transponders is structured as an IC (integrated circuit) card comprising a substrate and an integrated circuit chip which comprise respective internal circuits of said transponder and has a plurality of connector elements located thereon, with respective ones of said connector elements coupled to said internal circuits, with said integrated circuit chip being mounted in bare chip form on a first face of said substrate;

wherein said IC card comprises:
      a first portion of a patterned layer of electrically conductive material that is located adjacent said first face of said substrate, said first portion being connected via at least one of said connector elements to a ground potential of said internal circuits and located with a shaped cut-out region, said shaped region extending to an outer edge of said first face; and
      a second portion of said patterned layer of electrically conductive material, extending from said integrated circuit chip to a position adjacent said shaped region, shaped to function as a co-planar antenna connecting lead of a slot antenna, and connected at one end thereof via one of said connector elements to said internal circuits of said transponder;
   said cut-out portion and said co-planar antenna connecting lead having respective shapes and dimensions determined in accordance with a wavelength of said microwave radio waves such as to constitute said slot antenna.

* * * * *